US008530308B2

United States Patent

(12) United States Patent
Ema et al.

(10) Patent No.: US 8,530,308 B2
(45) Date of Patent: Sep. 10, 2013

(54) SEMICONDUCTOR INTEGRATED CIRCUIT DEVICE HAVING IMPROVED PUNCH-THROUGH RESISTANCE AND PRODUCTION METHOD THEREOF, SEMICONDUCTOR INTEGRATED CIRCUIT DEVICE INCLUDING A LOW-VOLTAGE TRANSISTOR AND A HIGH-VOLTAGE TRANSISTOR

(75) Inventors: Taiji Ema, Kawasaki (JP); Hideyuki Kojima, Kawasaki (JP); Toru Anezaki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 680 days.

(21) Appl. No.: 12/651,058

(22) Filed: Dec. 31, 2009

(65) Prior Publication Data

US 2010/0105180 A1 Apr. 29, 2010

Related U.S. Application Data

(60) Division of application No. 11/209,881, filed on Aug. 24, 2005, now Pat. No. 7,671,384, which is a continuation of application No. PCT/JP03/07373, filed on Jun. 10, 2003.

(51) Int. Cl.
*H01L 21/336* (2006.01)
*H01L 29/66* (2006.01)

(52) U.S. Cl.
USPC .......................................... 438/264; 257/203

(58) Field of Classification Search
USPC .......................... 438/264; 257/E21.422, 203
See application file for complete search history.

(56) References Cited

U.S. PATENT DOCUMENTS

| | | | | |
|---|---|---|---|---|
| 5,349,218 | A | 9/1994 | Tadaki et al. | |
| 5,654,577 | A | 8/1997 | Nakamura et al. | |
| 5,668,755 | A | 9/1997 | Hidaka | |
| 6,287,912 | B1 | 9/2001 | Asakura et al. | |
| 6,384,455 | B1 | 5/2002 | Nishigohri | |
| 6,399,443 | B1 | 6/2002 | Chwa et al. | |
| 6,444,554 | B1 | 9/2002 | Adachi et al. | |
| 6,952,034 | B2 * | 10/2005 | Hu et al. | 257/315 |
| 2002/0197800 | A1 | 12/2002 | Hashimoto et al. | |

FOREIGN PATENT DOCUMENTS

| | | |
|---|---|---|
| JP | 6-188364 | 7/1994 |
| JP | 6-327237 | 11/1994 |
| JP | 10-74846 | 3/1998 |
| JP | 10-163430 | 6/1998 |

(Continued)

OTHER PUBLICATIONS

Office Action dated Oct. 7, 2009 issued in corresponding Japanese Patent Application No. 2005-500737.

*Primary Examiner* — Fernando L Toledo
*Assistant Examiner* — Neil Prasad
(74) *Attorney, Agent, or Firm* — Westerman, Hattori, Daniels & Adrian, LLP

(57) ABSTRACT

An integrated circuit device comprises a memory cell well formed with a flash memory device, first and second well of opposite conductivity types for formation of high voltage transistors, and third and fourth wells of opposite conductivity types for low voltage transistors, wherein at least one of the first and second wells and at least one of the third and fourth wells have an impurity distribution profile steeper than the memory cell well.

11 Claims, 102 Drawing Sheets

(56) References Cited

FOREIGN PATENT DOCUMENTS

| | | |
|---|---|---|
| JP | 10-189780 | 7/1998 |
| JP | 10-199994 | 7/1998 |
| JP | 11-111639 A | 4/1999 |
| JP | 11-284152 | 10/1999 |
| JP | 11-511904 | 10/1999 |
| JP | 2001-85625 | 3/2001 |
| JP | 2001-196470 | 7/2001 |
| JP | 2002-368145 | 12/2002 |
| JP | 2003-7863 | 1/2003 |
| WO | 97/18588 | 5/1997 |

* cited by examiner

40

210

SEMICONDUCTOR INTEGRATED CIRCUIT DEVICE HAVING IMPROVED PUNCH-THROUGH RESISTANCE AND PRODUCTION METHOD THEREOF, SEMICONDUCTOR INTEGRATED CIRCUIT DEVICE INCLUDING A LOW-VOLTAGE TRANSISTOR AND A HIGH-VOLTAGE TRANSISTOR

CROSS-REFERENCE TO RELATED APPLICATIONS

The present invention is a Divisional of application Ser. No. 11/209,881, filed Aug. 24, 2005, which is a Continuation application filed under 35 U.S.C. 111(a) claiming benefit under 35 U.S.C. 120 and 365(c) of PCT application JP2003/007373 filed on Jun. 10, 2003, the entire contents of each are incorporated herein as reference.

BACKGROUND OF THE INVENTION

The present invention generally relates to semiconductor devices and more particularly to a semiconductor integrated circuit device in which a nonvolatile memory device and a logic device are integrated and the fabrication process thereof.

So-called hybrid semiconductor integrated circuit devices are the devices in which logic devices such as a CMOS device and non-volatile semiconductor memory devices such as a flash memory device are integrated on a common substrate. Such hybrid semiconductor integrated circuit devices constitute a product group called CPLD (complex programmable logic device) or FPGA (field programmable gate array), wherein these products form a large market in view of their capability of programming.

On the other hand, there is a large difference in the device structure and also in the operational voltage between flash memory devices and logic devices, and thus, there arises a problem of very complex fabrication process with such hybrid semiconductor integrated circuit devices in which flash memory devices and logic devices are integrated. Because of this, various proposals have been made so far for simplifying the fabrication process of such hybrid semiconductor integrated circuit devices.

For example, Japanese Laid-Open Patent Application No. 2001-196470 bulletin describes a process of fabricating a semiconductor integrated circuit device integrating therein a flash memory device and a logic device according to the process of: forming a well corresponding to the device region of a flash memory device, a well corresponding to the device region of a high voltage transistor, and a well corresponding to the device region of a low voltage transistor; and thereafter forming a floating gate of the flash memory device. However, while this conventional process is straightforward, there are included large number of process steps, and thus, this conventional art suffers from the problem of increased fabrication cost.

On the other hand, Japanese Laid-Open Patent Application No. 11-284152 bulletin describes the technology of: forming wells corresponding to the device regions of the flash memory device and the high-voltage transistor on the substrate; forming the tunneling insulation film, floating gate electrode and the inter-electrode insulation film of ONO (oxide-nitride-oxide) structure; removing the tunneling insulation film, the floating gate electrode and the ONO inter-electrode insulation film from the region of the logic circuit; and thereafter forming a well for the device region of the low voltage transistor in the region from which the tunneling insulation film, the floating gate electrode and the ONO inter-electrode insulation film have been removed, for suppressing the characteristic variation of the low voltage transistor constituting the logic device caused at the time of heat-treatment as much as possible. However, while this prior art can successfully minimize the influence of heat to the low voltage transistor, this technology moves the whole fabrication process of the low voltage transistor to the latter half of the fabrication process of the semiconductor integrated circuit device without clarifying which step of the process steps of the low voltage transistor is sensitive to the heat-treatment, the process has limited degree of freedom, and it is difficult to reduce the number of the process steps.

Further, Japanese Laid-Open Patent Application No. 2002-368145, Japanese Laid-Open Patent Application No. 2001-196470 and Japanese Laid-Open Patent Application No. 10-199994 describe the technology of reducing the number of the process steps while suppressing the characteristic change of the low voltage transistor at the time of the heat-treatment, by using the ion implantation mask provided for the formation of the well of the low voltage transistor also as a mask in the process removing the thick gate insulating film of the high-voltage transistor.

According to this prior art, the influence of the heat at the time of forming the floating gate electrodes of flash memory is prevented from reaching the low voltage transistor, and it becomes possible to realize an operational characteristic comparable to that of ordinary low voltage transistor not integrated with a flash memory for the low voltage transistor. Further, it is possible to reduce the number of the mask steps. However, with this prior art, there arise at least two serious problems as explained below.

REFERENCES

Patent Reference 1

Japanese Laid-Open Patent Application 10-199994 official gazette

Patent Reference 2

Japanese Laid-Open Patent Application 11-284152 official gazette

Patent Reference 3

Japanese Laid-Open Patent Application 2001-196470 official gazette

Patent Reference 4

Japanese Laid-Open Patent Application 2002-368145 official gazette

Patent Reference 5

Japanese Laid-Open Patent Application 10-74846 official gazette

Patent Reference 6

Japanese Laid-Open Patent Application 10-163430 official gazette

Patent Reference 7.

Japanese Laid-Open Patent Application 11-511904 official gazette

Patent Reference 8

Japanese Laid Open Patent Application 2001-85625 official gazette

Patent Reference 9

Japanese Laid-Open Patent Application 6-188364 official gazette

Patent Reference 10

Japanese Laid-Open Patent Application 6-327237 official gazette

SUMMARY OF THE INVENTION

FIGS. 1A-1C show the well formation process of a low-voltage transistor according to the method described in the above-mentioned Japanese Laid-Open Patent Application 2002-368145 official gazette.

Referring to FIG. 1A, there is formed a device isolation insulation film 12 of STI structure in a silicon substrate 11, and a thick silicon oxide film 12A constituting the gate insulation film of the previously formed high-voltage transistor is formed on the silicon substrate 11 in continuation with the device isolation insulation film 12.

In the step of FIG. 1B, a resist pattern 13 is formed on the silicon substrate 11 so as to cover an n-type well formation region, and a p-type impurity element such as $B^+$ is injected into the silicon substrate 11 by way of ion implantation process while using the resist pattern 13 as a mask. With this, a p-type well 11A is formed in the silicon substrate 11.

Next, in this conventional process, the silicon oxide film 12A is removed from the surface of silicon substrate 11 on the surface of the p-type well 11A in the process of FIG. 1C by an etching process while using the same resist pattern 13 as a mask. Thus, with this conventional method, the number of mask process is decreased by one, by using the mask for etching the silicon oxide film 12A also for the mask of the ion implantation process of FIG. 1B.

Next, the resist pattern 13 is removed in the step of FIG. 1D and a different resist pattern 14 is formed so as to cover the p-type well 11A. Further, an impurity element of n-type such as $P^+$ or $As^+$ is introduced into the silicon substrate 11 while using the resist pattern 14 as a mask, and an n-type well 11B is formed adjacent to the p-type well 11A.

Further, the silicon oxide film 12A is removed in the step of FIG. 1D from the surface of the silicon substrate 11 while using the resist pattern 14 as a mask, and a structure shown in FIG. 1E is obtained such that a p-type well 11A and an n-type well 11B are in contact with each other in the region right underneath the device isolation insulation film 12.

However, it should be noted that FIGS. 1A-1E above show an ideal case in which there is no positional error between the resist pattern 13 and resist pattern 14, while in the fabrication process of actual ultrafine semiconductor integrated circuits, however, it is thought inevitable that there is caused some positional error between the resist pattern 13 and the resist pattern 14 as shown in FIGS. 2A and 2B or FIGS. 3A and 3B.

In the example of FIG. 2A, it is noted that the resist pattern 14 extends to the region where the n-type well 11B is formed in the step of FIG. 1D beyond the region where the p-type well 11A is formed. When ion implantation of an n-type impurity element is conducted under this situation, there arise not only the problem that an undoped region is formed between the n-type well 11A and the p-type well 11B as shown in FIG. 2A but also the problem that the part that the resist pattern 14 went beyond is not etched at the time of the etching process of the silicon oxide film 12A as shown in FIG. 2B, and there is formed a stepped part 12C in the device isolation insulation film 12.

On the other hand, FIG. 3A shows the case in which the resist pattern 14 has not covered the region of the p-type well 11A completely. In this case, when the n-type impurity element such as $P^+$ or $As^+$ is introduced by an ion implantation process, the n-type well 11B invades into the p-type well beyond the boundary of the p-type well 11A. Thereby, there is formed a high resistance region depleted with carriers at the boundary of the p-type well 11A and the n-type well 11B.

Further, in the state of FIG. 3A, the stepped structure formed at the time of removal of the silicon oxide film 12A in the p-type well 11A is exposed in the silicon oxide film 12A, and thus, there is formed a deep groove 12D in correspondence to the stepped part when the silicon oxide film 12A is removed by an etching in the state of FIG. 3A.

When such a groove is formed on the surface of the device isolation insulation film 12 like this, there arises a problem, when an interconnection pattern such as a polysilicon pattern is formed across such a groove, that a short circuit may be caused by the conductive residues formed in such a groove. It is difficult to remove the conductive residue in such a deep groove by way of etching.

Furthermore, with this conventional process, the resist pattern 14 is formed directly on the exposed surface of the silicon substrate 11 as can be seen in FIGS. 1D, 2A and 3A, and thus, there arises a problem that the substrate surface is tend to be contaminated by the impurities contained in the resist film. Removal is of such contamination of the silicon substrate surface is also difficult.

Further, when attempt is made to form a semiconductor integrated circuit having a high voltage p-channel MOS transistor and a high voltage n-channel MOS transistor, a low voltage p-channel MOS transistor and a low voltage n-channel MOS transistor, in addition to a flash memory device, on a substrate by using this conventional fabrication process semiconductor device, there are required seven mask steps in total from the commencement of the process up to the formation of the gate insulation film of the low-voltage transistor: twice for forming the n-type wells used for the device regions of a high voltage p-channel MOS transistor and a low voltage p-channel MOS transistor; once for forming the p-type well used for the device region of the flash memory cell transistor; twice for forming the p-type wells used for the device regions of the low-voltage p-channel MOS transistor and the high-voltage p-channel MOS transistor; once for patterning of the floating gate electrode; and once for patterning of the ONO inter-electrode insulation film. Further, there are conducted ion implantation processes three times while changing the ion species, acceleration voltage and the dose amount at the time of formation of the high voltage p-channel MOS transistor. Similarly, at the time of formation of the high voltage n-channel MOS transistors, there are conducted ion implantation processes three times while changing the ion species, acceleration voltage and the dose amount. In addition to this, there are conducted an ion implantation processes once for threshold control of the flash memory cell, three times for the formation of low-voltage p-channel MOS transistor, and three times for formation of the low voltage n-channel MOS transistor. In all, thirteen ion implantation processes steps are required for fabrication of such a semiconductor integrated circuit.

Meanwhile, recent semiconductor integrated circuits integrating therein a flash memory device are subjected to the demand of capability of performing versatile functions, while this means that it is not sufficient to construct the semiconductor device by merely integrating p-channel MOS transistors and re-channel MOS transistors of high voltage with p-channel MOS transistors and n-channel MOS transistors of low voltage as in the case of conventional art. More specifically, there are emerging the needs of: constructing the high-voltage p-channel MOS transistor in terms of a low-threshold voltage transistor and a high-threshold voltage transistor; constructing the high-voltage n-channel MOS transistor in terms of a low-threshold voltage transistor and a high-threshold voltage transistor similarly; constructing the low-voltage p-channel MOS transistor in terms of a high-threshold transistor and a low-threshold transistor; constructing the low-voltage n-channel MOS transistor in terms of a low-threshold transistor and a high-threshold transistor; and further forming a mid-voltage p-channel MOS transistor and a mid-voltage n-channel MOS transistor, in addition to the memory cell transistor. In this case, there are formed eleven different transistors on the substrate.

FIGS. 4A-4Q show a hypothetical fabrication process of a semiconductor integrated circuit device in which such a conventional method is applied to a semiconductor integrated circuits that includes therein eleven transistors of different types.

Referring to FIG. 4A, a p-type silicon substrate 21 is formed with a device isolation region 11S of STI structure, wherein the device isolation region 11S defines: a device region 11A (Flash Cell) in which a flash memory device is formed; a device region 11B (HVN-LowVt) in which a high voltage low-threshold n-channel MOS transistor is formed; a device region 11C (HVN-HighVt) in which a high-voltage high-threshold n-channel MOS transistor is formed; a device region 11D (HVP-LowVt) in which a high-voltage low-threshold p-channel MOS transistor is formed; a device region 11E (HVP-HighVt) in which a high-voltage high-threshold p-channel MOS transistor is formed; a device region 11F in which a mid-voltage n-channel MOS transistor is formed; a device region 11G in which a mid-voltage p-channel MOS transistor is formed; a device region 11H (LVN-HighVt) in which a low-voltage high-threshold n-channel MOS transistor is formed; a device region 11I (LVN-LowVt) in which a low-voltage low-threshold n-channel MOS transistor is formed; a device region 11J (LVP-HighVt) in which a low-voltage high-threshold p-channel MOS transistor is formed; and a device region 11K (LVP-LowVt) in which a low-voltage low-threshold p-channel MOS transistor is formed.

Next in the step of FIG. 4B, a resist pattern R1 is formed on the structure of FIG. 4A so as to expose: the memory cell region 11A; the region 11B for the high-voltage low-threshold n-channel MOS transistor; and the region 11C for the high-voltage high-threshold n-channel MOS transistor region 11C, and a buried n-type well is formed at the depth 11*b* in the regions 11A-11C by introducing an n-type impurity element by an ion implantation process. Further, while using the same resist pattern R1 as a mask, a p-type impurity element is introduced to a depth 11*pw* and a depth 11*pc* in the regions 11A-11C by way of ion implantation process, and thus, there are formed a p-type well and a p-type channel stopper region. Further, while using the resist pattern R1 as a mask, a p-type impurity element is introduced to a depth 11*pt* by an ion implantation process, and threshold control is achieved for the n-channel MOS transistor formed in the device regions 11A-11C, particularly the high-voltage low-threshold n-channel MOS transistor formed in the device region 11B.

Further, a new resist pattern R2 is formed so as to expose the device region 11C of the high-voltage high-threshold n-channel MOS transistor in the step of FIG. 4C, and a p-type impurity element is introduced into the depth 11*pt* of the device region 11C by an ion implantation process while using the resist pattern R2 as a mask. With this, the impurity concentration level at the depth 11*pt* is increased to a predetermined value, and threshold control is achieved for the high-voltage high-threshold n-channel MOS transistor formed in the region 11C.

Next, a new resist pattern R3 exposing the device region 11D of the high-voltage low-threshold p-channel MOS transistor and the device region 11E of the high-voltage high-threshold p-channel MOS transistor is formed in the step of FIG. 4D, and an n-type impurity element is introduced to the depths 11*nw* and 11*nc* consecutively in the regions 11D and 11E by way of ion implantation process. Thereby, an n-type well and a channel stopper region of n-type are formed. Further, in the step of FIG. 4D, an n-type impurity element is introduced to the depth lint in the regions 11D and 11E by way of an ion implantation process while using the resist pattern R3 as a mask, and threshold control is achieved for the p-channel MOS transistors formed in the regions 11D and 11E, particularly the p-channel MOS transistor formed in the device region 11D.

Next, a resist pattern R4 is formed in the step of FIG. 4E so as to expose the device region 11E of the high voltage high threshold p-channel MOS transistor, and an n-type impurity element is introduced into the silicon substrate 11 at the depth lint by an ion implantation process while using the resist pattern R4 as a mask, such that the impurity concentration level at the depth lint of the device region 11E is increased to a predetermined value. With this, threshold control is achieved for the high-voltage p-channel MOS transistor formed in the region 11E.

Further, in the step of FIG. 4F, a resist pattern R5 is formed so as to expose the memory cell region 11A, and a p-type impurity element is introduced by an ion implantation process while using the resist pattern R5 as a mask, such that the impurity concentration level at the depth 11*pt* is increased to a predetermined value in the device region 11A. With this, threshold control of the memory cell transistor formed in the memory cell region 11A is achieved.

With this process that has expanded the conventional process, the threshold control is completed for the memory cell transistor and the high-voltage p-channel and n-channel MOS transistors formed on the silicon substrate by the step of FIG. 4F, and a tunneling insulation film 12 is formed uniformly on the silicon substrate 11 in the step of FIG. 4G.

Further, in the process of FIG. 4H, a polysilicon film constituting the floating gate electrode is deposited on the tunneling insulation film by a CVD process, or the like, and a floating gate electrode 13 is formed on the device region 11A by a patterning process that uses a mask process not illustrated.

Further, in the step of FIG. 4H, an inter-electrode insulation film 14 of ONO structure is formed on the tunneling insulation film 12 so as to cover the floating gate electrode 13, and in the step of FIG. 4I, the tunneling insulation film 12 is removed from other device regions 11B-11K by patterning the inter-electrode insulation film 14 and the tunneling insulation film 12 underneath while using a resist pattern R6 as a mask. Further, with the heat treatment process associated with formation of the ONO inter-electrode insulation film 14, it should be noted that the impurity elements that have been introduced with the previous process steps are activated.

With the step of FIG. 4I, the ONO film 14 is removed by using the mask R6 and the silicon surface is exposed except for the memory cell region 11A. Further, by a thermal oxidation process, a thick oxide film 15 is formed uniformly as the tunneling insulation film of the memory cell transistor in the device region 11A and the gate insulation film of the high-voltage MOS transistors in the device regions 11B-11E.

Next, in the step of FIG. 4J, a resist pattern R7 is formed on the oxide film 15 so as to expose the device region 11F of the mid-voltage re-channel MOS transistor, and a p-type impurity element is introduced into the device region 11F to the depth 11*p* and the depth position 11*pw* by consecutive ion implantation processes similarly to the step of FIG. 4B while using the resist pattern R7 as a mask. With this, a p-type channel stopper region and a p-type well are formed for the n-channel mid-voltage transistor in the device region 11F. Further, in the step of FIG. 4J, threshold control is conducted for the mid-voltage n-channel MOS transistor formed in the device region 11F, by increasing the impurity concentration level at the depth 11*pt* to a predetermined value. In the step of FIG. 4J, the oxide film 15 is removed from the device region 11F after the ion implantation process.

Further, in the step of FIG. 4K, an n-type impurity element is introduced into the device region 11G of the mid-voltage p-channel MOS transistor by an ion implantation consecutively to the depths 11*n*, 11*nw* and lint, similarly to the process of FIG. 4E while using a new resist pattern R8 as a mask. Further, in the step of FIG. 4K, threshold control is achieved for the p-channel MOS transistor formed in the device region 11G, by increasing the impurity concentration level at the depth lint to a predetermined value.

Further, in the step of FIG. 4K, the silicon oxide film 15 is removed by an etching process after the ion implantation process.

Next, in the step of FIG. 4L, the resist pattern R8 is removed, and by conducting a thermal oxidation process, a silicon oxide film 16 thinner than the silicon oxide film is formed as the gate insulation film of the voltage MOS transistor, such that the silicon oxide film 16 covers the device region 11F of the low-voltage n-channel MOS transistor and the device region 11G of the mid-voltage n-channel MOS transistor. In the step of FIG. 4L, on the other hand, it will be noted that a convex part similar to that explained previously with reference to FIG. 2B is formed on the device isolation insulation film 11S due to the positional error of the resist pattern R8 with respect to the resist pattern R7.

Next, in the step of FIG. 4M, a new resist pattern R9 is formed on the silicon substrate 11 so as to expose the device region 11H of the low-voltage high-threshold n-channel MOS transistor and the device region 11I of the low-voltage low-threshold n-channel MOS transistor, and a p-type impurity element is introduced by an ion implantation process to the depth 11*pc* and the 11*pw* while using the resist pattern R9 as a mask. Further, by using the same resist pattern R9 as a mask, the silicon oxide film 15 is removed from the device regions 11H and 11I by an etching process. With this, a p-type channel stopper and a p-type well are formed in the device regions 11H and 11I.

Further, in the step of FIG. 4N, a new resist pattern R10 is formed so as to expose the device region 11H of the low-voltage high-threshold re-channel MOS transistor, and threshold control of the low-voltage high-threshold n-channel MOS transistor is achieved by introducing a p-type impurity element to the depth 11*pt* by way of ion implantation process while using the resist pattern R10 as a mask.

Next, in the process of FIG. 4O, a new resist pattern R12 is formed on the silicon substrate 11 so as to expose the device region 11J of the low-voltage high-threshold p-channel MOS transistor and the device region 11K of the low-voltage low-threshold p-channel MOS transistor, and an n-type impurity element is introduced to the depths 11*nc* and 11*nw* by an ion implantation process while using the resist pattern R11 as a mask. Further, while using the same resist pattern R11 as a mask, the silicon oxide film 15 is removed from the device regions 11J and 11K by an etching process. With this, an n-type channel stopper diffusion region and an n-type well are formed in the device regions 11J and 11K.

Further, in the step of FIG. 4P, a new resist pattern R12 is formed so as to expose the device region 11H of the low-voltage high-threshold re-channel MOS transistor, and threshold control of the low-voltage high-threshold p-channel MOS transistor is achieved by introducing an n-type impurity element to the depth lint by an ion implantation process while using the resist pattern R12 as a mask.

Finally, in the step of FIG. 4Q, the resist pattern R12 is removed and a silicon oxide film 17 thinner than the silicon oxide film 16 is formed on the device regions 11H-11K as the gate insulation film of the low-voltage n-channel MOS transistors or the low-voltage p-channel MOS transistors after activating the impurity element introduced to the device regions 11F-11K by conducting a heat treatment.

Thus, with this fabrication process of the semiconductor integrated circuit, which is a straightforward expansion of the technology of Japanese Laid-Open Patent Application 2001-196470 official gazette, thirteen mask processes are required in all, thus in the steps of: FIG. 4B; FIG. 4C; FIG. 4D; FIG. 4E; FIG. 4F; FIG. 4H; FIG. 4I; FIG. 4J; FIG. 4K; FIG. 4M; FIG. 4N; FIG. 4O; and FIG. 4P. Further, with this process, there are needed twenty two ion implantation processes in all: four times with the process of FIG. 4B; once with the process of FIG. 4C; three times with the process of FIG. 4D; once with the process of FIG. 4E; once with the process of FIG. 4F; three times with the process of FIG. 4J; three times with the process of FIG. 4K; twice with the process of FIG. 4M; once with the process of FIG. 4N; twice with the process of FIG. 4O; and once with the process of FIG. 4P. Even in the case the ion implantation processes to depth lint in FIG. 4B and to the depth 11*pt* of FIG. 4D are eliminated, twenty ion implantation processes are still needed.

Further, as explained previously, with the process of FIGS. 4A-4Q, the resist film makes a direct contact with the silicon substrate surface particularly in the steps of FIGS. 4K, 4N, 4O and 4P, and contamination is easily brought about. When an oxide film to be used for the gate insulation film is formed by oxidation of such a contaminated silicon substrate, there is caused degradation of electrical properties such as leakage current characteristic of the gate insulation film, and the characteristics of the transistor thus obtained are inevitably deteriorated.

Further, as shown in FIG. 4L, there is a possibility that convex part or groove is formed on the surface of the device isolation insulation film 11S when there is a positional error in the resist patterns.

Meanwhile, the inventor of the present invention has studied the degradation of characteristics of high-speed low-voltage transistors with heat treatment in the investigation that constitutes the foundation of the present invention and discovered that there exist two factors in such deterioration of device characteristics caused by heat treatment, the one being the fluctuation of threshold voltage or drain current, and the other being the punch-through phenomenon occurring between the well of p-type or n-type and the diffusion region of $n^+$-type or $p^+$-type adjoining with the well across a device isolation insulation film. Further, it was discovered that the fluctuation of characteristics caused by the former factor is 10% or less and is easily suppressed by optimization of threshold voltage control or the condition of ion implantation process.

On the other hand, the latter factor is serious and measure has to be taken.

FIG. 5A shows the leakage current caused to flow by punch-through in the model structure shown in FIG. 5B between an $n^+$-type diffusion region 2 formed in the p-type well 1A and an n-type well 1B adjacent to the p-type well 1A, while changing the distance x between the $n^+$-type diffusion region 2 and the n-type well 1B variously. Here, it should be noted that the model structure of FIG. 5B is formed in a silicon substrate 1 such that the p-type well 1A and the n-type well 1B are contacting with each other. Further, a device isolation insulation film 3 of STI structure is formed on the surface of substrate 1 between the p-type well 1A and the n-type well 1B. Further, it should be noted that the distance x is defined as the horizontal distance between the sidewall of the n-type well 1B and the $n^+$-type diffusion region 2.

Referring to FIG. 5A, there is caused a large change of leakage current with the distance x, and hence with miniaturization of the semiconductor device, and it can be seen that the leakage current increases sharply particularly when the distance x has decreased to 0.5 μm or less. In FIG. 5A, it should be noted that ■ and ♦ represent the result for the semiconductor device in which a flash memory cell is formed together with a high-speed logic device, while x represents the result for the semiconductor device in which only the high-speed logic devices are provided. In the flash memory cell of ♦, the impurity concentration level of the n-type well 1B is reduced even as compared with the case of ■.

The result of FIG. 5A indicates that there is caused sharp increase of leakage current by punch-through phenomenon with device miniaturization in any of the devices. From FIG. 5A, it can be seen that the punch-through effect appears particularly conspicuously when the process of forming a flash memory cell is added. While this does not cause any problem with flash cells, or the like, in which a large width can be secured for well separation, this punch-through nevertheless raises a serious problem in low-voltage transistors miniaturized to the utmost limit for high-speed operation.

FIG. 6 shows the band structure of the model structure taken along the leakage current path of FIG. 5B.

Referring to FIG. 6, the p-type well 1A forms a potential barrier in conduction band Ec between the n-type diffusion region 2 and the n-type well 1B, and thus, when the width or height of the potential barrier is high sufficiently large or sufficiently high, the punch-through current is impeded effectively even in the case that a drive voltage is applied between the source and drain regions of the semiconductor device. On the other hand, when there is formed mutual diffusion of p-type and n-type impurity elements between the p-type well 1A and the n-type well 1B with heat treatment, or the like, associated with the process of the flash memory cell as shown in FIG. 6, there occurs a decrease of impurity concentration level in the p-type well 1A, and with this, the potential barrier height ΔE is reduced as shown in the FIG. 6 by a broken line. In such a case, the leakage current caused by punch-through explained with reference to FIG. 5A becomes a very serious problem. Particularly, the punch-through current increases rapidly when the interval between $n^+$-type diffusion region 2 and n-type well 1B is decreased.

Thus, when there is caused mutual diffusion of p-type and n-type impurity elements between the p-type well 1A and the n-type well 1B in the structure of FIG. 5B, there is formed a p-type region 1C of low hole concentration in the part where the p-type well 1A makes a contact with the n-type well 1B and an n-type region 1D of low electron concentration is formed in the part where the n-type well 1B makes a contact with the p-type well 1A as shown in FIG. 7. Here, it should be noted that FIG. 7 is a diagram showing a part of FIG. 5B with enlarged scale. In FIG. 7, the concentration contour line of p-type or n-type impurity element is shown with broken lines.

Referring to FIG. 7, it can be seen that there occurs a gradual decrease of hole concentration level toward the n-type well 1B as shown in FIG. 7 by broken lines in the p-type region 10, while in the n-type region 1D, there occurs a gradual decrease of electron concentration level toward the p-type well 1A as shown also with the broken lines.

When such mutual diffusion of p-type impurity element and n-type impurity element is caused in the boundary region of the p-type well 1A and the n-type well 1B, the proportion of the p-type well 1A of high impurity concentration level is decreased, and it becomes possible for the electrons to leak easily from the $n^+$-type diffusion region 2 to n-type well 1B or from the n-type well 1B to the $n^+$-type diffusion region 2 along a path A shown schematically in the FIG. 7 in the case a drive voltage is applied to the transistor.

The same phenomenon takes place also for holes.

In FIG. 7, because of different diffusion coefficient values between the p-type impurity element and the n-type impurity element, the extent of the n-type region 1D is generally different from the extent of the p-type region 10. Further, there should be a shift of location of the boundary between the region 1C and the region 1D. These, however, do not influence the aforementioned consideration.

Meanwhile, there is a large difference in the operational voltage between a flash memory device and a logic device, and thus, it is necessary with a hybrid semiconductor integrated circuit device, in which a flash memory device and a logic device are integrated, to provide a high-voltage transistor for driving the flash memory device, which requires high voltage, in addition to the high speed CMOS device that operates with a low voltage on a common substrate. Moreover, the high-voltage transistor used for driving the flash memory device with high voltage has to be able to perform a switching operation with the low supply voltage used for driving the high speed CMOS device. Thus, the high-voltage transistor is required to have a low threshold voltage.

By the way, the MOS transistors that constitute a high speed logic device such as CMOS device are highly miniaturized for high-speed operation, and associated with this, there is a need of increasing the aspect ratio of the STI device isolation insulation film used for device isolation along with such miniaturization. However, in the case that the aspect ratio of the device isolation insulation film is increased as such, there arises a problem that it becomes difficult to fill the deep device isolation trench an insulation film such as $SiO_2$.

Because of such circumstances, it is necessary with so-called semiconductor integrated circuits of hybrid type, in which a flash memory device and a high speed logic device are mixed, there is a resulted the need of reducing the depth of the device isolation insulation film in proportion with miniaturization of the high speed logic device.

In the case such a shallow device isolation insulation film is used, there occurs a decrease of threshold voltage in the parasitic field transistor having a channel right underneath the device isolation insulation film and formed of a pair of mutually adjacent n-type and p-type wells and the n-type or p-type source or drain diffusion region formed in these wells, and punch-through occurs easily between adjacent devices as a result of conduction of the parasitic field transistor. In the device region of such a high-speed low-voltage MOS transistor, however, the drive voltage of the transistor decreases simultaneously, and occurrence of the punch-through is suppressed after all, and problem does not result. Also, according to the needs, it is possible to increase the impurity concentration level in the region right underneath the device isolation insulation film and increase the threshold voltage of the parasitic field transistor.

On the other hand, in the memory cell region in which the non-volatile semiconductor memory device such as a flash memory device is formed, no such decrease of operational voltage results. Thus, with such a memory cell region and the control circuit thereof, conduction of the parasitic field transistor, caused via the channel right underneath the device isolation insulation film, becomes a very serious problem particularly when the depth of the device isolation insulation film is reduced with miniaturization of the logic devices. Particularly, in the case of the high-voltage transistor operated by high voltage generated inside the integrated circuit apparatus by pumping of electric charges, there occurs leakage of the electric charges used for boosting in the form of punch-through current when the threshold voltage of the parasitic field transistor underneath the device isolation insulation film, which defines the device region of the high-voltage transistor, is reduced. Thereby, electric power consumption is deteriorated seriously.

It is of course possible, with the semiconductor integrated circuit that integrates therein non-volatile semiconductor memory devices and logic devices, to decrease the depth of the device isolation insulation film in the region where the logic devices are formed while increasing the depth of the device isolation insulation film in region of the non-volatile semiconductor memory device devices. However, such construction invites increase in the number of mask processes and is thus unacceptable.

On the other hand, it is known that the threshold voltage of parasitic field transistor can be increased by increasing the impurity concentration level of the channel stopper region formed right under the device isolation insulation film.

Thus, the inventor of the present invention produced, in the investigation that constitutes the foundation of the present invention, fabricated a semiconductor integrated circuit device such that the concentration level of the channel stopper impurity element right underneath the device isolation insulation film is increased in the device isolation structure that defines the device region of non-volatile semiconductor memory device.

However, with such a semiconductor integrated circuit, it was discovered that there is caused increase of threshold voltage for the high-voltage transistor when the channel stopper impurity concentration level is increased and that it is very difficult to fabricate a high voltage MOS transistor having a desired low threshold voltage of 0.2V, for example. Further, when the concentration level of the channel stopper impurity element has been increased as such, the junction breakdown voltage falls off particularly in the device region of the high-voltage transistor, and there arises the problem of increase of leakage current.

Meanwhile, a non-volatile semiconductor device such as flash memory device uses a high voltage at the time of writing or erasing of information. In a semiconductor integrated circuit device in which flash memory devices and logic devices such as a CMOS device are integrated on a common substrate, it should be noted that such a high voltage is generated by boosting a power supply voltage supplied from outside for driving logic devices, or the like, on the substrate by a boosting circuit such as charge pump provided on the substrate.

With recent semiconductor integrated circuit devices, the logic devices therein are miniaturized extremely along with improvement of operational speed, and with this, the power supply voltage supplied to the semiconductor integrated circuit device is reduced to 1.2V or less. In view of such circumstances, a charge pump circuit used with recent semiconductor integrated circuit devices is required to generate a desired high voltage of 10V or 12V from a very low power supply voltage of 1.2V or 1.0V.

Generally, a charge pump circuit includes a pair of MOS transistors in diode connection and has the construction in which an end of a pumping capacitor is connected an intermediate node of the MOS transistors forming the pair. Thereby, desired boosting is achieved by accumulating electric charge in the capacitor by supplying clock signals to the other end of the pumping capacitor.

Conventionally, a device having a structure identical to that of a transistor and having a well of first conductivity type and a diffusion layer of opposite conductivity type has been used as the boosting capacitor. With such a device, called inversion type capacitor, capacitance is formed between the gate electrode and an inversion layer formed in the silicon layer right underneath the gate electrode.

FIG. 8 shows an example of such an inversion type capacitor 210.

Referring to FIG. 8, the pumping capacitor 210 is formed on a silicon substrate 211 of first conductivity type, and there is formed a capacitor electrode 213 corresponding to a gate electrode on a silicon substrate 211 via an insulation film 212, which corresponds to the gate insulation film. Further, diffusion regions 211A and 2118 of opposite conductivity type are formed in the silicon substrate 211 at respective lateral sides of the capacitor electrode 213, wherein diffusion regions 211A and 211B are connected commonly to form a first terminal of the capacitor, while the gate electrode 213 forms a second terminal.

In recent ultrafine semiconductor integrated circuit devices, however, it is becoming increasingly difficult for conventional charge pumps that use such an inversion type capacitor to operate properly with decrease of the power supply voltage used in the semiconductor integrated circuit.

FIG. 9A shows three operational regions, accumulation region, depletion regions and inversion region, appearing in a positive voltage boosting capacitor, in which the silicon substrate 211 is doped to p-type and the diffusion regions 211A and 2118 are doped to n-type in the capacitor 210 of FIG. 8, with application of voltage to the electrode 213.

Referring to FIG. 9A, with such an inversion type capacitor, a large capacitance is realized by applying a large positive voltage to the electrode 213 and by forming an inversion layer in the silicon substrate 211 right underneath the electrode 213.

On the other hand, in the case such an inversion type capacitor is operated with high frequency, the capacitance obtained in the inversion region is decreased remarkably as can be seen in FIG. 9A. Further, with such an inversion type capacitor, the current output obtained from the charge pump becomes very small when the power supply voltage is reduced.

Similar problem arises in the case of a negative voltage boosting capacitor in which the conductivity type is reversed. FIG. 9B shows accumulation region, depletion region and inversion region appearing in such a negative voltage boosting capacitor.

In view of such a situation, Japanese Laid-Open Patent Application 11-511904 official gazette discloses, in order to solve the problem associated with such an inversion type capacitor, a pumping capacitor called accumulation type or well capacitor type shown in FIG. 10A or FIG. 10B, wherein FIG. 10A shows a positive boosting capacitor 210A, while FIG. 10B shows a negative boosting capacitor 110B. In the drawings, those parts explained previously are designated by the same reference numerals and the explanation thereof will be omitted.

Referring to FIG. 10A, the positive boosting capacitor 210A is formed on an n-type well 211N was formed in a silicon substrate 211 (not shown), wherein $n^+$-type diffusion regions are formed as the diffusion regions 211A and 211B.

In the negative boosting capacitor 210B of FIG. 10B, on the other hand, there is formed an n-type well 211N in the silicon substrate 211, and a p-type well 211P is formed in the n-type well 211N. Further, diffusion regions of $p^+$-type are formed in the p-type well 211P as the diffusion regions 211A and 211B.

In the boosting capacitor 210A of FIG. 10A, operation for the accumulation region of FIG. 9B is realized by applying a positive voltage to the electrode 213. Further, the operation of the accumulation region of FIG. 9A is realized in the boosting capacitor 210B of FIG. 10B by applying a negative voltage to the electrode 213.

With such operation in the accumulation region, it is thought that the capacitance of the boosting capacitor is maintained constant even when the voltage approached to zero, as long as the voltage applied to the electrode 213 is positive in the case of the device 210A of FIG. 10A or as long as the voltage applied to electrode 213 is negative in the case of the device 210B of FIG. 10B. From these viewpoints, it is thought preferable to use the device of FIG. 10A or 10B operated in the accumulation region for the pumping capacitor used with low-voltage high-speed semiconductor integrated circuit device including a flash memory in view of zero voltage loss.

However, foregoing feature of constant capacitance irrespective of application voltage shown in FIGS. 10A and 10B is obtained only in the case in which the electrode 213 is formed by a material such as metal having a work function very much different from that of silicon, and it was discovered that there actually occurs a phenomenon shown in FIG. 11 or 12 in which the capacitance is reduced remarkably in the case where the application voltage is low. Here, it should be noted that FIG. 11 corresponds to the characteristic of FIG. 9A for the positive boosting capacitor, while FIG. 12 is corresponds to the characteristic of FIG. 9B for the negative boosting capacitor. It should be noted that the relationship of FIGS. 11 and 12 has been discovered by the inventor of the present invention in the investigation that constitutes the foundation of the present invention. It should be noted that Japanese Laid-Open Patent Application 11-511904 official gazette noted before does not mention about the conductivity type of the electrode 13.

Referring to FIG. 11 or FIG. 12, it is noted that there is caused a remarkable decrease of capacitance when the application voltage in the range of 1.0-1.2V, while this means that it is not efficient to boost the supply voltage of 1.0V or 1.2V to the voltage of 5V, for example, by using such a pumping capacitor.

While there is a possibility that this problem can be avoided by using a material such as metal having a work function very much different from that of silicon for the electrode 213 in the construction of FIG. 10A or 10B, there is still a need of using different metallic materials of different work functions for the n-channel capacitor and the p-channel capacitor. However, formation of metal gate electrode by using different metallic materials at the time fabrication process of semiconductor integrated circuit device is not acceptable as such a process causes the fabrication process extremely complicated.

Accordingly, it is a general object of the present invention to provide a novel and useful semiconductor integrated circuit device and the fabrication process thereof wherein the foregoing problems are eliminated.

Another and more specific object of the present invention is to provide a semiconductor integrated circuit device in which a non-volatile memory device and a logic device are integrated on a common substrate and a fabrication process of such a semiconductor integrated circuit device, wherein it is possible to secure a sufficient breakdown voltage between the diffusion region of a logic device and a well of opposite conductivity type adjacent thereto even in the case the semiconductor integrated circuit device is miniaturized, capable of being fabricated with smaller number of process steps even in the case there are many kinds of transistor formed on the substrate, and capable of avoiding contamination of the gate oxide film.

Another object of the present invention is to provide a semiconductor integrated circuit device, comprising:

a memory cell well formed on a substrate;

a non-volatile semiconductor memory device formed on said memory cell well;

a first well formed on said substrate;

a first transistor formed on said first well and having a gate insulation film of a first film thickness;

a second well formed on said substrate;

a second transistor formed on said second well and having a gate insulation film of said first film thickness, said second transistor having an opposite channel conductivity type to said first transistor;

a third well formed on said substrate;

a third transistor formed on said third well with a gate insulation film having a second film thickness smaller than said first film thickness;

a fourth well formed on said substrate; and a fourth transistor formed on a fourth well and having a gate insulation film of said second film thickness, said fourth transistor having an opposite channel conductivity type to said third transistor, at least one of said first and second wells and at least one of said third and fourth wells having an impurity distribution profile steeper than an impurity distribution profile of said memory cell well.

Another object of the present invention is to provide a fabrication process of a semiconductor integrated circuit device having a flash memory device and logic devices on a semiconductor substrate, comprising the steps of:

defining, on said semiconductor substrate, a first device region in correspondence to said flash memory device and second and third device region in correspondence to said logic devices;

forming a first well in said first device region in said semiconductor substrate;

growing a first gate insulation film on said first well as a tunneling insulation film of said flash memory device;

growing a first conductor film on said first gate insulation film;

patterning said first conductor film and removing said first conductor film from said second and third regions while leaving said first conductor film in said first region as a floating gate electrode;

growing a dielectric film on said first conductor film;

forming, after growing said dielectric film, a second well in said semiconductor substrate in correspondence to said second device region and a third well in said semiconductor substrate in correspondence to said third device region;

growing a second gate insulation film on said second and third wells;

selectively removing said second gate insulation film selectively on said third well top;

growing a third gate insulation film of a film thickness different from said second gate insulation film on said third well;

growing a second conductor film on said dielectric film and said second and third gate insulation films;

patterning said second conductor film and forming a control gate of a non-volatile memory in said first device region and forming gate electrodes of peripheral transistors in said second and third device regions.

According to the present invention, it becomes possible to reduce the number of mask processes and the number ion implantation processes at the time of formation of a semiconductor integrated circuit device including plural transistors of different kinds a substrate. Thereby, it becomes possible with the present invention to form a pair of mutually adjacent wells of different conductivity types such that at least one of the wells has a sharper impurity concentration profile than an impurity distribution profile of the well in which the memory cell transistor is formed. Thereby, there occurs no degradation in the punch-through resistance in the semiconductor integrated circuit device. Further, according to the present invention, contamination of the silicon substrate by a resist film is avoided, and the problem of formation of projections and depressions on the silicon substrate is avoided also.

Another object of the present invention is to provide a semiconductor integrated circuit device in which a high-voltage transistor and a low-voltage transistor are integrated on the semiconductor substrate wherein it is possible to suppress conduction of a parasitic field transistor formed in a device region in which the high-voltage transistor is formed and having a channel right under the device isolation structure, without increasing the number of fabrication steps and without increasing the threshold voltage of the high-voltage transistor, even in the case the depth and film thickness of the device isolation insulation film formed on the semiconductor substrate are reduced as a result of miniaturization of the low-voltage transistor.

Another object of the present invention is to provide a semiconductor integrated circuit device, comprising:

a semiconductor substrate defined with first and second device regions by a device isolation insulation film;

a first semiconductor device formed in said first device region on said semiconductor substrate; and a second semiconductor device formed in said second device region on said semiconductor substrate, said first semiconductor device comprising a first transistor having a first gate insulation film formed on said first device region with a first film thickness and a first gate electrode formed on said first gate insulation film in the form of consecutive stacking of a polysilicon layer and a metal silicide layer, said second semiconductor device comprising a second transistor having a second gate insulation film formed on said second device region with a second film thickness smaller than said first film thickness and a second gate electrode formed on said second gate insulation film in the form of consecutive stacking of a polysilicon layer and a metal silicide layer, said first and second device isolation insulation films extending in said semiconductor substrate to a substantially identical depth, said first device isolation insulation film carrying a conductor pattern in which a polysilicon layer and a metal silicide layer are stacked consecutively, said polysilicon layer constituting said conductor pattern having an impurity concentration level lower than said polysilicon layer constituting said second gate electrode, said semiconductor substrate containing an impurity element in a region right underneath said first device isolation insulation film with a concentration level lower than a part right underneath said second device isolation insulation film.

According to the present invention, the conductor pattern formed on the second device isolation insulation film is formed of a polysilicon layer of low impurity concentration level and a metal silicide layer formed thereon, and thus, there is caused depletion in the polysilicon layer in the case a voltage is applied to the metal silicide layer, and conduction of the parasitic field transistor having a channel right underneath the device isolation insulation film is suppressed effectively, even in the case the thickness of the second device isolation insulation film constituting the second the device isolation structure is reduced. With regard to the conductor pattern, on the other hand, a polysilicon film of high resistance such as a polysilicon film of low impurity concentration level or undoped polysilicon film free form impurity element is used, wherein there arises no problem of increase of resistance for the conductor pattern, as there is formed a low resistance metal silicide layer on the surface of such a polysilicon film. With this, it becomes possible to increase the threshold voltage of the parasitic field transistor while suppressing increase of the substrate impurity concentration level, which may cause increase of threshold voltage of the high voltage transistor.

Another object of the present invention is to provide a semiconductor integrated circuit device in which a non-volatile semiconductor device and a logic device are integrated on a substrate together with a boosting element cable of boosting a voltage efficiently even in the case a low voltage of about 1.2V less is supplied thereto and the fabrication process of such a semiconductor integrated circuit device.

Another object of the present invention is to provide a semiconductor integrated circuit device, comprising:

a semiconductor substrate;

a first semiconductor device formed on said semiconductor substrate;

a second semiconductor device formed on said semiconductor substrate; and a boosting capacitor formed on said semiconductor substrate, said first semiconductor device comprising a first MOS transistor, said first MOS transistor comprising: a first gate insulation film having a first film thickness; a first gate electrode formed on said first gate insulation film; and a pair of diffusion regions formed in said semiconductor substrate at respective lateral sides of said first gate electrode, said second semiconductor device comprising a second MOS transistor, said second MOS transistor comprising: a second gate insulation film having a second film thickness smaller than said first film thickness; a second gate electrode formed on said second gate insulation film; a pair of diffusion regions formed in said semiconductor substrate at respective lateral sides of said second gate electrode; and a channel dope region of said first conductivity type formed in said semiconductor substrate along a surface thereof right underneath said second gate electrode, said boosting capacitor comprising: a capacitor insulation film formed on said semiconductor substrate with said first film thickness and having a composition identical to that of said first gate insulation film; a capacitor electrode formed on said capacitor insulation film; and a pair of diffusion regions of said first conductivity type formed at respective lateral sides of said capacitor electrode, said semiconductor substrate containing an impurity element of said first conductivity type in said boosting capacitor during in correspondence to a part right underneath said capacitor electrode with a concentration equal to or larger than said channel doping region.

According to the present invention, capacitance-voltage characteristic of the boosting capacitor is changed by forming the impurity injection region of the first the conductivity type in the device region in which the boosting capacitor is formed along the substrate surface between the pair of diffusion regions of the first conductivity type, and it becomes possible to obtain a large capacitance at low voltage particularly in the accumulation region. With this, it becomes possible to form necessary high voltage efficiently from low supply voltage even in the case of a semiconductor integrated circuit device including therein a high-speed logic device driven with a very low voltage of 1.2V or less. Further, the boosting capacitor of the present invention can be formed without adding extra process steps in the formation process of the first and second MOS transistors.

Other objects and further features of the present invention will become apparent from the detailed description of the present invention when read in conjunction with detailed description of the present invention with reference to the drawings.

BEST MODE FOR IMPLEMENTING THE INVENTION

Principle

Next, the principle of the present invention will be explained for the example of FIGS. 13A-13L showing a semiconductor integrated circuit device having a construction in which a memory cell, high-voltage n-channel and p-channel MOS transistors, and low-voltage n-channel and p-channel MOS transistors are integrated on a silicon substrate.

Figure 13A:
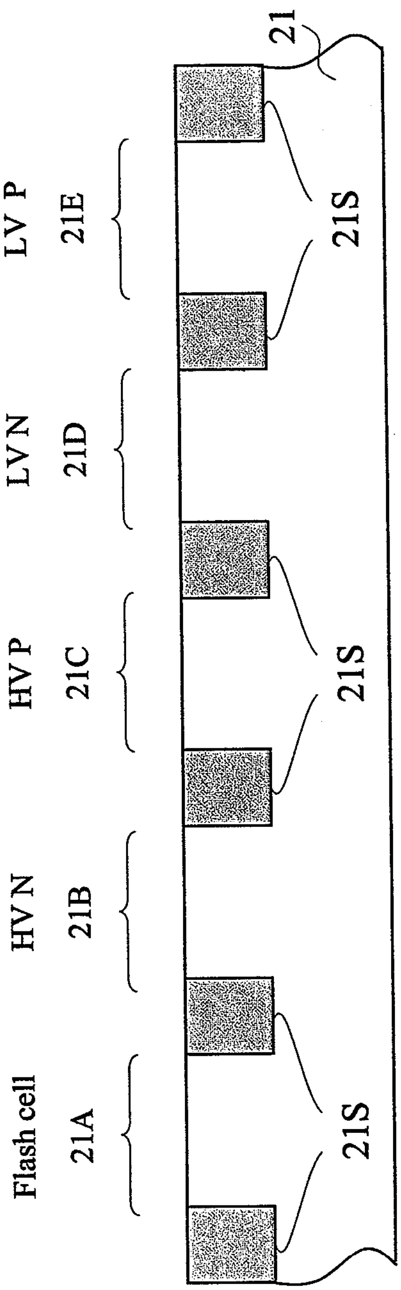
FIGS. 13A-13L are diagrams explaining the principle of the present invention.

Referring to FIG. 13A, a device isolation insulator film 21S of STI structure is formed on a silicon substrate 21 of p-type or n-type, and with this, there are defined, on the silicon substrate 21: a device region (Flash Cell) 21A for a flash memory device; a region (HVN) for a high-voltage n-channel MOS transistor; a region (HVP) 21C for a high-voltage p-channel MOS transistor; a region (LVN) for a low-voltage n-channel MOS transistor; and a device region (LVP) for a low-voltage p-channel MOS transistor.

Figure 13B:
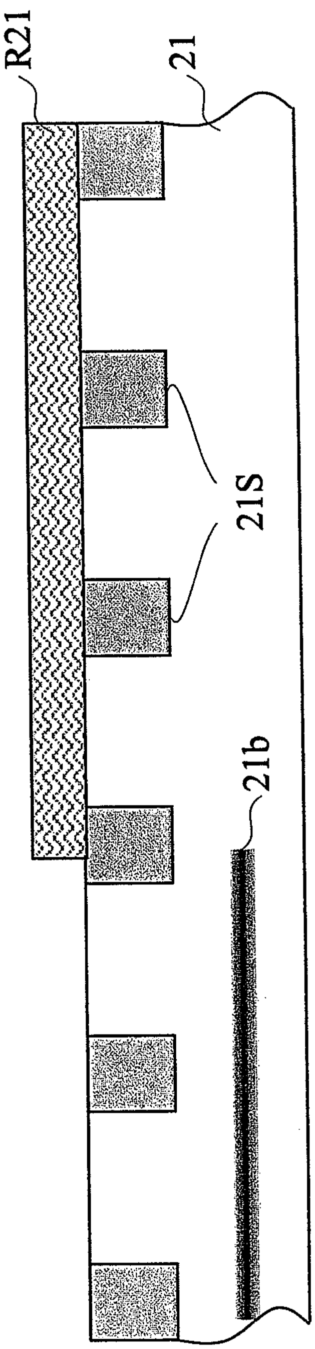

Next, in the step of FIG. 13B, a resist pattern R21 is formed on the silicon substrate 21 via a silicon oxide film not illustrated so as to expose the device regions 21A and 21B, and an n-type impurity element is introduced into the silicon substrate 21 to an injection depth 21*b* of an n-type buried well set at a deep level of the silicon substrate 21 by an ion implantation process while using the resist pattern R21 as a mask.

Figure 13C:
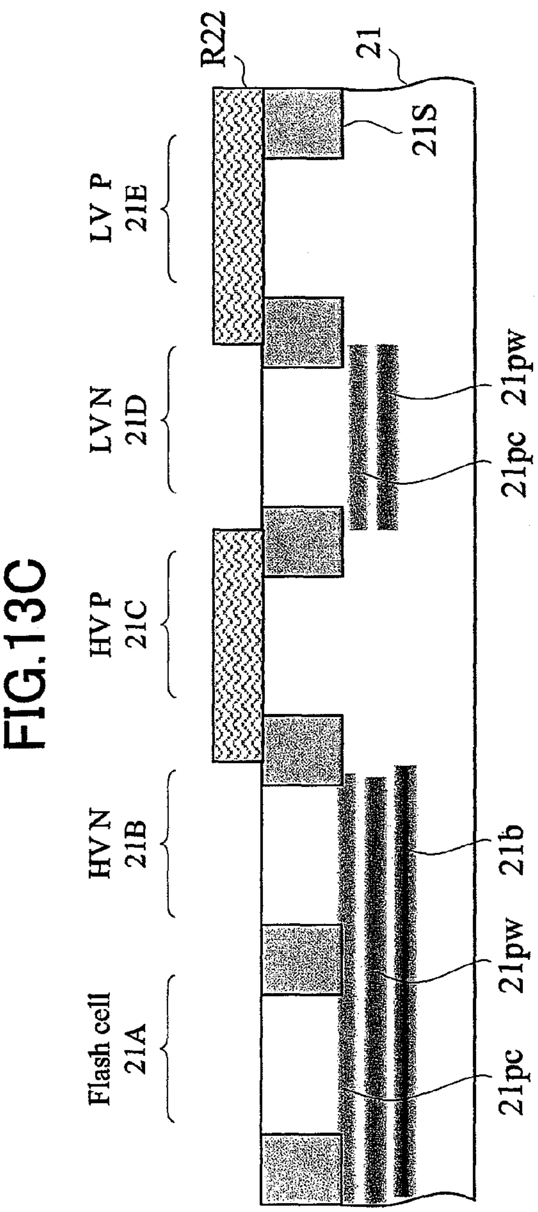

Next, in the step of FIG. 13C, a new resist pattern R22 is formed on the silicon substrate 21 so as to expose the device regions 21A and 21B and further the device region 21D of the low-voltage re-channel MOS transistor, and while using the resist pattern R22 as a mask, a p-type impurity element is introduced into the regions 21A, 21B and 21D consecutively at a depth 21*pw* and a depth 21*pc* while changing the acceleration voltage and dose of the ion implantation process. With this, a p-type well and a p-type channel stopper region are formed.

Figure 13D:
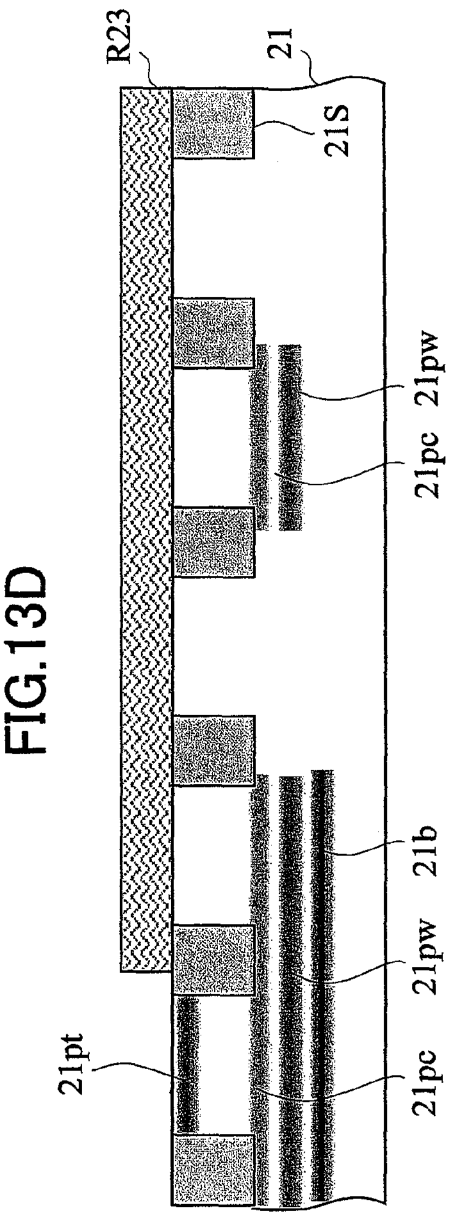

Next, in the step of FIG. 13D, a new resist pattern R23 is formed on the silicon substrate 21 so as to expose the flash memory device region 21A, and while using the resist pattern R23 as a mask, a p-type impurity element is introduced into the device region 21A at a depth 21*pt* by an ion implantation process for control of p-type threshold control. With this, threshold control of the memory cell transistor formed in the memory cell region 11A is achieved.

Figure 13E:
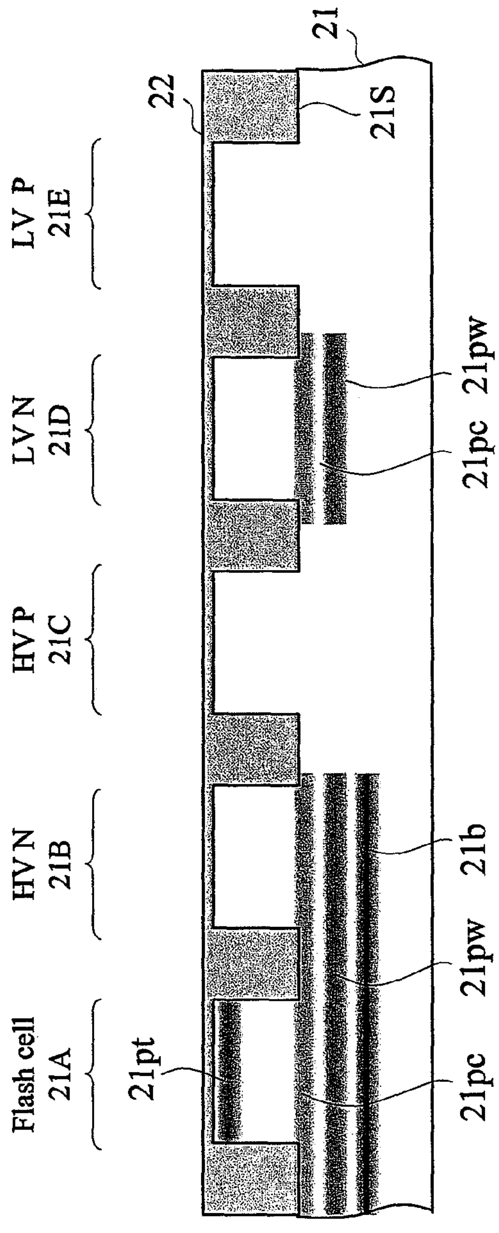

Next, in the step of FIG. 13E, the resist pattern R23 and also the silicon oxide film not illustrated are removed, and a silicon oxide film 22 is formed on the surface of the silicon substrate 21 as the tunneling insulation film of the flash memory device with a thickness of 10 nm.

Figure 13F:
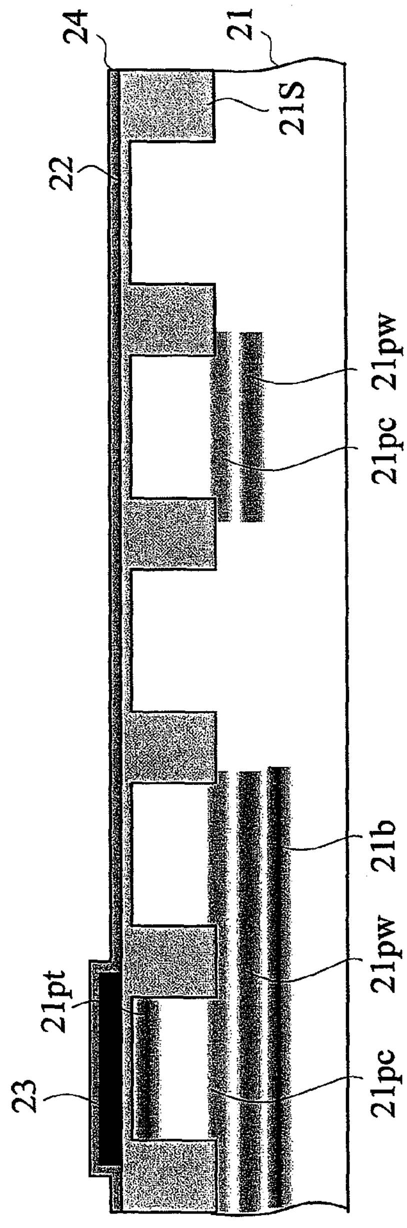

Next, in the step of FIG. 13F, a polysilicon film is deposited on the silicon oxide film 22 uniformly, and a floating gate electrode 23 of polysilicon is formed on the silicon oxide film 22 in the device region 21A is formed by patterning by the polysilicon film by a mask process not illustrated. Further, an inter-electrode insulation film 24 of ONO structure is formed on the silicon oxide film 22 in the step of FIG. 13F so as to cover the floating gate electrode 23.

Figure 13G:
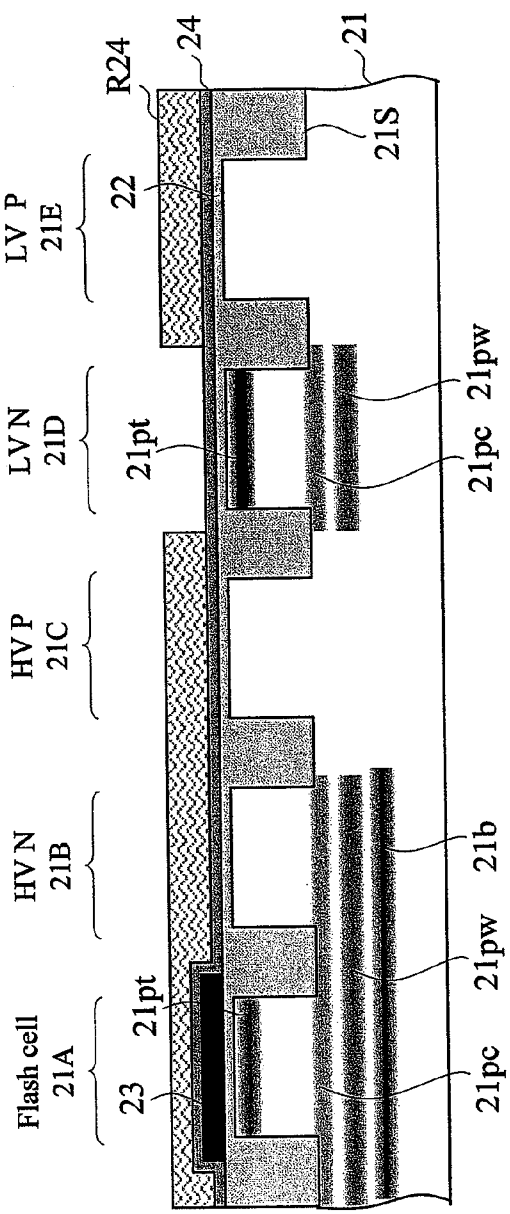

Next, in the process of FIG. 13G, a new resist pattern R24 is formed on the inter-electrode insulation film 24 so as to expose the device region 21D of the low-voltage n-channel MOS transistor, and a p-type impurity element is introduced into the device region 21D at a p-type threshold control depth 21*pt* by an ion implantation process while using the resist pattern R24 as a mask. With this, threshold control is achieved for the n-channel MOS transistor formed in the device region 21D.

Figure 13H:
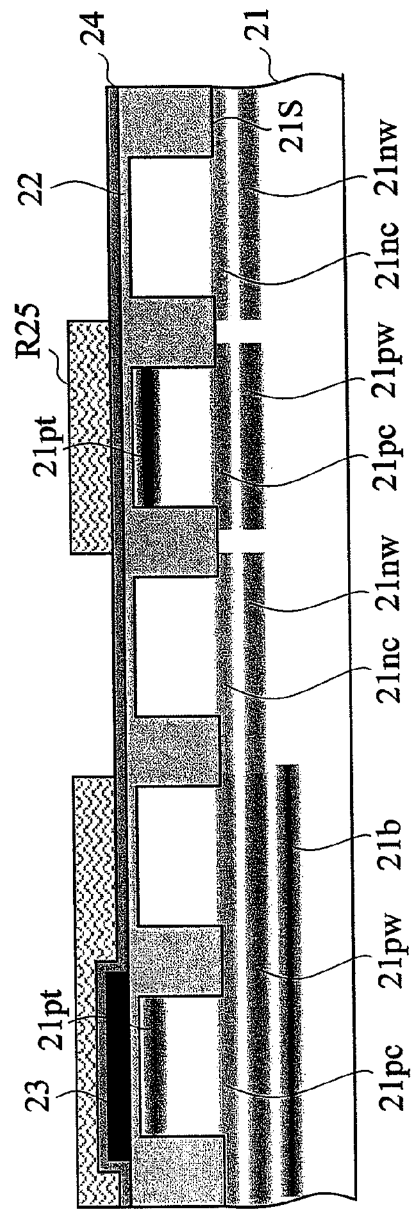

Next, in the step of FIG. 13H, a new resist pattern R25 is formed on the ONO film 24 so as to expose the device region 21C of the high-voltage p-channel MOS transistor and the device region 21E of the low-voltage channel MOS transistor, and an n-type impurity element is introduced into the device region 21C and the device region 21E at depths 21*nw* and 21*nc* of the silicon substrate by an ion implantation process while using the resist pattern R25 as a mask. Thereby, an n-type well and an n-type channel stopper region are formed.

Figure 13I:
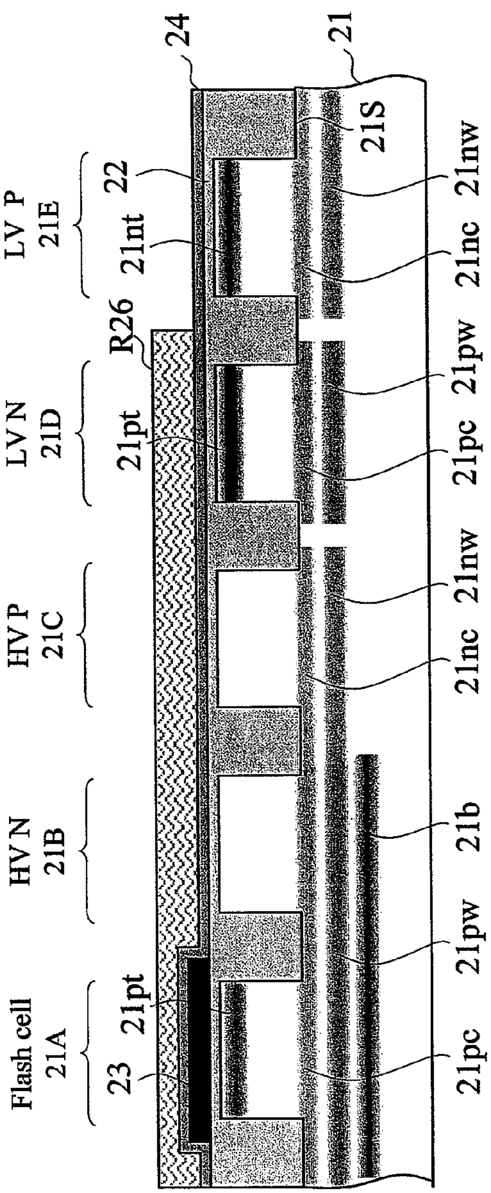

Further, in the step of FIG. 13I, a new resist pattern R26 is formed on the ONO film 24 so as to expose the device region 21E of the low-voltage p-channel MOS transistor, and threshold control is achieved for the low-voltage p-channel MOS transistor formed in the device region 21E by introducing an n-type impurity element into the device region 21E by an ion implantation process to a threshold control depth 21*nt* while using the resist pattern R26 as a mask. With this, threshold control is achieved for the low-voltage p-channel MOS transistor formed in the device region 21E.

Figure 13J:
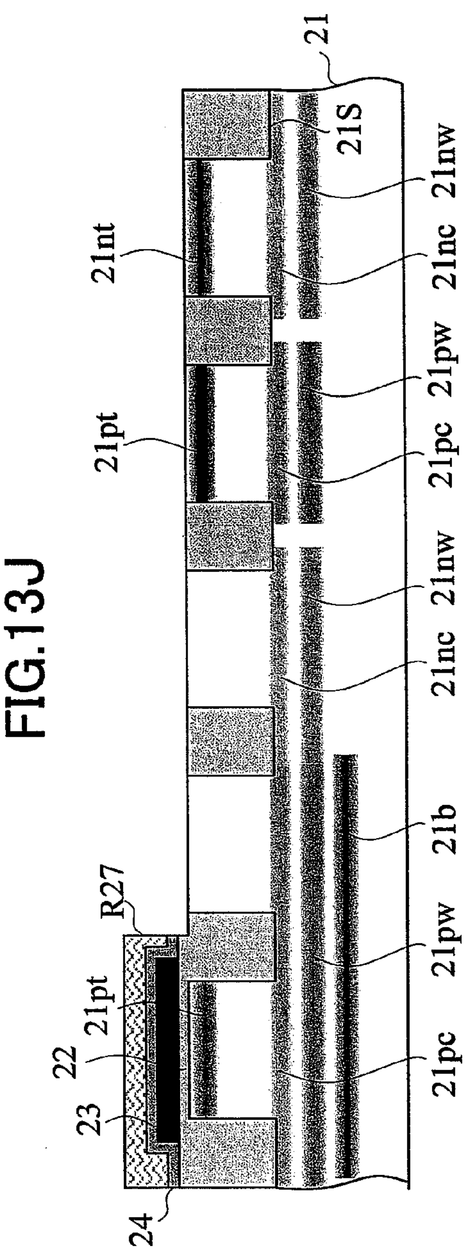

Further, the ONO film 24 and the silicon oxide film 22 underneath are removed from the device regions 21B-21E in the step of FIG. 13J by a patterning process that uses a resist pattern R27, and the silicon oxide film 22 is left only on the device region 21A as a tunneling insulation film.

Figure 13K:
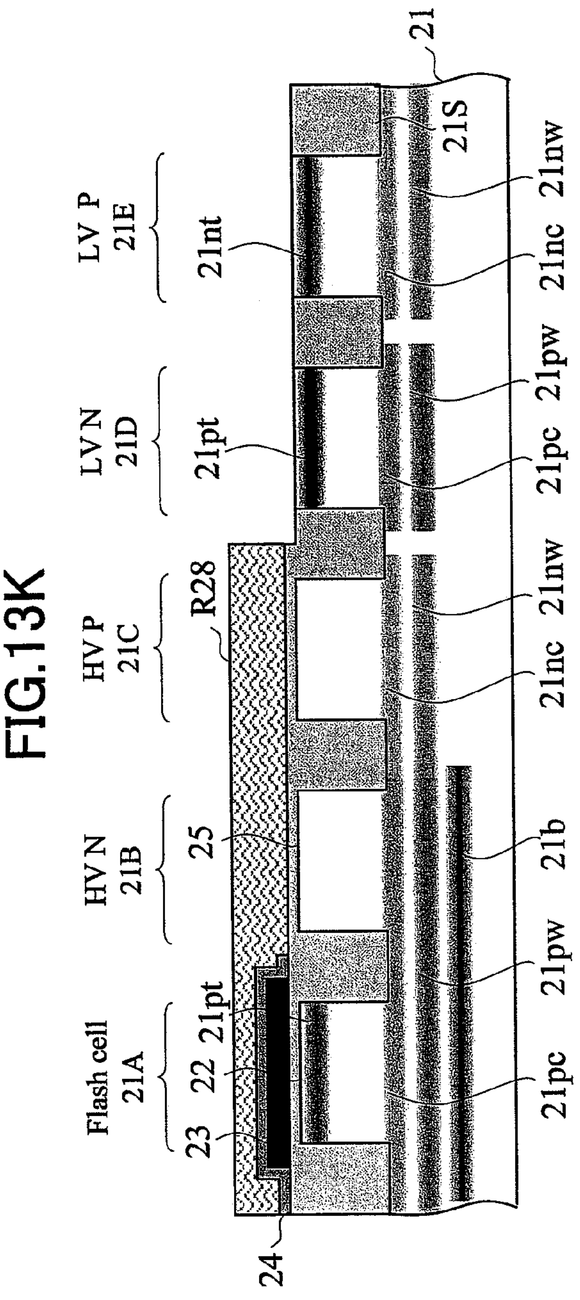

Further, the resist film R27 is removed in the step of FIG. 13K, and a silicon oxide film 25, which is used as the gate insulation film of the high-voltage MOS transistors in the device regions 21B and 21C, is formed on the exposed silicon substrate 21 with the thickness of 13 nm. Further, in the step of FIG. 13K, the resist pattern R28 is formed so as to expose the device regions 21D and 21E, and the silicon oxide film 25 is removed from the device regions 21D and 21E while using the resist pattern R28 as a mask.

Figure 13L:
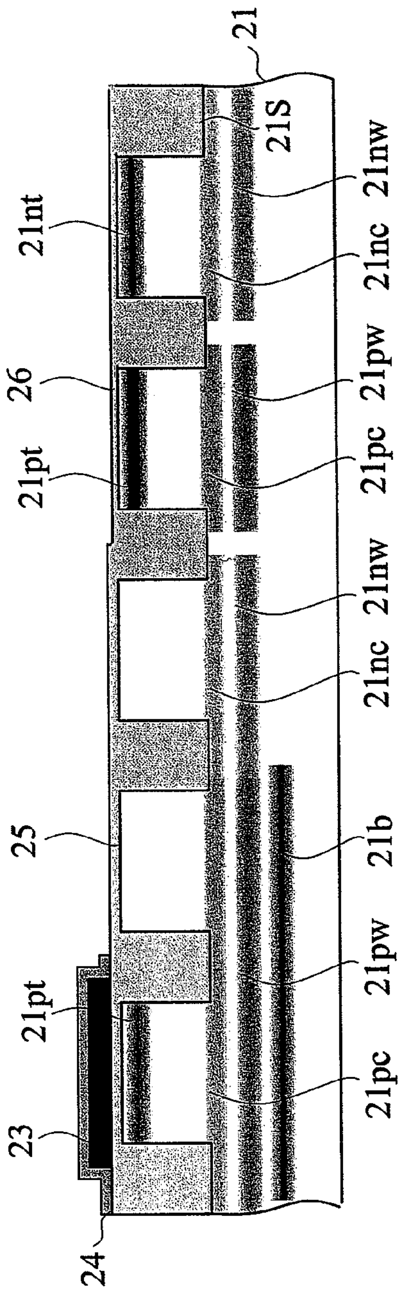

Further, the resist pattern R28 is removed in the step of FIG. 13L, and a silicon oxide film 26 is formed on the device regions 21D and 21E as the gate insulation film of the low-voltage MOS transistor with a smaller thickness than the silicon oxide film 25.

In the process of FIGS. 13A-13L, there are needed nine mask steps in all, once in each of the steps of FIG. 13B, FIG. 13C, FIG. 13D, FIG. 13F, FIG. 13G, FIG. 13H, FIG. 13I, FIG. 13J and FIG. 13K, while there are needed eight ion implantation steps in all, once with the step of FIG. 13B, twice with the step of FIG. 13C, once with the step of FIG. 13D, once with the step of FIG. 13G, twice with the step of FIG. 13H, and once with the step of FIG. 13I. Comparing this with the case of forming the structure by the method of the Japanese Laid-Open Patent Application 2001-196470 official gazette, it will be noted that while the number of the mask steps is increased, the number of the ion implantation steps is decreased substantially. Further, in the case the ion implantation process to the depth 21*nc* in the step of FIG. 13H is omitted, the total number of the ion implantation process steps becomes seven.

Figure 1A:
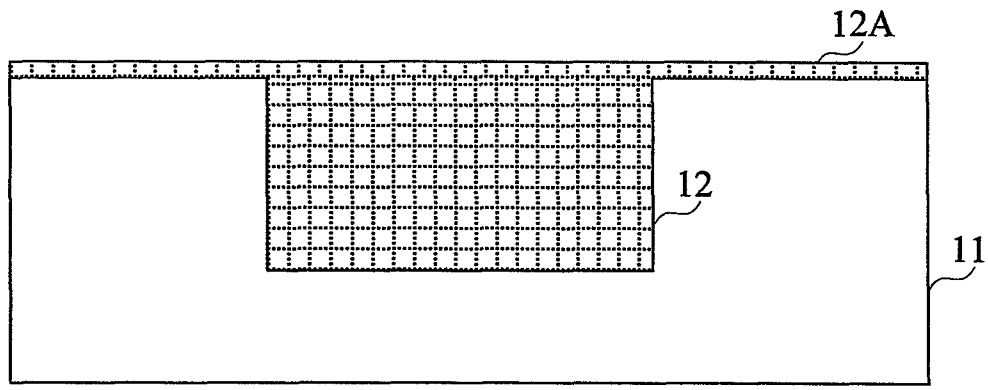
FIGS. 1A-1E are diagrams showing a part of the fabrication process of a conventional semiconductor integrated circuit device.
Figure 1B:
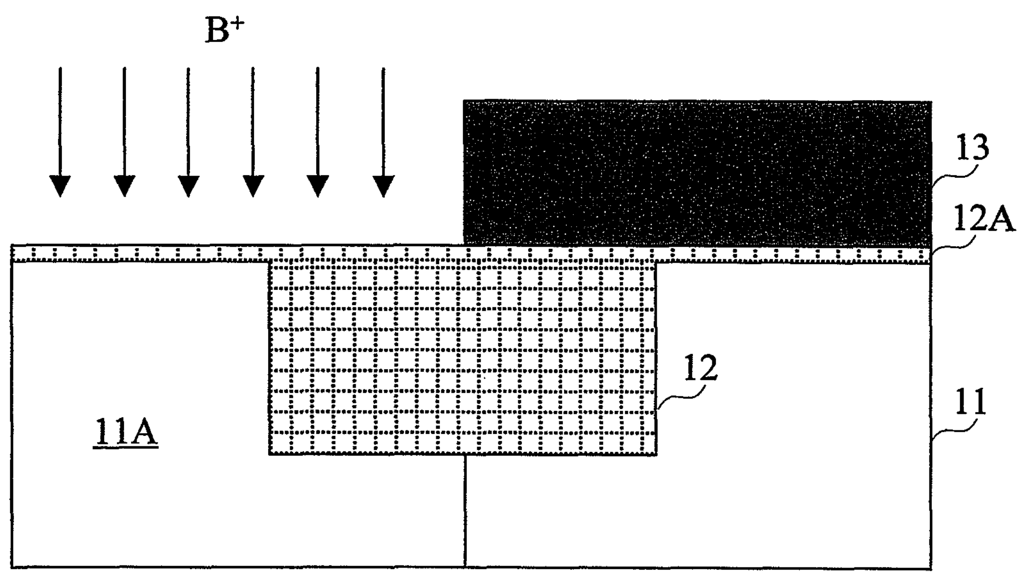
Figure 1C:
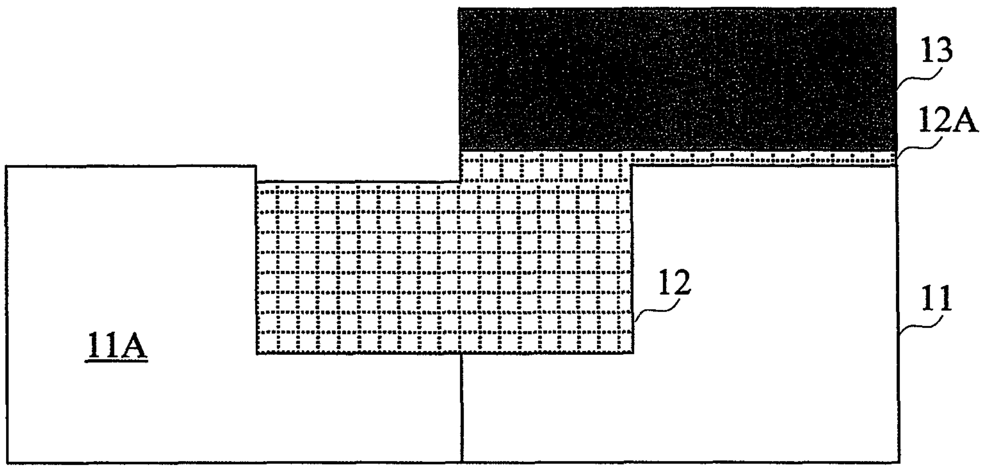
Figure 1D:
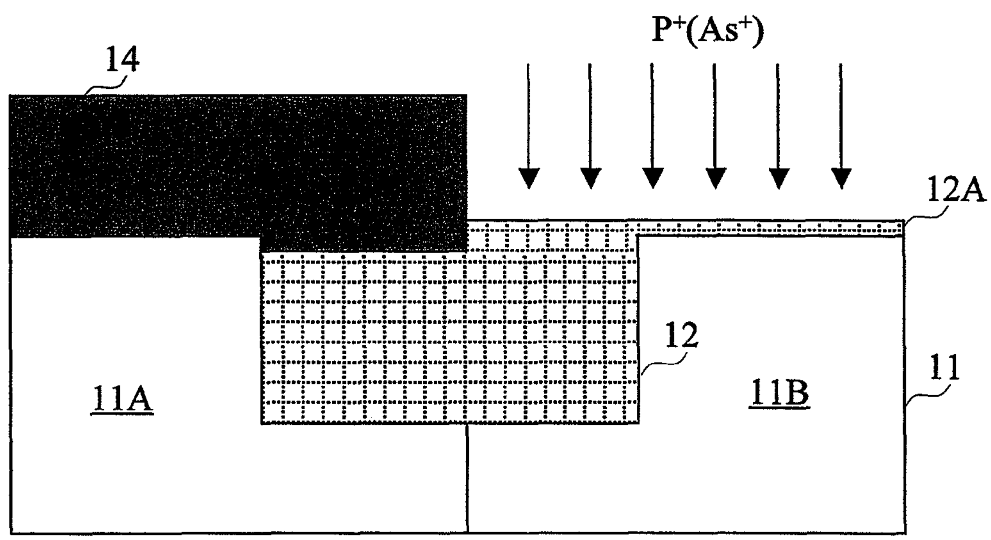
Figure 1E:
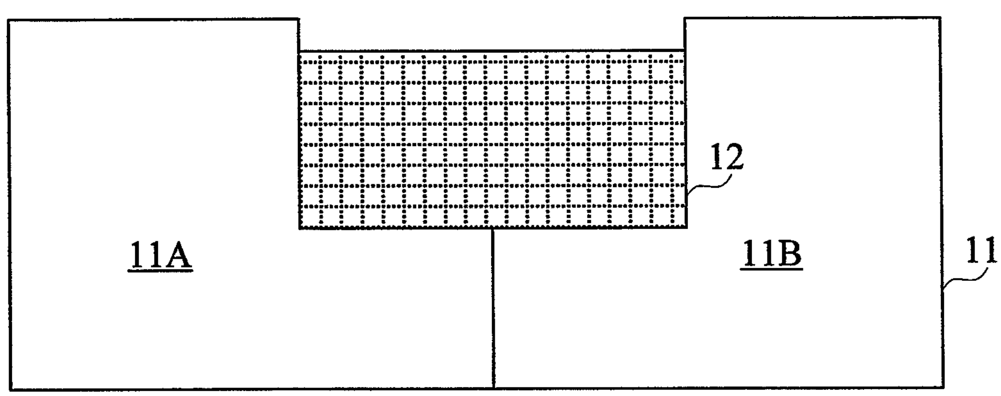
Figure 2A:
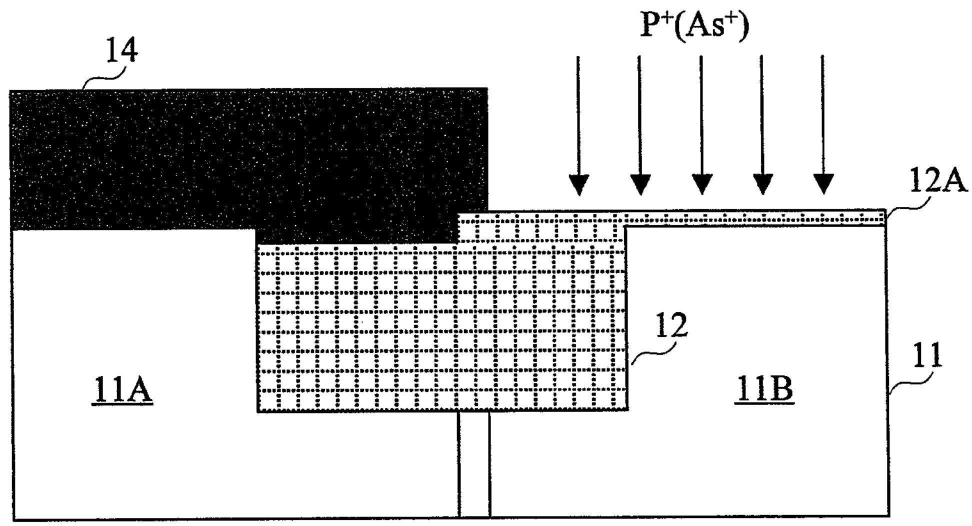
FIGS. 2A-2B are diagrams explaining the problems in the fabrication process of the semiconductor integrated circuit device of FIGS. 1A-1E.
Figure 2B:
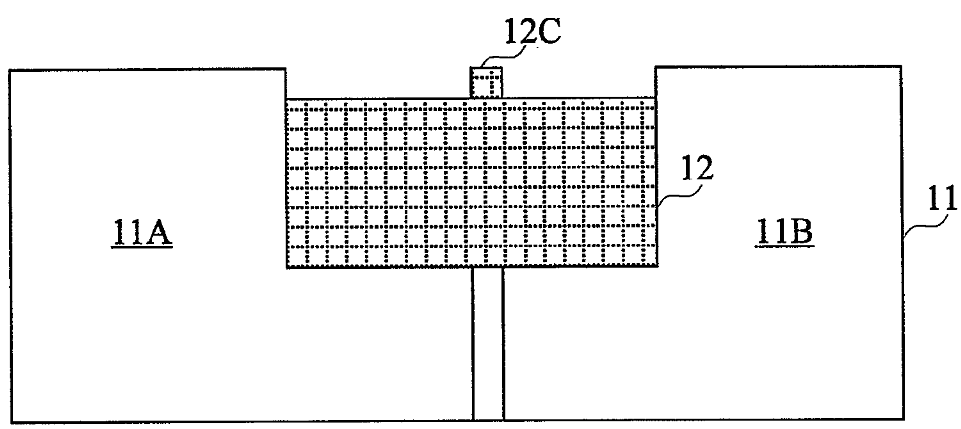
Figure 3A:
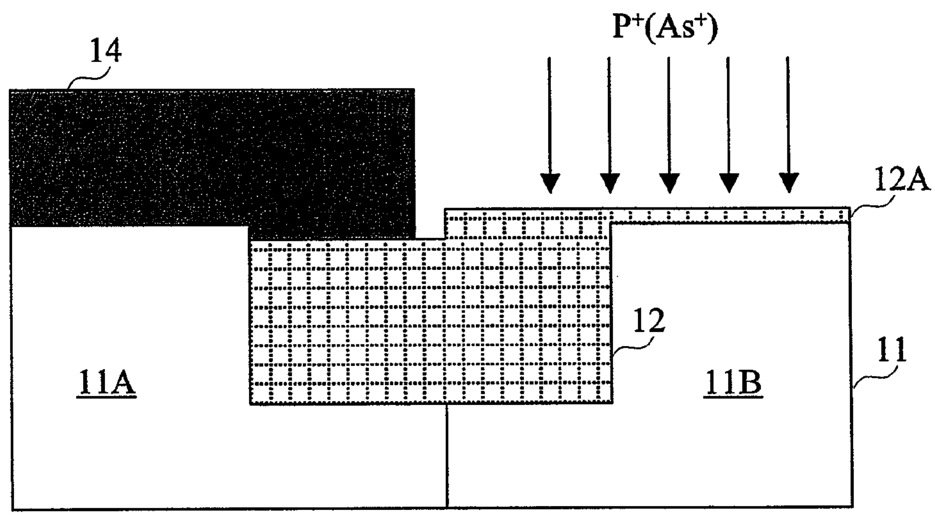
FIGS. 3A-3B are different diagrams explaining the problems of the fabrication process of the semiconductor integrated circuit device of FIGS. 1A-1E.
Figure 3B:
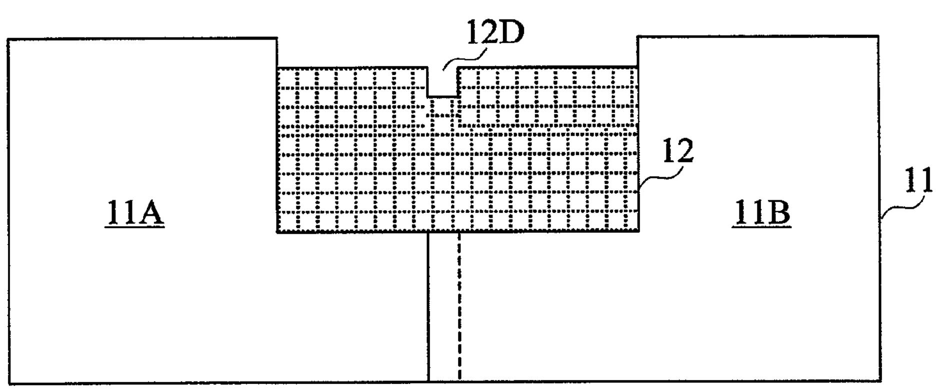

Further, in the process of FIGS. 13A-13L, it should be noted that the resist pattern does not make contact with the silicon surface, and thus, the problem of degradation of electrical properties of the gate insulation film, caused by contamination of the silicon surface by resist, is successfully eliminated. Further, with the process of the present invention, there arises no problem of formation of protrusion or groove on the device isolation insulation film explained with reference to FIG. 2B or 3B in the region of the low-voltage transistor, in which formation of minute pattern is necessary.

Meanwhile, with the fabrication process of the semiconductor integrated circuit device of the present invention explained with reference to FIGS. 13A-13L, it should be noted that increase of the number of mask steps is avoided by conducting the ion implantation process to the device region 21B of the high voltage n-channel MOS transistor and to the device region 21D of the low voltage n-channel MOS transistor at the same time in the step of FIG. 13C and by conducting the ion implantation process into the device region 21C of the high-voltage p-channel MOS transistor and to the device region 21E of the low voltage p-channel MOS transistor at the same time in the step of FIG. 13H.

Here, the ion implantation process of FIG. 13C is conducted before formation of the ONO inter-electrode insulation film 24, and thus, the distribution of the impurity element introduced into the device region 21D of the low-voltage re-channel MOS transistor becomes inevitably broad as a result of diffusion caused with the heat treatment process associated with the formation of the ONO inter-electrode insulation film 24.

Figure 6:
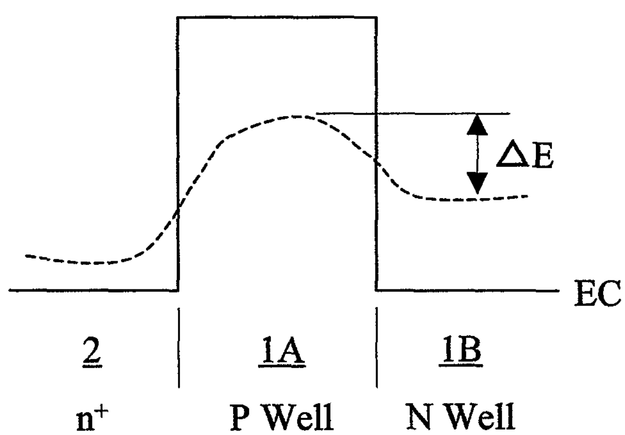
FIG. 6 is a diagram showing the band structure of a model structure of FIG. 5B.

While it may seem that, in view of mechanism of punch-through explained with reference to FIGS. 6 and 7, such broad distribution profile of the impurity element would cause decrease of punch-through resistance in the miniaturized high-voltage MOS transistors and low-voltage MOS transistors and should invite unfavorable results, it should be noted that a sharp distribution profile is maintained for the impurity element in the device regions 21C and 21E for other high-voltage and low-voltage MOS transistors, as the ion implantation to the device regions 21C and 21E is carried out in the step of FIG. 13H after formation of the ONO inter-electrode insulation film 24.

Figure 7:
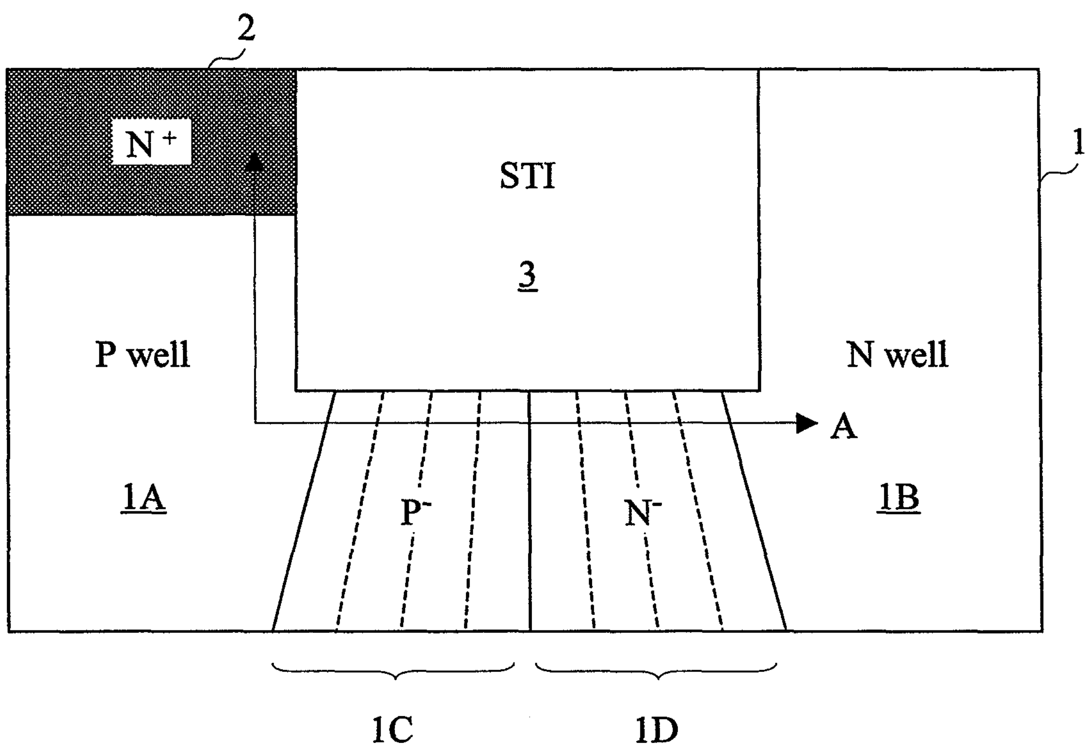
FIG. 7 is a diagram showing the mutual diffusion of impurity elements caused in the model structure when the process of FIGS. 4A-4Q is applied.
Figure 8:
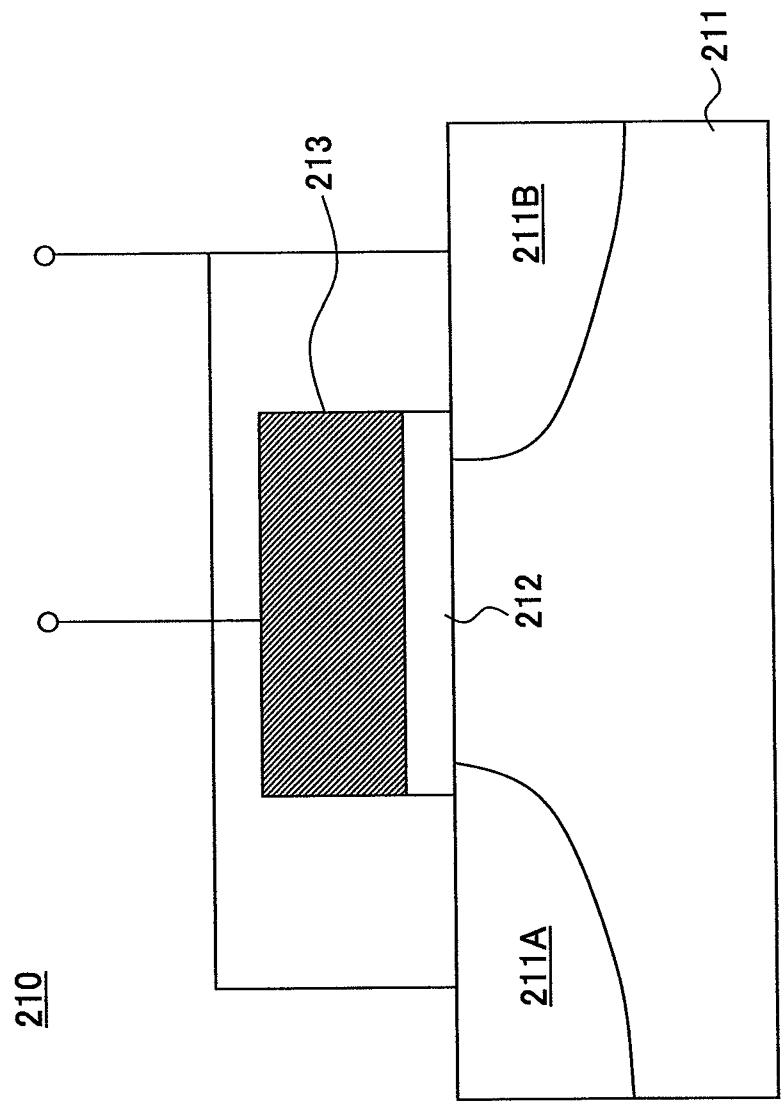
FIG. 8 is a diagram showing the construction of a conventional boosting capacitor.
Figure 14:
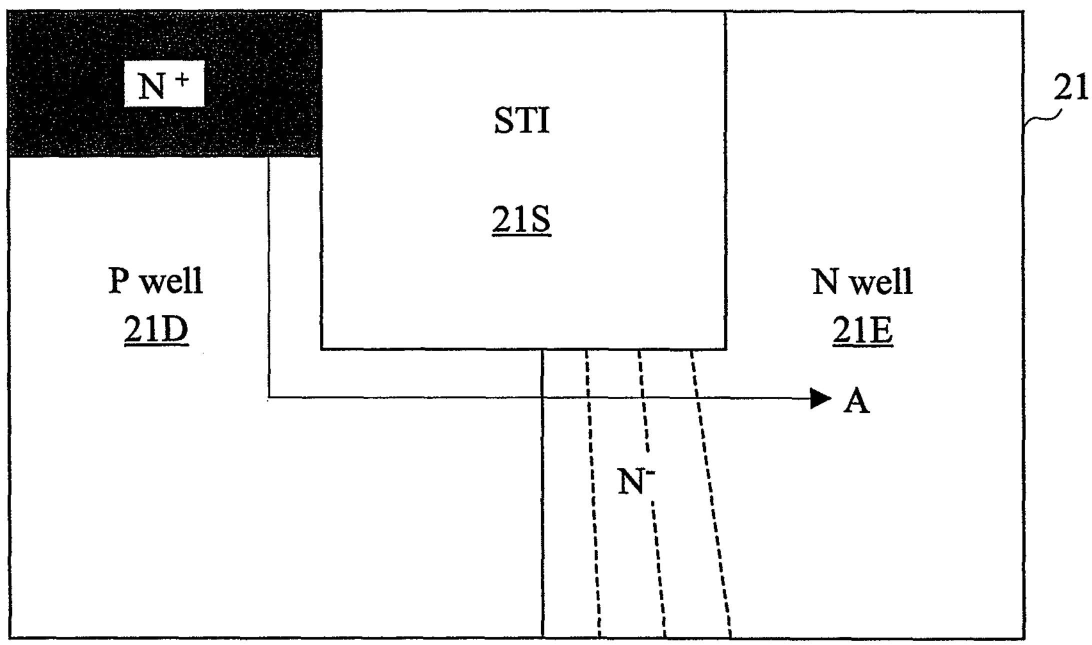
FIG. 14 is a diagram showing the mechanism of suppressing punch-through achieved in the process of FIGS. 13A-13L.

FIG. 14 is a diagram schematically showing the well formation in the region including the device region 21D and device region 21E of the semiconductor integrated circuit device fabricated according to the process of FIGS. 13A-13L, wherein the broken lines in FIG. 14 represent the contour lines of the p-type or n-type impurity element in the silicon substrate 21, similarly to the case of FIG. 7.

Referring to FIG. 14, there is formed a p-type well in the device region 21D as a result of ion implantation of FIG. 13C and a diffusion region of $n^+$-type constituting a part of the n-channel MOS transistor is formed in the p-type well.

As can be seen in FIG. 14, there occurs diffusion of the p-type impurity element in the step of FIG. 13F in the device region 21E from the device region 21D with formation of the ONO inter-electrode insulation film 24.

On the other hand, the ion implantation process is conducted after the process of FIG. 13F in the device region 21E, and thus there occurs no diffusion of the n-type impurity element from the device region 21E to the device region 21D. Thus, the concentration level of the n-type impurity element decreases sharply in the substrate 21 at the boundary of the device region 21E and the device region 21D right underneath the device isolation insulation film 21S. On the other hand, in the device region 21E, there is a possibility that generation of carrier electrons by activation of the n-type impurity element, is canceled out by the activation of the p-type impurity element diffused from the device region 21D to the device region 21E, and there is formed a region in which the electron concentration level is reduced.

In the present invention, the dose of the n-type impurity element in the device region 21E is increased as compared with conventional case and compensate for the decrease of the electron concentration level. With this, occurrence of punch-through along the path A is suppressed.

Further, in the present invention, in which ion implantation process of device region 21B for high voltage n-channel MOS transistor is formed carried out at the same time to the ion implantation process of the memory cell region 21A, and thus, the number of process steps is reduced.

Figure 9A:
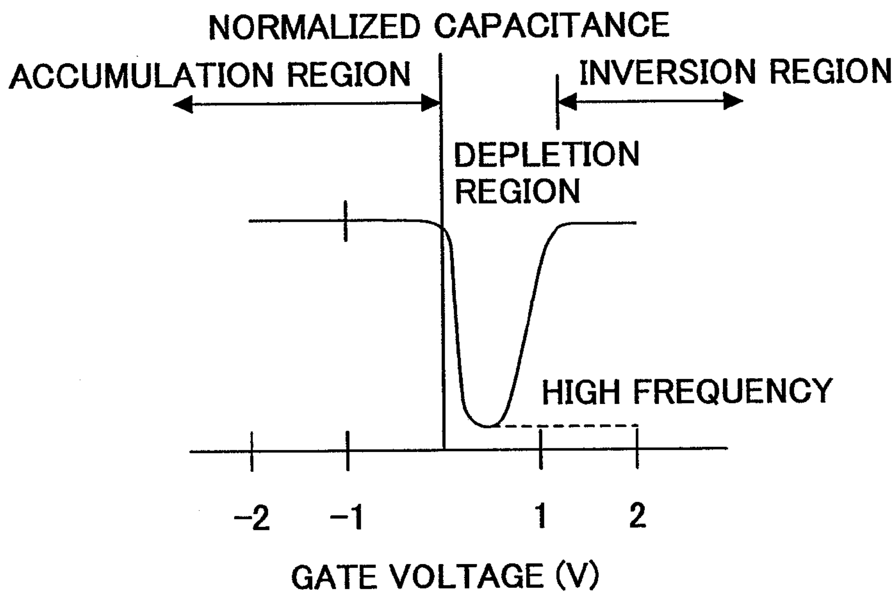
FIGS. 9A and 9B are diagrams showing the capacitance-voltage characteristic of the boosting capacitor of FIG. 1.
Figure 9B:
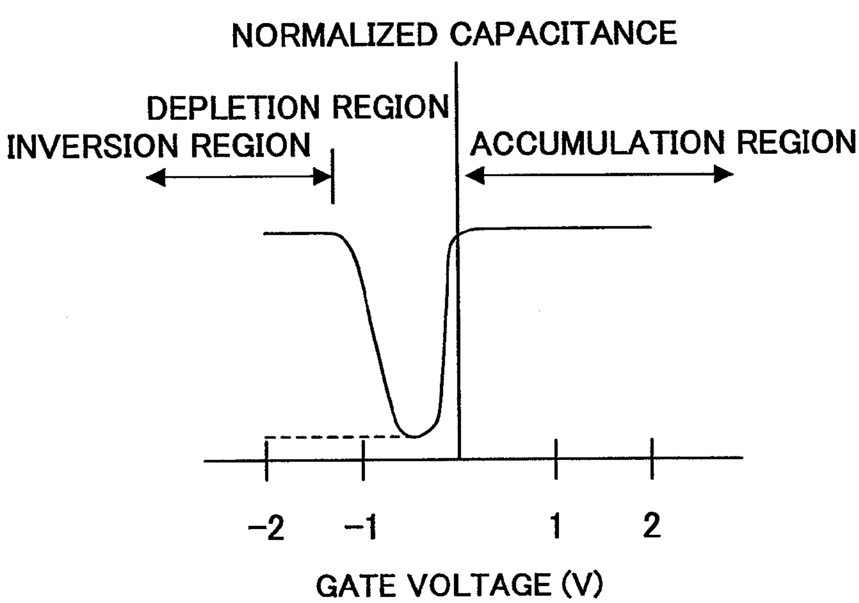
Figure 10A:
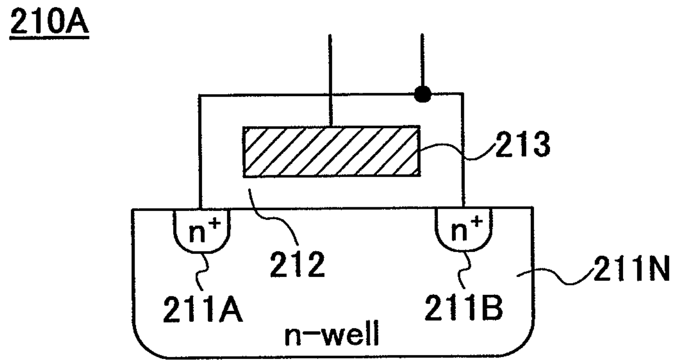
FIGS. 10A and 10B are diagrams showing the construction of a boosting capacitor of conventional art.
Figure 10B:
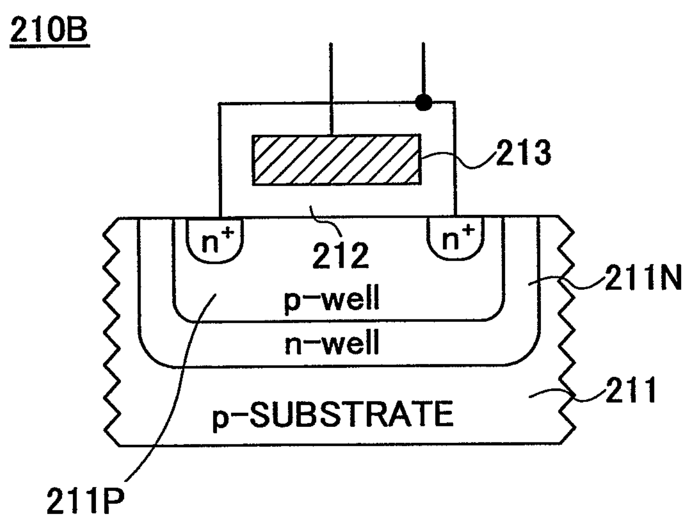

Thereby, the ion implantation process to the device region 21B is carried out also before the formation of the ONO inter-electrode insulation film 24 of FIG. 13F, and thus, the distribution profile of the p-type impurity element in the device region 21B becomes a broad, while because the ion implantation to the device region 21C for the high voltage MOS transistor of opposite conductivity type is conducted after formation process of the ONO film 24 of FIG. 13F, and thus, sharp distribution profile is attained for the n-type impurity element in the device region 21C. Thereby, occurrence of leakage current by punch-through is suppressed effectively similarly to FIG. 9.

Thus, according to the present invention, it becomes possible to achieve miniaturization of the semiconductor integrated circuit device in which a non-volatile memory element such as a flash memory device is integrated, with various n-type and p-type MOS transistors of various operational voltages, while securing sufficient punch-through resisting voltage, and it becomes possible to reduce the number of process steps at the time of fabricating such a semiconductor integrated circuit device. Also, it becomes possible to positively avoid contamination of the gate oxide film by impurities at the time of fabrication process of such a semiconductor integrated circuit device.

First Embodiment

Figure 15:
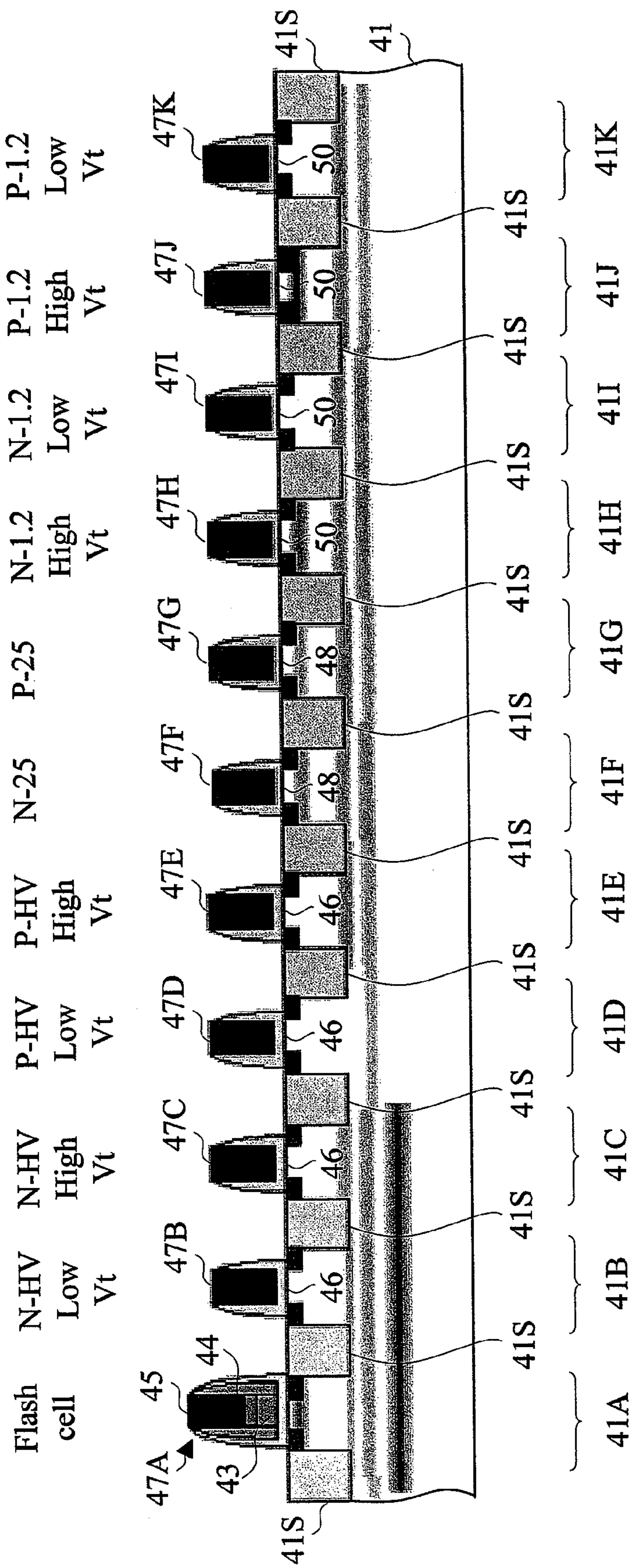
FIG. 15 is a diagram showing the construction of a semiconductor integrated circuit device according to a first embodiment of the present invention.

FIG. 15 shows the construction of a semiconductor integrated circuit device 40 according to a first embodiment of the present invention.

Referring to FIG. 15, the Semiconductor integrated circuit device 40 is a logic integrated circuit apparatus of 0.13 μm rule and including therein a flash memory device and includes device regions 41A-41K defined on a silicon substrate 41 of p-type or n-type by a device isolation insulation film 41S of STI structure, wherein a flash memory device is formed in the device region 41A, a high-voltage low-threshold n-channel MOS transistor is formed in the device region 41B, a high-voltage high-threshold n-channel MOS transistor is formed in the device region 41C, a high-voltage low-threshold p-channel MOS transistor is formed in the device region 41D, and a high-voltage high-threshold p-channel MOS transistor is formed in the device region 41E. These high voltage p-channel or n-channel MOS transistors constitute a control circuit controlling the flash memory device.

Further, a mid-voltage n-channel MOS transistor operating with the power supply voltage of 2.5V is formed in the device region 41F, while a mid-voltage p-channel MOS transistor operating with the power supply voltage of same 2.5V is formed in the device region 41G. Further, a low-voltage high-threshold n-channel MOS transistor operating with the power supply voltage of 1.2V is formed in the device region 41H, while a low-voltage low-threshold n-channel MOS transistor operating with the power supply voltage of 1.2V is formed in the device region 41I, and a low-voltage high-threshold p-channel MOS transistor operating with the power supply voltage of 1.2V is formed in the device region 41J. Furthermore, a low-voltage low-threshold p-channel MOS transistor operating with the power supply voltage of 1.2V is formed in the device region 41E. These low-voltage p-channel and n-channel MOS transistors constitute, together with an input-output circuit formed of the middle-voltage p-channel and n-channel MOS transistors, a high-speed logic circuit.

In the device regions 41A-41C, there are formed p-type wells, while n-type wells are formed in the device regions 41D and 41E. Further, a p-type well is formed in the device region 41F, while an n-type well is formed in the device region 41G. Further, p-type wells are formed in the device regions 41H and 41I, and n-type wells are formed in the device regions 41J and 41K.

A tunneling insulation film 42 is formed on the surface of the device region 41A, while on the tunneling insulation film 42, a floating gate electrode 43 of polysilicon and an inter-electrode insulation film 44 having an ONO structure are formed consecutively. Further, a control gate electrode 45 of the polysilicon is formed on the inter-electrode insulation film 44.

On the other hand, gate insulation films 46 to are formed on the respective surfaces of the device regions 41B-41E for the high-voltage transistor, and on the gate insulation films 46, there are formed a polysilicon gate electrode 47B in the device region 41B, a polysilicon gate electrode 47C in the device region 41C, a polysilicon gate electrode 47D in the device region 41D, and a polysilicon electrode 47F in the device region 41E.

Further, on the surfaces of the device regions 41F and 41G, there are formed gate insulation films 48 for the mid-voltage transistor with reduced thickness as compared with the gate insulation films 46, and there are formed, on the gate insulation film 48, a polysilicon gate electrode 47F in the device region 41F and a polysilicon gate electrode 47G in the device region 41G.

Further, a gate insulation film 50 for the low-voltage transistor is formed on the surface of the device regions 41H-41K, and on the gate insulation film 50, there are formed a polysilicon gate electrode 47H in the device region 41H, a polysilicon gate electrode 47I in the device region 41I, a polysilicon gate electrode 47J in the device region 41J, and a polysilicon electrode 47K in the device region 41K.

Also, in the device region 41A, there are formed a pair of diffusion regions forming the source region and the drain region at respective lateral sides of the gate electrode structure 47A formed of stacking of the floating gate electrode 43, the inter-electrode insulation film 44 and the control gate electrode 45. Similarly, there are formed a pair of diffusion regions forming the source region and the drain region in each of the device regions 41B-41H at both sides of the gate electrode.

In the diffusion regions 41A-41K, various impurity elements are introduced to various depths with various concentrations for well formation or threshold control. With regard to the ion implantation process conducted in the diffusion regions 41A-41K will be explained below with reference to FIGS. 16A-16Z and also FIGS. 16AA-16AB.

Figure 16A:
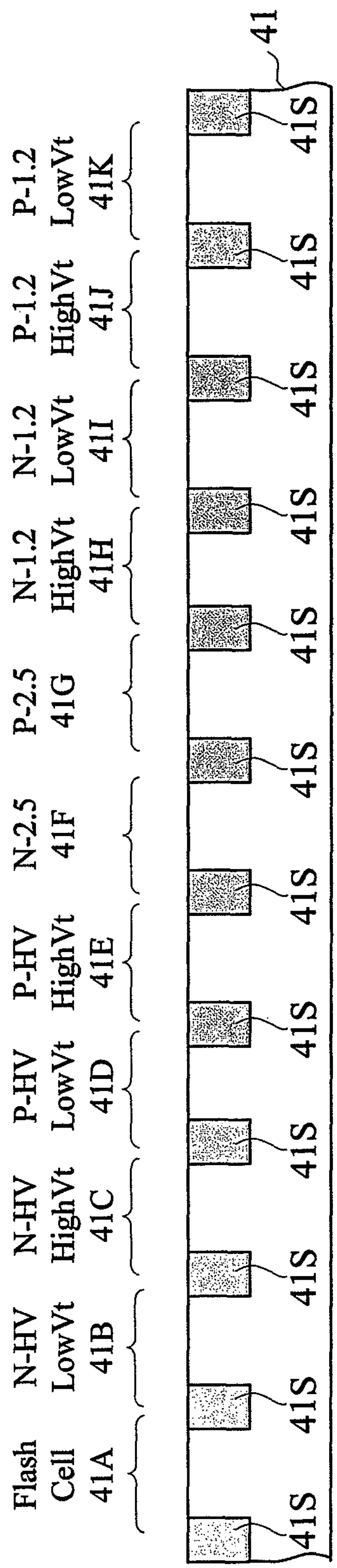
FIGS. 16A-16Z and FIGS. 16AA-16AB are diagrams showing the fabrication process of the semiconductor integrated circuit device of FIG. 15.

Referring to FIG. 16A, the device isolation film 41S of STI type is formed on the silicon substrate 41 as explained before, and the device regions 41A-41K are defined with this.

Further, while not illustrated, the surface of the silicon substrate 41 is oxidized in the step of FIG. 16A and there is formed a silicon oxide film with the film thickness of about 10 nm.

Figure 16B:
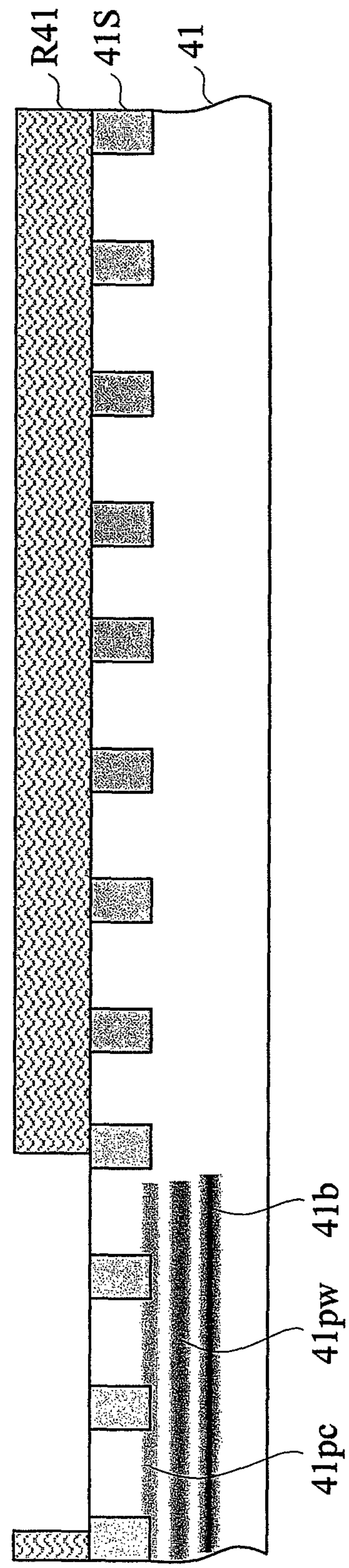

Next in the step of FIG. 16B, a resist pattern R41 exposing the device regions 41A-41C is formed on the structure of FIG. 16A, and, while using the resist pattern R41 as a mask, $P^+$ is introduced by an ion implantation process under the acceleration voltage of 2 MeV with a dose of $2\times10^{13}$ $cm^{-2}$ to a depth 41*b* deeper than the lower edge of the device isolation insulation film 41S to form a buried n-type impurity region.

Further, in the step of FIG. 16B, while using the resist pattern R41 as a mask, $B^+$ is introduced by an ion implantation process to a depth 41*pw* under the acceleration voltage of 400 keV with the dose of $1.5\times10^{13}$ $cm^{-2}$, and with this, a p-type well is formed. Further, in the step of FIG. 16B, while using the resist pattern R61 as a mask, $B^+$ is introduced to a depth 41*pc* under the acceleration voltage of 100 keV with the dose of $2\times10^{12}$ $cm^{-2}$. With this, a channel stopper region of p-type is formed at the depth 41*pc*. Here, it should be noted that the depths 41*b*, 41*pw* and 41*pc* represent relative ion implantation depths, and thus, the depth 41*pw* is deeper than the device isolation film 41S and shallower than the depth 41*b*. Further, the depth 41*pc* is shallower than the depth position 41*pw* and generally corresponds to the lower edge of the device isolation film 41S. By introducing the p-type impurity element to the depth 41*pc*, resistance against punch-through is improved and it becomes possible to control the threshold characteristic of the transistor.

Figure 16C:
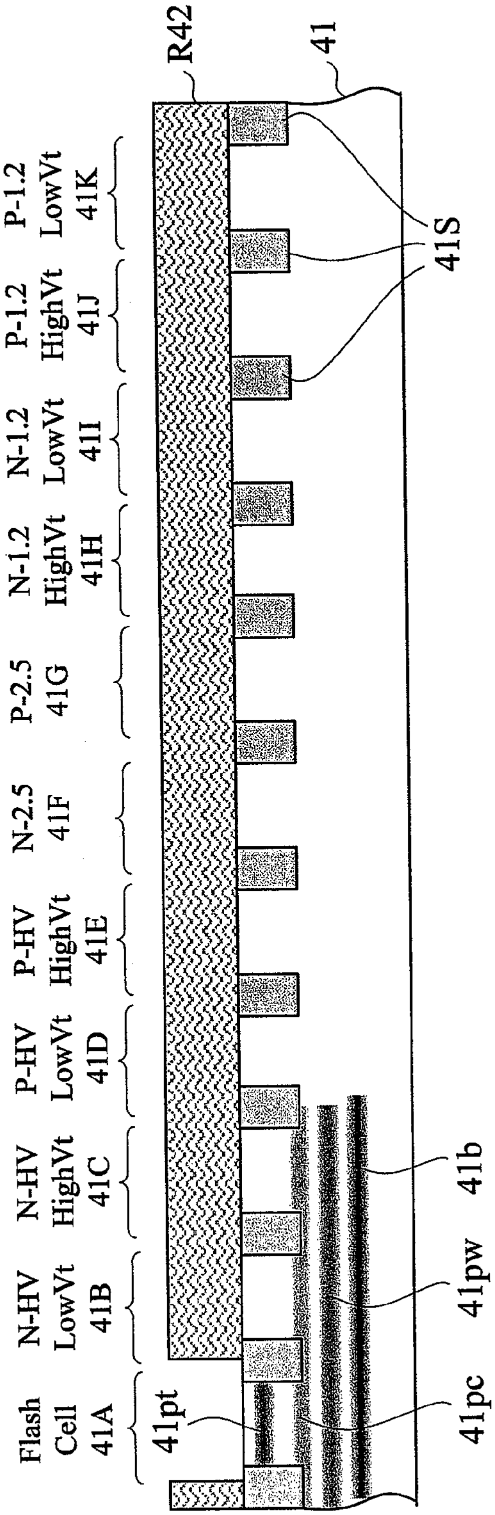

Next, in the step of FIG. 16C, a resist pattern R42 is formed so as to expose the memory cell region 41A, and threshold control is conducted for the memory cell transistor formed in the device region 41A by introducing $B^+$ by ion implantation process under the acceleration voltage of 40 keV with the dose of $6\times10^{13}$ $cm^{-2}$ to a shallow depth 41*pt* near the substrate surface.

Figure 16D:
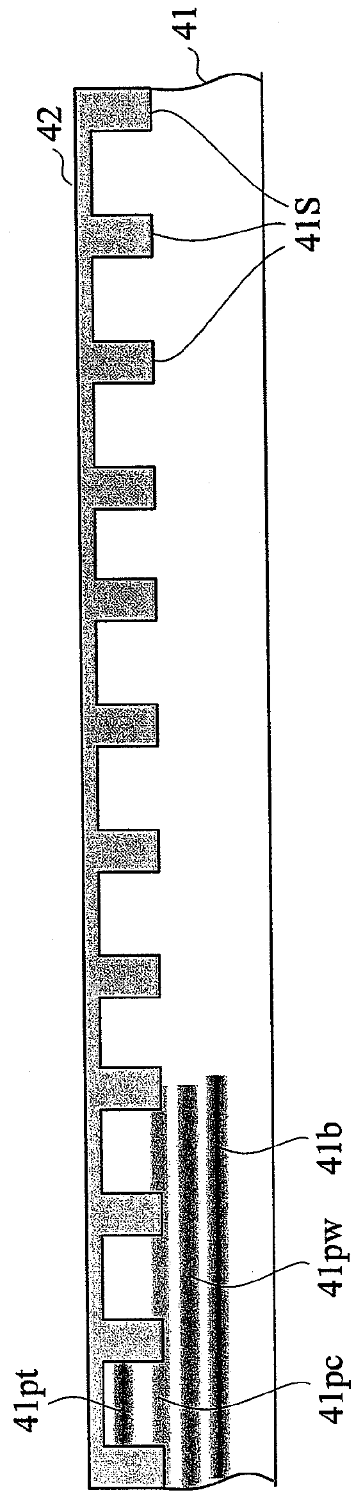

Next, in the step of FIG. 16D, the resist pattern R42 is removed and, after removing the silicon oxide film formed on the surface of the silicon substrate 41 by an HF aqueous solution, a thermal oxidation process is conducted at the temperature of 900-1050° C. for 30 minutes to form a silicon oxide film forming the tunneling insulation film 42 with the film thickness of about 10 nm.

With this formation of the tunneling insulation film 42, the impurity element introduced into device regions 41A-41C previously causes diffusion over a distance of 0.1-0.2 μm.

Figure 16E:
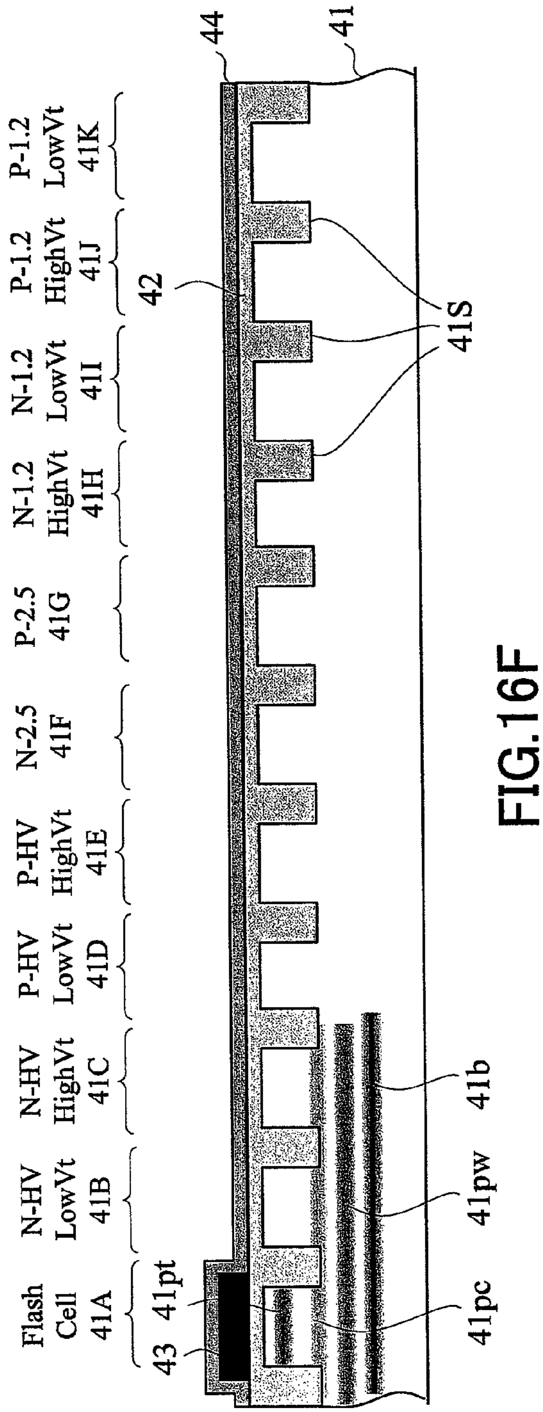

Next in the step of FIG. 16E, a polysilicon film doped with an impurity element is deposited on structure of FIG. 16D by a CVD process, followed by a patterning process, to form the foregoing floating gate electrode 43 on the device region 41A. Further, after formation of the floating gate electrode 43, an oxide film and a nitride film are deposited on the silicon oxide film 42 by a CVD process respectively with the thicknesses of 5 nm and 10 nm. Furthermore, by oxidizing the structure thus obtained in a wet atmosphere of 950° C., a dielectric film of an ONO structure is formed as the inter-electrode insulation film 44.

In this step of FIG. 16E, the p-type impurity element introduced previously to the device regions 41A-41C cause further diffusion over the distance of 0.1-0.2 μm as a result of heat treatment at the time of formation of the ONO film 44. As a result of such heat treatment, the distribution of the p-type impurity element is changed to a broad profile after the step of FIG. 16E in the p-type wells formed in the device regions 12A-12C.

Figure 16F:
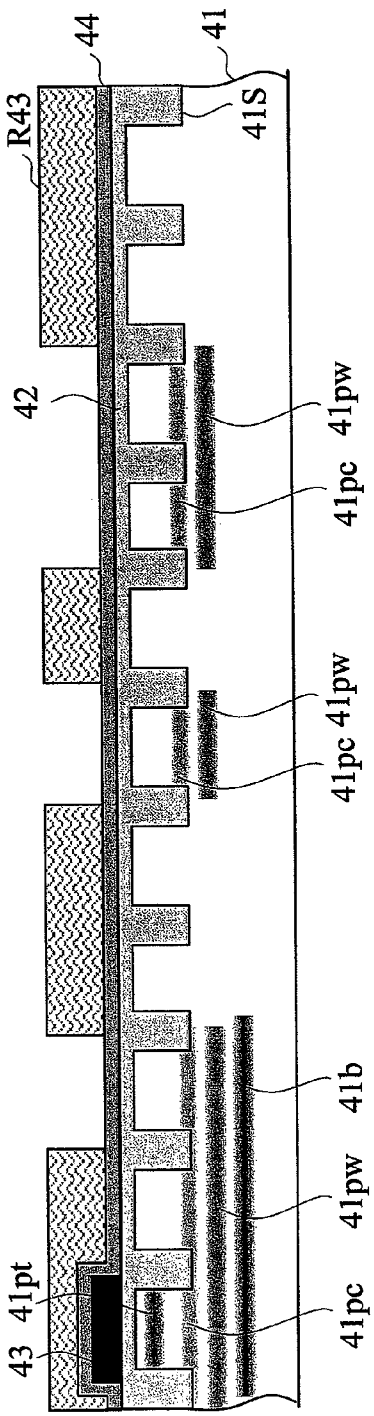

Next, in the step of FIG. 16F, a new resist pattern R43 is formed on the structure of FIG. 16E so as to expose the device regions 41C, 41F and 41H-41I, and while using the resist pattern R43 as a mask, $B^+$ is introduced by an ion implantation process first under acceleration voltage of 400 keV with the dose of $1.5\times10^{13}$ $cm^2$ and next under the acceleration voltage of 100 keV with the dose of $8\times10^{12}$ $cm^2$. Thereby, p-type regions forming the p-type well and the p-type channel stopper region are formed respectively in the device region 41F and in the regions 41H-41I at a depth 41 *pw* deeper than the depth of the device isolation insulation film 41S. Further, in the device region 41C introduced with the p-type impurity element previously, there occurs increase of impurity concentration level in the p-type well, and threshold control is achieved for the high voltage high threshold n-channel MOS transistor formed in the device region 41C.

Thus, in the p-type well formed in the device regions 41F, 41H and 41I, B thus introduced do not experience heat treatment except for the thermal activation treatment, and sharp distribution profile is maintained.

Figure 16G:
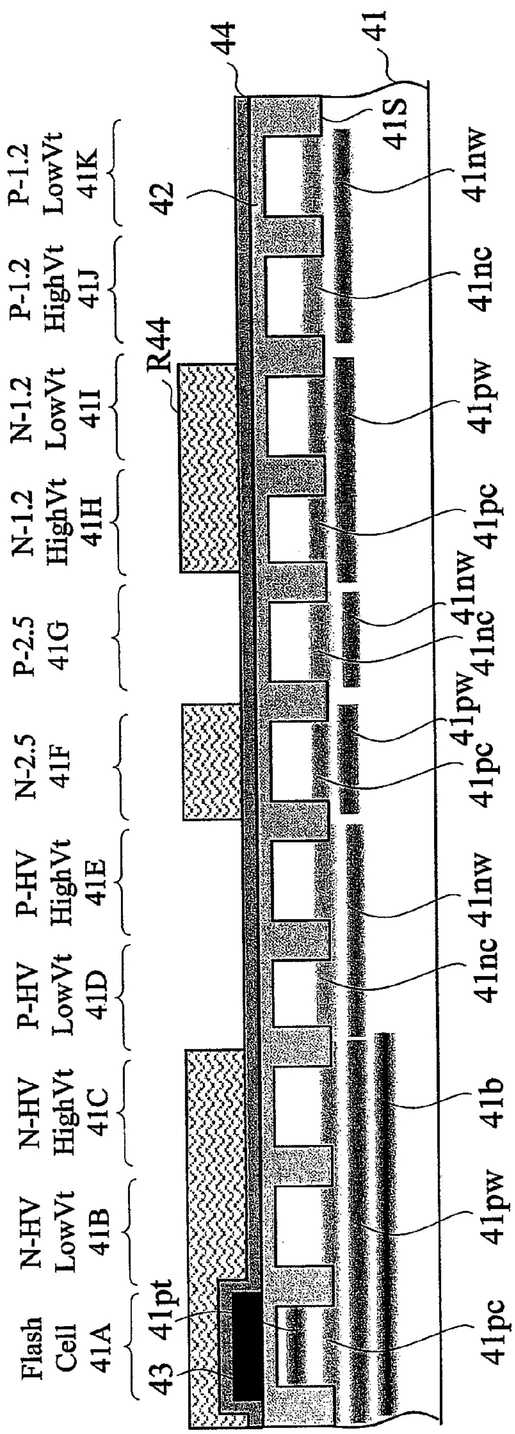

Next in the step of FIG. 16G, a new resist pattern R44 is formed on the ONO film 44 so as to expose the device regions 41D, 41E, 41G, 41J and 41K, and $P^+$ is introduced into the silicon substrate 41 by an ion implantation process first under the acceleration voltage of 600 keV and with the dose of $1.5\times10^{13}$ $cm^{-3}$, and next under the acceleration voltage of 240 keV with the dose of $3\times10^{12}$ $cm^{-3}$ while using the resist pattern R44 as a mask. With this, an n-type well is formed in the device regions 41D, 41E and further in the device region 41G at a depth 41*nw* deeper than the device isolation insulation film 41S and an n-type channel stopper region is formed at a depth 41*nc* corresponding generally to the lower edge of the device isolation insulation film 41S. Furthermore, it should be noted that the threshold voltage of the high voltage low threshold p-channel MOS transistor is controlled to 0.2V by the channel stopper impurities.

Figure 16H:
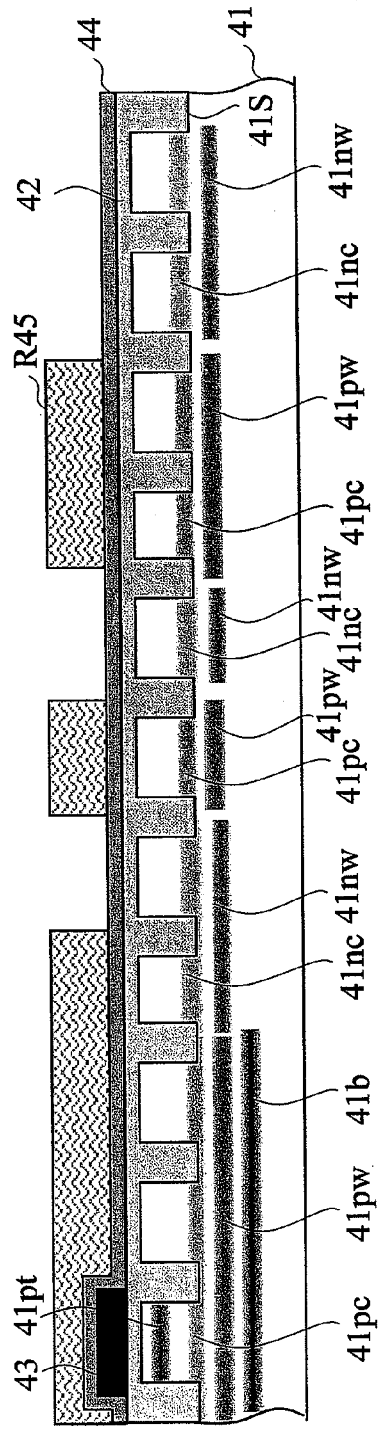

Next, in the step of FIG. 16H, a resist pattern R45 is formed on the ONO film 44 so as to expose the device regions 41E and 41G, and 41J and 41K, and $P^+$ is introduced into the device regions 41E, 41G, 41J and 41K to a depth 41*nc* corresponding to the lower edge of the device isolation insulation film 41S by an ion implantation process conducted under the acceleration voltage of 240 keV with the dose of $6.5\times10^{12}$ $cm^{-2}$ while using the resist pattern R45 as a mask, such that there occurs increase of impurity concentration level in the n-type channel stopper region formed in the device regions 41E, 41G, 41J and 41K. With this, threshold control is achieved especially for the high voltage high threshold p-channel MOS transistor formed in the device region 41E.

Figure 16I:
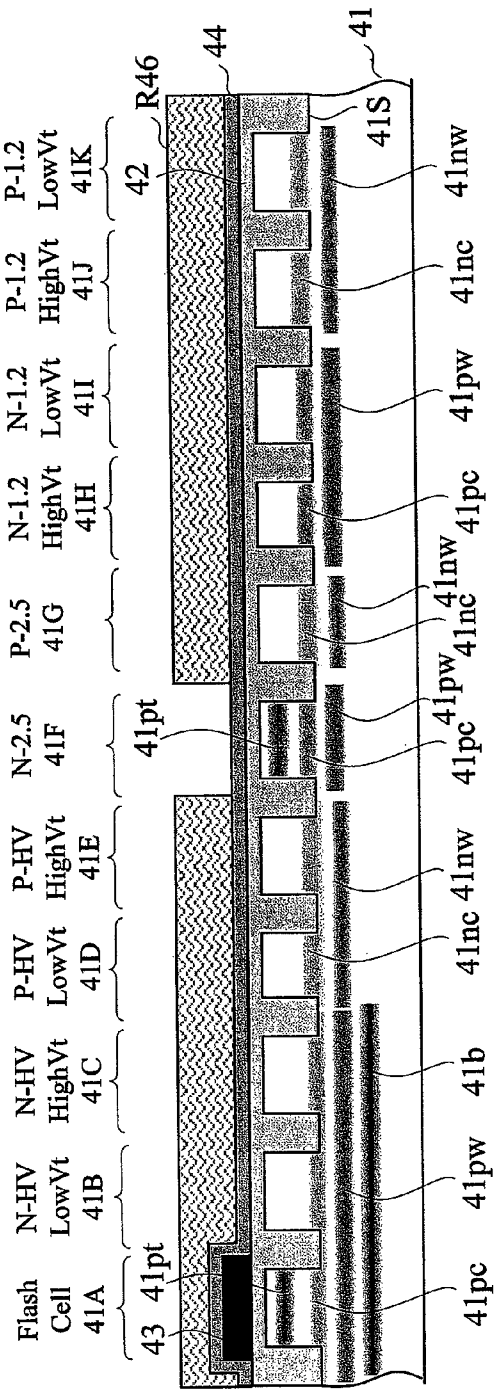

Next, in the step of FIG. 16I, a resist pattern R46 is formed on the ONO film 44 so as to expose the device region 41F, and $B^+$ is introduced into a shallow depth 41*pt* near the substrate surface in the device region 41F by an ion implantation process conducted under acceleration voltage of 30 keV with the dose of $5\times10^{12}$ $cm^{-2}$ while using the resist pattern R46 as a mask, and with this, threshold control is achieved for the mid voltage re-channel MOS transistor formed in the device region 41F.

Figure 16J:
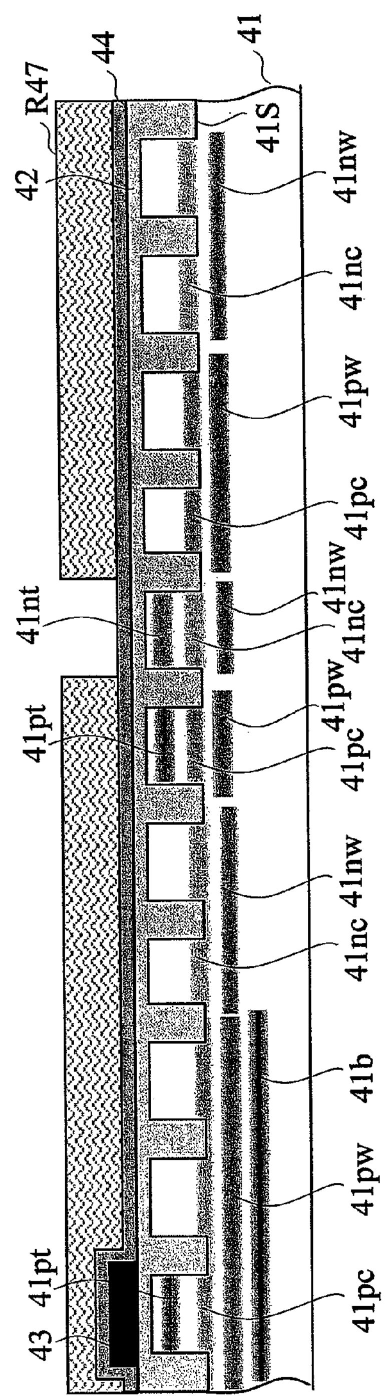

Further, in the step of FIG. 16J, a resist pattern R47 is formed on the ONO film 44 so as to expose the device region 41G, and $As^+$ is introduced into a shallow depth 41*nt* near the substrate surface of the device region 41G by an ion implantation process under the acceleration voltage, of 150 keV with the dose of $3\times10^{12}$ $cm^{-2}$ while using the resist pattern R47 as a mask. With this, threshold control is achieved for the mid voltage p-channel MOS transistor formed in the device region 41G.

Figure 16K:
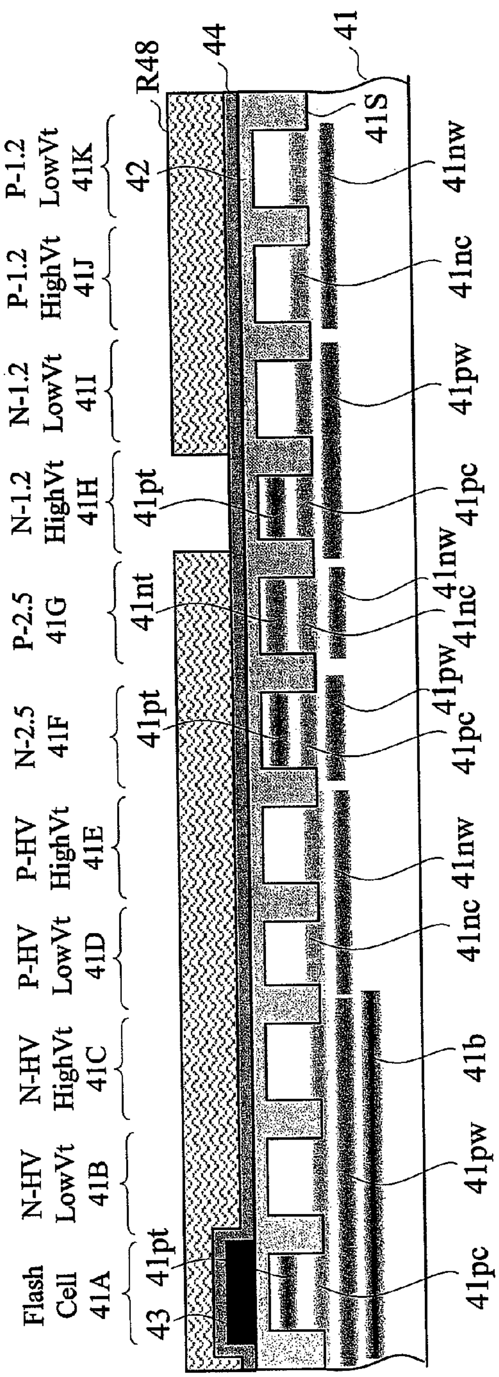

Further, in the step of FIG. 16K, a resist pattern R48 exposing the device region 41H is formed on the ONO film 44, and while using the resist pattern R48 as a mask, ion implantation of $B^+$ is conducted into a shallow depth 41*pt* near the substrate surface in the device region 41H under the acceleration voltage of 10 keV with the dose $5\times10^{12}$ $cm^{-2}$. With this, threshold control is achieved for the low voltage high threshold n-channel MOS transistor formed in the device region 41H. Here, it should be noted that the depth 41*pt* of the device region 41H is closer to the substrate surface as compared with the depth position 41*pt* of device region 41F.

Figure 16L:
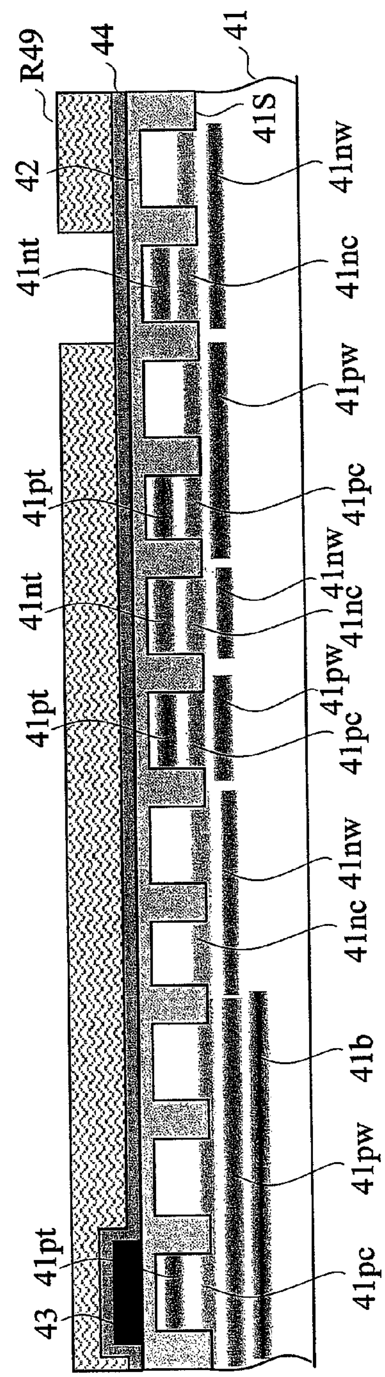

Next, in the step of FIG. 16L, a Resist pattern R49 exposing the device region 41J is formed on the ONO film 44, and while using the resist pattern R49 as a mask, ion implantation of $B^+$ is conducted into a shallow depth 41*nt* near the substrate surface of the device region 41J under the acceleration voltage of 10 keV with the dose $5\times10^{12}$ $cm^{-2}$. Thereby, threshold control is achieved for the low voltage high threshold p-channel MOS transistor formed in the device region 41J. Again, the depth 41*nt* of the device region 41J is closer to the substrate surface as compared with the depth 41*nt* of depth position 41G.

Figure 16M:
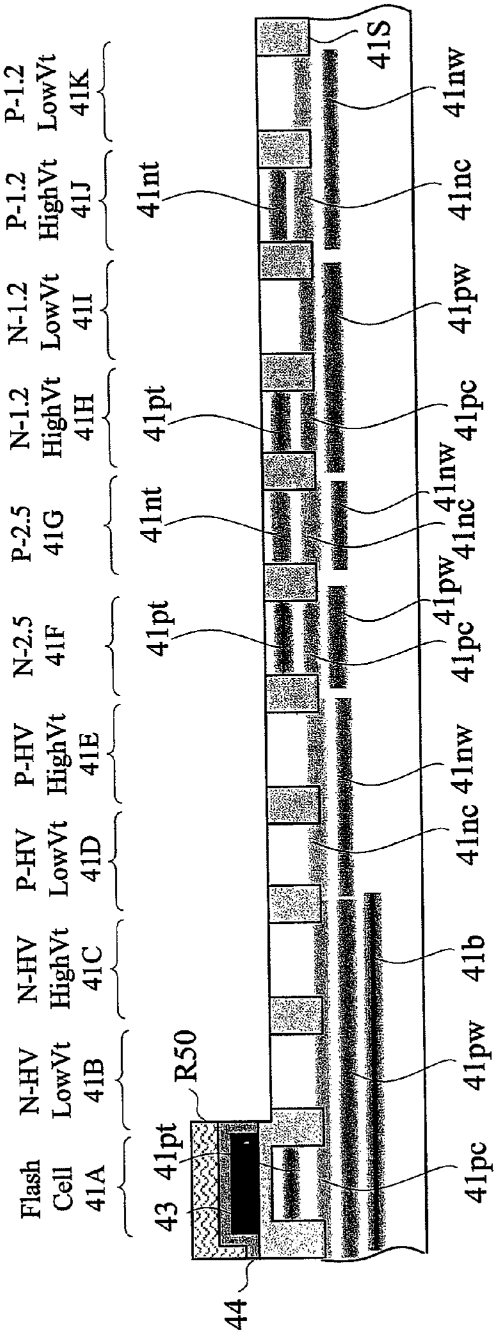

Next, in the step of FIG. 16M, the ONO film 44 and the silicon oxide film 22 underneath are patterned while using a Resist pattern R50 as a mask, and the surface of the silicon substrate 41 is exposed for the device regions 41B-41K.

Figure 16N:
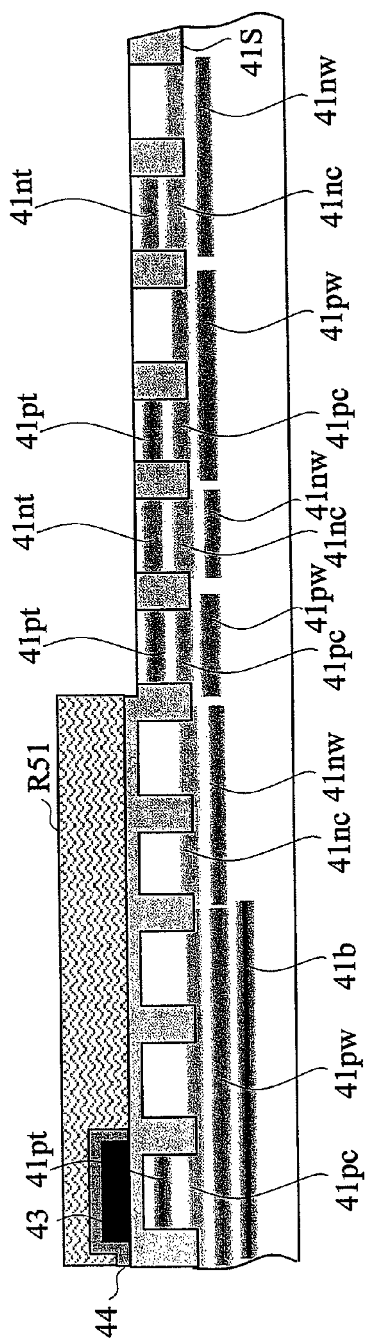

Further, in the step of FIG. 16N, the resist pattern R50 is removed and thermal oxidation processing is conducted at 850° C. With this, a silicon oxide film constituting a gate insulation film 46 of the high voltage MOS transistor is formed with a thickness of 13 nm.

In step of FIG. 16N, there is further formed a resist pattern R51 on the silicon oxide film 46 so as to expose the device regions 41F-41K, and by patterning the silicon oxide film 46 while using the resist pattern R51 as a mask, the silicon substrate surface is exposed again for the device regions 41F-41K.

Figure 16O:
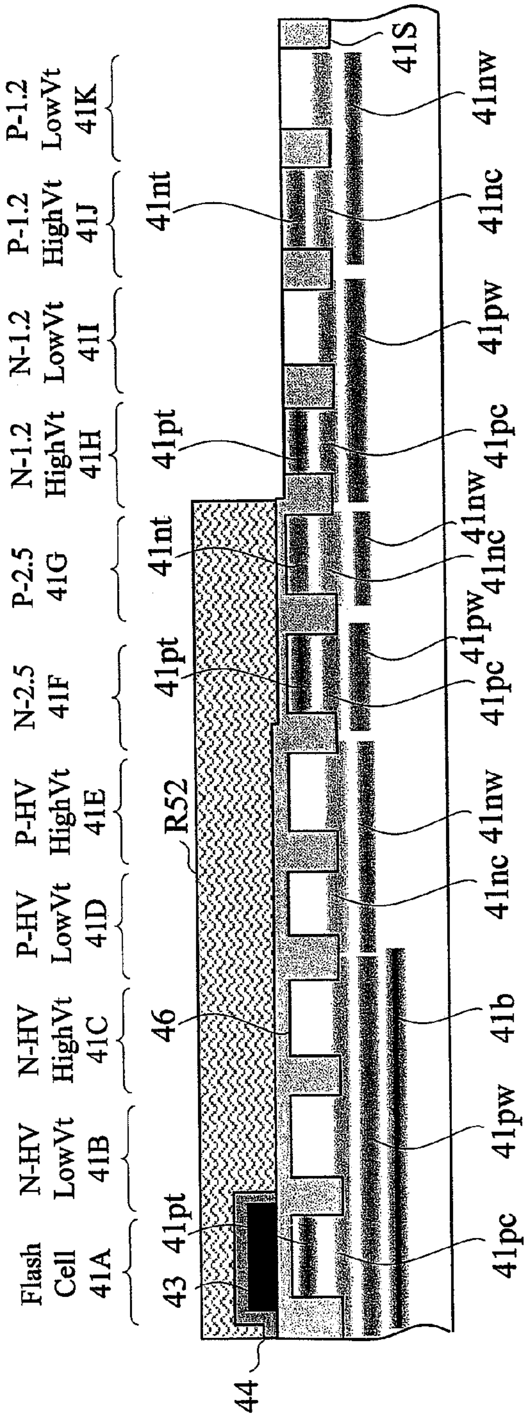

Further, the resist pattern R51 is removed in the step of FIG. 16O, and a silicon oxide film forming a gate insulation film 48 of the mid voltage MOS transistor is formed by a thermal oxidation process to a thickness of 4.5 nm.

In step of FIG. 16O, a resist pattern R52 exposing the device regions 41H-41K is formed on the silicon oxide film 48, and by patterning the silicon oxide film 48 while using the resist pattern R52 as a mask, the surface of the silicon substrate is exposed again in the device regions 41H-41K.

Figure 16P:
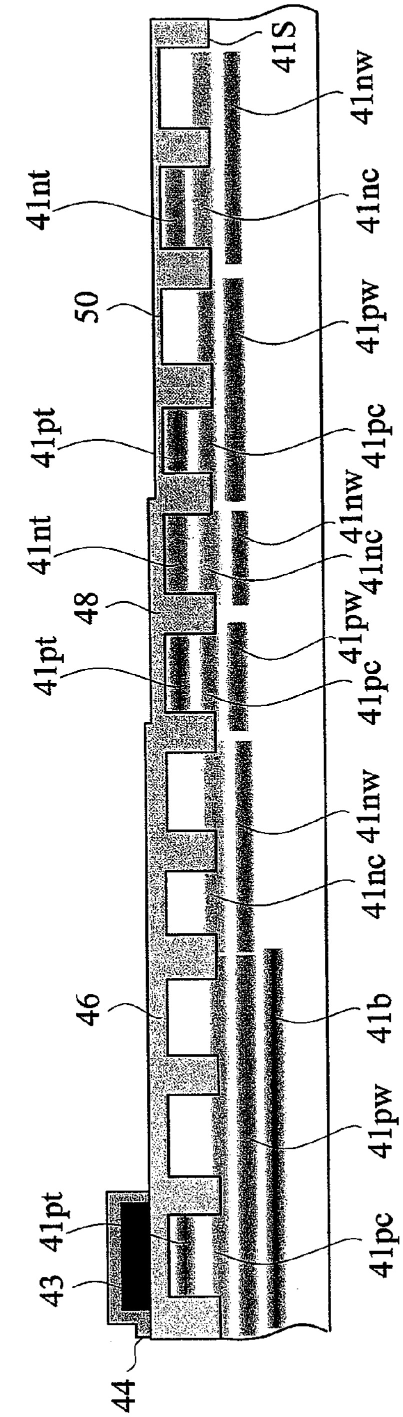

Further, the resist pattern R52 is removed in the step of FIG. 16P, and a silicon oxide film forming a gate insulation film 50 of low voltage MOS transistor is formed to a thickness of 2.2 nm by conducting a thermal oxidation process.

Because of repeated thermal oxidation processes carried out up to the step to FIG. 16P, the gate insulation film 42 is grown to the thickness of 16 nm and the gate insulation film 46 is grown to the thickness of 5 nm in the state of FIG. 16P. In the process steps from FIG. 16A to FIG. 16P, it should be noted that there exist in all thirteen mask steps: FIG. 16B; FIG. 16C; FIG. 16E; FIG. 16F; FIG. 16G; FIG. 16H; FIG. 16I; FIG. 16J: FIG. 16K; FIG. 16L; FIG. 16M; FIG. 16N; and FIG. 16Q, while this is identical to case of the conventional technology explained with reference to FIGS. 13A-13L. However, with the process of the present embodiment, the resist film does not contact with the silicon substrate surface immediately before formation of the gate oxide film, and the problem of contamination of the gate oxide film by the impurities is avoided.

Further, the problem of formation of projections or depressions on the silicon substrate surface due to mask misalignment does not take place.

Further, with the present embodiment, there are conducted thirteen ion implantation process steps in all: three times with the step of FIG. 16B; once with the step of FIG. 16C; twice with the step of FIG. 16F; twice with the step of FIG. 16G; once with the step of FIG. 16H; once with the step of FIG. 16I; once with the step of FIG. 16J; once with the step of FIG. 16K; and once with the step of FIG. 16L, and thus, the number of the ion implantation process steps is decreased significantly as compared with the hypothetical case of FIGS. 13A-13L.

Figure 16Q:
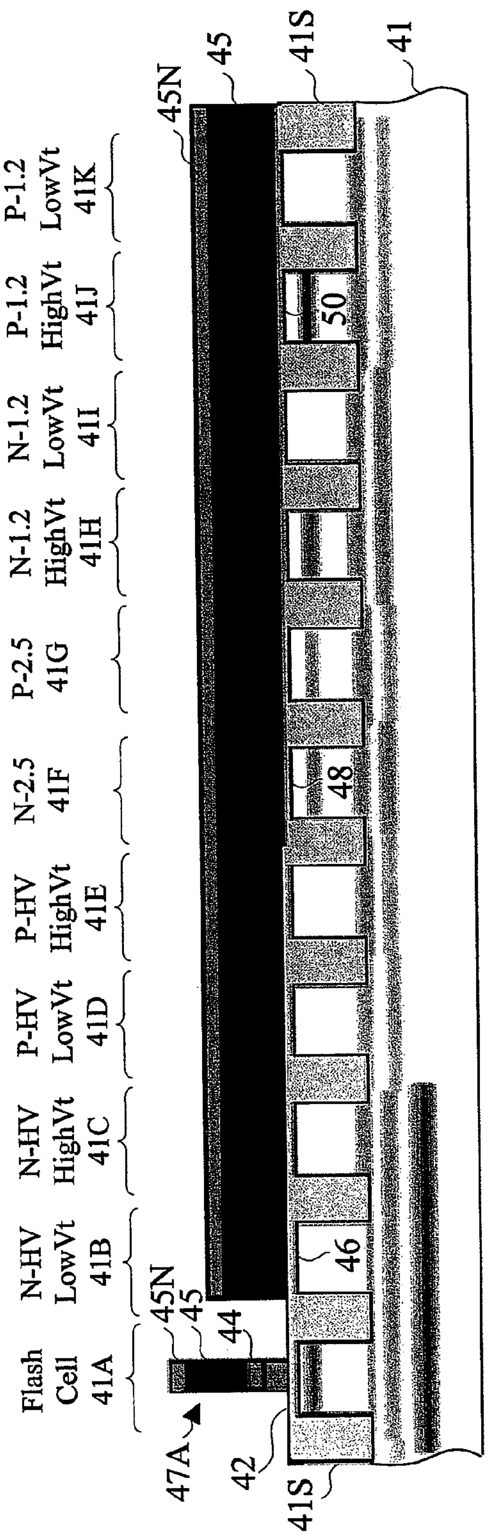

Next in the step of FIG. 16Q, a polysilicon film 45 is deposited on the structure of FIG. 16P to the thickness of 180 nm by a CVD process, and an SiN film 45N is deposited further thereon by a plasma CVD process so as to form an antireflection coating with the thickness of 30 nm, wherein this SiN film functions also as an etching stopper film. Next, in the step of FIG. 16Q, the polysilicon film 45 is patterned by a resist process and a gate electrode structure 47A having a stacked structure is formed in the flash memory device region 44A such that a control gate electrode 45 is stacked on the inter-electrode insulation film 44.

Figure 16R:
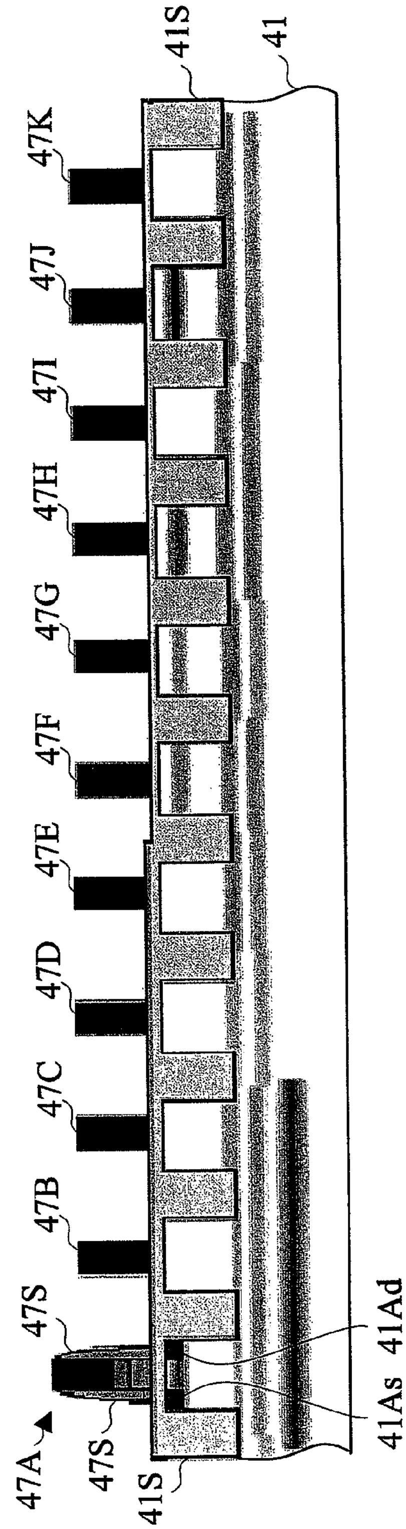

Next, in the step of FIG. 16R, the structure of FIG. 16Q is thermally oxidized and a thermal oxide film (not shown) is formed on the sidewall surface of the stacked gate electrode structure 47A. Further, $B^+$ is introduced into the device region 41A by an ion implantation process while using the stacked gate electrode structure 47A and the polysilicon film 45 as a mask, and a source region 41As and a drain region 41Ad are formed at respective lateral sides of the stacked gate electrode 47A.

Further, in the step of FIG. 16R, a pyrolitic CVD process and an etch back process by RIE are conducted after formation of the source region 41*s* and the drain region 41*d*, sidewall insulation films 47*s* of SiN are formed on the sidewall surfaces of the stacked gate electrode structure 47A. Thereby, the SiN film 45N on the polysilicon film 45 is removed at the same time as the formation of the sidewall insulation films 47*s*.

After formation of the sidewall insulation films 47*s*, the polysilicon film 45 is patterned in the device regions 41B-41K in the step of FIG. 16R, and gate electrodes 47B-47K are formed respectively in the device regions 41B-41K.

Figure 16S:
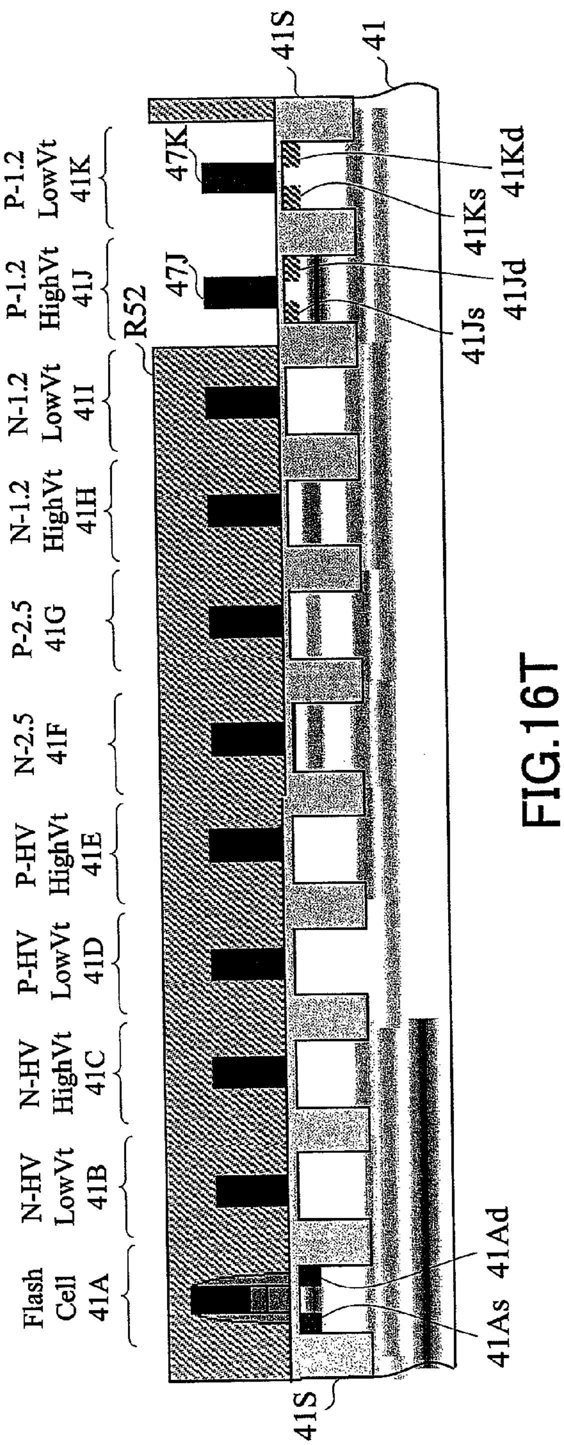

Next, in the step of FIG. 16S, a resist pattern R52 exposing the device regions 41J and 41K is formed on the substrate 41 of the structure of FIG. 16R, and, while using the resist pattern R52 and the gate electrodes 47J and 47K as a mask, $B^+$ is introduced by an ion implantation process under the acceleration voltage of 0.5 keV and with the dose of $3.6\times10^{14}$ $cm^{-2}$, followed by an ion implantation process of $As^+$ conducted four times obliquely with the angle of 28° under the acceleration voltage of 80 keV with the dose of $6.5\times10^{12}$ $cm^{-2}$. With this, a source extension region 41Js or 41Ks of p-type accompanied with the pocket region of n-type and a drain extension region 41Jd or 41Kd of p-type accompanied with a pocket region of n-type are formed in the device regions 41J and 41K at respective lateral sides of the gate electrode 47J or 47K.

Figure 16T:
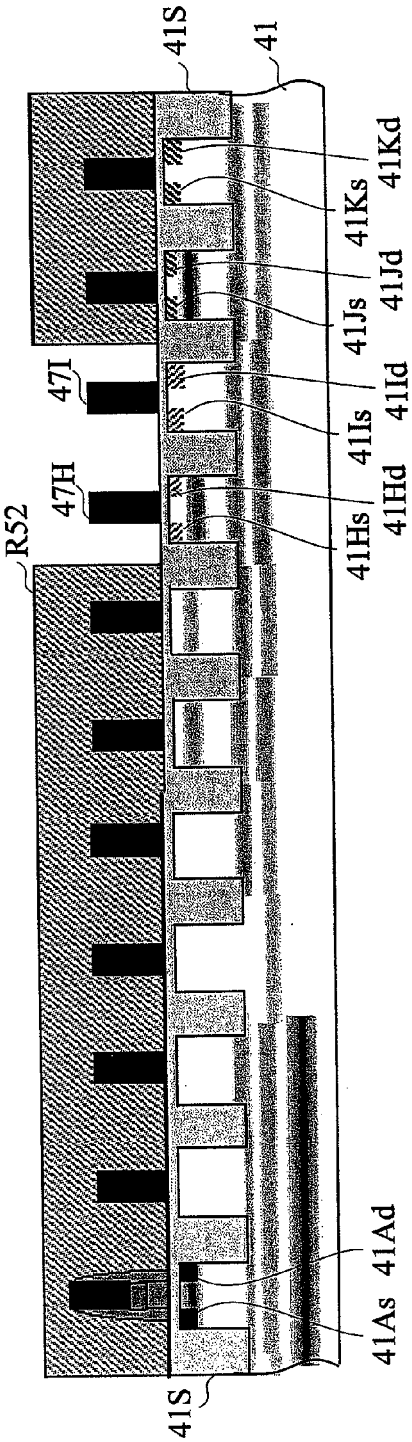

Next with the process of FIG. 16T, the resist pattern R52 of FIG. 16S is removed, and a resist pattern R53 exposing the device regions 41H and 41I is formed on the substrate 41. Further, while using the resist pattern R53 and the gate electrodes 47H and 47I as a mask, $As^+$ is introduced by an ion implantation process under the acceleration voltage of 3 keV with dose of $1.1\times10^{15}$ $cm^{-2}$, followed by ion implantation of $BF_2^+$ conducted four times obliquely with the angle of 28° under the acceleration voltage of 35 keV with the dose of $9.5\times10^{12}$ $cm^{-2}$. With this, a source extension region 41Hs or 41Is of n-type accompanied with the pocket region of p-type and a drain extension region 41Hd or 41Id of n-type accompanied with the pocket region of p-type are formed in the device regions 41H and 41I at respective lateral sides of the gate electrode 47H or 47I.

Figure 16U:
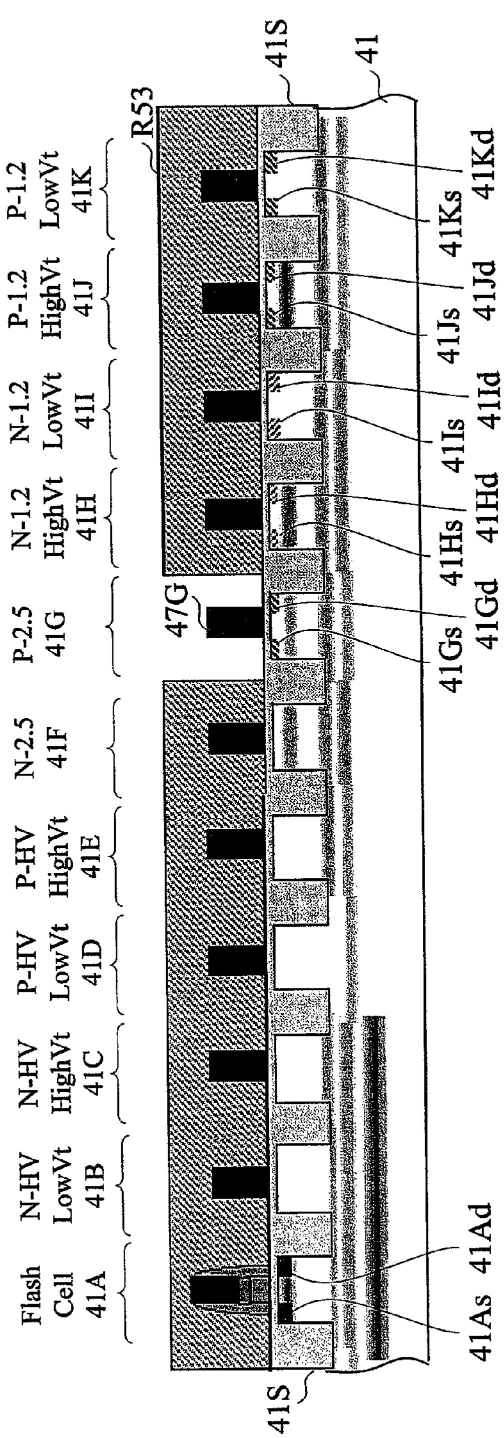

Further, the resist pattern R52 of FIG. 16T is removed with the step of FIG. 16U, and a resist pattern R53 exposing the device region 41G is formed newly on the substrate 41. Further, while using the resist pattern R53 and the gate electrode 47G as a mask, $BF_2^+$ is introduced by an ion implantation process under the acceleration voltage of 10 keV with the dose $7.0\times10^{13}$ $cm^{-2}$. With this, a p-type source region 41Gs and an n-type drain region 41Gd are formed at respective lateral sides of the gate electrode 47G.

Figure 16V:
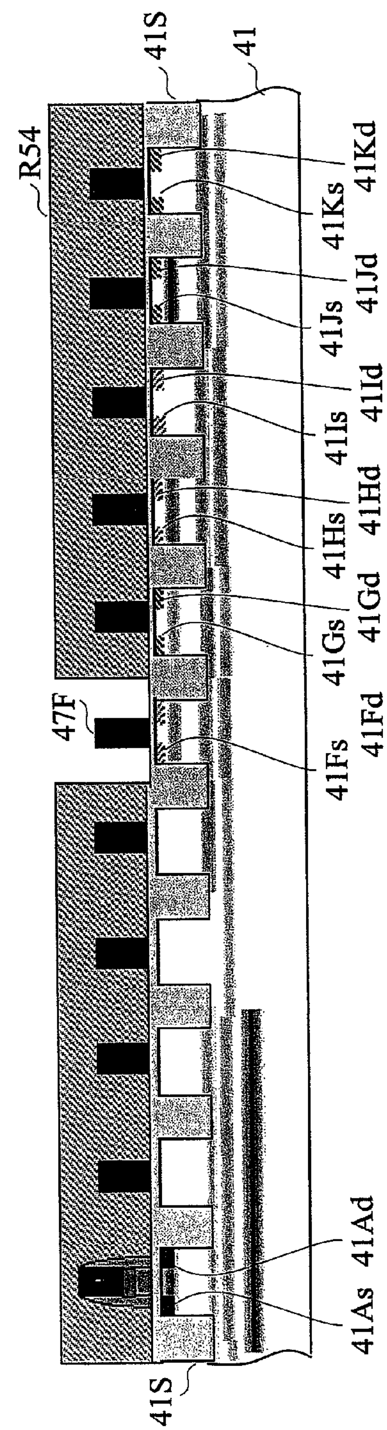

Further, in the step of FIG. 16V, the resist pattern R53 of FIG. 16U is removed a resist pattern R54 is newly formed on the substrate 41 so as to expose the device region 41F. Further, while using the resist pattern R54 and the gate electrode 47F as a mask, $As^+$ is introduced by an ion implantation process under the acceleration voltage of 10 keV with the dose of $2.0\times10^{13}$ $cm^{-2}$, followed by an ion implantation of $P^+$ under the acceleration voltage of 10 keV with the dose of $3.0\times10^{13}$ $cm^{-2}$, and an n-type source region 41Fs and an n-type drain region 41Fd are formed at both sides of the gate electrode 47F.

Figure 16W:
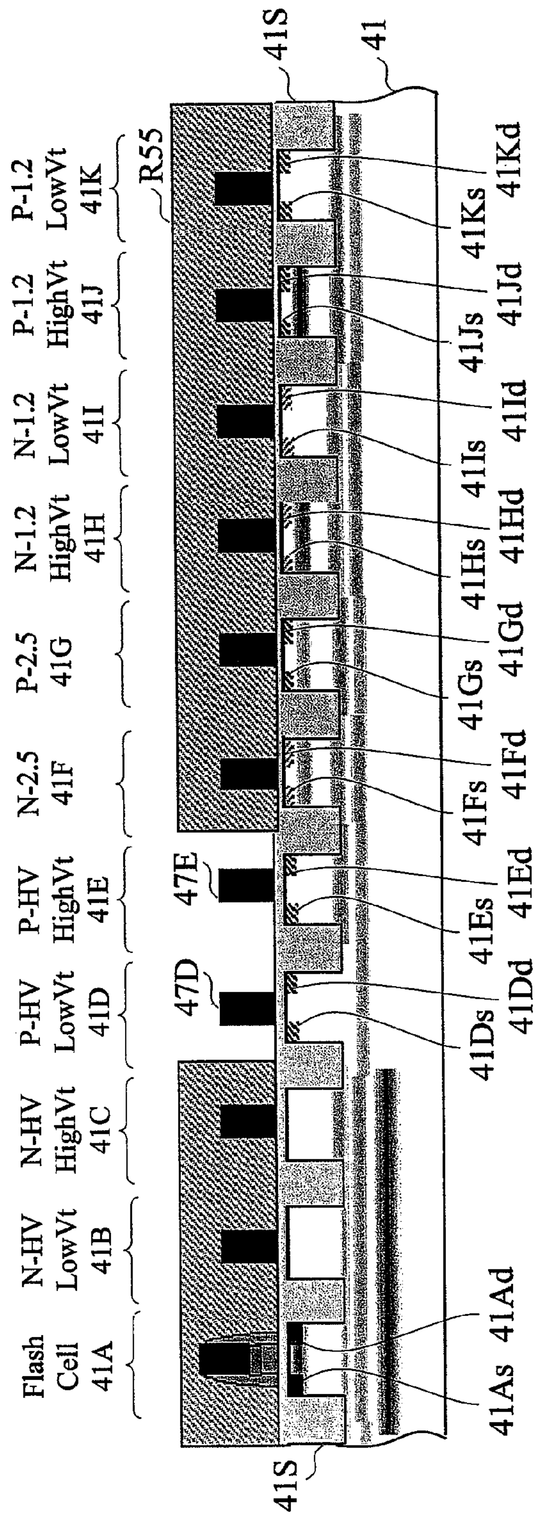

Next, the resist pattern R54 is removed with the process of FIG. 16W, and a resist pattern R55 exposing the device regions 41D and 41E is formed on the substrate 41. Further, while using the resist pattern R55 and the gate electrodes 47D and 47Eas a mask, $BF_2^+$ is introduced into the device regions 41D and 41E by an ion implantation process conducted under the acceleration voltage of 80 keV with the of dose $4.5\times10^{13}$ $cm^{-2}$, and a p-type source region 41Ds and a p-type drain region 41Dd are formed in the device region 41D at respective lateral sides of the gate electrode 47D and a p-type source region 41Es and a p-type drain region 41Ed are formed at respective lateral sides of the gate electrode 47E in the device region 41E.

Figure 16X:
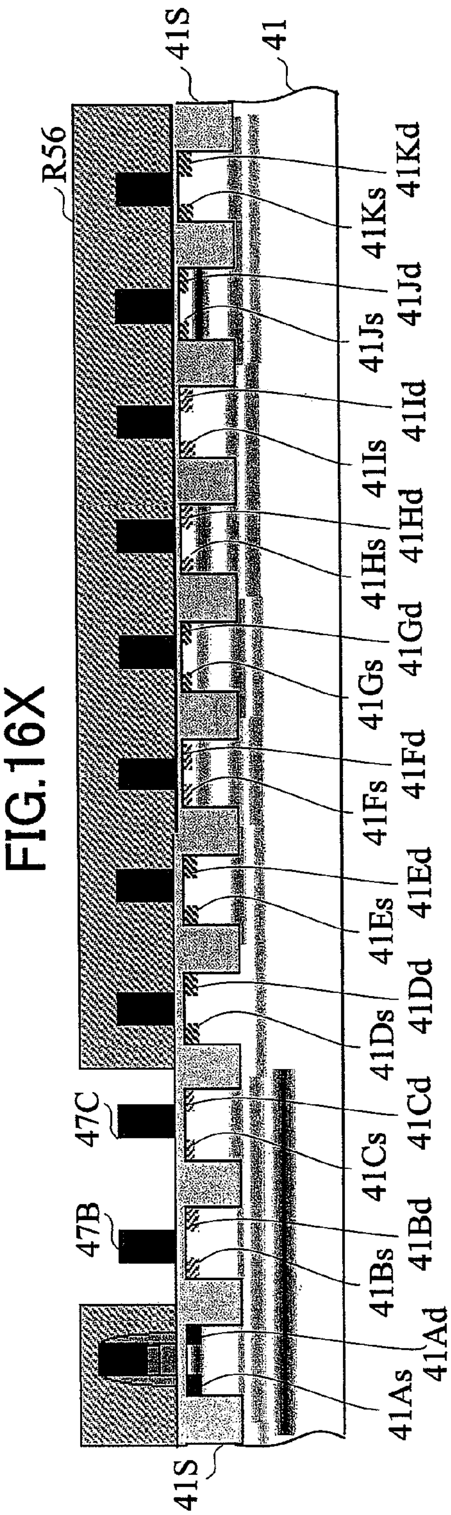

Further, the resist pattern R55 is removed with the process of FIG. 16X, and a resist pattern R56 exposing the device regions 41B and 41C is formed on substrate 41. Further, while using the resist pattern R56 and the gate electrodes 41B and 41C as a mask, $P^+$ is introduced by an ion implantation process under the acceleration voltage of 35 keV and with the dose of $4.0\times10^{13}$ $cm^{-2}$. With this, an n-type source region 41Bs and an n-type drain region 41Bd are formed in the device region 41B at respective lateral sides of the gate electrode 47B, and an n-type source region 41Cs and an n-type drain region 41Cd are formed in the device region 41C at respective lateral sides of the gate electrode 47C.

Figure 16Y:
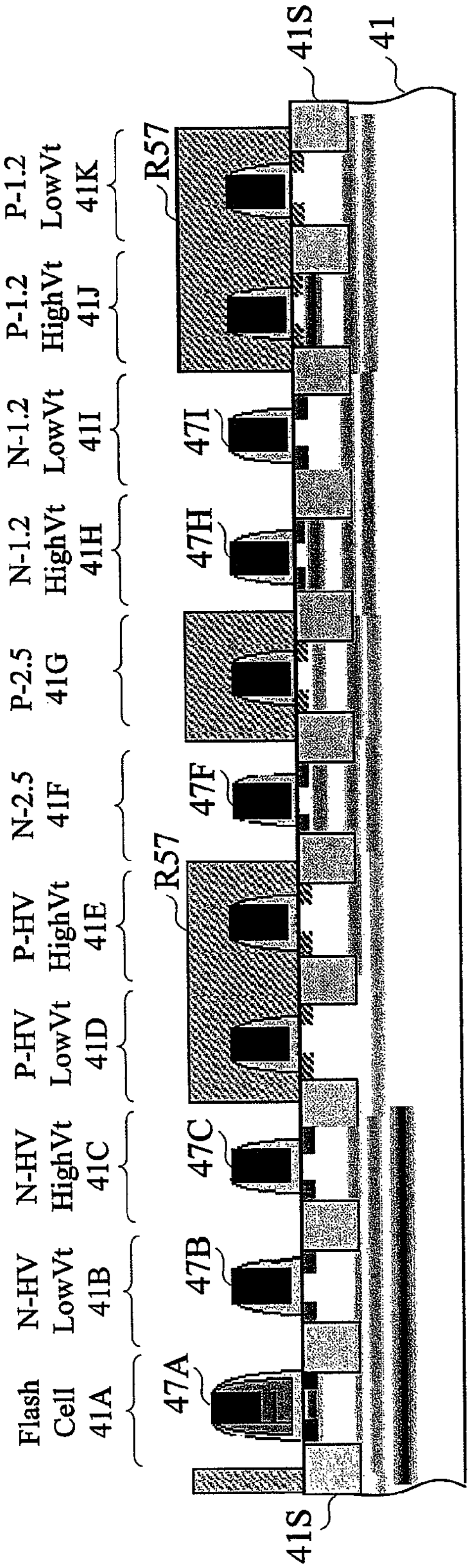

Further, in the step of FIG. 16Y, the resist pattern R56 of FIG. 16X is removed and a silicon oxide film is deposited on the substrate 41 uniformly with the thickness of 100 nm by a CVD process so as to cover the stacked gate electrode structure 47A and the gate electrodes 47B-47K. Further, by etching back the same by an RIE process until the surface of the substrate 41 is exposed, sidewall oxide films are formed to the sidewall surfaces of the stacked gate electrode structure 47A and the gate electrodes 47B-47K.

Further, as shown in FIG. 16Y, a resist pattern R57 is formed on the substrate 41 so as to expose the device regions 41A-41C and the device region 41F, and further the device regions 47H and 47I, and $P^+$ is introduced by an ion implantation process under the acceleration voltage of 10 keV with the dose $6.0\times10^{15}$ $cm^{-2}$ while using the resist pattern R57 and further the stacked gate electrode structure 47A, the gate electrodes 47B and 47C, the gate electrode 47F, the gate electrodes 47H and 47I and further the sidewall oxide films thereof as a mask, source and drain regions of $n^+$-type (not shown) are formed in the respective device regions 41A-41C, 41F, 41H and 41I.

Figure 16Z:
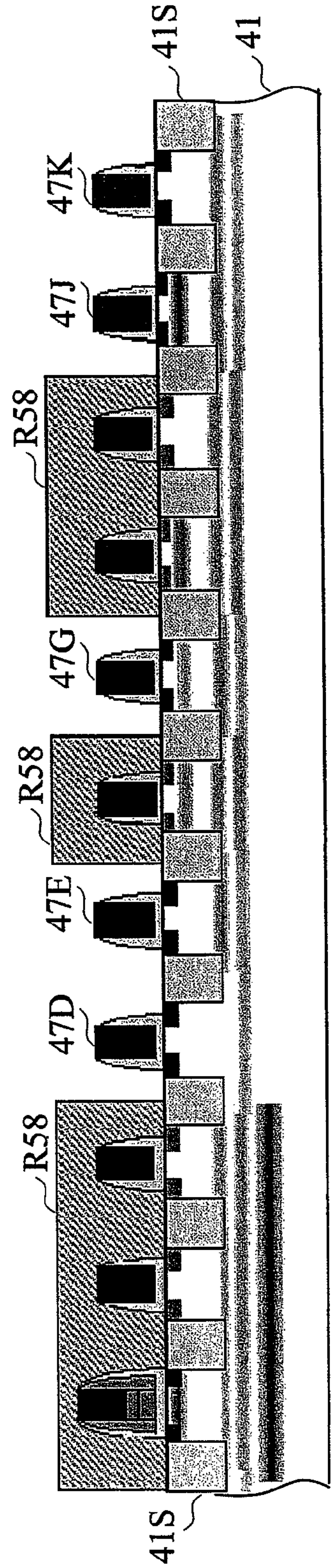
Figure 16A:
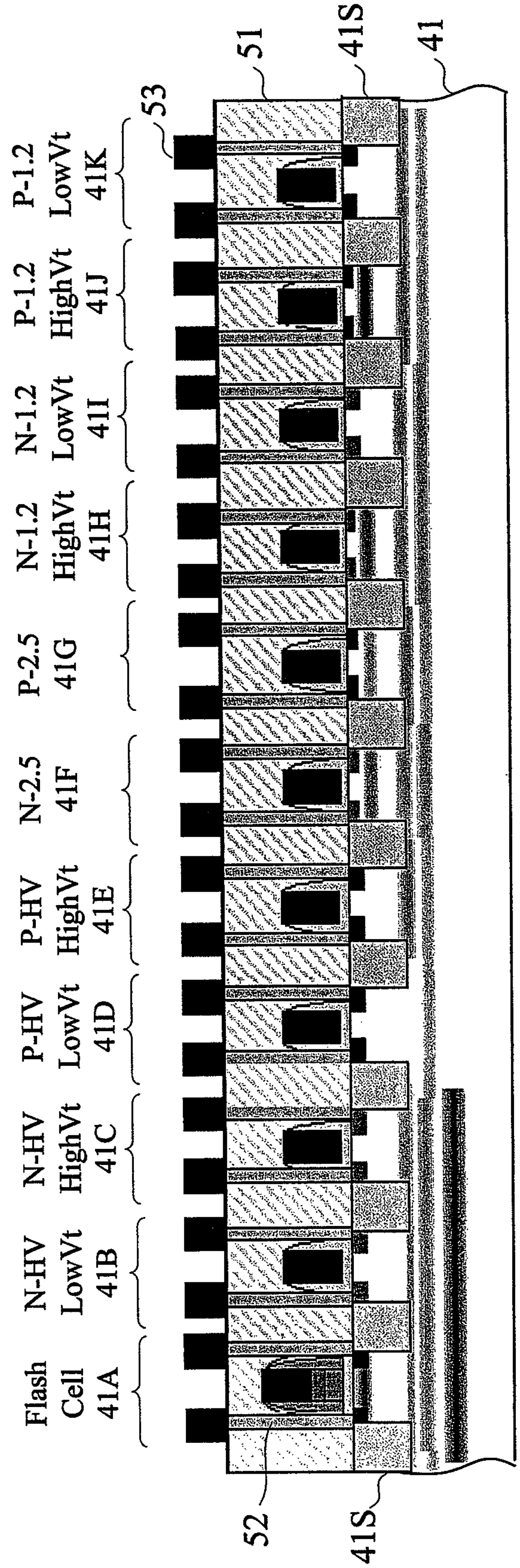
Figure 16A:
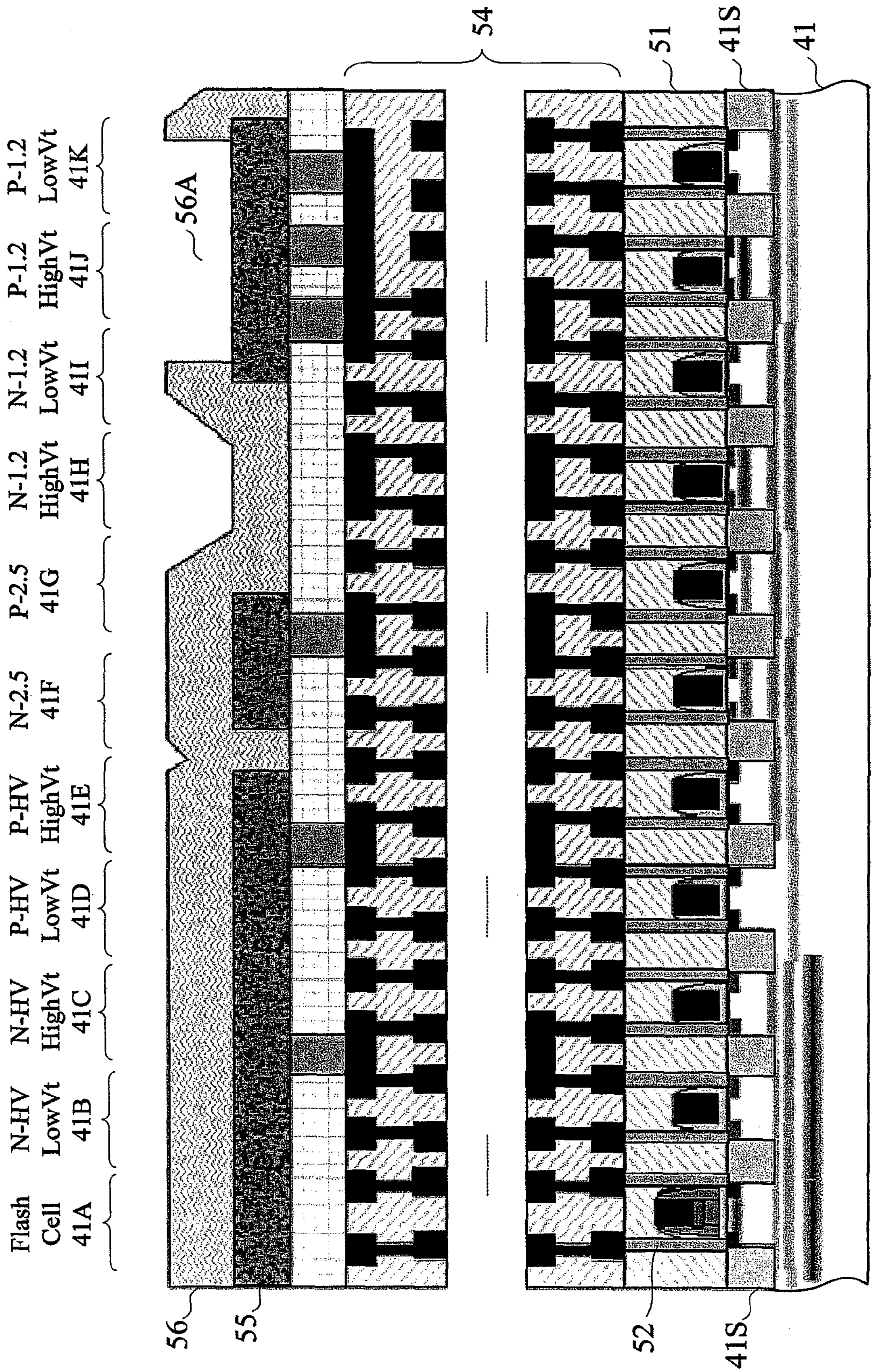

Further, in the step of FIG. 16Z, a resist pattern R58 is formed on the substrate 41 so as to expose the device regions 41D and 41E and further the device region 41G and the device regions 47J and 47K, and $B^+$ is introduced under the acceleration voltage of 5 keV with the dose of $4.0\times10^{15}$ $cm^{-2}$ while using the resist pattern R58 and the gate electrodes 47D, 47E, 47G, 47J and 47K and further the sidewall oxide films thereof as a mask. With this, source regions and drain regions of $p^+$-type (not shown) are formed in the respective device regions 41D-41E, 41G, 41J and 41K.

Further, in the step of FIG. 16AA, the resist film R58 is removed, a silicide layer is formed on the exposed surfaces of the gate electrodes 47A-47K and the exposed surfaces of the source and drain regions according to a known method. Further, an insulation film 51 is deposited on the substrate 41 and contact holes are formed therein. Further, an interconnection pattern 53 is formed on the insulation film 51 so as to make a contact with the source region and the drain region of the respective device regions 41A-41K through the contact holes.

Further, a multilayer interconnection structure 54 is formed on the structure of FIG. 16AA in the step of FIG. 16AB, and pad electrodes 55 are formed on the multilayer interconnection structure. Further, the entire structure is covered by a passivation film 56, and contact openings 56A are formed in the passivation film 56As according to the needs. With this, the integrated circuit device 40 explained with reference to FIG. 15 is completed.

In present embodiment, the ion implantation process to the device regions 41D-41K is carried out after the formation process of the ONO film of FIG. 16E. Thereby, there is realized a sharp impurity distribution profile in the well of n-type or p-type in these device regions, and with this, it becomes possible to suppress the punch-through leakage current effectively. In the explanation of FIGS. 16A-16AB, it should be noted that the depths 41*b*, 41*pw*, 41*pc*, 41*pt*, 41*nw*, 41*nc* and 41*nt* represent the depth of ion implantation, while the impurity elements thus introduced show a maximum of concentration in these positions even after heat treatment or thermal activation process, and it is thought that these depths represent the peak of the impurity concentration profile.

Further, with the present embodiment, the distribution of the impurity element constituting the p-type well is broadened in the device regions 41B and 41C of the high voltage n-channel MOS transistors, and because of this, a preferable effect of improved junction breakdown voltage is achieved in these device regions.

Second Embodiment

Next, the fabrication process of the semiconductor integrated circuit device according to a second embodiment of the present invention will be explained with reference to FIGS. 17A-17P, wherein those parts of drawings explained previously are designated by the same reference numerals and the description thereof will be omitted.

Figure 17A:
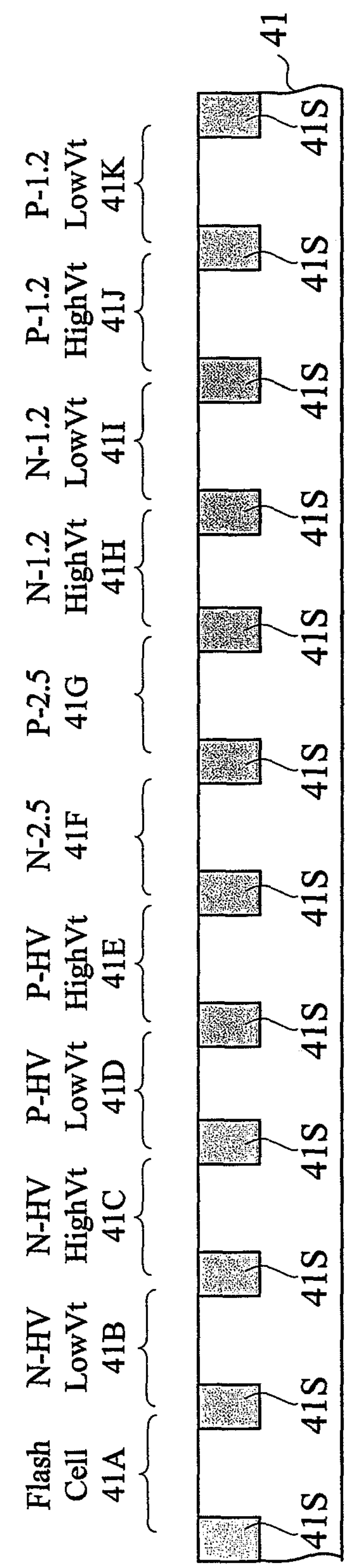
FIGS. 17A-17P are diagrams explaining the fabrication process of a semiconductor integrated circuit device according to a second embodiment of the present invention.

Referring to FIG. 17A, this process corresponds to the process of FIG. 16A before and there are formed device regions 41A-41K on the silicon substrate 41 so as to be defined by an STI device isolation insulation film 41S. Further, while not illustrated, the surface of the silicon substrate 41 is covered with a thermal oxide film of the thickness of 10 nm in the state of FIG. 17A.

Figure 17B:
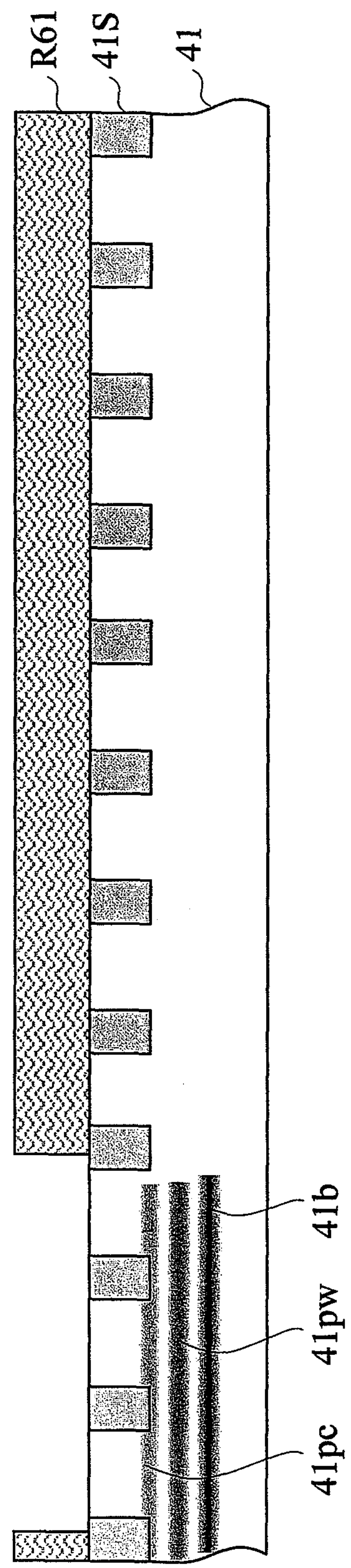

Next, in step of FIG. 17B, a resist pattern R61 is formed on the structure of FIG. 17A so as to expose the device regions 41A-41C, and while using the resist pattern R61 as a mask, $P^+$ is introduced to a depth 41*b* deeper than the bottom edge of the device isolation insulation film 41S by an ion implantation process conducted under the acceleration voltage of 2 MeV with the dose of $2\times10^{13}$ $cm^{-2}$. Thereby, an n-type buried impurity region is formed.

Further, in the step of FIG. 17B, $B^+$ is introduced into a depth 41*pw* by an ion implantation process conducted under the acceleration voltage of 400 keV with the dose of $1.5\times10^{13}$ $cm^{-2}$ while using the resist pattern R61 as a mask similarly to the process of FIG. 16B, and a p-type well is formed. Further, in the step o of FIG. 12B, $B^+$ is introduced to a depth 41*pc* by an ion implantation process conducted under the acceleration voltage of 100 keV with a dose $2\times10^{12}$ $cm^{-2}$ while using the resist pattern R61 as a mask. With this, a channel stopper region of p-type is formed to the depth 41*pc*.

Figure 17C:
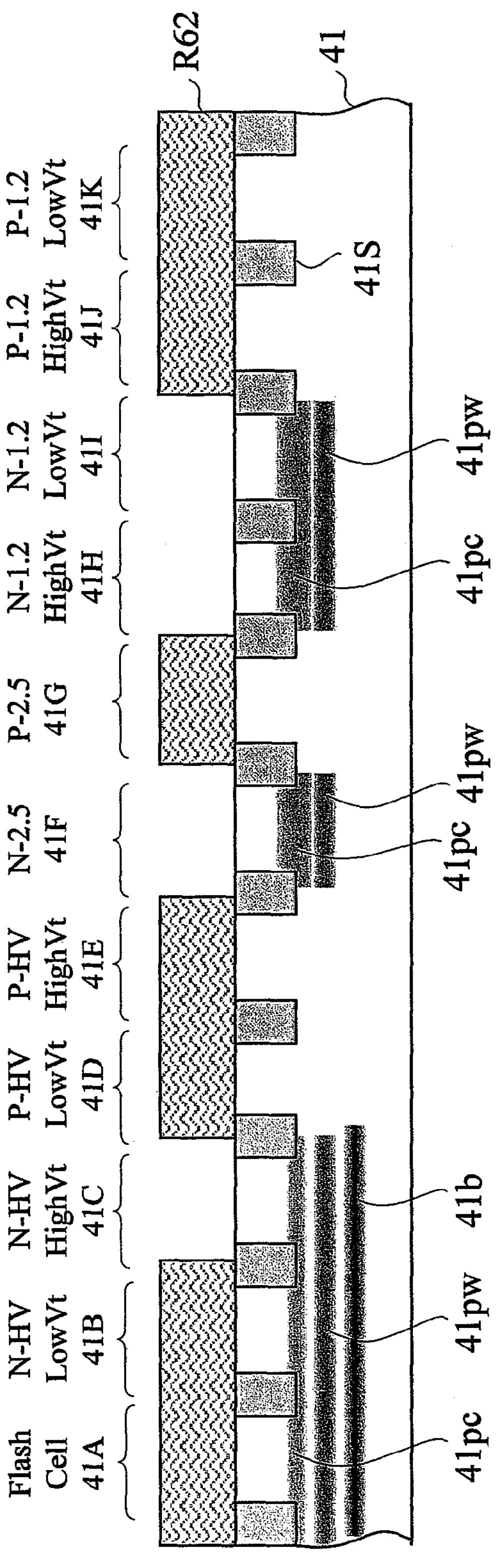

Next, in the step of FIG. 17C, a resist pattern R62 is formed newly on the silicon substrate 41 so as to expose the device region 41C of the high voltage high threshold n-channel MOS transistor and the device region 41F of the mid voltage n-channel MOS transistor and further the device region 41H of the low voltage high threshold n-channel MOS transistor and the device region 41I the low voltage low threshold n-channel MOS transistor, $B^+$ is introduced to the depths 41*pw* and 41 pc by an ion implantation process first under the acceleration voltage of 400 keV and with the dose of $1.5\times10^{12}$ $cm^{-2}$ and next under the acceleration voltage of 100 keV with the dose of $6\times10^{12}Cm^{-2}$, and threshold control is achieved for the high voltage high threshold n-channel MOS transistor in the device region 41C. Further, in the device regions 41F, 41H and 41I, p-type wells and p-type channel stopper regions of the n-channel MOS transistors formed in these device regions are formed.

Figure 17D:
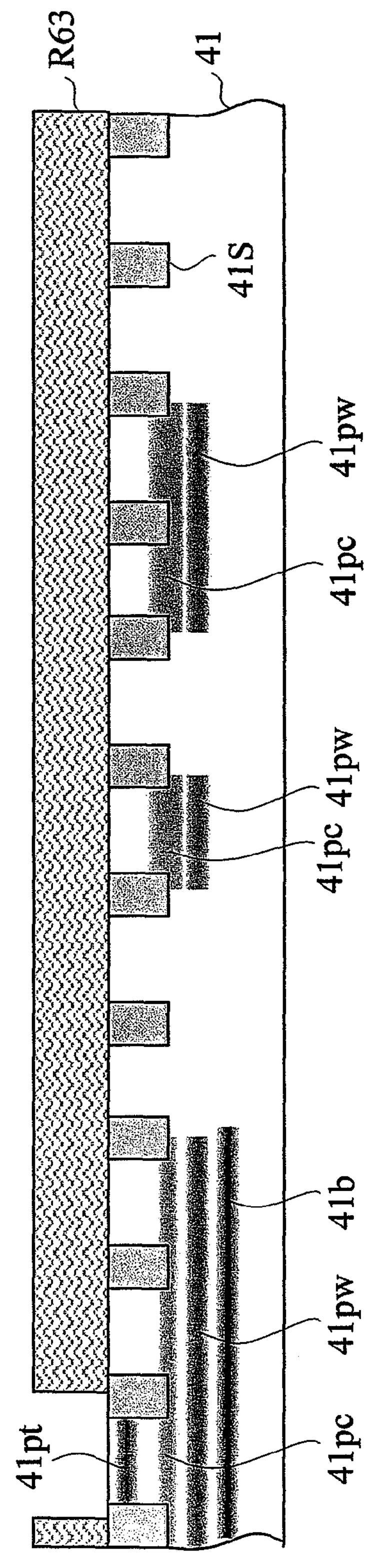

Next with the step of FIG. 17D, a resist pattern R63 exposing the device region 41A is formed newly on the silicon substrate 41, and $B^+$ is introduced to a depth 41*pt* by an ion implantation process conducted under the acceleration voltage of 40 keV with a dose $6\times10^{13}$ $cm^{-2}$ while using the resist pattern R65 as a mask. With this, threshold control of the flash memory cell transistor formed in the device region 41A is achieved.

Figure 17E:
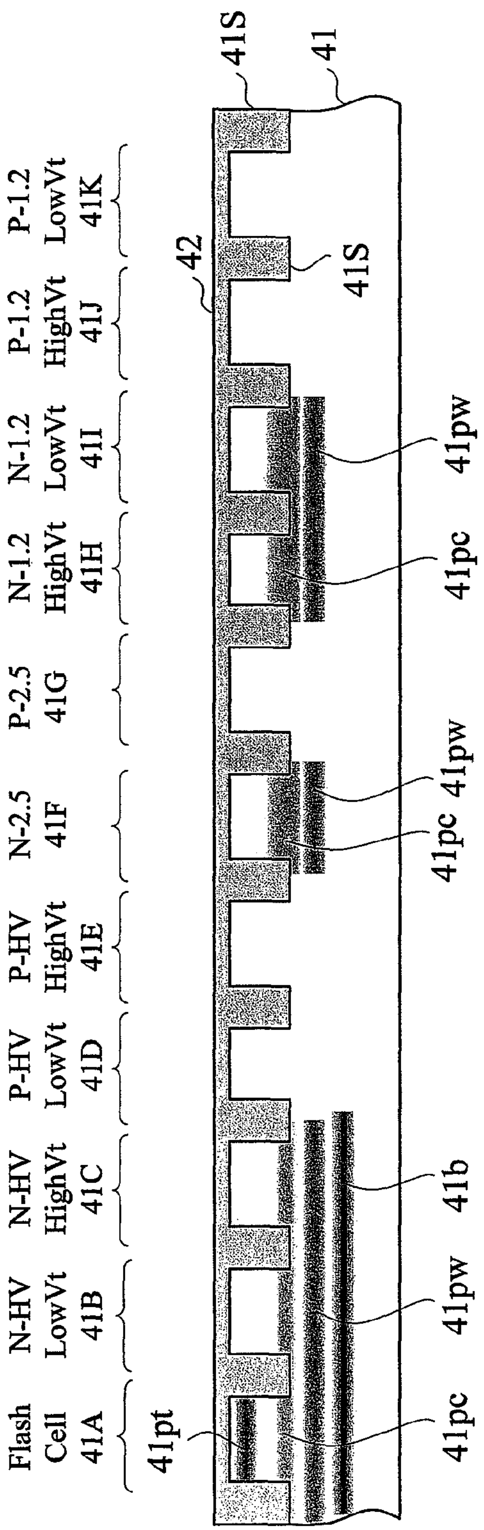

Next in the step of FIG. 17E, the resist pattern R63 is removed, and, after removing a silicon oxide film formed on the surface of the silicon substrate 41 with the process of FIG. 17A in an HF aqueous solution, the silicon substrate 41 is subjected to a thermal oxidization process conducted at the temperature of 900-1050° C. for 30 minutes. Thereby, a silicon oxide film forming the tunneling insulation film 42 is formed on the surface of the silicon substrate 41 to the thickness of 10 nm.

Figure 17F:
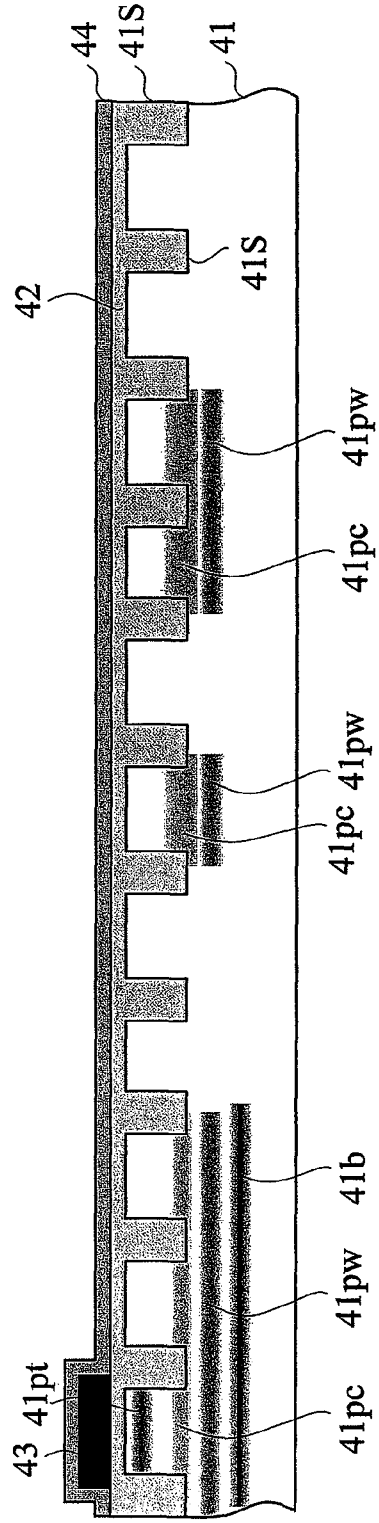

Next in the step of FIG. 17F, a polysilicon film is formed on the silicon oxide film 42 in the device region 41A to the thickness of 90 nm by a CVD process, and a floating gate electrode 43 is formed by patterning the same by using a resist process not illustrated. Further, in the process of FIG. 17F, an oxide film and a nitride film are formed on the structure thus obtained so as to cover the floating gate electrode 43 with respective thicknesses of 5 nm and 10 nm. Further, the surface of the nitride film thus formed is subjected to a thermal oxidation processing for 90 minutes at the temperature of 950° C., and with this, there is formed an inter-electrode insulation film 44 of an ONO structure on the silicon oxide film 42As with a thickness of 30 nm so as to cover the floating gate electrode 43.

With the steps of FIGS. 17E and 17F, the impurity element introduced into the device regions 41A-41C, 41F and 41H-41I cause diffusion as a result of the heat treatment over a distance of 0.1-0.2 μm, and as a result, there appears a broad distribution in the p-type impurity element in the p-type well formed in these device regions.

Figure 17G:
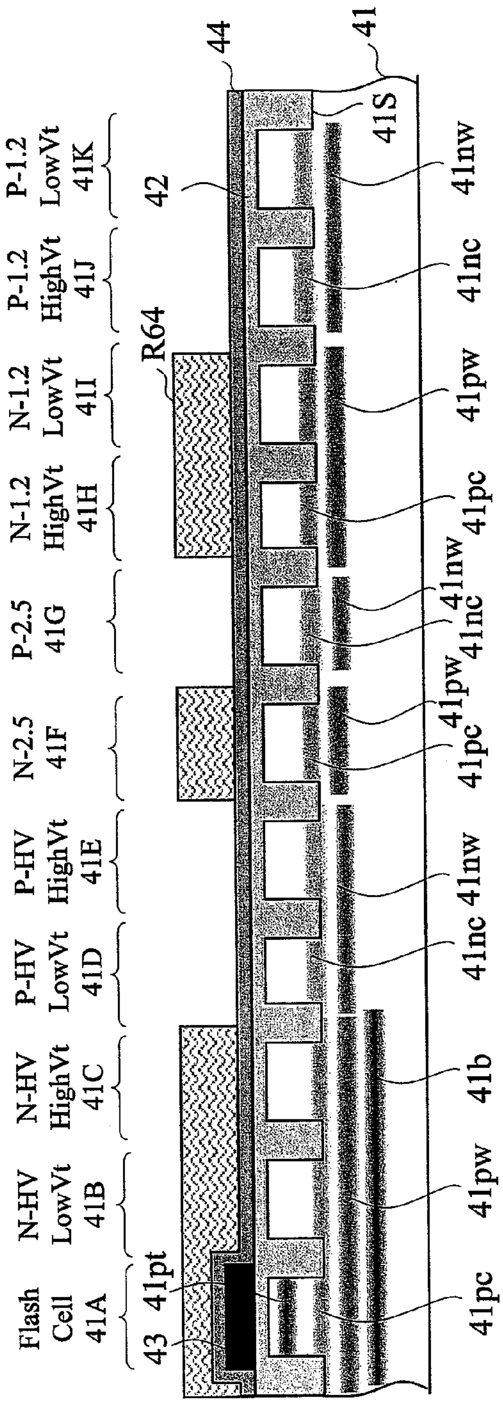

Next, in the step of FIG. 17G, a resist pattern R64 is formed newly on the structure of FIG. 17F so as to expose the device regions 41D-41E, the device region 41G and the device regions 41J-41K, and while using the resist pattern R64 as a mask, $P^+$ is introduced first to a depth 41*nw* by an ion implantation process under the acceleration voltage of 600 keV with a dose of $1.5\times10^{13}$ $cm^{-2}$, and with this, an n-type well is formed in these device regions. Further, in the step of FIG. 17G, while using the resist pattern R64 as a mask, $P^+$ is introduced by an ion implantation to a depth 41*nc* under the acceleration voltage of 240 keV with a dose of $3\times10^{12}$ $cm^{-2}$, and an n-type channel stopper region is formed in these device regions at a depth corresponding to the depth of the bottom edge of the device isolation insulation film 41S. Further, with this, threshold control is achieved for the high voltage low threshold p-channel MOS transistor formed in the device region 41D.

Figure 17H:
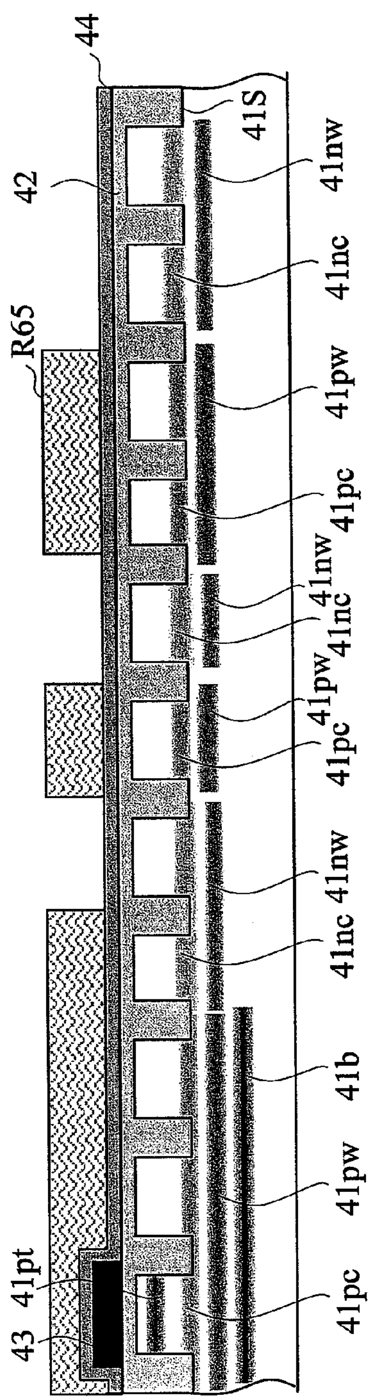

Next, in the step of FIG. 17H, a resist pattern R65 is formed newly on the ONO film 44 so as to expose the device regions 41E, 41G and 41J-41K, $P^+$ is introduced by an ion implantation process to a depth 41*nc* under the acceleration voltage of 240 keV and the dose $6.5\times10^{12}$ $cm^{-2}$ while using the resist pattern R65 as a mask. Thereby, threshold control is achieved for the p-channel MOS transistor formed in the device region 41E, and at the same time, the impurity concentration level is increased in the n-type channel stopper region of the p-channel MOS transistors formed in the device region 41G and the device regions 41J-41K.

Figure 17I:
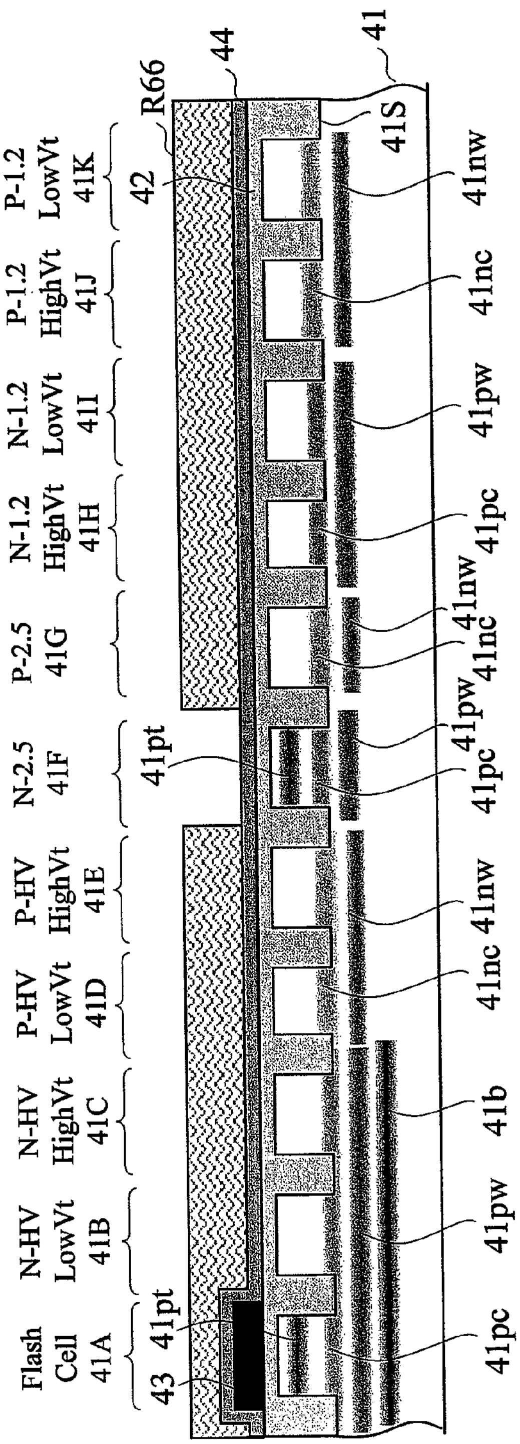

Next, in the step of FIG. 17I, a resist pattern R66 on is formed newly the ONO film 44 so as to expose the device region 41F, and while using the resist pattern R66 as a mask, $B^+$ is introduced to a depth 41*pt* under the acceleration voltage of 30 keV and dose of $5\times10^{12}$ $cm^{-2}$, and threshold control is achieved for the mid voltage n-channel MOS transistor formed in the device region 41F.

Figure 17J:
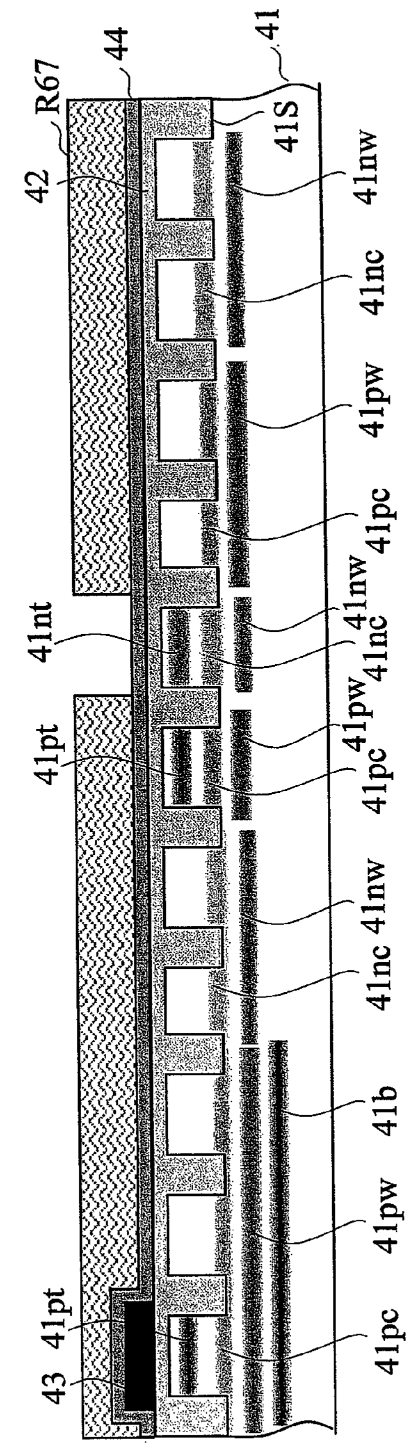

Further, in the step of FIG. 17J, a resist pattern R67 exposing the device region 41G is formed newly on the ONO film 44, and $As^+$ is introduced to the depth 41*nt* by an ion implantation process conducted under the acceleration voltage of 150 keV with the dose of $3\times10^{12}$ $cm^{-2}$. With this, threshold control is achieved for the mid voltage p-channel MOS transistor formed in the device region 41G.

Figure 17K:
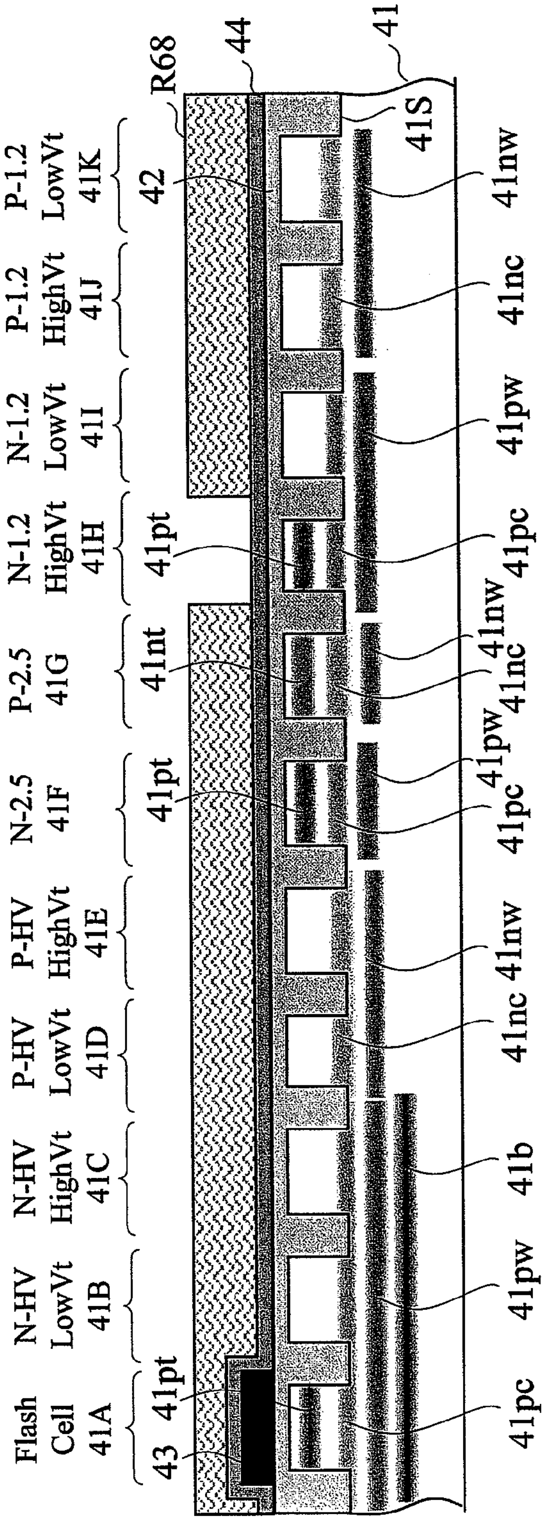

Next in the process of FIG. 17K, a resist pattern R68 that exposes the device region 41H is formed newly on the ONO film 44, and, while using the resist pattern R68 as a mask, $B^+$ is introduced into a depth 41*pt* by an ion implantation process conducted under the acceleration voltage of 10 keV with a dose of $5\times10^{12}$ $cm^{-2}$. With this, threshold control is achieved for the low voltage n-channel MOS transistor formed in the device region 41F. It should be noted that the depth 41*pt* of the device region 41H is located closer to the surface of substrate 41 unlike the depth 41*pt* of other device regions such as the device region 41F.

Figure 17L:
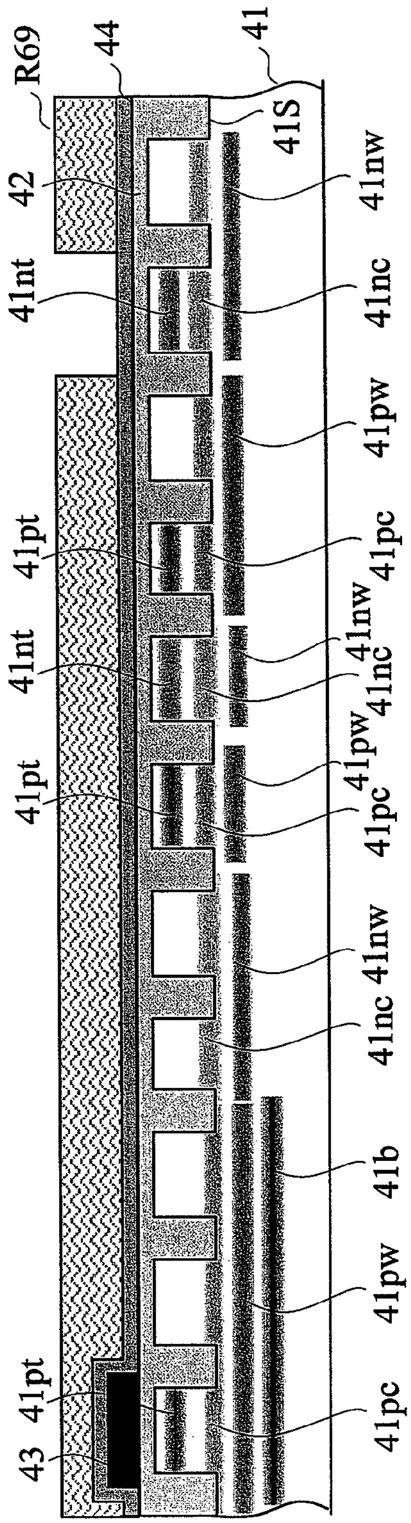

Further, in the step of FIG. 17L, a resist pattern R69 exposing the device region 41J is formed newly on the ONO film 44, and while using the resist pattern R69 as a mask, $As^+$ is introduced to a depth 41*nt* by an ion implantation process conducted under the acceleration voltage of 100 keV with the dose of $3\times10^{12}$ $cm^2$, and threshold control is achieved for the mid voltage p-channel MOS transistor formed in the device region 41H. Again, it should be noted that the depth 41*nt* in the device region 41J is located close to the substrate surface as compared with the depth 41*nt* of other device region 41G.

Figure 17M:
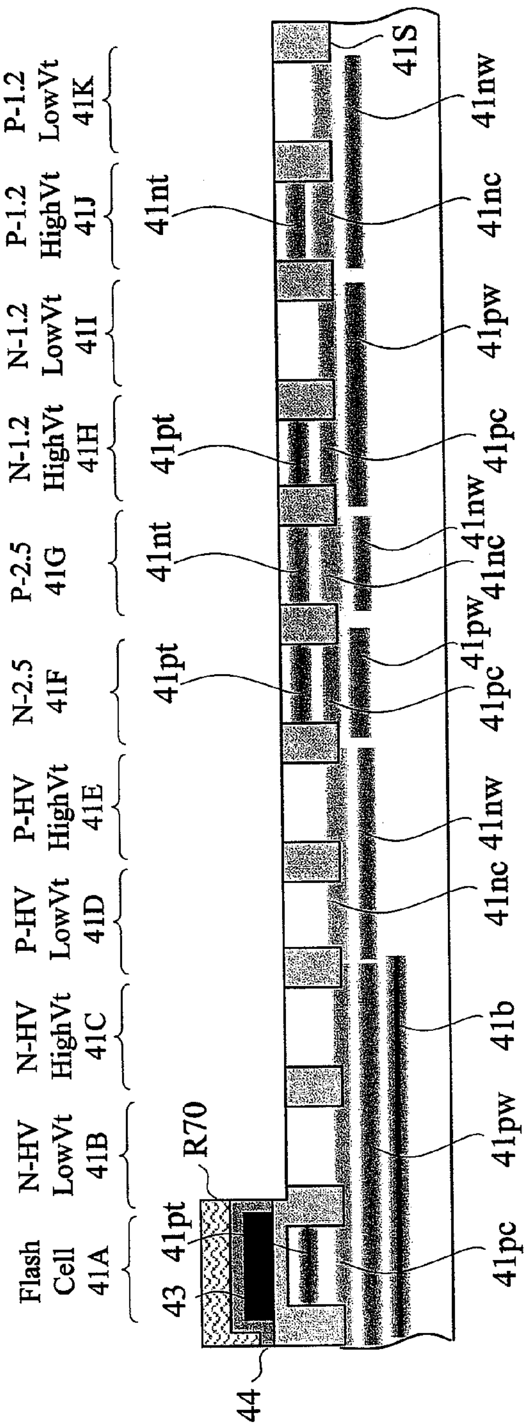

Further, in the step of FIG. 17M, the ONO film 44 is patterned by a resist pattern R70, and the surface of the silicon substrate 41 is exposed in the device regions 41B-41K.

Figure 17N:
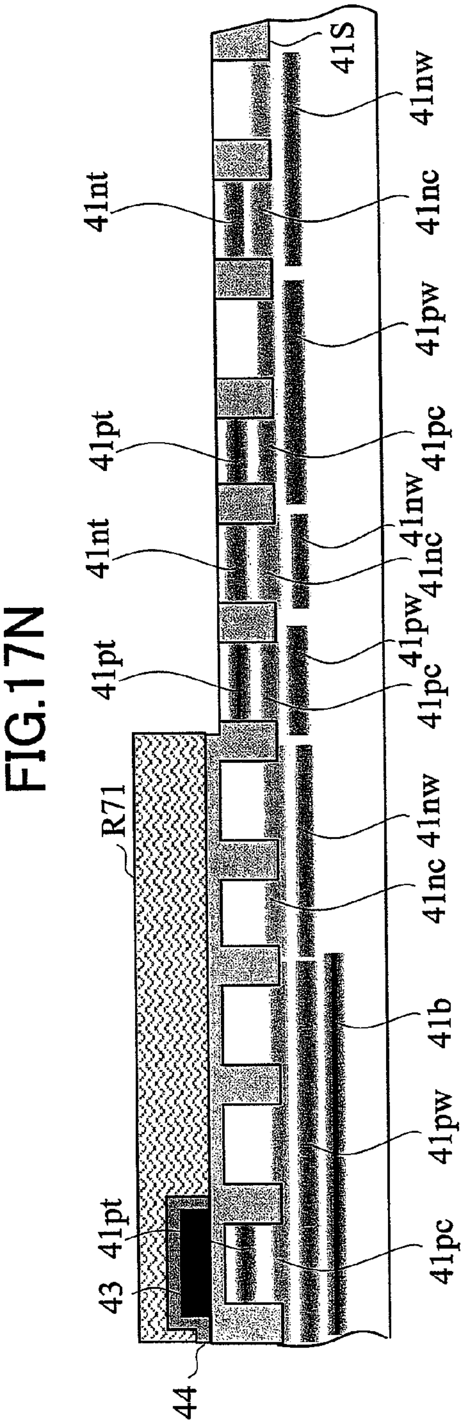

Further, in the step of FIG. 17N, the resist pattern R70 is removed, and, by subjecting the silicon substrate to a thermal oxidation processing at the temperature of 850° C., a silicon oxide film used for the gate insulation film 46 of the high voltage MOS transistor is formed on the silicon substrate surface with the thickness of 13 nm.

In step of FIG. 17N, a resist pattern R71 covering the device regions 41A-41E is formed newly and by patterning the silicon oxide film 46 while using the resist pattern R71 as a mask, the surface of the silicon substrate 41 is exposed in the device regions 41F-41K.

Figure 17O:
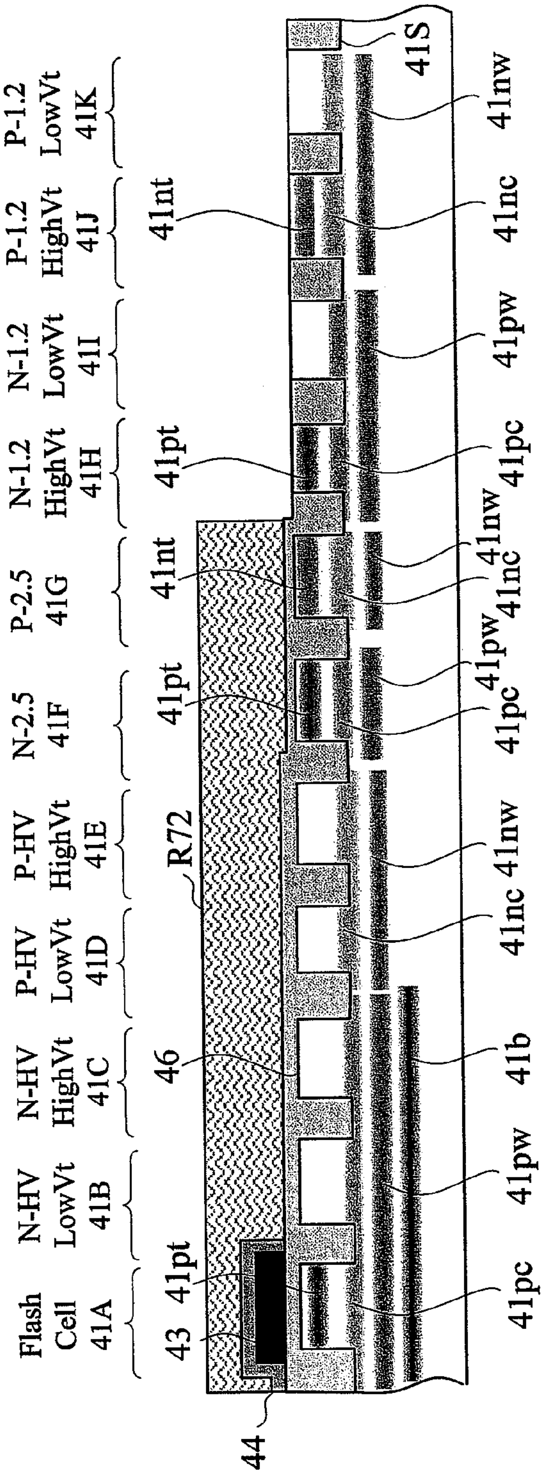

Further, in the step of FIG. 17O, the resist pattern R71 is removed, and by subjecting the silicon substrate 41 to a thermal oxidizing process, a silicon oxide film used for the gate insulation film 48 of the mid voltage MOS transistor is formed on the device regions 41F-41K with the thickness of 4.5 nm. Further, in the step of FIG. 17O, a resist pattern R72 covering the device regions 41A-41G is newly formed, and by patterning the silicon oxide film 48 while using the resist pattern R72 as a the mask, the surface of the silicon substrate 41 is exposed in the device regions 41H-41K.

Figure 17P:
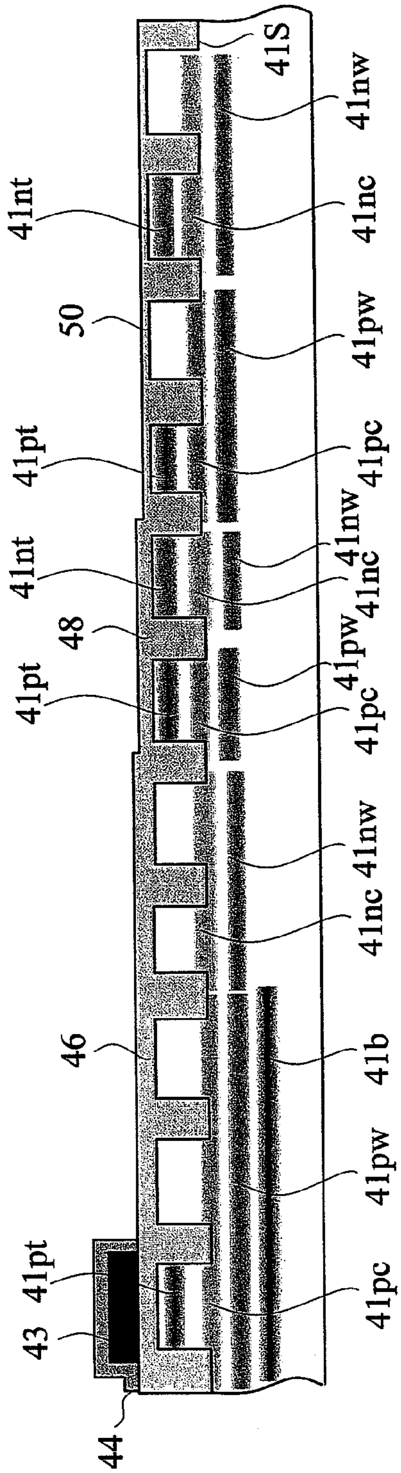

Further, in the process of FIG. 17P, the resist pattern R72 is removed, and by applying a thermal oxidation processing to the silicon substrate 41, a silicon oxide film 50 used for the gate insulation film 50 of the low voltage MOS transistor is formed on the device regions 41H-41K with the thickness of 2.2 nm.

With the present embodiment, too, there are thirteen mask steps from the step of FIG. 17A to the step of FIG. 17P, and there are twelve ion implantation process steps. Thus, it will be noted that the number of the ion implantation process steps is decreased substantially as compared with the case explained with reference to FIG. 4A-4Q in which the conventional technology is expanded. With the present embodiment, too, the resist pattern is formed on the ONO film 44, and there exists no such a process in which the resist film is formed directly on the silicon substrate surface. Thus, there arises no problem of contamination of the substrate by the resist film, and there is caused no formation of projections or depressions on the silicon substrate surface.

With the present embodiment, the p-type well and the channel stopper region are formed before formation of the ONO film 44 in the device regions 41F, 41H and 41I in which the mid voltage MOS transistor and the low voltage MOS transistor are formed. Thus, in these wells, the distribution of the p-type impurity element forming the well becomes bread similarly to the memory cell region 41A or the device regions 41B and 41C.

Even in this case, the n-type impurity element that forming the n-type well in the adjacent device regions 41D-41E, 41G and 41J-41K does not experience the effect of heat treatment and maintains the sharp distribution profile in view of the fact that the ion implantation of the n-type wells is conducted after the formation of the ONO film 44. Accordingly, the problem of punch-through caused along the bottom edge of the device isolation insulation film between the p-type and n-type wells adjacent to the device isolation film explain with reference to FIG. 14 previously is effectively suppressed also in the present embodiment.

Third Embodiment

Next, fabrication process of a semiconductor integrated circuit device according to a third embodiment of the present invention will be explained with reference to FIGS. 18A-18P, wherein those parts explained previously are designated by the same reference numerals and the description thereof will be omitted.

Figure 18A:
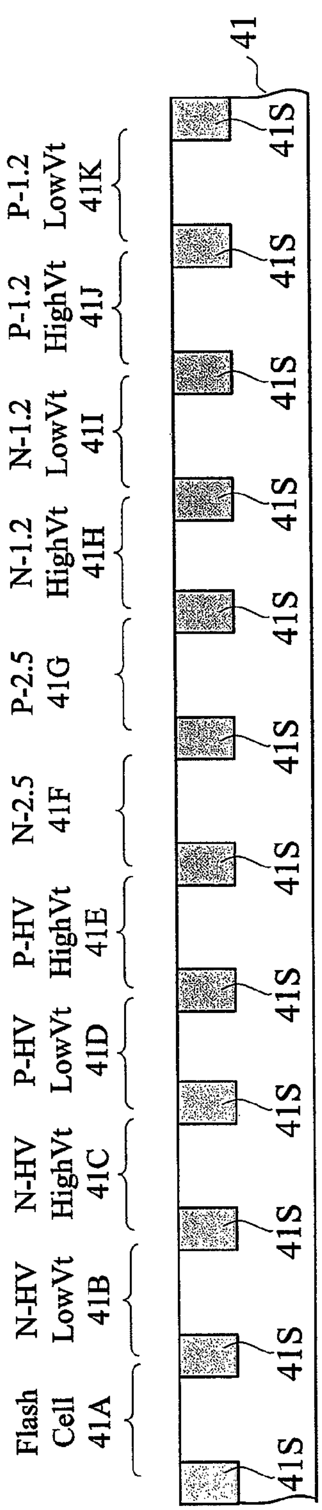
FIGS. 18A-18P are diagrams explaining the fabrication process of a semiconductor integrated circuit device according to a third embodiment of the present invention.

Referring to FIG. 18A, this process corresponding to the process of FIG. 16A or 17A noted before, and device regions 41A-41K are defined on a silicon substrate 41 by an STI device isolation insulation film 41S. Further, while not illustrated, the surface of the silicon substrate 41 is covered by a thermal oxide film of the thickness of 10 nm in the state of FIG. 18A.

Figure 18B:
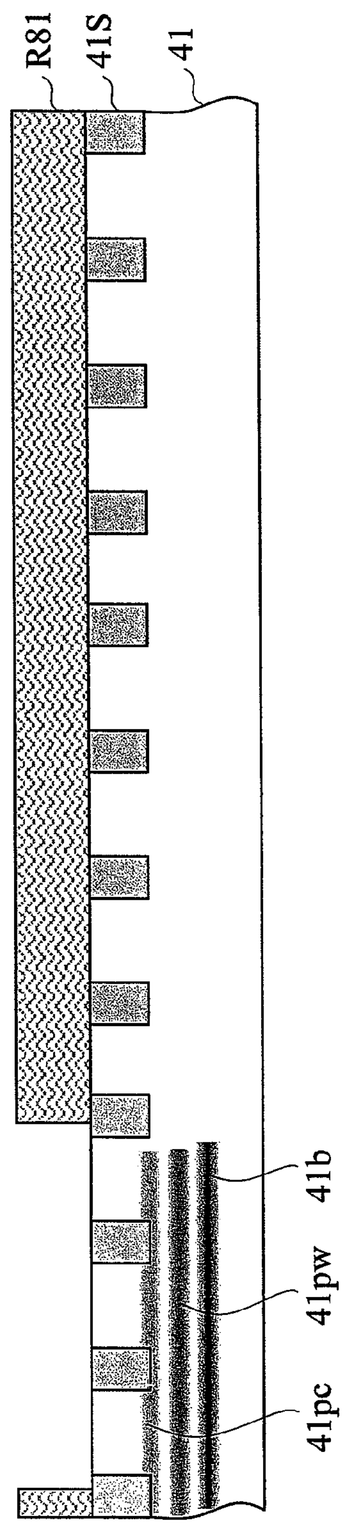

Next, in the step of FIG. 18B, a resist pattern R81 exposing the device regions 41A-41C are formed on the structure of FIG. 18A, while using the resist pattern R81 as a mask, $P^+$ is introduced to a depth 41*b* deeper than the lower edge of the device isolation insulation film 41S by an ion implantation process conducted under the acceleration voltage of 2 MeV with the dose of $2\times10^{13}$ $cm^2$, and with this, an n-type buried impurity region is formed.

Further, in the step of FIG. 18B, $B^+$ is introduced to a depth 41*pw* by an ion implantation process conducted under the acceleration voltage of 400 keV with a dose of $1.5\times10^{13}$ $cm^{-2}$ similarly to the step of FIG. 16B or FIG. 17B, while using the resist pattern R81 as a mask, and a p-type well is formed. Further, in the step of FIG. 18B, $B^+$ is introduced to the depth 41*pc* by an ion implantation process conducted under the acceleration voltage of 100 keV with a dose of $2\times10^{12}$ $cm^{-2}$ while using the resist pattern R61 as a mask. With this, a channel stopper region of p-type is formed at the depth 41*pc*.

Figure 18C:
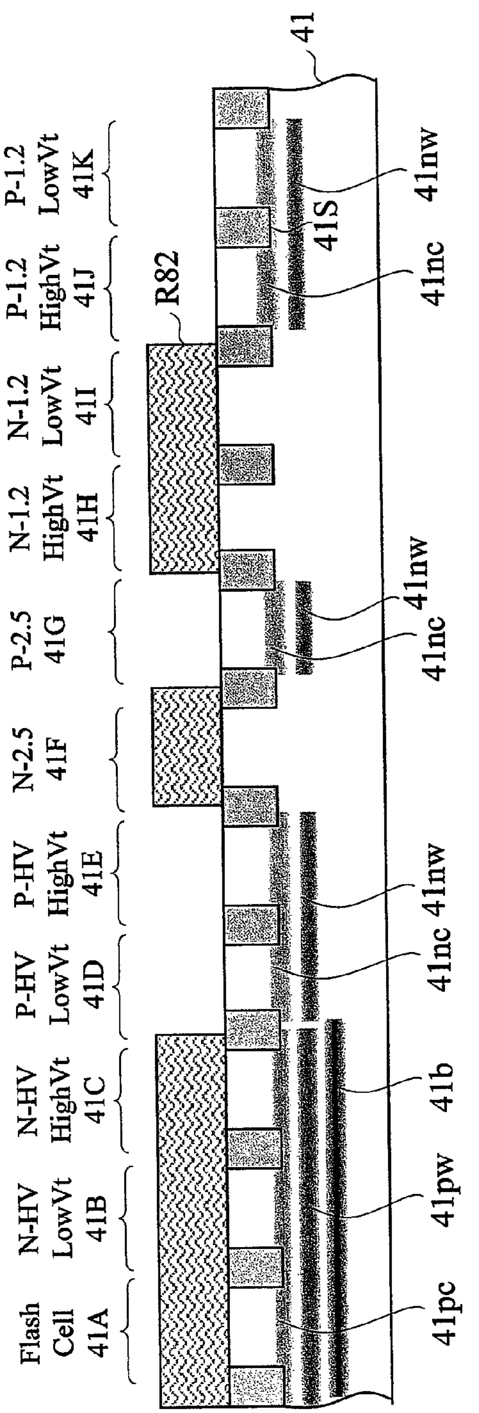

Next, in the step of FIG. 18C, a resist pattern R82 exposing the device regions 41D-41E, 41G and 41J-41K is formed newly on the silicon substrate 41, and $P^+$ is introduced to a depth 14*nw* by an ion implantation process conducted under the acceleration voltage of 600 keV with the dose of $2\times10^{13}$ $cm^{-2}$. With this, an n-type well is formed in the device region. Further, in the step of FIG. 14C, $P^+$ is introduced to a depth 14*nc* by an ion implantation process conducted under the acceleration voltage of 240 keV with the dose of $1\times10^{12}$ $cm^{-2}$ while using the resist pattern R82 as a mask, and an n-type channel stopper region is formed in the device region.

Figure 18D:
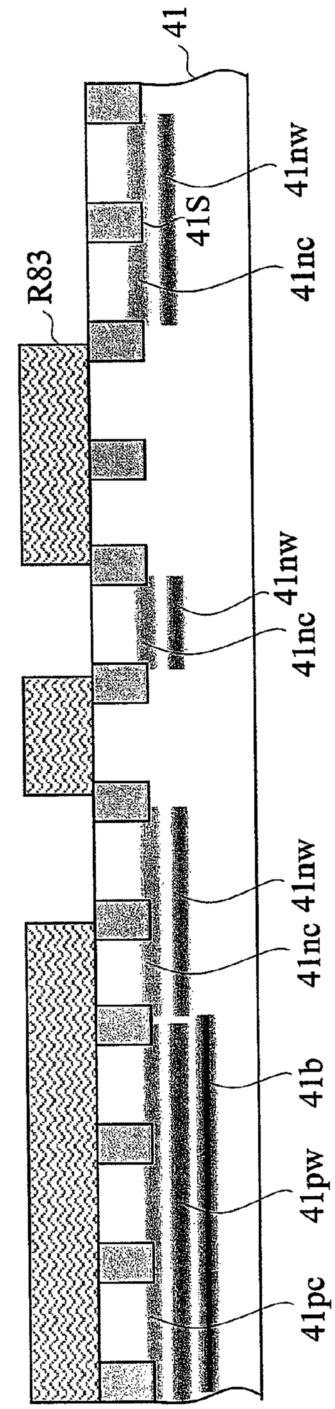

Next, in the step of FIG. 18D, a resist pattern R83 exposing the device regions 41E, 41G and 41J-41K is formed newly on the silicon substrate 41, and $P^+$ is introduced by an ion implantation process under the acceleration voltage of 240 keV with the dose $4.5\times10^{12}$ $cm^{-2}$. With this, the impurity concentration level at the depth 14*nc* is increased in these device regions. With this, the threshold of the high voltage high threshold p-channel MOS transistor formed in the device region 41E is controlled, and the channel stopper concentration is increased in the mid voltage p-channel MOS transistor formed in the device region 41G and the low voltage p-channel MOS transistor formed in the device regions 41J-41K.

Figure 18E:
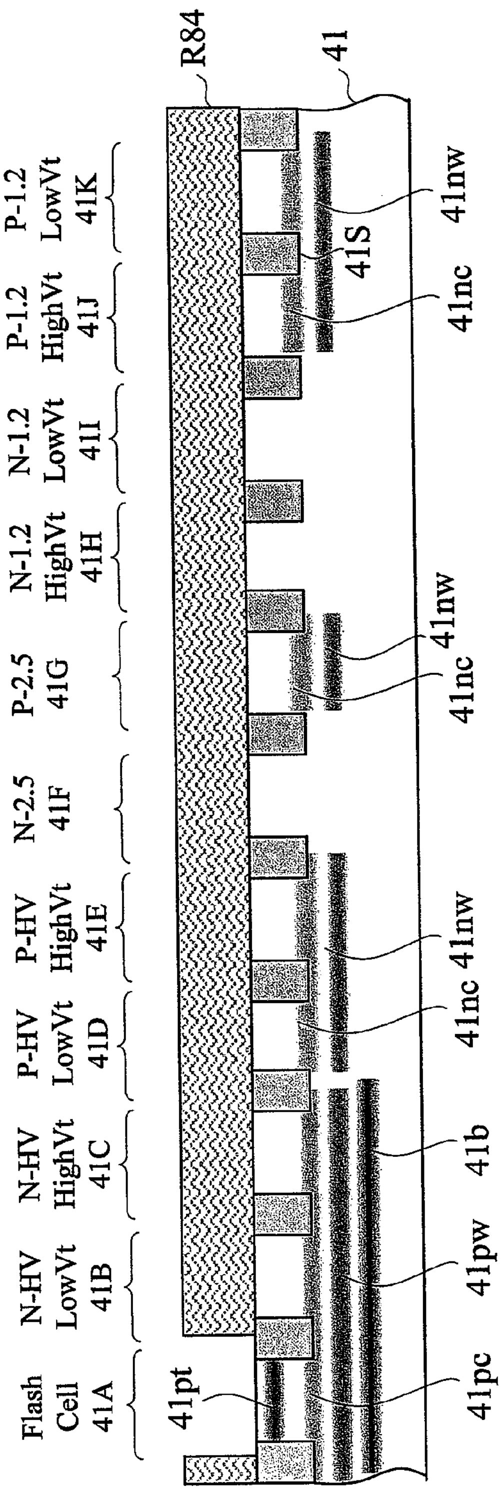

Next, in the step of FIG. 18E, a resist pattern R84 exposing the device region 41A is formed newly on the silicon substrate 41, and while using the resist pattern R84 as a mask, $B^+$ is introduced to a depth 41*pt* by an ion implantation process conducted under the acceleration voltage of 40 keV with the dose of $6\times10^{13}$ $cm^{-2}$, and threshold control is achieved for the flash memory cell transistor formed in the device region 41A.

Figure 18F:
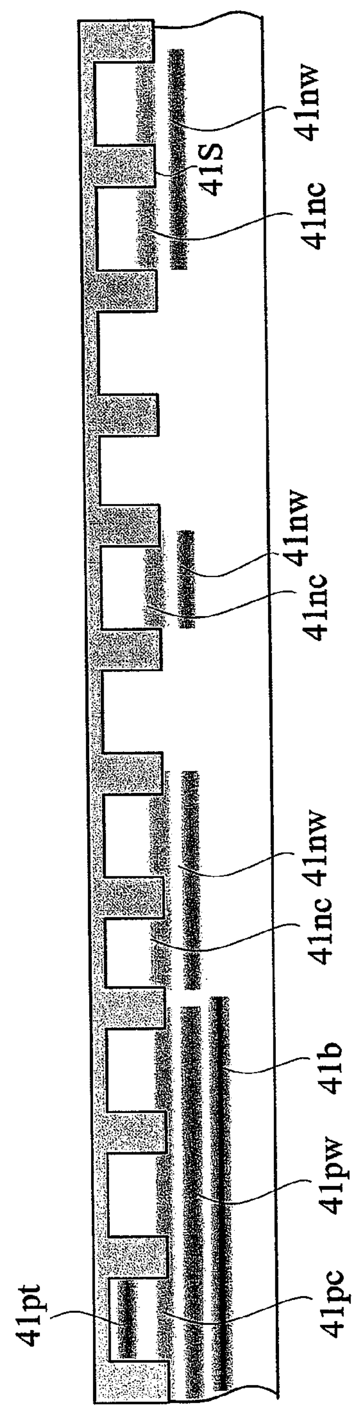

Next, in the step of FIG. 18F, the resist pattern R84 is removed, and, after removing the silicon oxide film formed in the silicon substrate 41 surface in an HF aqueous solution, thermal oxidation processing is applied to the substrate 41 at the temperature of 900-1050° C. for thirty minutes, and a silicon oxide film used for that the tunneling insulation film 42 is formed to the thickness of 10 nm.

Figure 18G:
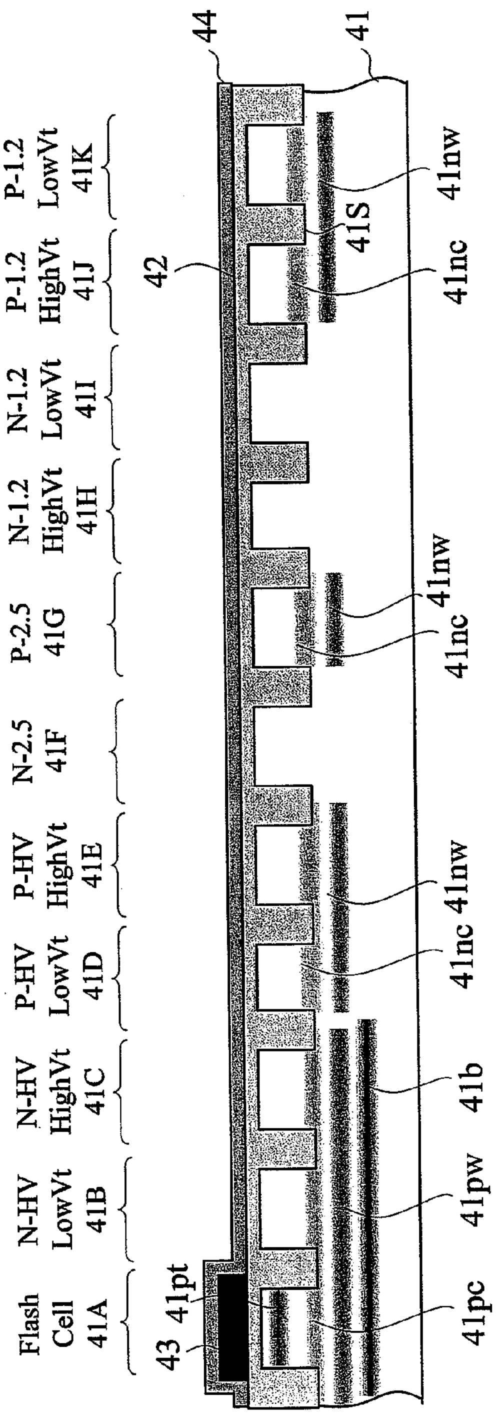

Further, in the step of FIG. 18G, a polysilicon film is deposited on the silicon oxide film 42 to a thickness of 90 nm by a CVD process, and by patterning the same by a resist process not illustrated, a polysilicon floating gate electrode pattern 43 is formed on the silicon oxide film 42 in the device region 41A.

Further, in the step of FIG. 18G, an insulation film having an ONO structure is deposited on the silicon oxide film 42 so as to cover the floating gate electrode pattern 43 as an inter-electrode insulation film 44 of the flash memory device, by depositing an oxide film and a nitride film with respective thicknesses of 5 nm and 10 nm by a CVD process and further processing the surface of the nitride film with a thermal oxidation processing for 90 minutes at 950° C. As a result of the heat treatment process of FIGS. 18F and 18G, the distribution profile of the impurity element introduced previously to the device regions 41A-41E, 41G and 41I-41K undergoes a change to broad profile.

Figure 18H:
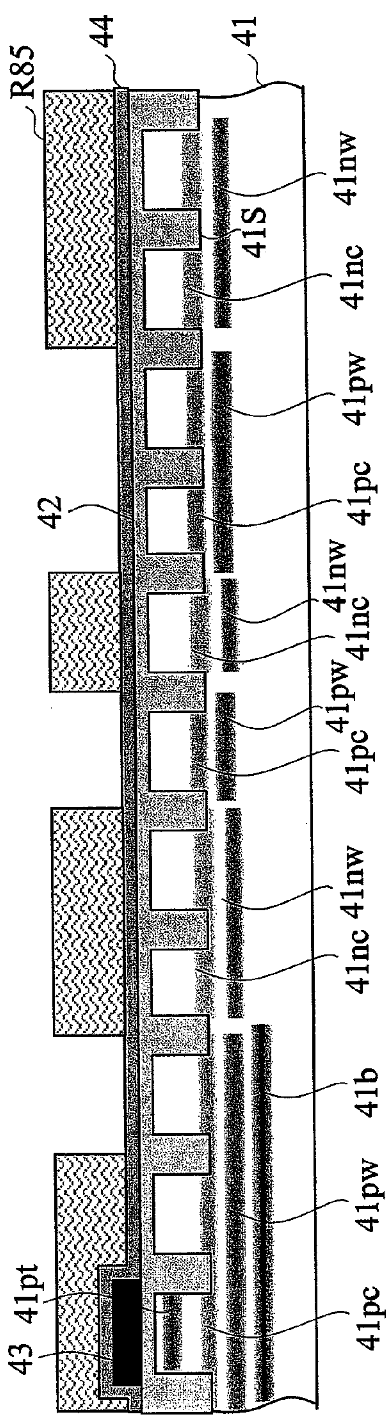

Next, in the step of FIG. 18H, a resist pattern R85 exposing the device regions 41C, 41F and 41H-41I is formed newly on the structure of FIG. 18G, and while using the resist pattern R85 as a mask, $B^+$ is introduced by an ion implantation process under the acceleration voltage of 100 keV with the dose of $8\times10^{12}$ $cm^{-2}$. With this, threshold of the high voltage high threshold n-channel MOS transistor formed in the device region 41C is controlled, and p-type channel stopper regions are formed for the mid voltage or low voltage n-channel MOS transistors in the device regions 41F, 41H and 41I. It has been experimentally demonstrated that punch-through can be suppressed even when the distribution of the impurity element in the n-type well and p-type well is gradual, provided that the distribution of the channel stopper impurity is steep.

Figure 18I:
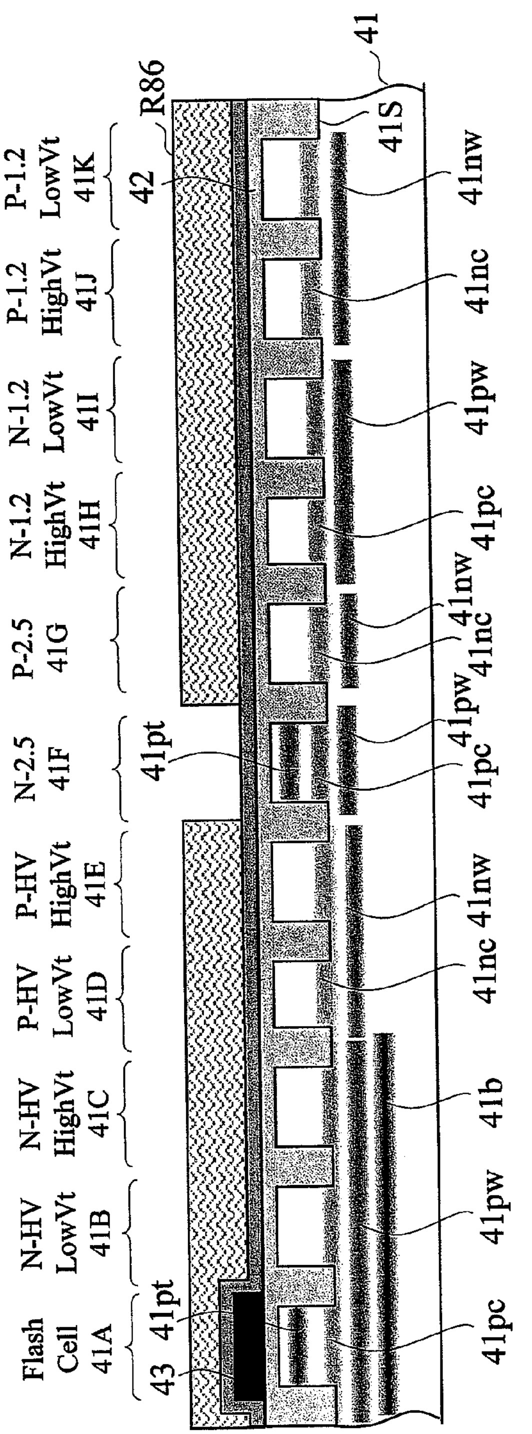

Further, in the step of FIG. 18I, a resist pattern R86 exposing the device region 41F is formed newly on the ONO film 44, and while using the resist pattern R86 as a mask, $B^+$ is introduced to a depth 41*pt* by an ion implantation process conducted under the acceleration voltage of 30 keV with the dose of $5\times10^{12}$ $cm^{-2}$, and threshold control is achieved for the mid voltage n-channel MOS transistor formed in the device region 41F.

Figure 18J:
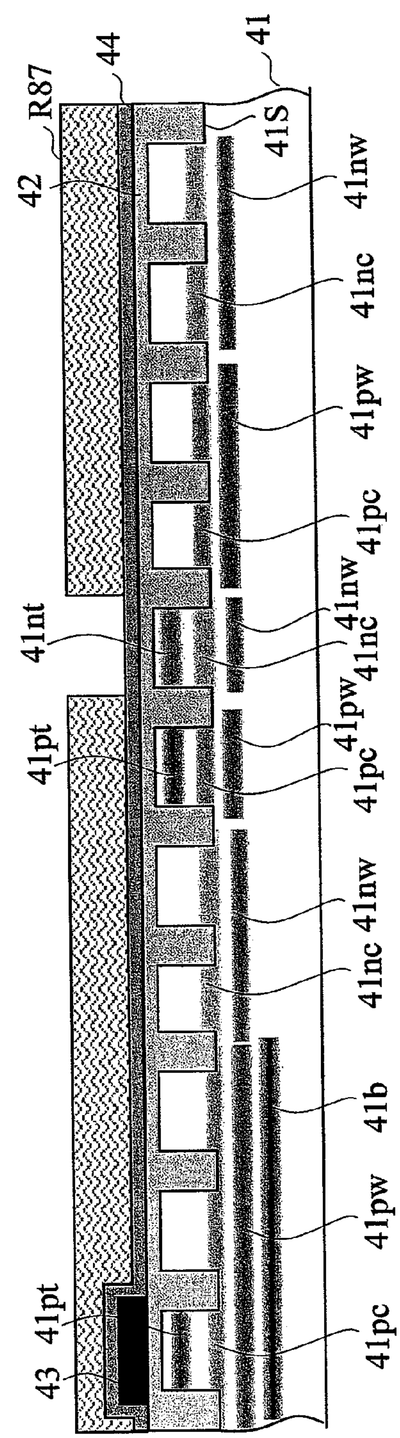

Further, in the step of FIG. 18J, a resist pattern R87 exposing the device region 41G is formed newly on the ONO film 44, and while using the resist pattern R87 as a mask, $As^+$ is introduced to the depth 41*nt* by an ion implantation process conducted under the acceleration voltage of 150 keV with the dose of $3\times10^{12}$ $cm^{-2}$, and threshold control is achieved for the mid voltage p-channel MOS transistor formed in the device region 41G.

Figure 18K:
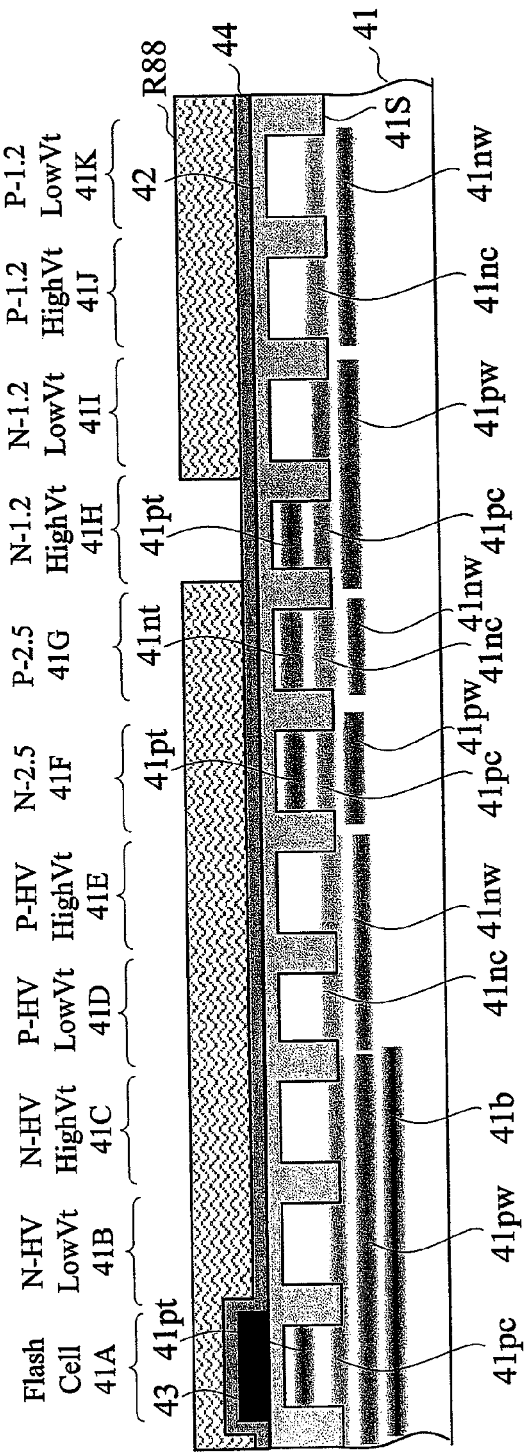

Next in the process of FIG. 18K, a resist pattern R88 exposing the device region 41H is formed newly on the ONO film 44, and while using the resist pattern R88 as a mask, $B^+$ is introduced to a depth 41*pt* by an ion implantation process conducted under the acceleration voltage of 10 keV with the dose of $5\times10^{12}$ $cm^{-2}$. With this, threshold control of the low voltage high threshold p-channel MOS transistor formed in the device region 41H is achieved.

Figure 18L:
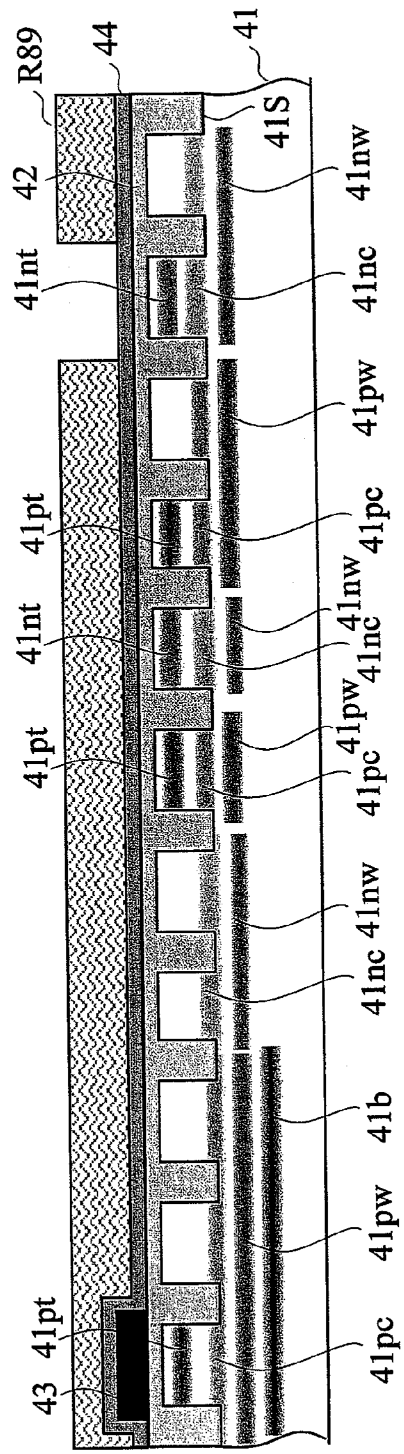

Next in the step of FIG. 18L, a resist pattern R89 exposing the device region 41J is formed newly on the ONO film 44, and while using the resist pattern R89 as a mask, $As^+$ is introduced to a depth 41*nt* by an ion implantation process conducted under the acceleration voltage of 100 keV with the dose of $5\times10^{12}$ $cm^2$, and threshold control is achieved for the low voltage high threshold p-channel MOS transistor formed in the device region 41J.

Figure 18M:
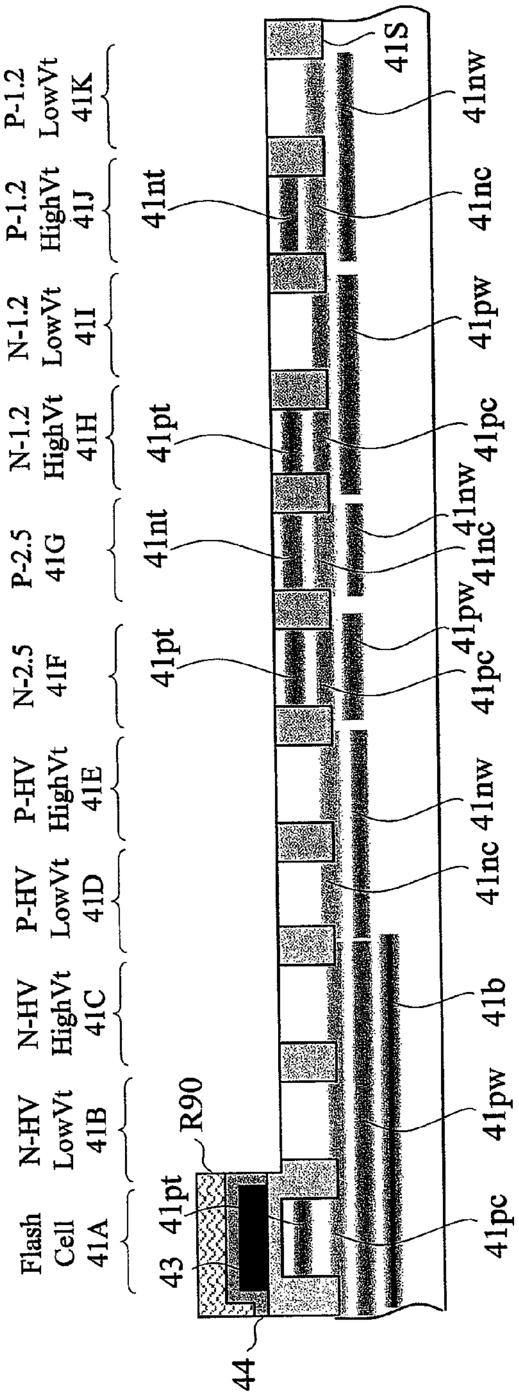

Further, in the step of FIG. 18M, a resist pattern R90 continuously exposing the device regions 41B-41K is formed newly on the ONO film 44. Further, while using the resist pattern R90 as a mask, the ONO film 44 and the silicon oxide film 42 underneath are patterned until the silicon substrate surface is exposed at the device regions 41B-41K.

Figure 18N:
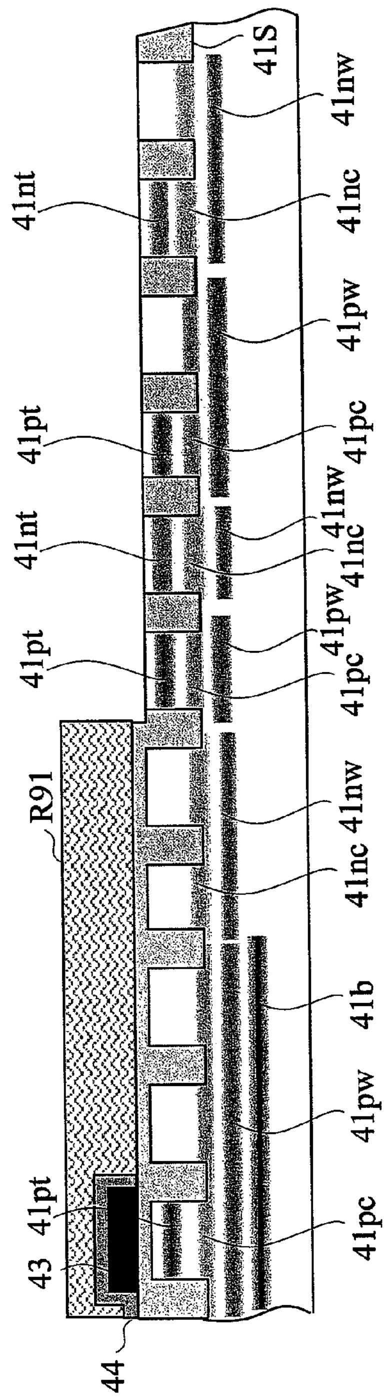

Further, in the step of FIG. 18N, the resist pattern R90 is removed. Further, by processing the silicon substrate 41 by a thermal oxidization processing at 850° C., a silicon oxide film used for the gate insulation film 46 of the high voltage MOS transistor is formed on the silicon substrate surface to the thickness of 13 nm.

In the step of FIG. 18N, a resist pattern R91 covering the device regions 41A-41E is formed newly. Further, by patterning the silicon oxide film 46 while using resist pattern R91 as a mask, the surface of silicon substrate 41 is exposed in the device regions 41F-41K.

Figure 18O:
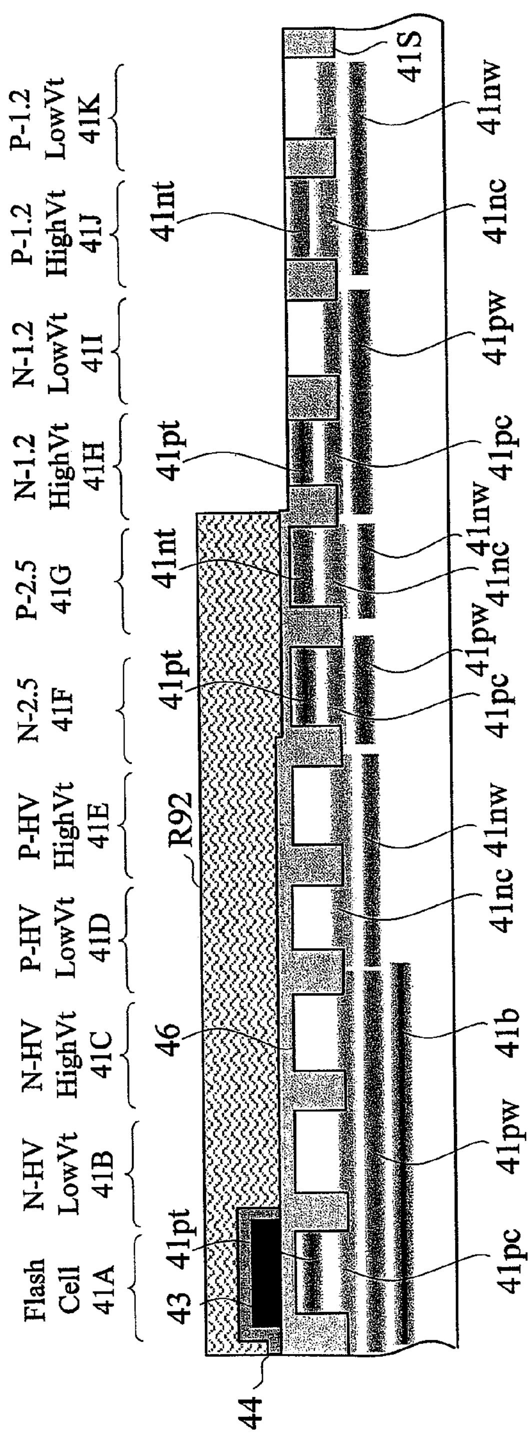

Further, in the step of FIG. 18O, the resist pattern R91 is removed, and by applying a thermal oxidation processing to the silicon substrate 41, a silicon oxide film used for the gate insulation film 48 of the mid voltage MOS transistor is formed on the device regions 41F-41K with the thickness of 4.5 nm.

Further, in the step of FIG. 18O, a resist pattern R92 covering the device regions 41A-41G is formed newly, and while using the resist pattern R92 as a mask, the silicon oxide film 48 it patterned. With this, the surface of the silicon substrate 41 is exposed in the device regions 41H-41K.

Figure 18P:
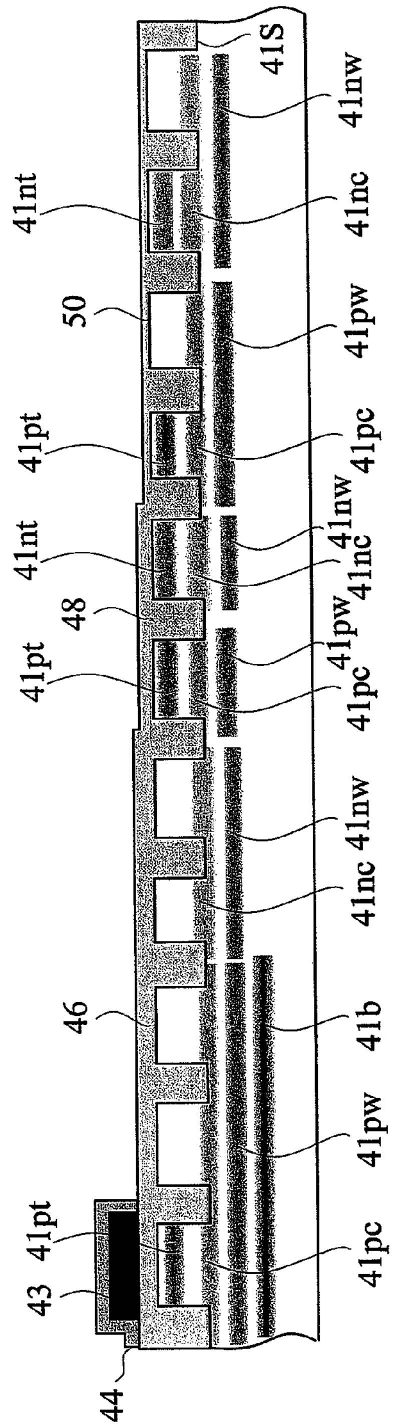

Further, in the step of FIG. 18P, the resist pattern R92 is removed, and by applying a thermal oxidation processing to the silicon substrate 41, a silicon oxide film used for the gate insulation film 50 of the low voltage MOS transistor is formed on the device regions 41H-41K to the thickness of 2.2 nm.

Figure 4A:
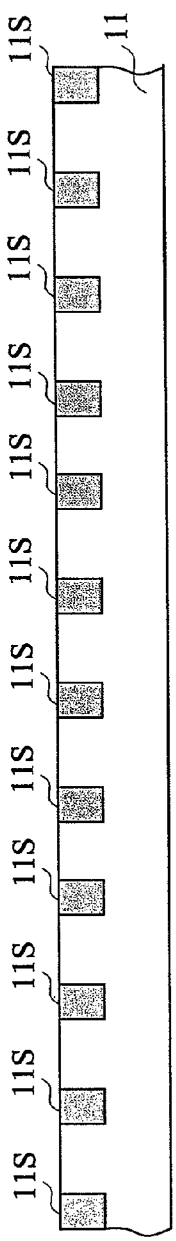
FIGS. 4A-4Q are diagrams showing the fabrication process of a semiconductor integrated circuit device constituting a comparative example of the present invention in which the conventional fabrication process of the semiconductor integrated circuit device of FIGS. 1A-1E is expanded in the investigation made by the inventor of the present invention as the foundation of the present invention.
Figure 4B:
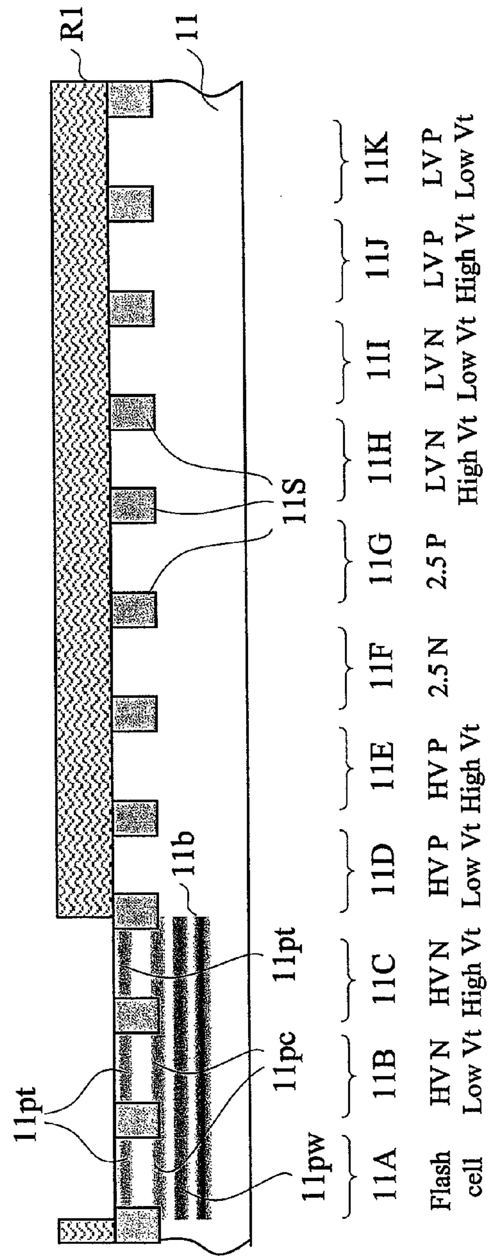
Figure 4C:
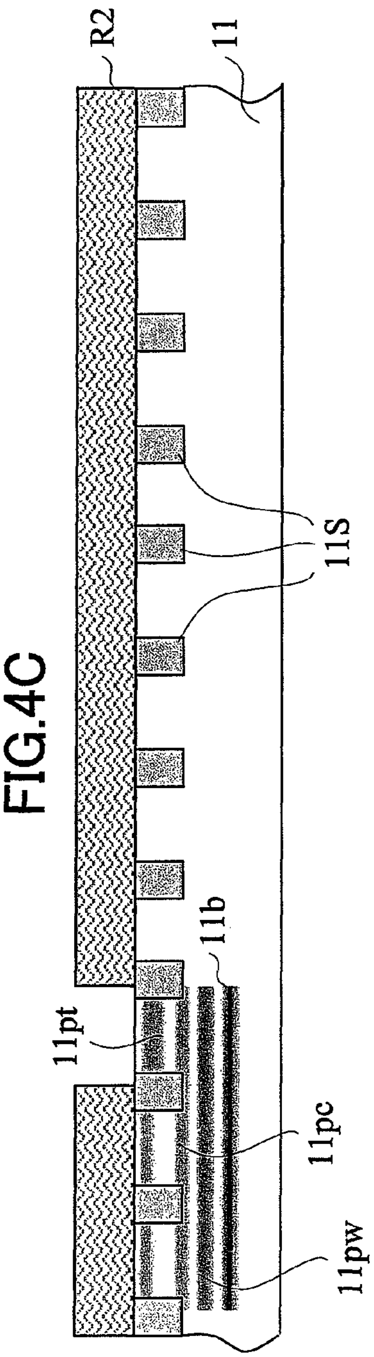
Figure 4D:
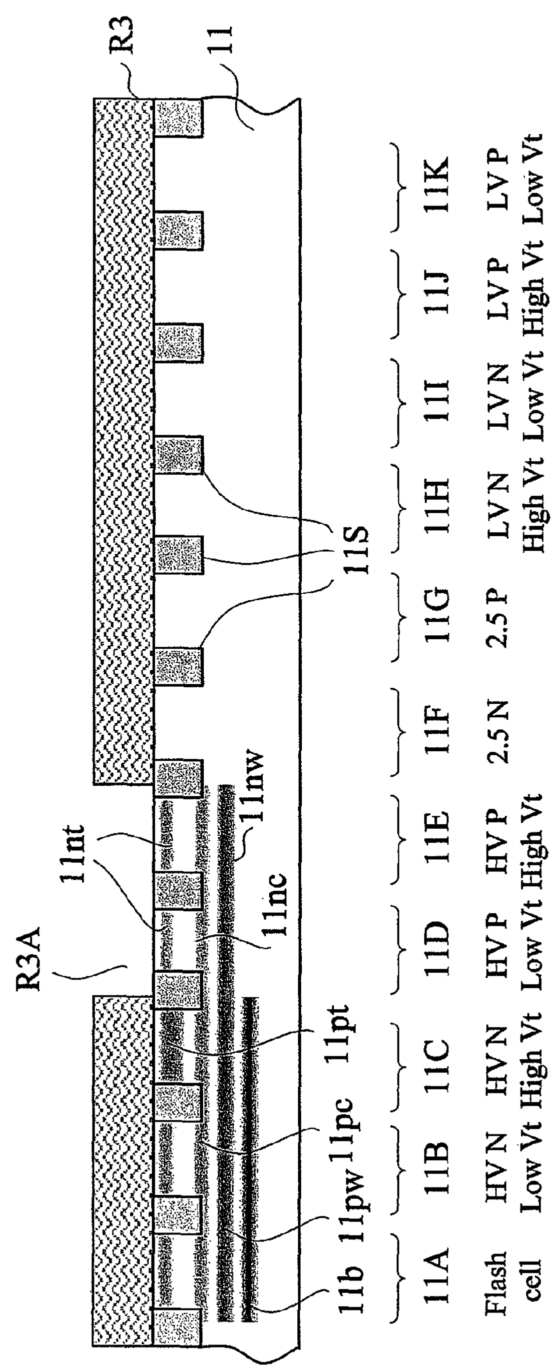
Figure 4E:
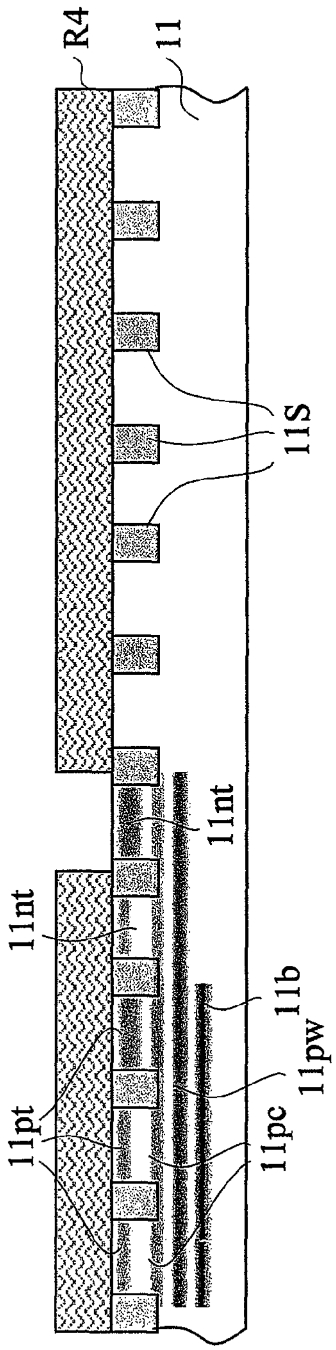
Figure 4F:
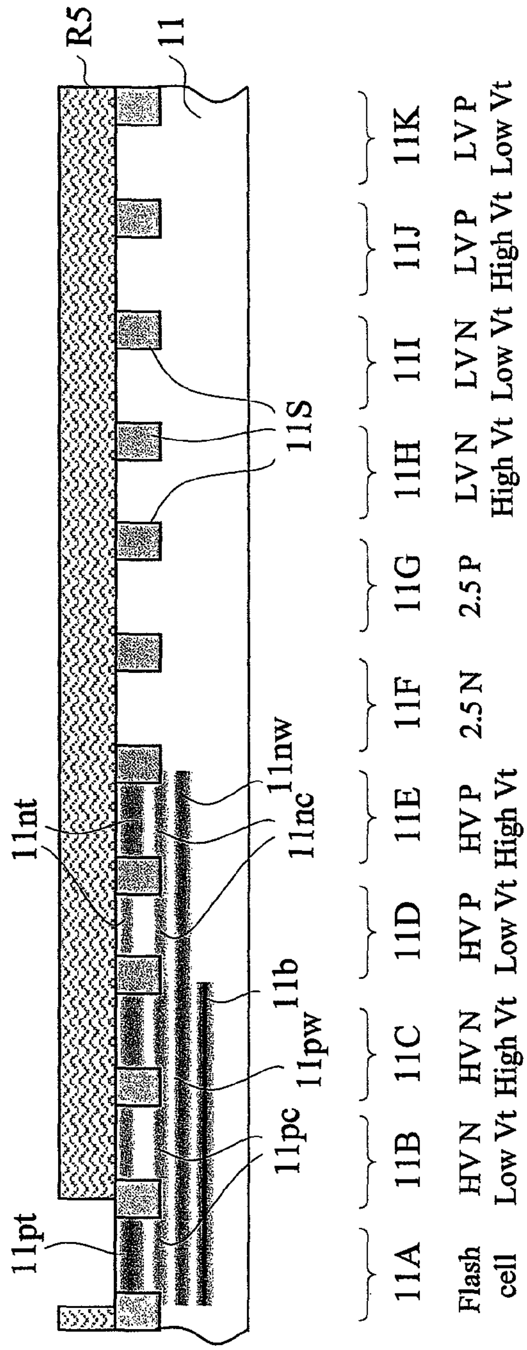
Figure 4G:
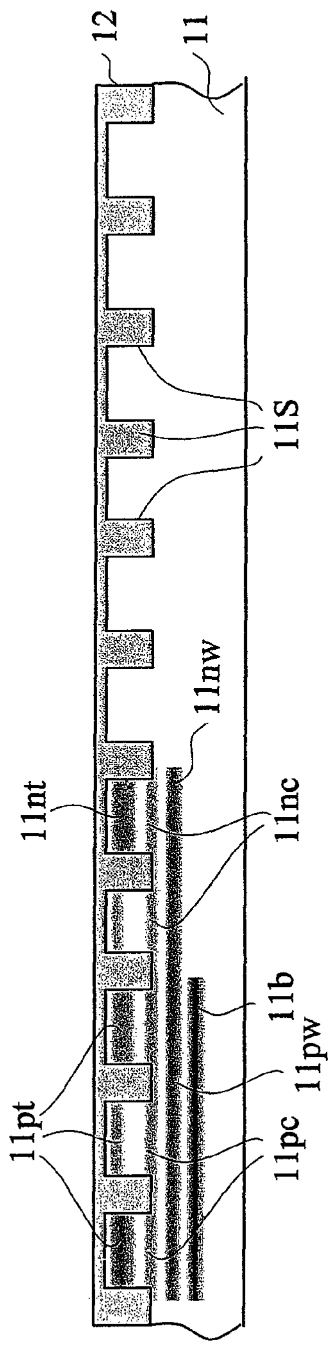
Figure 4H:
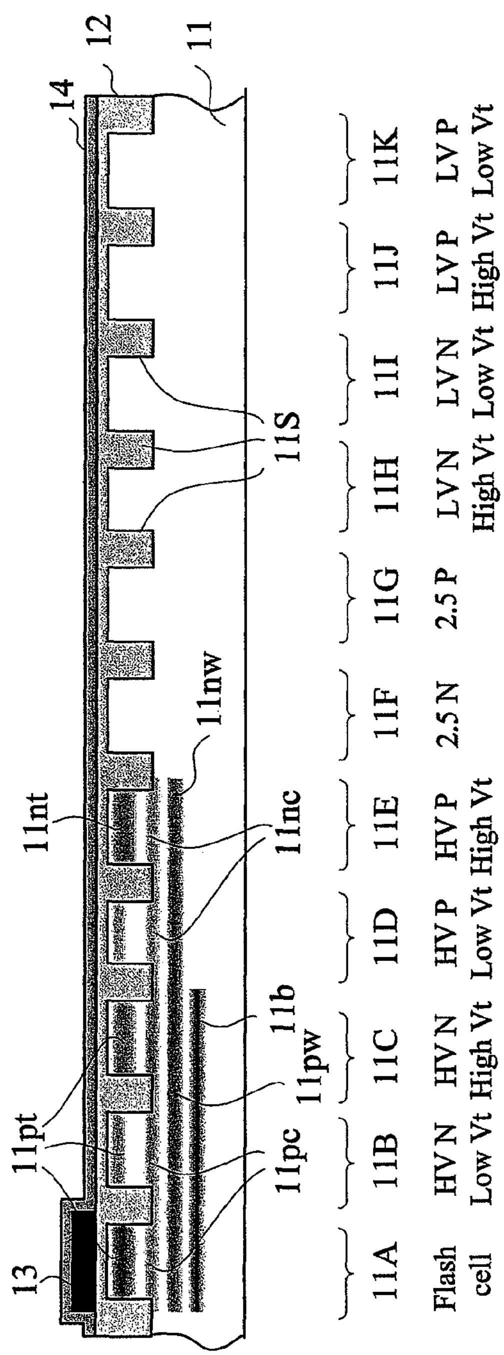
Figure 4I:
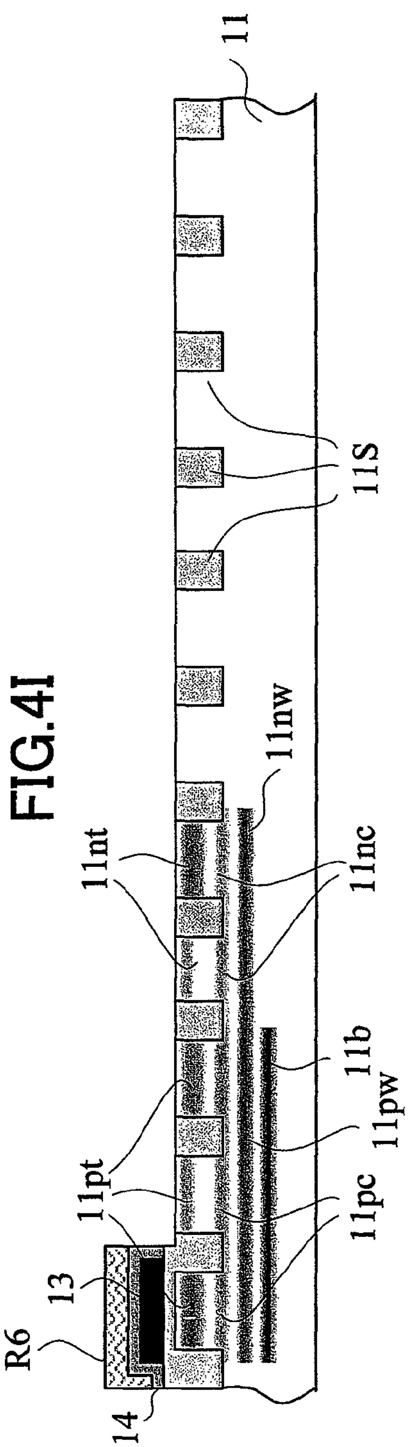
Figure 4J:
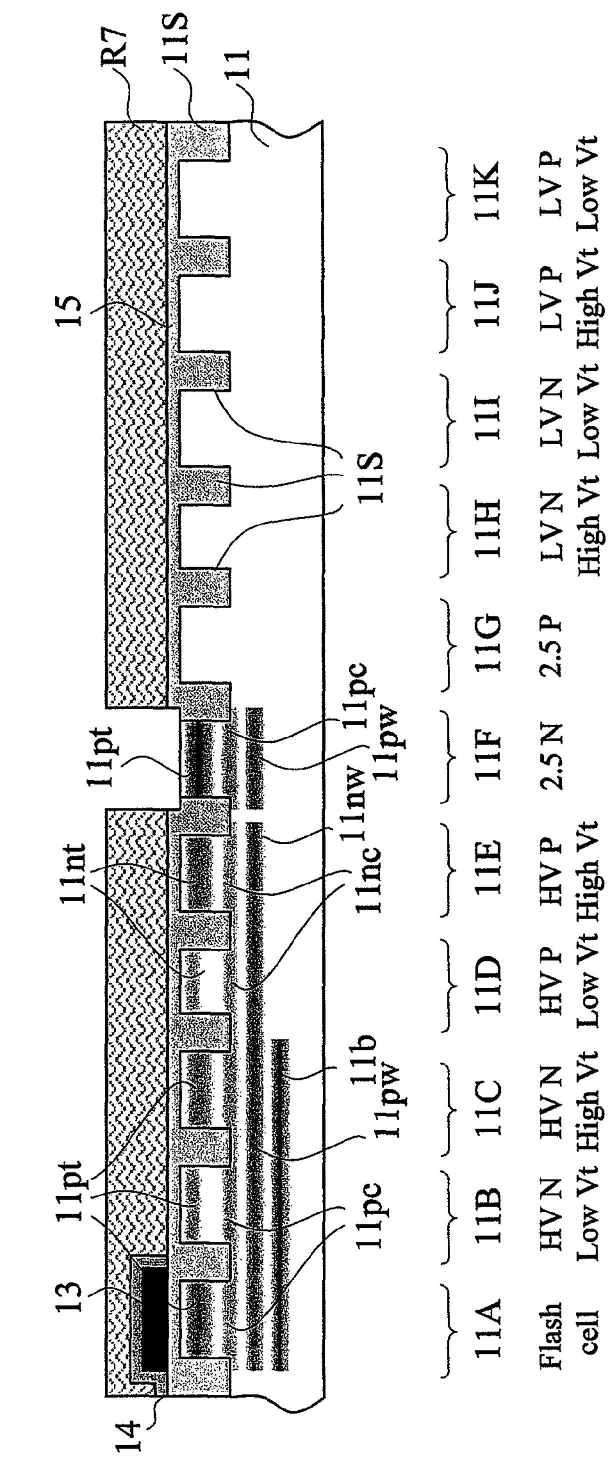
Figure 4K:
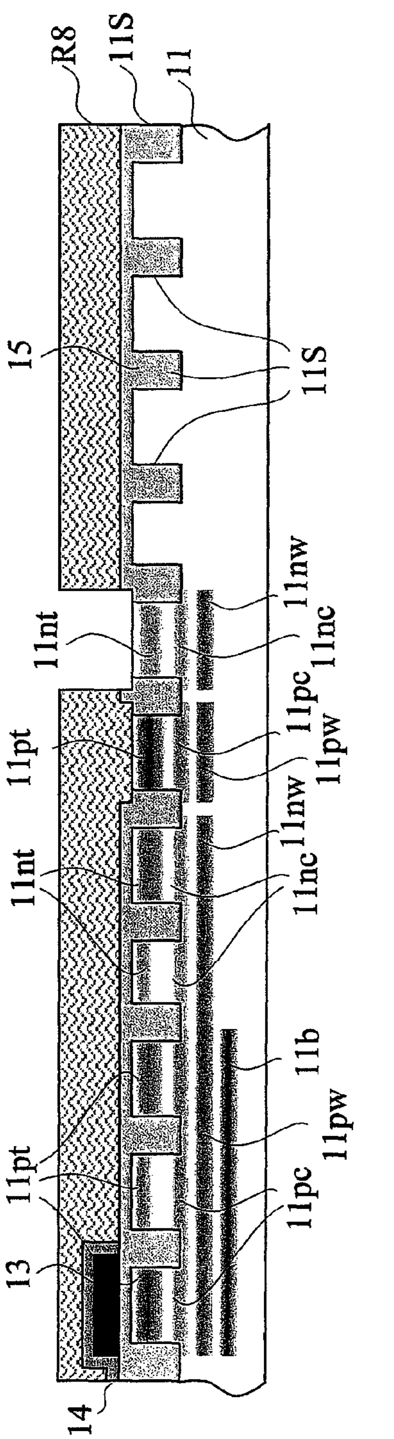
Figure 4L:
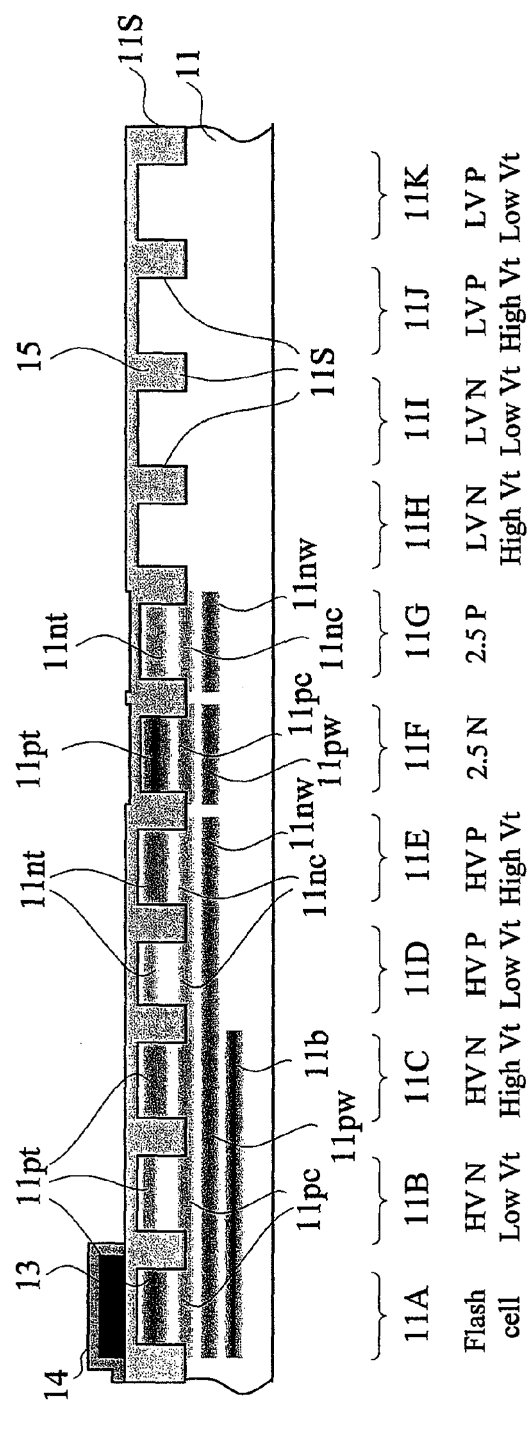
Figure 4M:
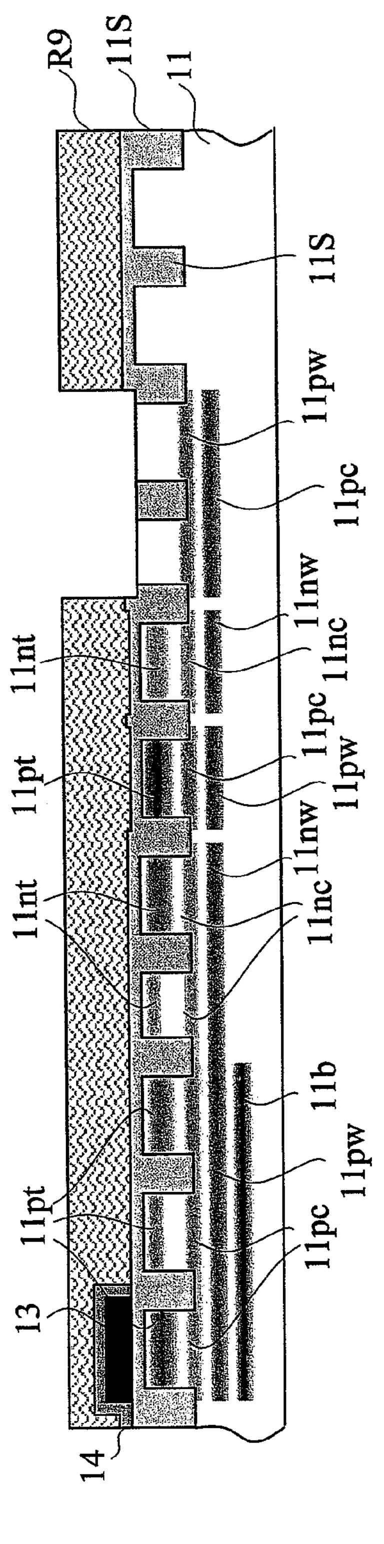
Figure 4N:
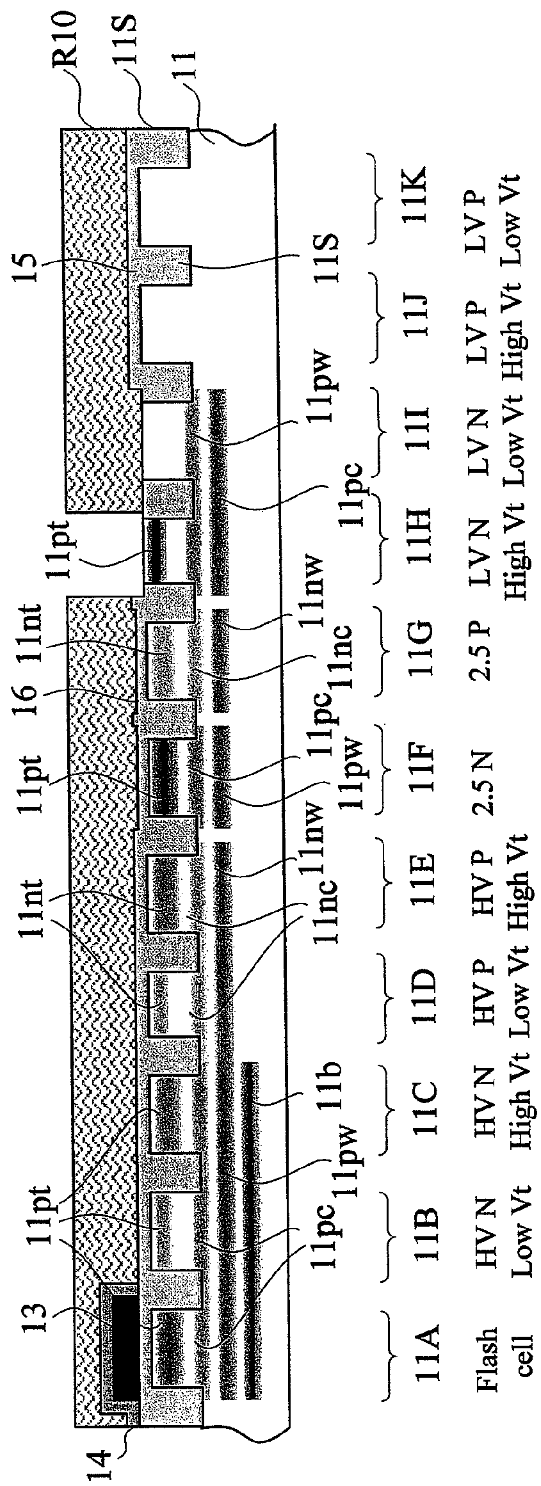
Figure 4O:
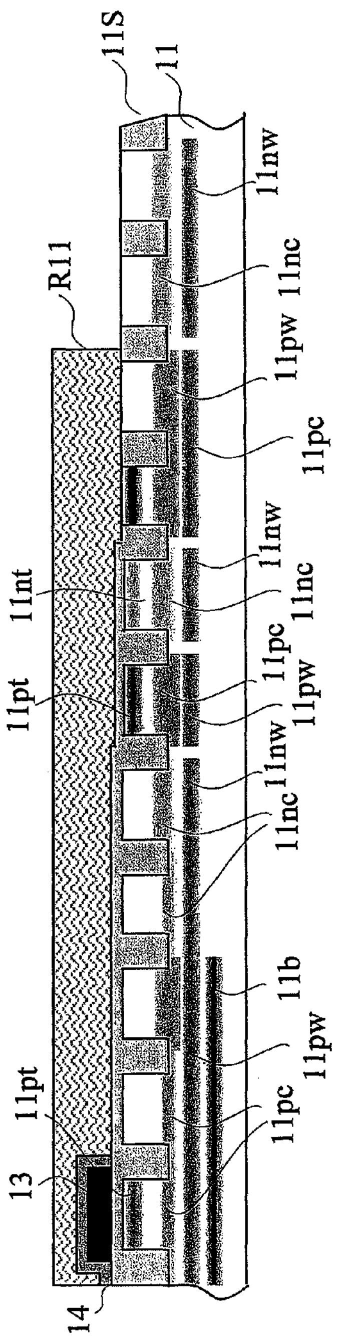
Figure 4P:
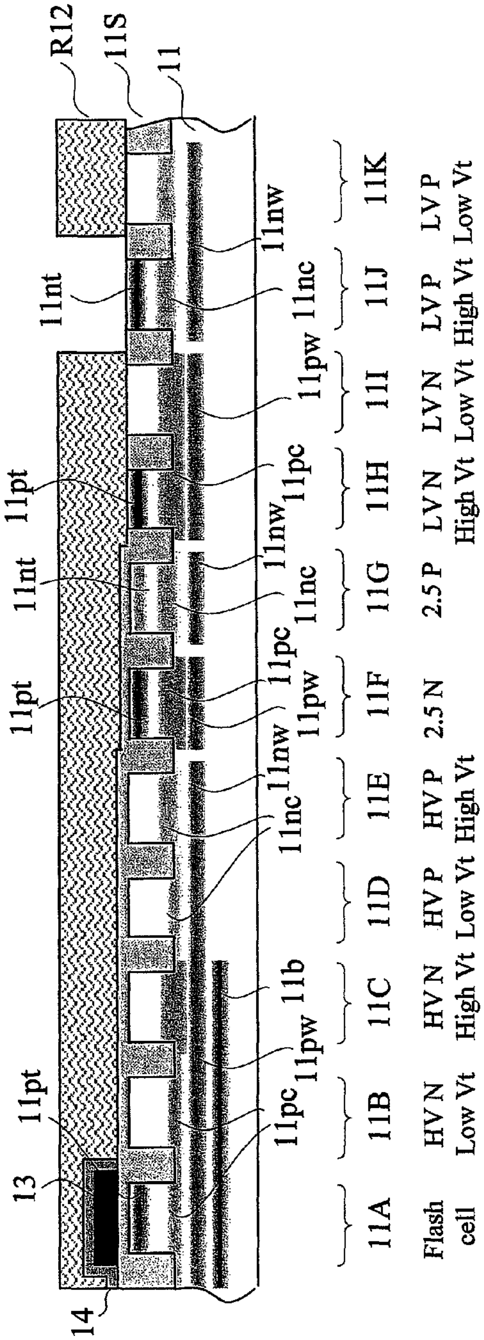
Figure 4Q:
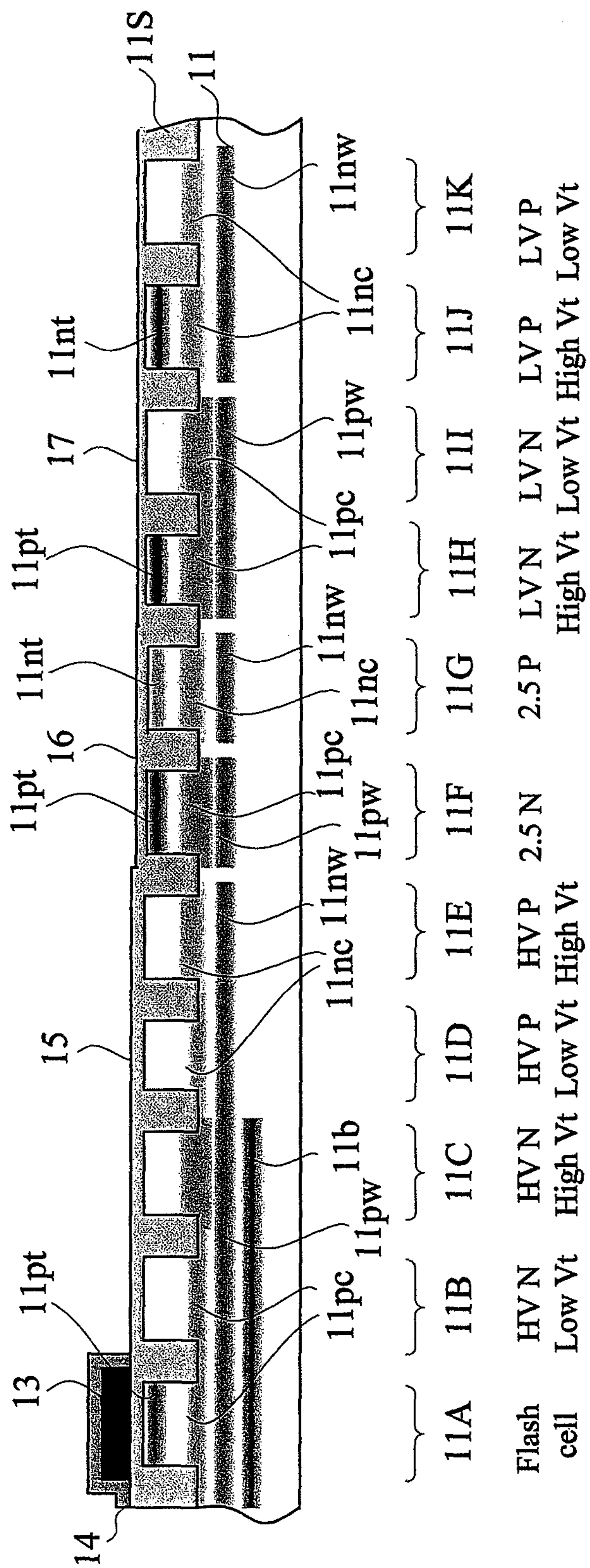
Figure 5A:
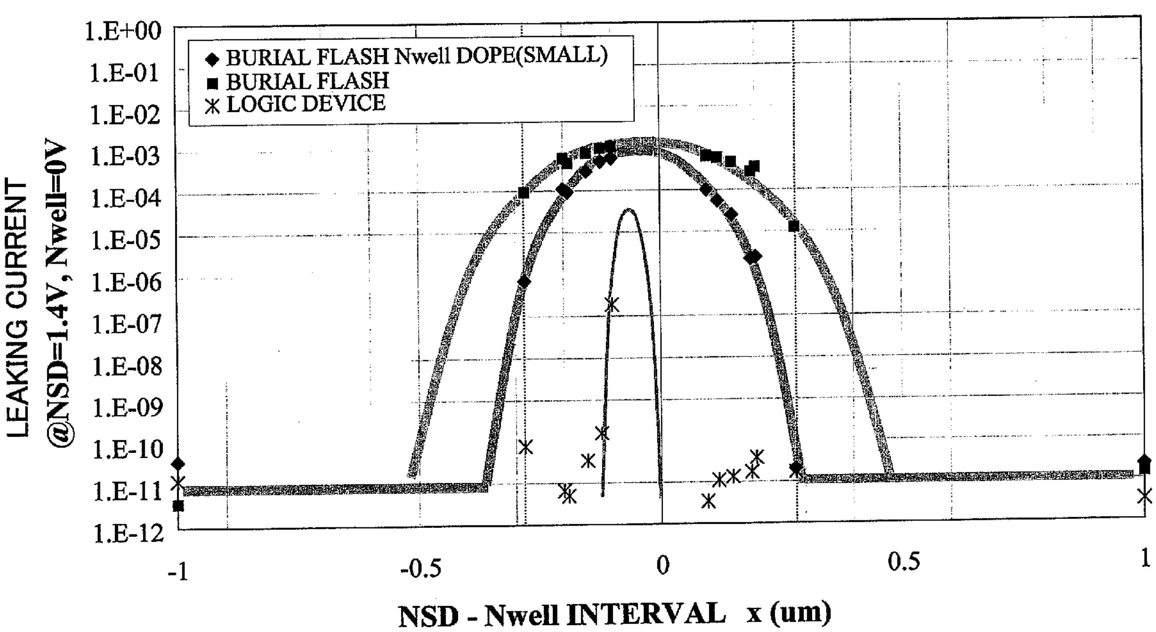
FIGS. 5A and 5B are diagrams explaining the punch-through caused in the process of FIGS. 4A-4Q.
Figure 5B:
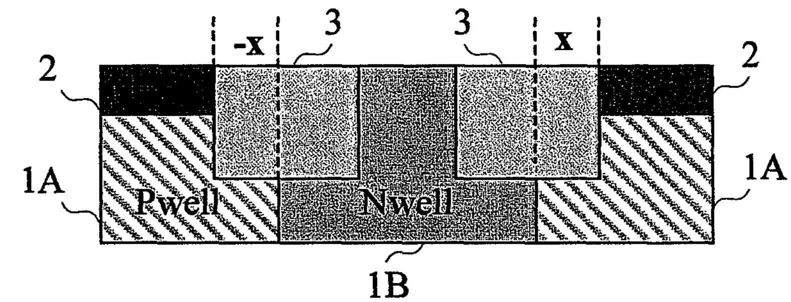

With the present embodiment, there are thirteen mask process steps and thirteen ion implantation process steps in the process from FIG. 18A to FIG. 18P, and thus, it will be noted that the number of the ion implantation process steps is decreased substantially as compared with the case of expanding the conventional technology as explained with reference to FIGS. 4A-4Q. In the present embodiment, too, the resist pattern is formed on the ONO film 44, and there exists no such a process in which the resist film is formed directly on the silicon substrate surface does not exist. Thus, there is caused no problem of contamination of substrate by the resist film, and there occurs no formation of projections or depressions on the silicon substrate surface.

In present embodiment, it should be noted that well formation for the high voltage n-channel MOS transistors and the high voltage p-channel MOS transistors in the device regions 41B-41E is conducted before the formation step of the ONO film 44.

In this case, there occurs mutual diffusion of p-type impurity element and n-type impurity element at the boundary between the mutually adjacent p-type well and n-type well, and there is a possibility that the situation explained previously with reference to FIG. 7 results.

Figure 19:
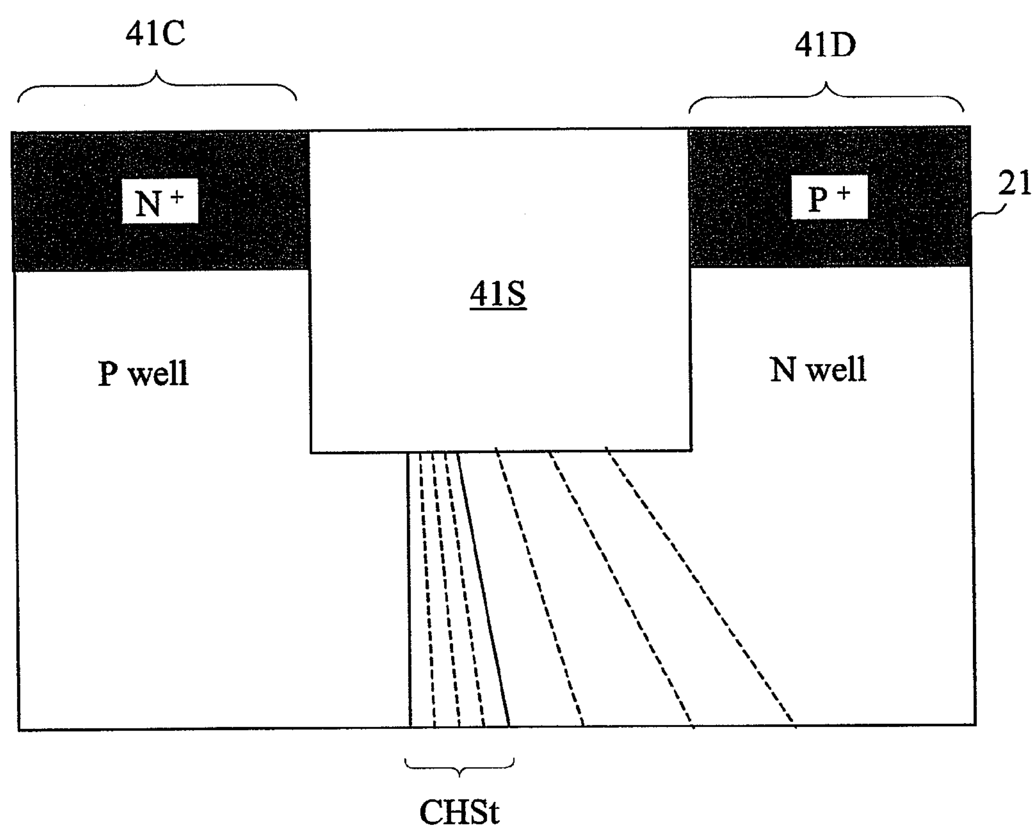
FIG. 19 is a diagram showing the mechanism of suppressing punch-through in the semiconductor integrated circuit device formed with the process of FIGS. 18A-18P.

Thus, in order to avoid this problem, the present embodiment forms the p-type channel stopper region in the device region 41C with steep distribution profile in the step of FIG. 18H. By forming a p-channel stopper region having such a steep distribution profile, it was discovered that punch-through between the $n^+$-type diffusion region in the device region 41C and the n-type well in the device region 41D is suppressed effectively as shown in FIG. 19. On the other hand, there is a tendency that punch-through does not occur easily between a $p^+$-type diffusion region in an n-type well and a p-type well adjacent thereto, and such a punch through can be suppressed by merely increasing the impurity concentration level of the n-type well with respect to the p-type well slightly.

Referring to FIG. 19, it can be seen that there occurs extensive diffusion of the p-type impurity element in the n-side well of the device region 41D from the p-type well of the device region 41C, while it can be seen also that the p-type channel stopper impurity element CHSt maintains a steep distribution profile.

Fourth Embodiment

Figure 20:
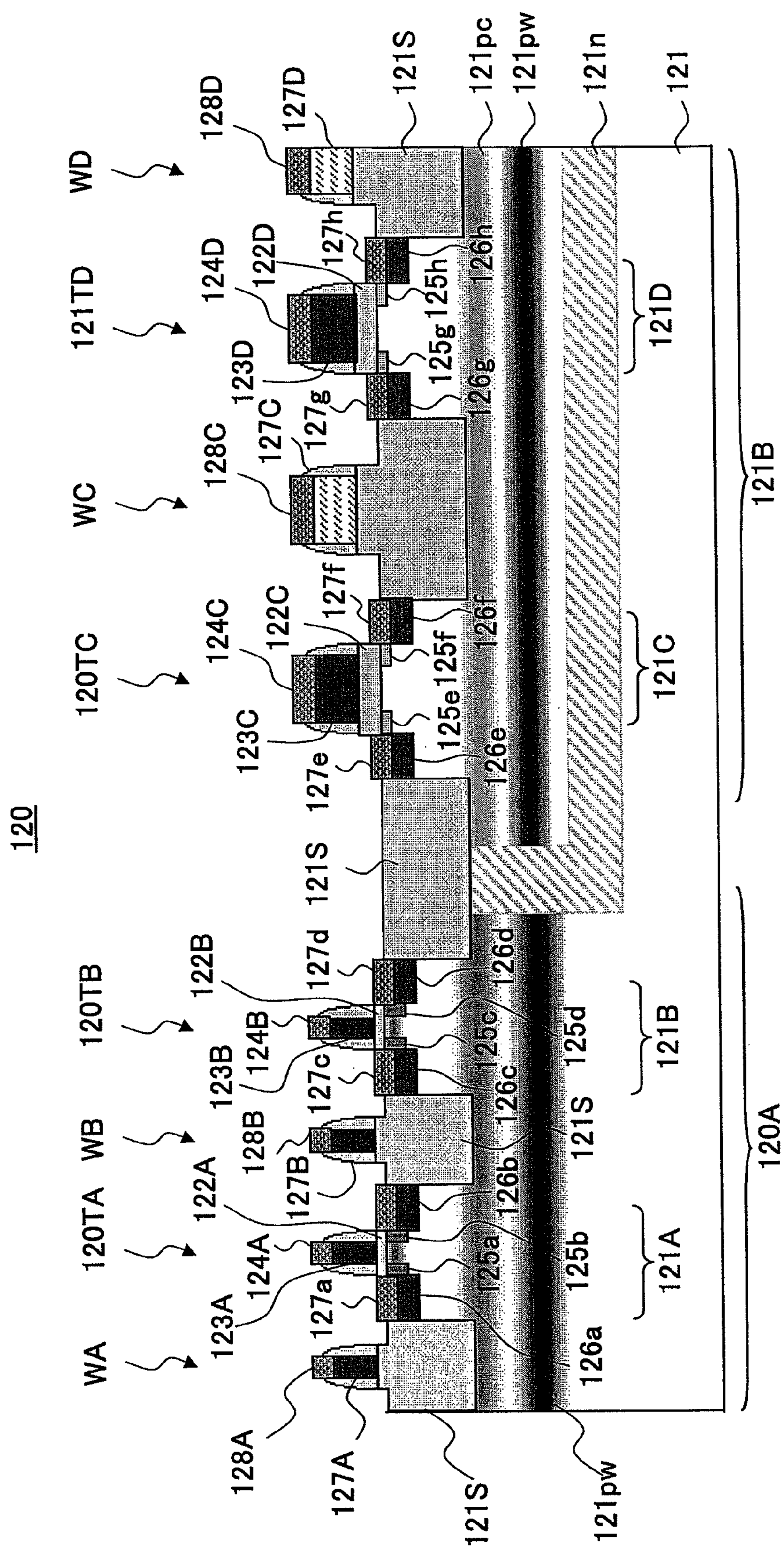
FIG. 20 is a diagram showing the construction of a semiconductor integrated circuit device according to a fourth embodiment of the present invention.

FIG. 20 is a diagram explaining the construction of a semiconductor integrated circuit device 120 according to a fourth embodiment of the present invention.

Referring to FIG. 20, there are defined a low voltage device region 120A and a high voltage device region 120B on a silicon substrate 121 by a device isolation insulation film 121S of an STI structure, wherein device regions 121A and 121B are defined in the low voltage region 120A by the device isolation insulation film 121S, while device regions 121C and 121D are defined in the high voltage region 120B by the device isolation insulation film 121S.

On the device region 121A, there is formed a polysilicon gate electrode 123A via a first gate insulation film 122A having a first film thickness, and a metal silicide film 124A is formed on the polysilicon gate electrode 123A. Similarly, there is formed a polysilicon gate electrode 123B on the device region 121B via a gate insulation film 122B having the first film thickness, and a metal silicide film 124B is formed on the polysilicon gate electrode 123B.

Similarly, a polysilicon gate electrode 123C is formed on the device region 121C via a gate insulation film 122C having a second film thickness larger than the first film thickness, and a metal silicide film 124C is formed on the polysilicon gate electrode 123C. Similarly there is formed a polysilicon gate electrode 123D on the device region 121D via a gate insulation film 122D having the second film thickness, and a metal silicide film 124D is formed on the polysilicon gate electrode 123D.

In the device region 121A, LDD regions 125*a* and 125*b* of n-type are formed at respective lateral sides of the gate electrode 123A, while in the device region 121B, there are formed LDD regions 125*c* and 125*d* of n-type similarly at respective lateral sides of the gate electrode 123B. Further, in the device region 121C, LDD regions 125*e* and 125*f* of n-type are formed at respective lateral sides of the gate electrode 123C, while in the device region 121D, there are formed LDD regions 125*g* and 125*h* of n-type at respective lateral sides of the gate electrode 123D.

Further, in each of the gate electrodes 123A-123D, there are formed a pair of sidewall insulation films on the sidewall surfaces thereof, and there are formed diffusion region 126*a* and 126*b* of $n^+$-type in the silicon substrate 121 at respective outer sides of the sidewall insulation films in the device region 121A. Similarly, in the device region 121B, diffusion regions 126*c* and 126*d* of $n^+$-type are formed in the silicon substrate 21 at respective outer sides of the sidewall insulation films. Further, in the device region 121C, diffusion regions 126*e* and 126*f* of $n^+$-type are formed in the silicon substrate 121 at respective outer sides of the sidewall insulation films, and in the device region 121D, the diffusion regions 126*h* and 126*g* of $n^+$-type are formed in the silicon substrate 121 at respective outer sides of the sidewall insulation films. Further, silicide layers 127*a* and 127*b* are formed on the respective surfaces of the $n^+$-type diffusion regions 126*a* and 126*b*, and silicide layers 127*c* and 127*d* are formed on the respective surfaces of the diffusion regions 126*c* and 126*d*. Further, silicide layers 127*e* and 127*f* are formed on the respective surfaces of the diffusion regions 126*e* and 126*f*, and silicide layers 127*h* and 127*g* are formed on the respective surfaces of the diffusion regions 126*g* and 126*h*.

Further, with the semiconductor integrated circuit device 120 of FIG. 20, a channel stopper region of p-type is formed in the low voltage region 120A for the device regions 121A and 121B at a depth 121*pc* generally corresponding to the depth of the device isolation insulation film 121S, and a p-type well is formed at a depth 21*pw* further underneath the depth 121*pc*. Further, in the vicinity of the substrate surface of the device regions 121A and 121B, there are formed channel doping regions of p-type for threshold control of the transistors 120TA and 120TB.

In the high voltage region 120B, on the other hand, there is formed a buried region of n-type at a depth 121*n* deep in the substrate, and a p-type well is formed thereabove in correspondence to the depth 121*pw*, and a p-type channel stopper region is formed in correspondence to a depth pc. Further, underneath the device isolation insulation film 121S between the low voltage region 120A and the high voltage region 120B, there is formed an n-type impurity region reaching the n-type buried region.

With the semiconductor integrated circuit device of the present embodiment, the concentration of the p-type impurity element of the channel stopper region formed in the high voltage region 120B at the depth pc is set to be lower than the concentration of the p-type impurity element of the channel stopper region formed in the low voltage region 120A at the depth pc, and with this, the threshold voltages of the high-voltage transistors 120TC and 120TD are controlled. Further, with this, a large junction breakdown voltage is secured for the high-voltage transistors 120TC and 120TD, and it becomes possible to carry out the desired high voltage operation with stability.

Further, with the semiconductor integrated circuit device 120 of FIG. 20, it should be noted that, in the low voltage region 120A, a conductor pattern WA is formed by stacking a polysilicon layer 127A and a metal silicide layer 128A on the device isolation insulation film 121S or a conductor pattern WB is formed by stacking a polysilicon layer 127B and a metal silicide layer 128B on the device isolation insulation film 121S as an interconnection pattern, while in the high voltage region 120B, there is formed a conductor pattern WC on the device isolation insulation film 121S by stacking a polysilicon layer 127C and a metal silicide layer 128C or a conductor pattern WD is formed on the device isolation insulation film 121S in the form of stacking of a polysilicon layer 127D and a metal silicide layer 128D as an interconnection pattern, wherein it should be noted that the polysilicon layers 127A and 127B forming the conductor patterns-WA and WB are doped to $n^+$-type, while the polysilicon layers 127C and 127D forming the conductor patterns WC and WD are not doped by impurities. Thus, the polysilicon layers 127C and 127D are formed of so-called i-type (intrinsic) polysilicon.

Thus, in the case a voltage is applied to the conductor pattern WC or WD, this voltage is not applied to the device isolation insulation film 21S underneath directly but there is formed a depletion layer in the undoped polysilicon layer. Thus, the voltage transmitted through the conductor pattern WC or WD is applied to the device isolation insulation film 121S via the depletion layer, and as a result, there occurs an increase of threshold voltage in the parasitic field transistor formed right underneath the device isolation insulation film 121S in correspondence to the conductor pattern WC. With this, the punch-through caused between the n-type diffusion region 126*f* forming a part of the transistor 120TC and the n-type well of the transistor 120TD adjacent thereto across the device isolation insulation film 121S in response to the conduction of the parasitic field effect transistor, is effectively blocked.

In the case the width of the device isolation insulation film 121S is 0.6 μm and the depth thereof is 300 nm, it is possible to increase the threshold voltage of the parasitic field transistor that is formed right under the device isolation insulation film 121S from 10V to 15V.

Because a low-resistance silicide layer 128C or 128D is formed on the surface of the conductor pattern WC or WD with the semiconductor integrated circuit device 120, there occurs no increase of resistance in these conductor patterns.

Thus, with the semiconductor integrated circuit device 120 of the present embodiment, it becomes possible to interrupt the current path of the leakage current flowing through the region right underneath the device isolation insulation film 121S without increasing the depth of device isolation to insulation film 121S in the high voltage region 121B or without increasing the channel stopper impurity concentration level of the transistor 120TC. Thereby, it becomes possible to realize miniaturization of the low voltage high speed semiconductor device formed in the low voltage region 120A by using the shallow device isolation insulation film 121S, without causing the problem of aspect ratio of the device isolation insulation film 121S.

Further, because there occurs no increase in the concentration level of channel stopper impurity in the transistor 120TC with the present embodiment, there occurs no increase of threshold in the transistor 120TC.

Further, as explained before, it is possible to form the transistors 120TC and 120TD such that the threshold voltage of the transistor 120TC is lower than the threshold voltage of transistor 120TD, by changing the impurity concentration level of the p-type channel stoppers formed in the high voltage region 120B at the depth position 121*pc* between the device region 121C and the device region 121D. For example, it is possible to form the transistor 120TC and the transistor 120TD such that the threshold voltage of the transistor 120TC is lower than the threshold voltage of transistor 120TD.

Similarly to the low voltage region 120A, it is possible to form the low-voltage transistors 120TA and 120TB such that the threshold voltage of the transistor 120TA is lower than the threshold voltage of transistor 120TB by changing the impurity concentration level of the p-type channel stoppers at the depth 121*pc* between the device region 121A and the 121B.

FIGS. 21A-21J show the fabrication process of the semiconductor integrated circuit device 120 of FIG. 20.

Figure 21A:
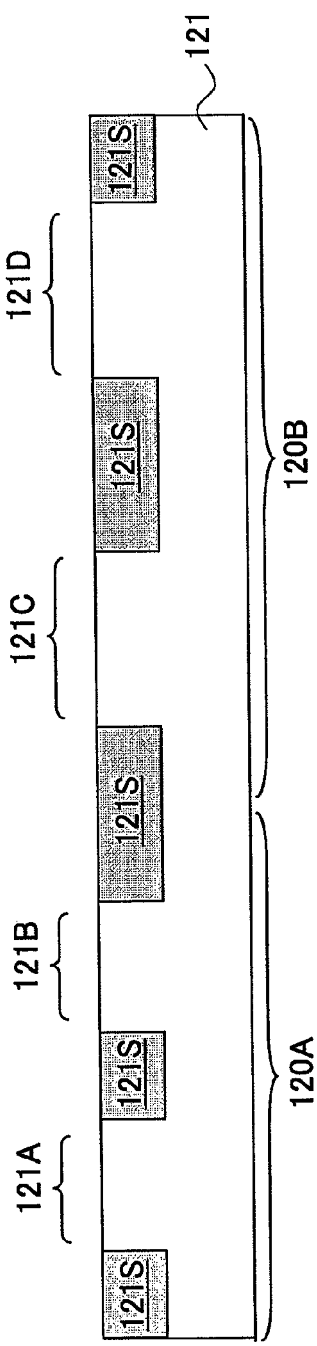
FIGS. 21A-21J are diagrams showing the fabrication process of the semiconductor integrated circuit device of FIG. 20.

Referring to FIG. 21A, the device regions 121A-121D are defined on the silicon substrate 121 by the device isolation insulation film 121S, wherein a silicon oxide film (now shown) is formed on the surface of the silicon substrate with a film thickness of 10 nm.

Figure 21B:
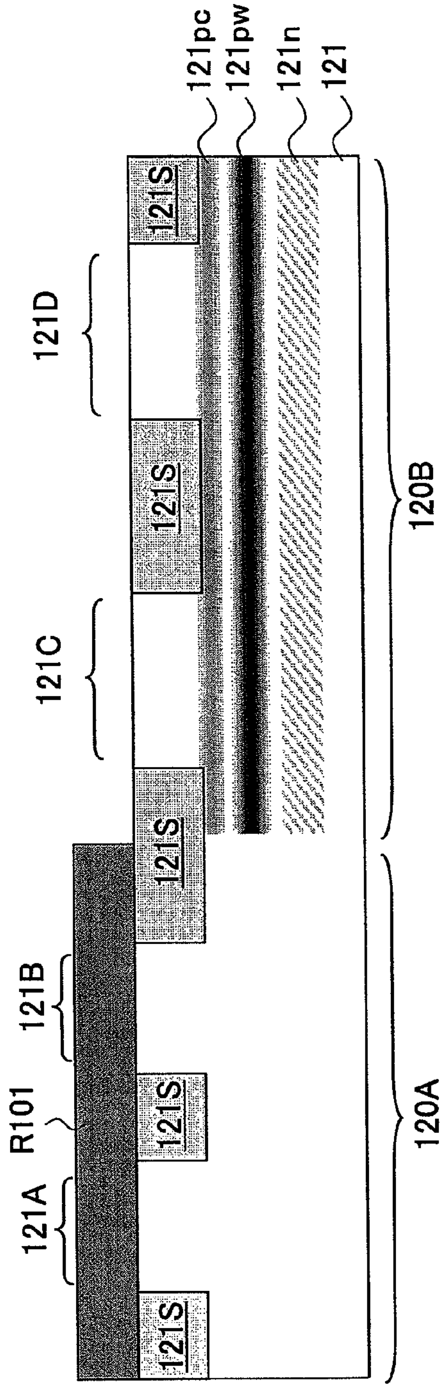

In the step of FIG. 21B, while covering the low voltage region 120A including the device regions 121A and 121B with a resist pattern R101, an n-type impurity element is introduced to the depth 121*n* in the high voltage region 120B by an ion implantation process, and with this, the n-type buried impurity region is formed.

Further, in the step of FIG. 21B, a p-type impurity element is introduced to the depths 121*pw* and 121*pc* by an ion implantation process while using the same resist pattern R101 as a mask, and the p-type well and the p-type channel stopper region are formed in the high voltage region 120B.

Figure 21C:
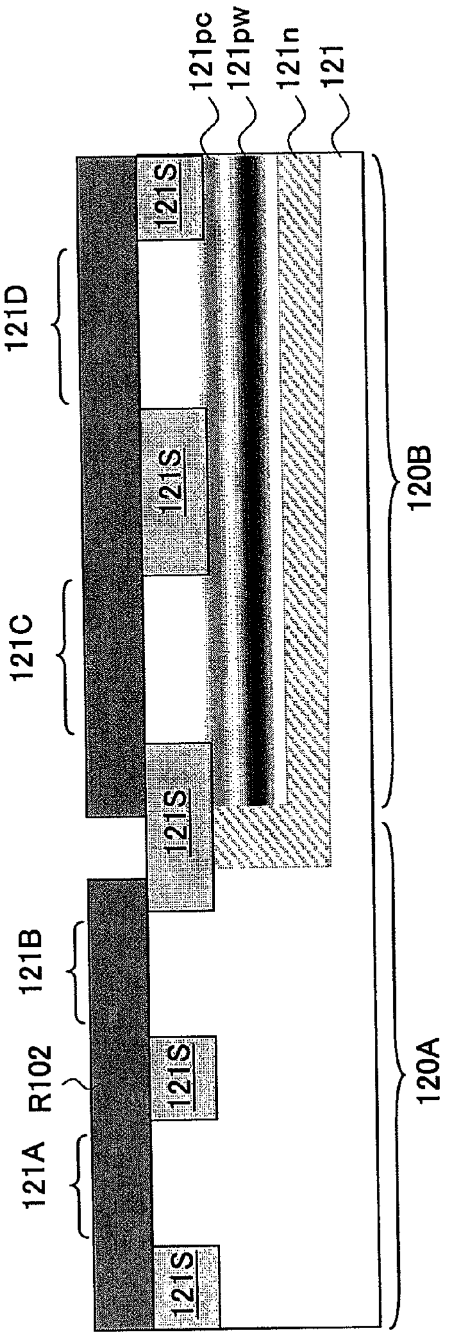

Further, in the step of FIG. 21C, a resist pattern R102 is formed so as to expose a part of the device isolation insulation film 121S located at the boundary between the low voltage region 120A and the high voltage region 120B, and while using the resist pattern R102 as a mask, an n-type impurity element is introduced by an ion implantation process to a depth 121*n*. With this, the high voltage region 120B is formed so as to enclose the n-type buried impurity region.

Figure 21D:
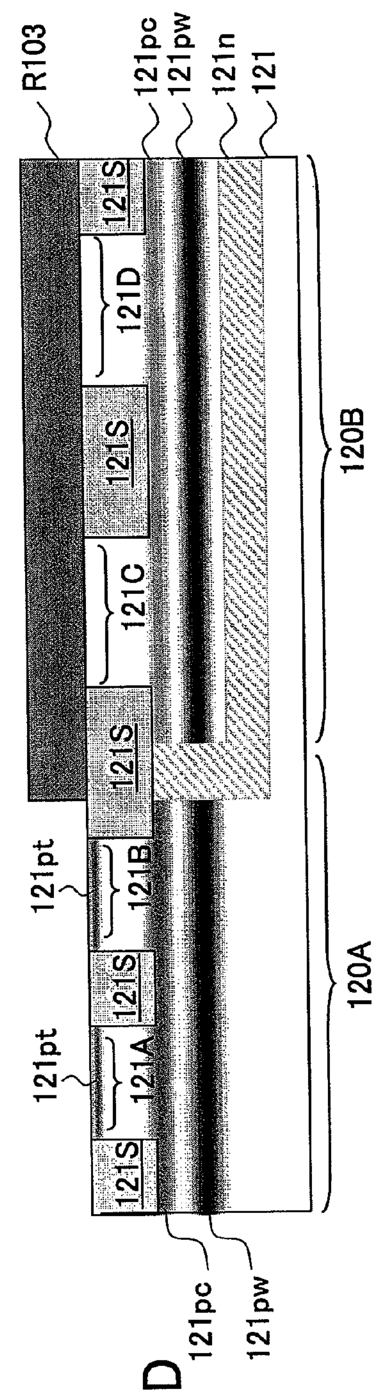

Next, in the step of FIG. 21D, a resist pattern R103 covering the high voltage region 120B is formed, and a p-type impurity element is introduced by the ion implantation into the device regions 121A and 121B including the region right underneath the device isolation insulation film 121S, and a p-type well is formed in the high voltage region 120B at the depth corresponding to the depth 121*pw* and a p-type channel stopper region is formed to depth corresponding to the depth position 121*p* in the high voltage region 120B. Further, a p-type impurity element is introduced into the depth 121*pt* near the substrate surface by an ion implantation process in the device regions 121A and 121B to form a channel doping region for threshold control.

Figure 21E:
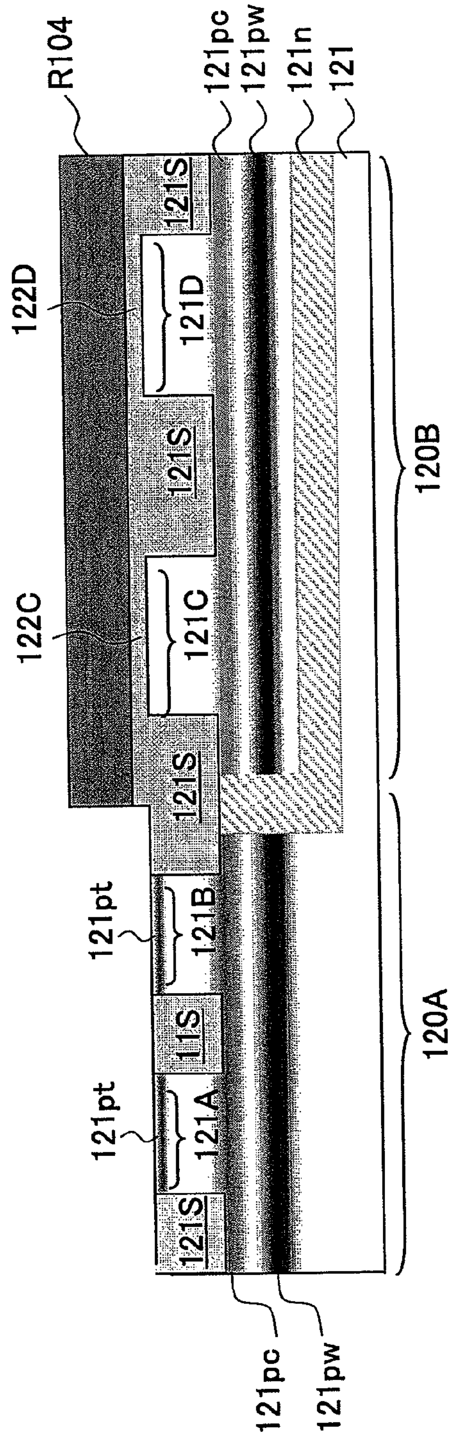

Next in the process of FIG. 21E, the resist film R103 is removed and the surface of the silicon substrate 121 is subjected to a thermally oxidation process, and a thermal oxide film 122 constituting the gate insulation film 122C or 122D of the high voltage MOS transistors 120TC and 120TD formed in the high voltage region 120B, is formed on the device regions 121C and 121D to the film thickness of 15 nm.

In the step of FIG. 21E, a resist pattern R104 covering the high voltage region 120B on the oxide film 122 is formed further, and the oxide film 122 is removed while using the resist pattern R104 as a mask. With this, the surface of the silicon substrate 121 is exposed in the device regions 121A and 121B.

Figure 21F:
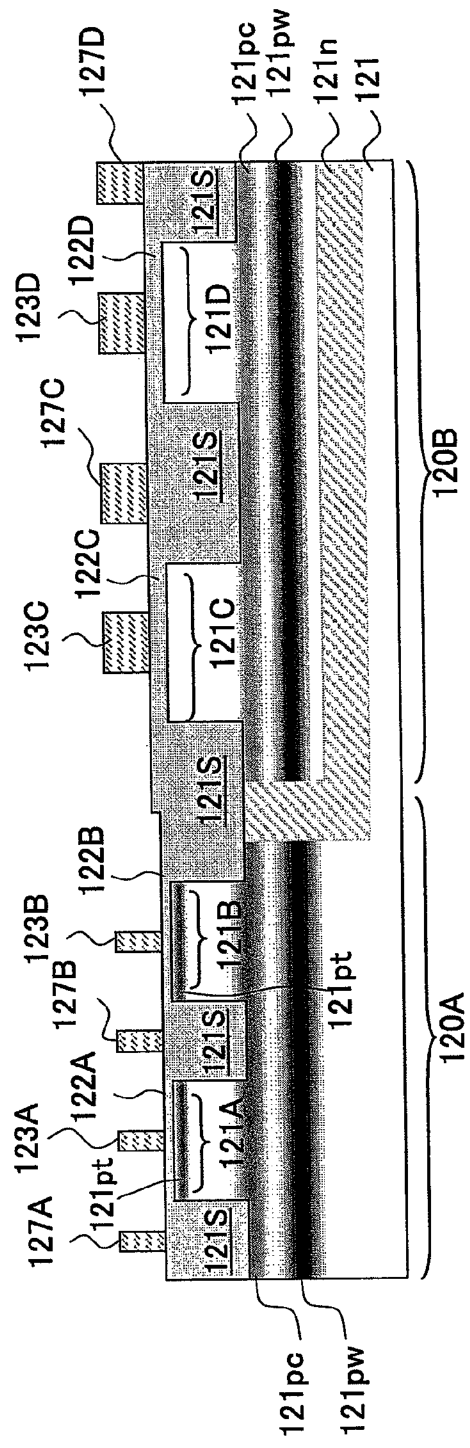

Next in the step of FIG. 21F, the resist pattern. R104 is removed, and after processing the surface of the silicon substrate 121 by a thermal oxidization processing again, and a thermal oxide film constituting the gate insulation films 122A and 122B of the low voltage MOS transistors 120TA and 120TB in the low voltage region 120A, is formed to the film thickness of 2 nm.

Further, in the step of FIG. 21F, an undoped polysilicon film not containing an the impurity element is deposited uniformly on the silicon substrate 121, on which the thermal oxide films 122A, 122B, 122C and 122D are thus formed. Further, by patterning the same, the gate electrodes 123A-123D are formed such that the gate electrode 123A of the low voltage MOS transistor 120TA is formed on the thermal oxide film 122A in the device region 121A, the gate electrode 123B of the low voltage MOS transistor 120TB in formed on the thermal oxide film 122B in the device region 121B, the gate electrode 123C of the high voltage MOS transistor 120TC is formed on the thermal oxide film 122C in the device region 121C, and the gate electrode 123D of the high voltage MOS transistor 120TD is formed on the thermal oxide film 122D in the device region 121D.

Further, in the step of FIG. 21F, the polysilicon patterns 127A and 127B are formed in the low voltage region 120A on the device isolation insulation film 121S and the polysilicon patterns 127C and 127D are formed on the device isolation insulation film 121S in the high voltage region 120B as a result of patterning of the polysilicon film.

Figure 21G:
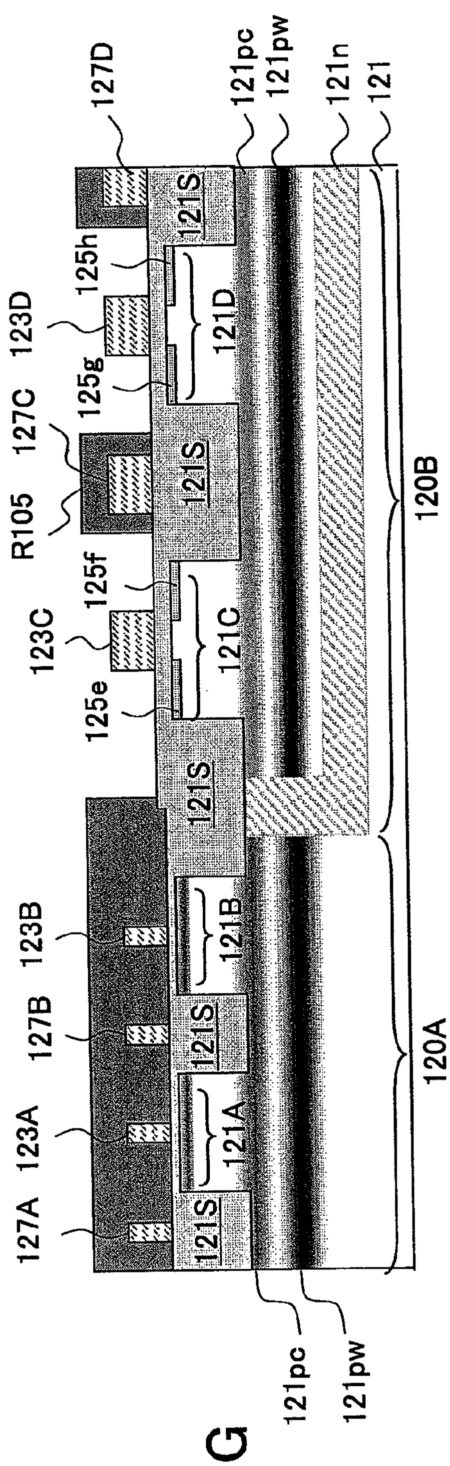

Next in the step of FIG. 21G, a resist pattern R105 is formed on the structure of the FIG. 21F so as to cover the polysilicon gate electrodes 123A and 123B in the low voltage region 120A and the polysilicon patterns 127A and 127B continuously, and so as to cover the polysilicon patterns 127C and 127D in the high voltage region 120B, and while using the resist pattern R105 as a mask, ion implantation of an n-type impurity element is conducted, and there are formed a pair of n-type LDD regions 125*e* and 125*f* in the device region 121C at respective lateral sides of the gate electrode 123C. Further, at the same time, a pair of n-type LDD regions 125*g* and 125*h* are formed in the device region 121D at respective lateral sides of the gate electrode 123D.

With this ion implantation process, the polysilicon gate electrodes 123C and 123D are doped to the n-type.

Figure 21H:
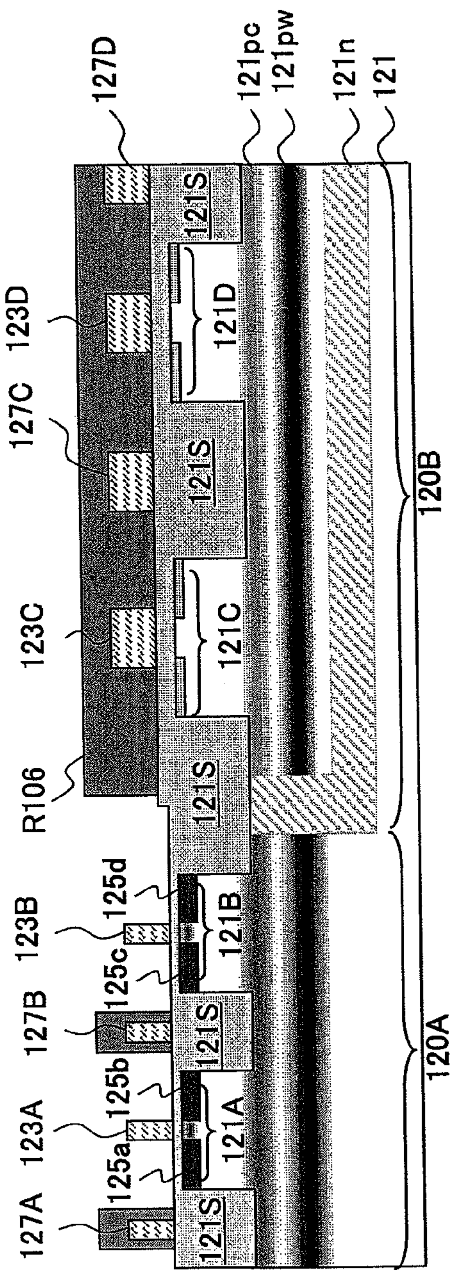

Next, in the step of FIG. 21H, a resist pattern R106 is formed so as to cover the polysilicon patterns 127A and 127B in the low voltage region 120A so as to cover the high voltage region 120B continuously, and while using the resist pattern R106 as a mask, an n-type impurity element is introduced by an ion implantation process with a dose different from the process of FIG. 21G, and there are formed a pair of n-type LDD regions 125*a* and 125*b* at respective lateral sides of the gate electrode 123A in the device region 121A, and a pair of n-type LDD regions 125*c* and 125*d* are formed in the device region 121B at respective lateral sides of the polysilicon gate electrode 123B.

Figure 21I:
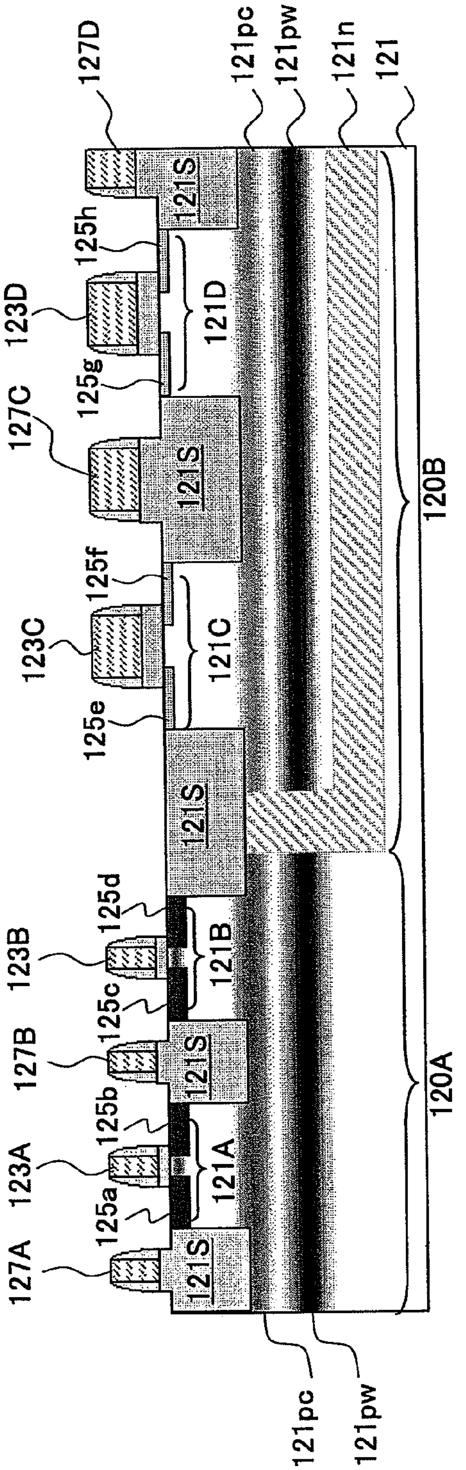
Figure 21J:
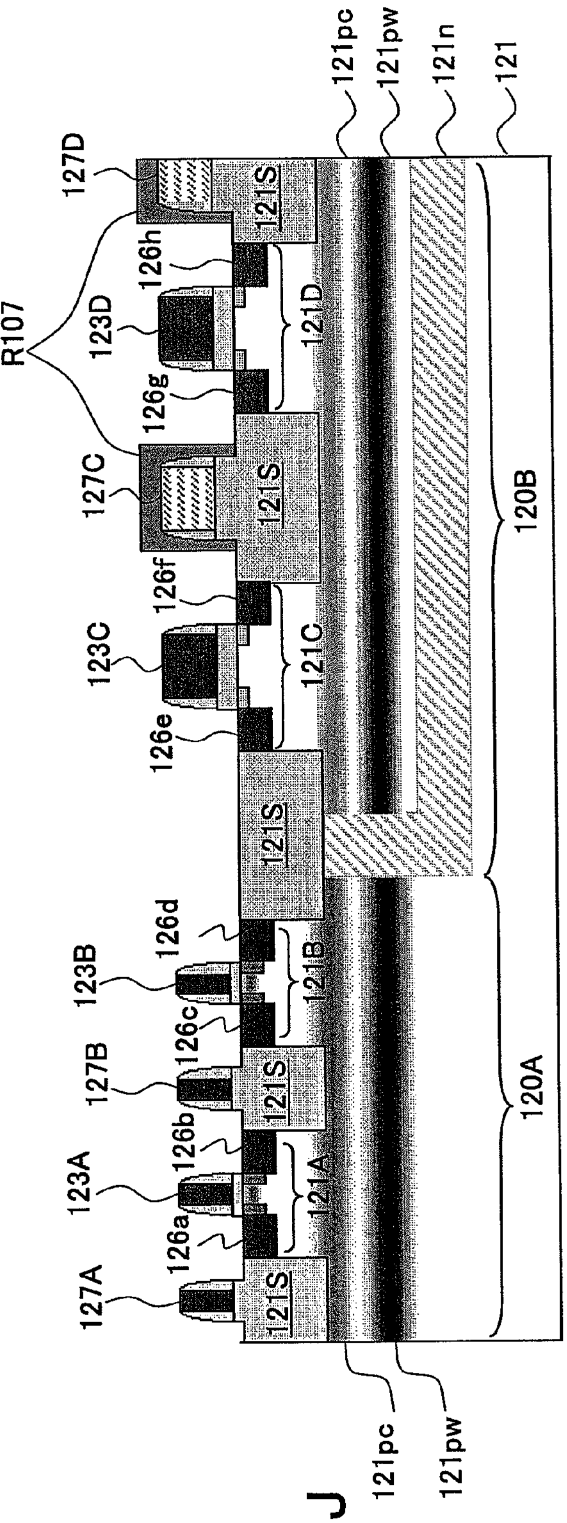

Further, in the step of FIG. 21I, a pair of sidewall insulation films are formed to each of the polysilicon gate electrodes 123A-123D and each of the polysilicon patterns 127A-127D, and in the step of FIG. 21J, the polysilicon patterns 127C and 127D of the structure of FIG. 21I are covered with a resist pattern R107. Further, by carrying out an ion implantation process of an n-type impurity element, the $n^+$-type diffusion regions 126*a* and 126*b* are formed in the device region 121A at respective lateral sides of the gate electrode 123A, more specifically at the respective outer sides of the sidewall insulation films. In the device region 1218, the $n^+$-type diffusion regions 126*c* and 126*d* are formed with this process at respective lateral sides of the gate electrode 123B, more specifically at respective outer sides of the sidewall insulation films, while in the device region 121C, the $n^+$-type diffusion regions 126*e* and 126*f* are formed at respective lateral sides of the gate electrode 123C, more specifically at respective outer sides of the sidewall insulation films. Further, in the device region 121D, the $n^+$-type diffusion regions 126*g* and 126*h* are formed at respective lateral sides of the gate electrode 123D, more specifically at respective outer sides of the sidewall insulation films.

In the step of FIG. 21J, the gate electrodes 123A-123D and the polysilicon patterns 127A and 127B are doped to $n^+$-type with the ion implantation process, while it should be noted that the polysilicon patterns 127C and 127D are covered by the resist pattern 127C and no ion implantation process is conducted. Thus, the polysilicon patterns 127C and 127D do not have conductivity.

Thus, after the step of FIG. 21J, the resist pattern R107 is removed, and by conducting the steps of: depositing a metal film such a cobalt film; applying a heat treatment; and removing unreacted metal film by etching, the structure having the silicide films 124A-124D, 127*a*-127*h* and 128A-128D is obtained as explained previously with reference to FIG. 15.

It should be noted that the process steps of FIGS. 21G and 21H can be conducted also while omitting the resist pattern R105 or R106. In this case, the polysilicon patterns 127A-127D are doped to the n-type, while the carrier density induced in the polysilicon patterns 127A-127D is trifling, there occurs only minor decrease in the effect of the present invention.

In the present embodiment, while there is a need of covering the polysilicon patterns 127C and 127D by the resist pattern R107 in the step of FIG. 21J for conducting the ion implantation process, there is no need of covering the polysilicon pattern 127A or 127B, and thus, the present embodiment omits the process of covering the polysilicon patterns 127A and 127B, which are highly miniaturized patterns similarly to the gate electrodes 123A and 123B of the low-voltage transistor and thus requires a strict resist process. Thus, the resist pattern R107 covers only the polysilicon patterns 127C and 127D formed on the high voltage region 120A where the device isolation has an increased width. Thereby, mask data for the gate electrodes 123C and 123D of the high voltage MOS transistor can be used for the mask data of the resist pattern R107 with an enlargement corresponding to the tolerance of alignment. Thereby, the resist pattern R107 can be formed easily. Because of this, there arises no difficulty in formation of the resist pattern R107 used with the present embodiment.

Fifth Embodiment

Figure 22:
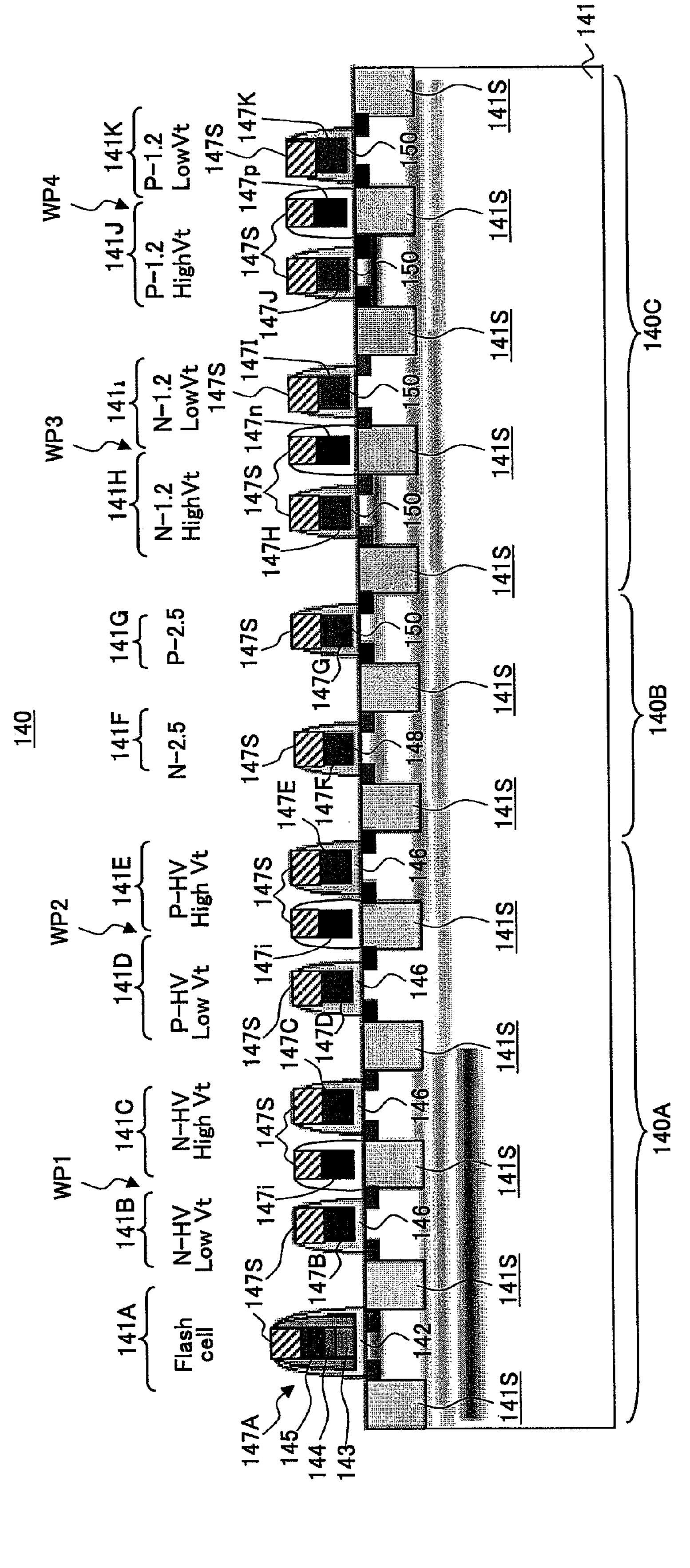
FIG. 22 is a diagram showing the construction of a semiconductor integrated circuit device according to a fifth embodiment of the present invention.

FIG. 22 shows the construction of a semiconductor integrated circuit device 140 by according to a fifth embodiment of the present invention.

Referring to FIG. 22, the semiconductor integrated circuit device 140 is a logic integrated circuit device of a 0.13 μm rule carrying a flash memory device thereon and includes device regions 141A-141K defined on a silicon substrate 141 of p-type or n-type by a device isolation insulation film 141S of STI structure, wherein the device region 141A is formed with a flash memory device, the device region 141B is formed with a high voltage low threshold n-channel MOS transistor, the device region 141C is formed with a high voltage high threshold n-channel MOS transistor, the device region 141D is formed with a high voltage low threshold p-channel MOS transistor, and the device region 141E is formed with a high voltage high threshold p-channel MOS transistor.

At the time of reading operation, the flash memory device is operated with a drive voltage of 5V, while at the time of writing or erasing, the flash memory device is driven with the voltage of 10V, or the like. Thereby, the high voltage p-channel or n-channel MOS transistor formed to the device regions 141B-141E constitute a control circuit that drives the flash memory device with the foregoing drive voltage. Thus, the device regions 141B-141E form a high voltage region 140A in the substrate 141.

Further, in the device region 141F, there is formed a mid voltage n-channel MOS transistor operating the supply voltage of 2.5V or 3.3V, and a mid voltage p-channel MOS transistor operating also with the power supply voltage of 2.5V is formed in the device region 141G, wherein these mid-voltage transistors constitute an input/output circuit of the semiconductor integrated circuit device 140. Thus, the device regions 141F and 141G form a mod voltage region in the substrate 141.

Further, in the device region 141H, there is formed a low voltage high threshold n-channel MOS transistor operating with the supply voltage of 1.2V, while in the device region 141I, there is formed a low voltage low threshold n-channel MOS transistor operating with the supply voltage of 1.2V. Further, in the device region 141J, there is formed a low voltage high threshold p-channel MOS transistor operating with the supply voltage of 1.2V, and a low voltage low threshold p-channel MOS transistor operating with the supply voltage of 1.2V is formed in the device region 141K. These low voltage p-channel and n-channel MOS transistors form, together with the mid voltage p-channel and n-channel MOS transistors, a high-speed logic circuit. Thereby, the device regions 141H-141K form a low voltage region 140C in the substrate 141.

The device regions 141A-141C are formed with a p-type well, the device regions 141D and 141E are formed with an n-type well, the device region 141F is formed with a p-type well, and the device region 141G is formed with an n-type well. Further, the device regions 141H and 141I are formed with a p-type well, and the device regions 141J and 141K are formed with an n-type well.

On the surface of the device region 141A, there is formed a tunneling insulation film 142, while on the tunneling insulation film 142, there are formed a floating gate electrode 143 of polysilicon and an inter-electrode insulation film 144 of an ONO structure are formed consecutively. Further, a control gate electrode 145 of the polysilicon on is formed on the inter-electrode insulation film 144. It should be noted that the floating gate electrode 143, the inter-electrode insulation film 144 and the control gate electrode 145 form a stacked floating gate structure 147A.

On the surface of the device regions 141B-141E, on the other hand, there is formed a gate insulation film 146 for the high-voltage transistor, while on the gate insulation film 146, it should be noted that there are formed polysilicon gate electrodes 147B-147F such that the polysilicon gate electrode 147B is formed on the device region 141B, the polysilicon gate electrode 147C is formed on the device region 141C, the polysilicon gate electrode 147D is formed on the device region 141D and the polysilicon electrode 147F is formed on the device region 141E.

Further, on the surfaces of the device regions 141F and 141G, there are formed a thinner gate insulation film 148 thinner than the gate insulation film 146 for the gate insulation film of the mid voltage transistor, while on the gate insulation film 148, there is formed a polysilicon gate electrode 147F in the device region 141F and a polysilicon gate electrode 147G is formed in the device region 141G.

Further, a gate insulation film 150 for the low-voltage transistor is formed on the surfaces of the device regions 141H-141K, wherein the gate insulation film 150 carries thereon the polysilicon gate electrodes 147H-147J such that the polysilicon gate electrode 147H is formed in the device region 141H, the polysilicon gate electrode 147I is formed in the device region 141I, the polysilicon gate electrode 147J is formed in the device region 141J, and the polysilicon electrode 147K is formed in the device region 141K.

Further, in the device region 141A, there are formed a pair of diffusion regions at respective lateral sides of the stacked gate electrode structure 147A formed of stacking of the floating gate electrode 143, the inter-electrode insulation film 144 and the control gate electrode 145 as the source and drain regions. Similarly, a pair of diffusion regions are formed at respective lateral sides of the gate electrode in each of the device regions 141B-141H as source and drain regions.

Further, in each of the control gate electrode 145, the gate electrodes 147B-147K and the stacked floating gate electrode structure 147A, the surface thereof is formed with a silicide layer 147S such as a cobalt silicide. It should be noted that similar silicide layer is formed also on the surface of the source and drain regions although not illustrated.

Further, in the construction of FIG. 17, there is formed an interconnection pattern WP1 of the construction in which the silicide layer 147S is formed on the undoped polysilicon layer 147*i*, such that the interconnection pattern WP1 is formed on the device isolation insulation film 141S located between the device regions 141B and 141C in the high voltage region 140A. Further, an interconnection pattern WP2 of similar construction is formed on the device isolation insulation film 141S located between the device regions 141D and 141E in the high voltage region 140A.

Further, in the low voltage region 140C, there is formed an interconnection pattern WP3 of the construction in which a silicide layer 147S is stacked on a polysilicon layer 147*n* doped to $n^+$-type such that the interconnection pattern WP3 is formed on the device isolation insulation film 1415 located between the device regions 141H and 141I, while on the device isolation insulation film 141S located between the device regions 141J and 141K in the low voltage region 140C, there is further formed an interconnection pattern WP4 such that the interconnection pattern WP4 has a stacked construction in which the silicide layer 147S is stacked on the polysilicon layer 147*p* doped to the $p^+$-type.

In the semiconductor integrated circuit device 140 of the FIG. 22, it should be noted that various impurity elements are introduced to various depths with various concentration levels for well formation or threshold control in the diffusion regions 141A-141K.

Next, fabrication process of the semiconductor integrated circuit device 140 of FIG. 22 will be explained with reference to FIGS. 23A-23Z and FIGS. 23AA-23AB.

Figure 23A:
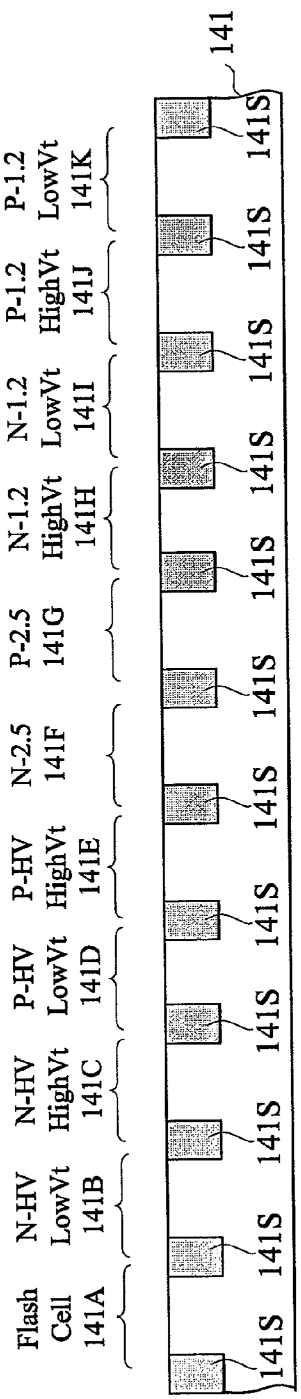
FIGS. 23A-23Z and FIGS. 23AA-23AB are diagrams explaining the fabrication process of the semiconductor integrated circuit device of FIG. 22.

Referring to FIG. 23A, there is formed an STI device isolation film 141S on the silicon substrate 141 as explained before, and with this, device regions 141A-141K are defined on the silicon substrate 141. Further, while not illustrated, the surface of the silicon substrate 141 is oxidized in the step of FIG. 23A, and a silicon oxide film is formed with the film thickness of about 10 nm.

Figure 23B:
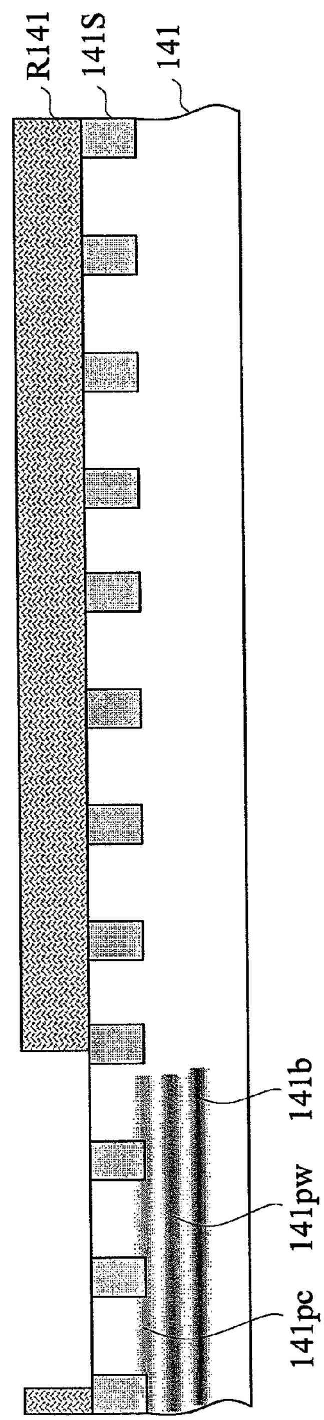

Next, in the step of FIG. 23B, a resist pattern R141 exposing the device regions 141A-141C is formed on the structure of FIG. 23A, and while using the resist pattern R141 as a mask, $P^+$ is introduced by an ion implantation process under the acceleration voltage of 2 MeV to a depth 141*b* deeper than the bottom edge of the device isolation insulation film 141S with the dose of $2\times10^{13}$ $cm^{-2}$. With this, the n-type buried impurity region is formed.

Further, in the step of FIG. 23B, while using the resist pattern R141 as a mask, $B^+$ is introduced by an ion implantation process under the acceleration voltage of 400 keV to a depth 141*pw* with the dose of $1.5\times10^{13}$ $cm^{-2}$, and a p-type well is formed as a result. Further, in the step of FIG. 23B, while using the resist pattern R161 as a mask, $B^+$ is introduced to a depth 41*pc* by an ion implantation process conducted under the acceleration voltage of 100 keV with the dose of $2\times10^{12}$ $cm^{-2}$. With this, there is formed a channel stopper region of p-type at a depth 141*pc*. Here, it should be noted that the depths 141*b*, 141*pw* and 141*pc* represent relative ion implantation depths with the relation ship that the depth 141*pw* is deeper than the device isolation insulation film 141S but shallower than depth 141*b*. Further, the depth 141*pc* is shallower than the depth 141*pw* and generally correspond to the lower edge of the device isolation insulation film 141S. By introducing a p-type impurity element to the depth 141*pc*, punch-through resistance is improved, and at the same time, it becomes possible to control the threshold characteristic of the transistor thus formed.

Figure 23C:
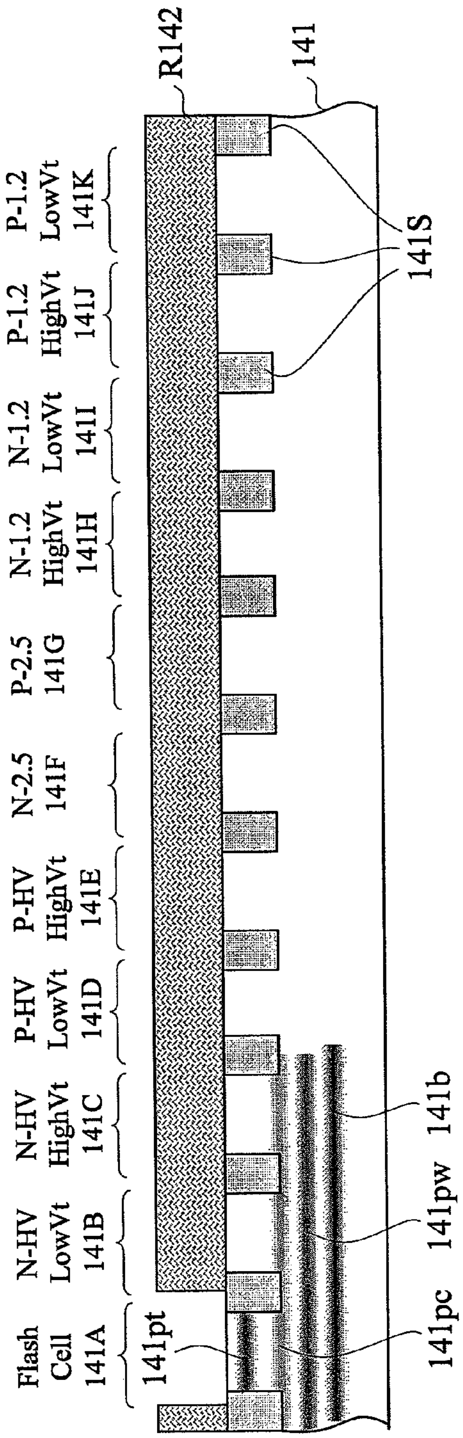

Next, with the process of FIG. 23C, a resist pattern R142 exposes the memory cell region 141A is formed, and $B^+$ is introduced to a shallow depth 141*pt* near the substrate surface by an ion implantation process conducted under the acceleration voltage of 40 keV with the dose of $6\times10^{13}$ $cm^{-2}$. With this, threshold control is achieved for the memory cell transistor formed in the device region 141A.

Figure 23D:
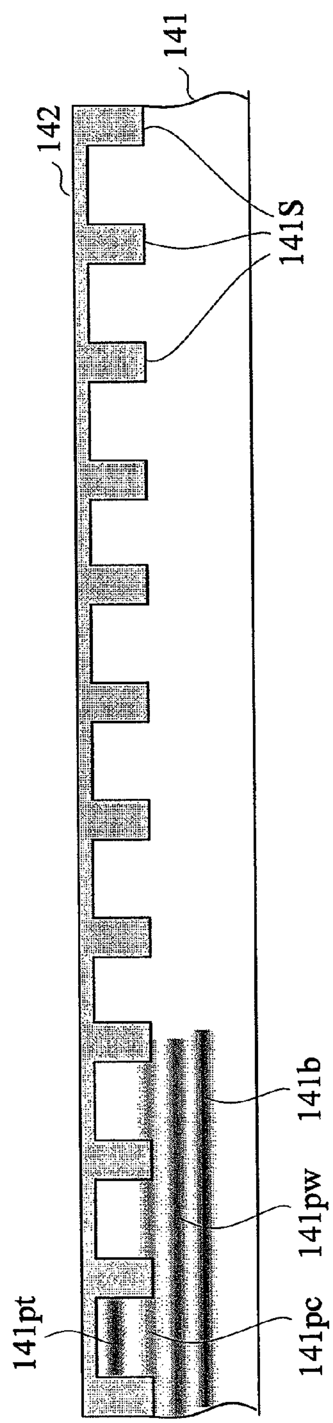

Further, with the step of FIG. 23D, the resist pattern R142 is removed, and after removing the silicon oxide film formed on the surface of the silicon substrate 141 in an HF aqueous solution, a thermal oxidation processing has been conducted at the temperature of 900-1050° C. for 30 minutes. With this, a silicon oxide film used for the tunneling insulation film 142 is formed with the film thickness of about 10 nm.

In this formation step of the tunneling insulation film 142, it should be noted that the p-type impurity element introduced to the device regions 141A-141C previously cause diffusion over a distance of 0.1-0.2 μm.

Next, in the step of FIG. 23E, a polysilicon film doped with an impurity element is deposited on the structure of FIG. 23D by a CVD process, and the floating gate electrode 143 is formed on the device region 141A by patterning the same subsequently. Further, after formation of the floating gate electrode 143, an oxide film and a nitride film are deposited on the silicon oxide film 142 by a CVD process respectively with the thicknesses of 5 nm and 10 nm. Further, by conducting an oxidization process in a wet ambient at 950° C., a dielectric film having an ONO structure is formed as the inter-electrode insulation film 144.

Figure 23E:
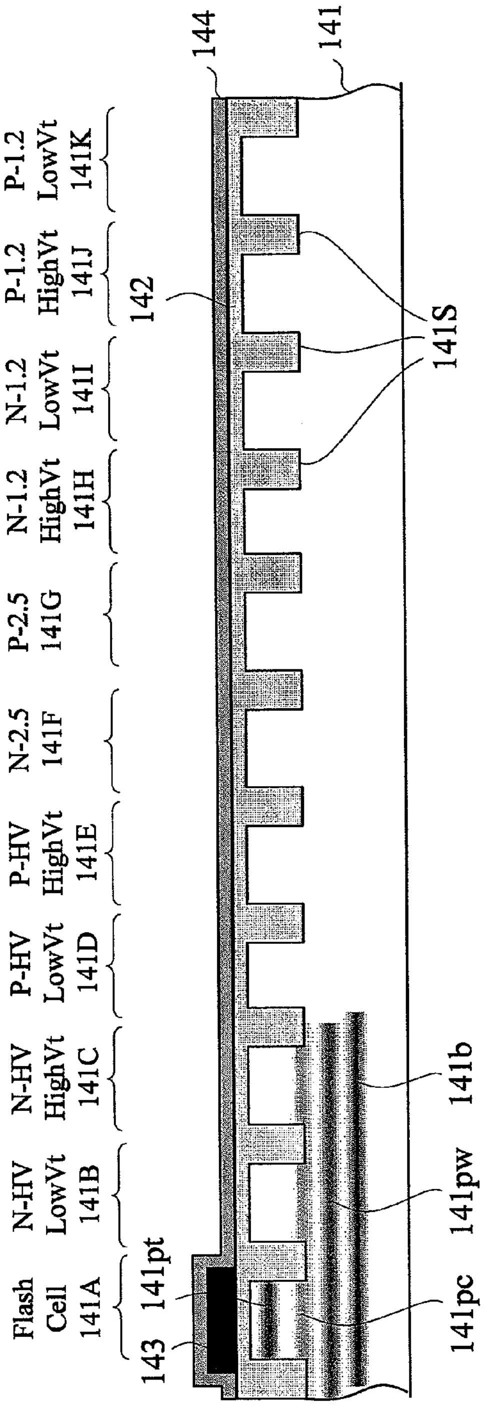

With this step of FIG. 23E, the p-type impurity element introduced to the device regions 141A-141C previously cause a diffusion over the distance of 0.1-0.2 μm with the heat treatment at the time of formation of the ONO film 144. As a result of such heat treatment, the distribution profile of the p-type impurity element changes to broad after the processing of FIG. 23F in the p-type well formed to the device regions 141A-141C.

Figure 23F:
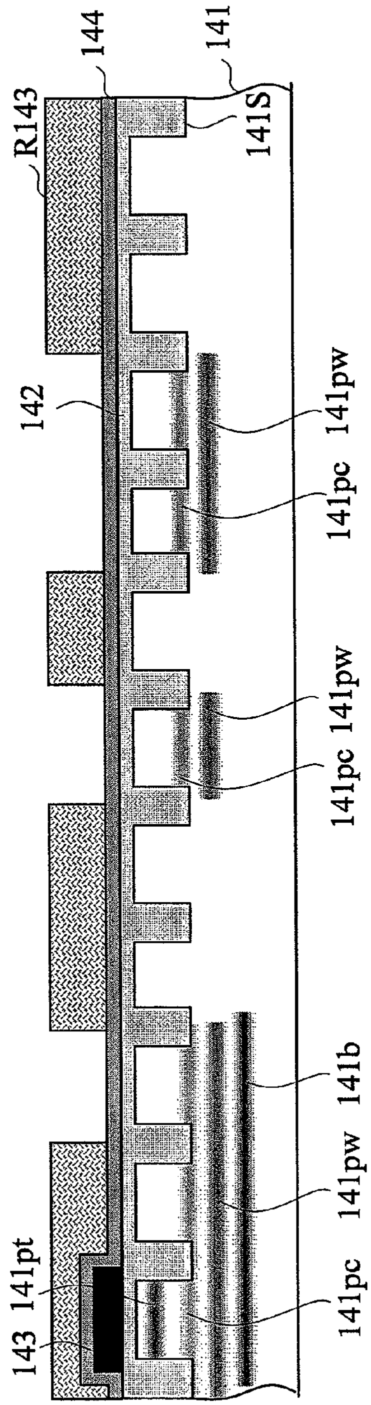

Next, in the step of FIG. 23F, a new resist pattern R143 exposing the device regions 141C, 141F and 141H-141I is formed on the structure of FIG. 23E, and while using the resist pattern R143 as a mask, $B^+$ is introduced by an ion implantation process first under the acceleration voltage of 400 keV with the dose of $1.5\times10^{13}$ $cm^{-2}$, followed by an acceleration voltage of 100 keV under the dose of $8\times10^{12}$ $cm^{-2}$, and a p-type impurity element regions forming a p-type well and a p-type channel stopper region are formed in the device regions 141F and 141H-141I, respectively at a depth 141*pw* deeper than the depth of the device isolation insulation film 141S and at the depth 141*pc* generally equal to the bottom edge of the device isolation insulation film 141S. Further, in the device region 141C in which the p-type impurity element is introduced previously, there occurs an increase in the impurity concentration level of the p-type well, and threshold control is achieved for the high voltage high threshold n-channel MOS transistor formed in the device region 141C.

In the p-type well formed in the device regions 141F and 141H and 141I, B thus introduced does not experience a heat treatment other than the thermal activation treatment, and thus maintains the sharp distribution profile.

Figure 23G:
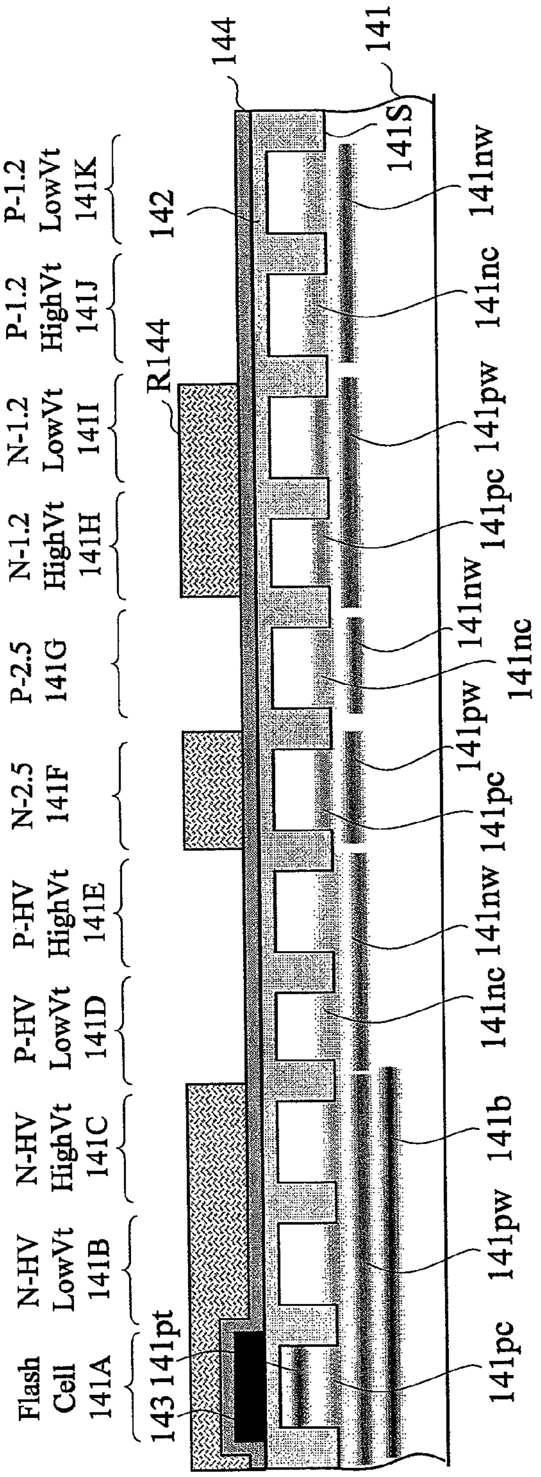

Next, in the step of FIG. 23G, a new resist pattern R144, is formed on the ONO film 144 so as to expose the device regions 141D, 141E, 141G, 141J and 141K, and while using the resist pattern R144 as a mask, $P^+$ is introduced by an ion implantation process into the silicon substrate 141, first under the acceleration voltage of 600 keV with the dose of 1.5×1013 $cm^2$, and next under the acceleration voltage of 240 keV with the dose of $3\times10^{12}$ $cm^{-3}$, and with this, an n-type well is formed in the device regions 141D and 141E and further in the device region 141G as a depth 141*nw* deeper than the device isolation insulation film 141S. Further, an n-type channel stopper region is formed to a depth 141*nc* generally corresponding the bottom edge of the device isolation insulation film 141S.

Figure 23H:
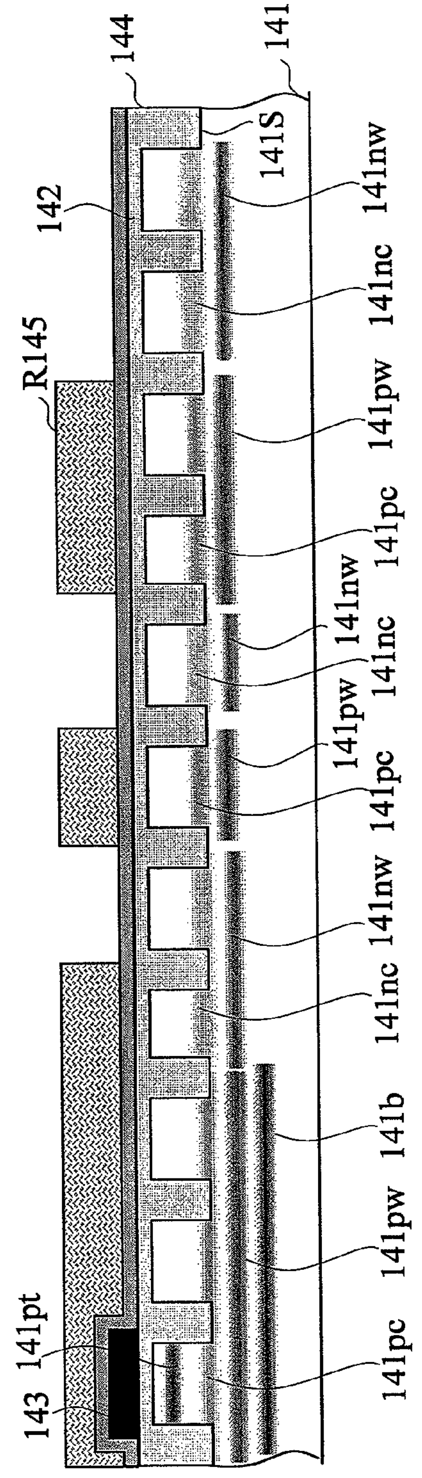

Next, in the step of FIG. 23H, a resist pattern R145 exposing the device regions 141E and 141G, 141J and 141K is formed on the ONO film 144, and while using the resist pattern R145 as a mask, $P^+$ is introduced to a depth 141*nc* corresponding to the bottom edge of the device isolation insulation film 141S in the device regions 141E, 141G, 141J and 141K, by an ion implantation process conducted under the acceleration voltage of 240 keV with the dose of $6.5\times10^{12}$ $cm^{-2}$. With this, the impurity concentration level of the n-type channel stopper region formed in the device regions 141E, 141G, 141J and 141K is increased, and threshold control of the high voltage high threshold p-channel MOS transistor formed in device region 141E is achieved.

Figure 23I:
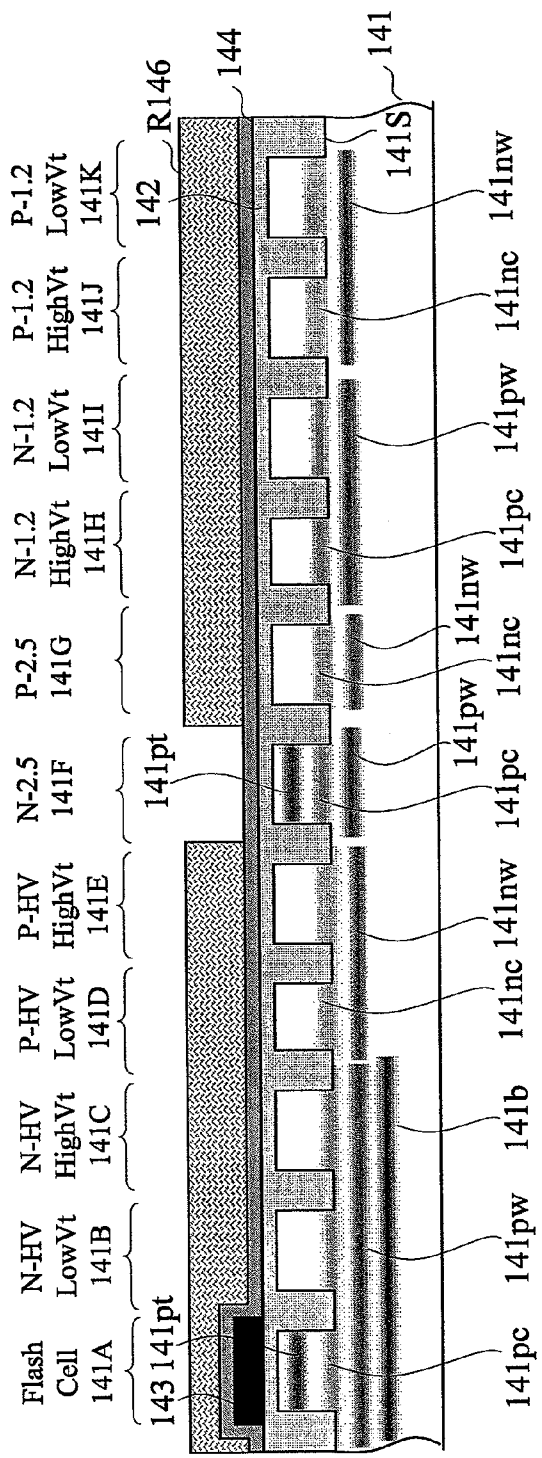

Next, in the step of FIG. 23I, a resist pattern R146 exposing the device region 141F is formed on the ONO film 144, and while using the resist pattern R146 as a mask, $B^+$ is introduced into a shallow depth 141*pt* near the substrate surface of the device region 141F by an ion implantation process, under the acceleration voltage of 30 keV with the dose of $5\times10^{12}$ $cm^{-2}$. With this, threshold control is achieved for the mod voltage n-channel MOS transistor formed in the device region 141F.

Figure 23J:
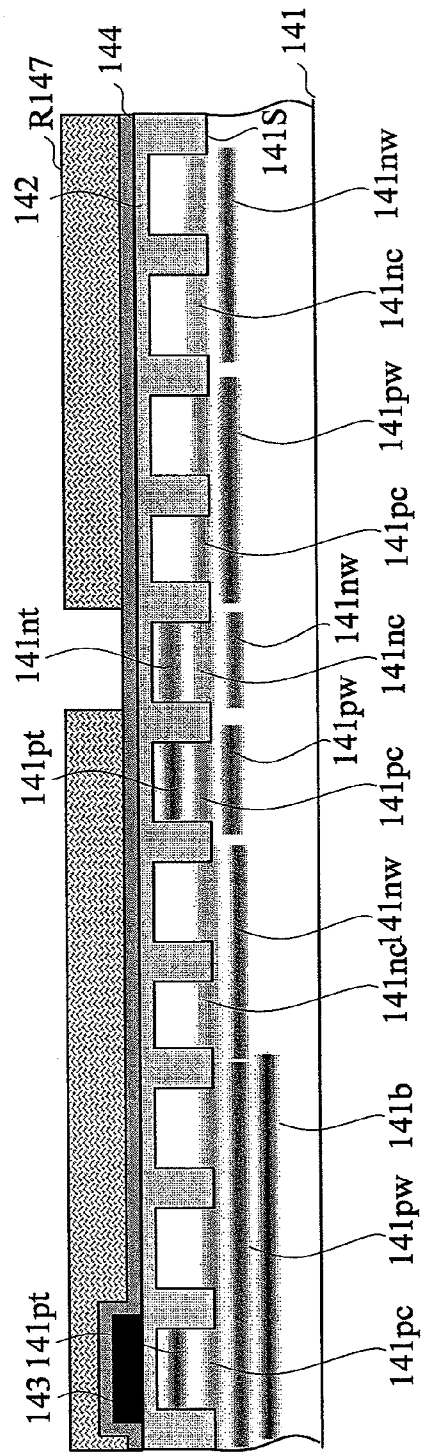

Further, in the step of FIG. 23J, a resist pattern R147 exposing the device region 141G is formed on the ONO film 144, and while using the resist pattern R147 as a mask, As is introduced into a shallow depth 41*nt* near the substrate surface of the device region 141G by an ion implantation process conducted under the acceleration voltage of 150 keV with the dose of $3\times10^{12}$ $cm^{-2}$. With this, threshold control is achieved for the mid voltage p-channel MOS transistor formed in the device region 141G.

Figure 23K:
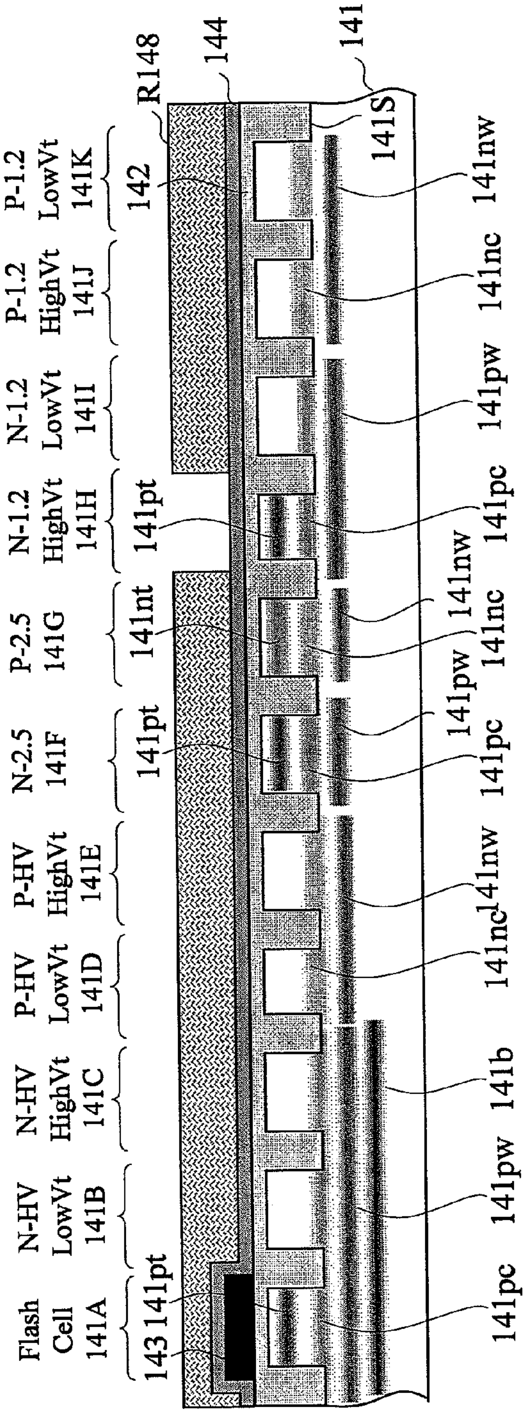

Next, in the step of FIG. 23K, a resist pattern R148 exposing the device region 141H is formed on the ONO film 144, and while using the resist pattern R148 as a mask, B is introduced to a shallow depth 141*pt* near the substrate surface of the device region 141H by an ion implantation process conducted under the acceleration voltage of 10 keV with the dose of $5\times10^{12}$ $cm^{-2}$.

With this, threshold control of the low voltage high threshold n-channel MOS transistor formed in the device region 141H is achieved. It should be noted that the depth 141*pt* of the device region 141H is closer to the substrate surface as compared with the depth 141*pt* of the device region 141F.

Figure 23L:
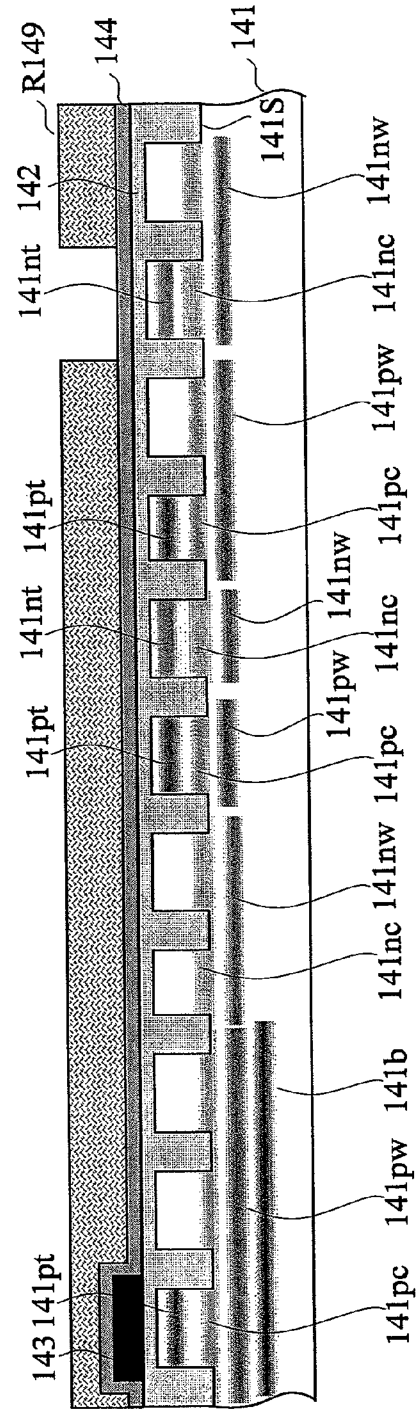

Next, in the step of FIG. 23L, a resist pattern R149 exposing the device region 141J is formed on the ONO film 144, and while using the resist pattern R149 as a mask, $B^+$ is introduced to a shallow depth 141*nt* near the substrate surface of the device region 141J, by an ion implantation process conducted under the acceleration voltage of 10 keV with the dose of $5\times10^{12}$ $cm^2$, and with this, threshold control is achieved for the low voltage high threshold p-channel MOS transistor formed in the device region 141J. In this case, the depth 141*nt* of the device region 141J is closer to the substrate surface as compared with the depth 141*nt* of the device region 141G.

Figure 23M:
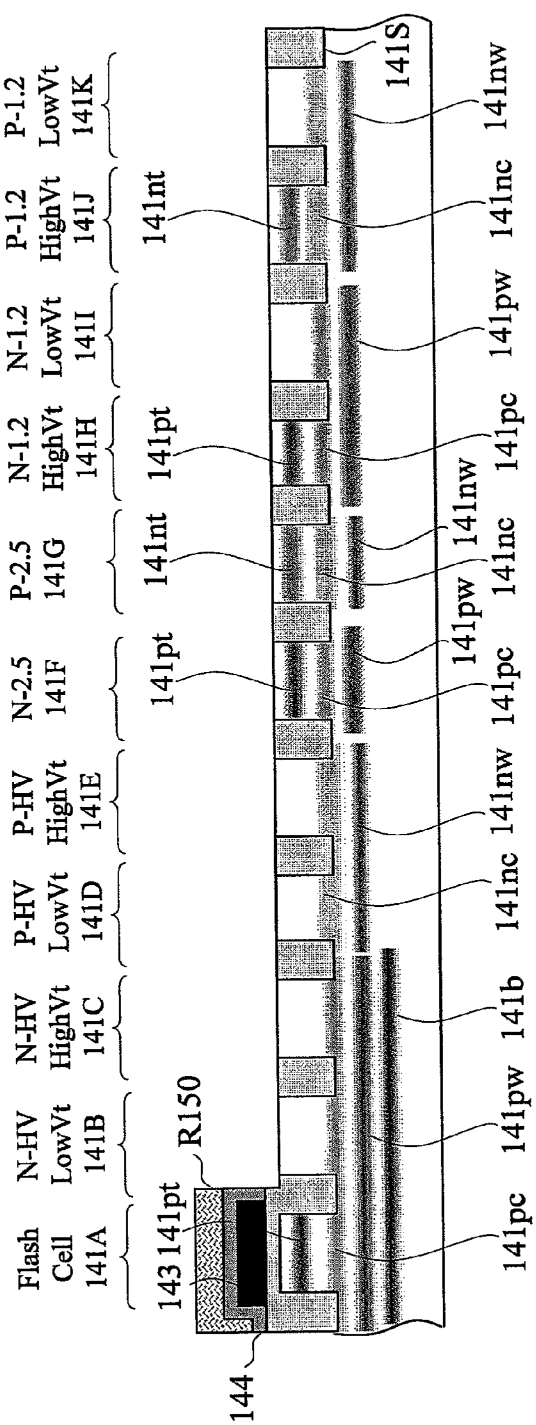

Next, in the step of FIG. 23M, the ONO film 144 and the silicon oxide film 122 underneath are patterned while using the resist pattern R150 as a mask, and the surface of the silicon substrate 141 is exposed in the device regions 141B-141K.

Figure 23N:
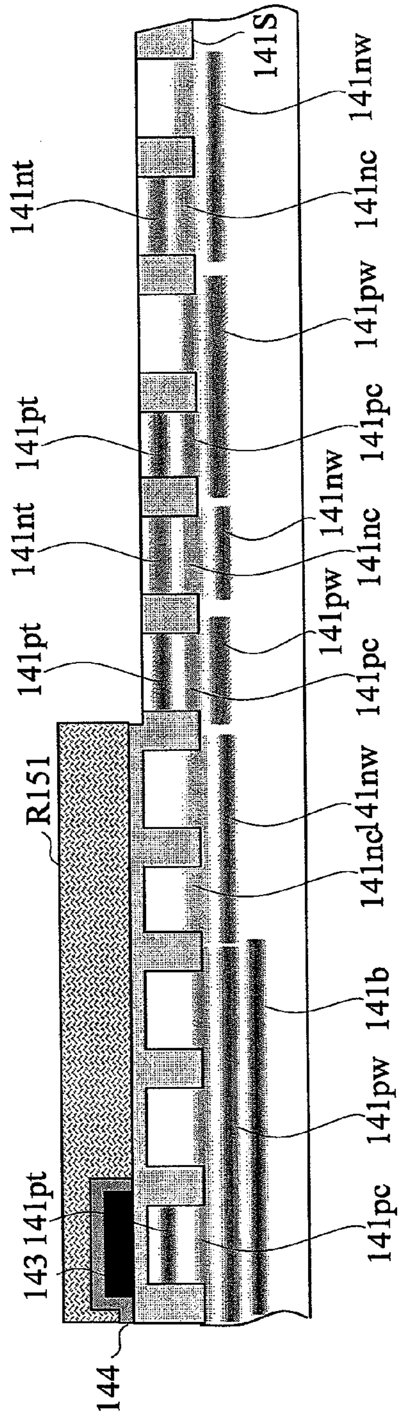

Further, in the step of FIG. 23N, the resist pattern R150 is removed, and a silicon oxide film used for the gate insulation film 146 of the high voltage MOS transistor is formed to the thickness of 13 nm by conducting a thermal oxidation processing at 850° C. In the step of FIG. 23N, the resist pattern R151 exposing the device regions 141F-141K is formed on the silicon oxide film 146, and while using the resist pattern R151 as a mask, the silicon oxide film 146 is subjected to patterning such that the silicon substrate surface is exposed again over the device regions 141F-141K.

Figure 23O:
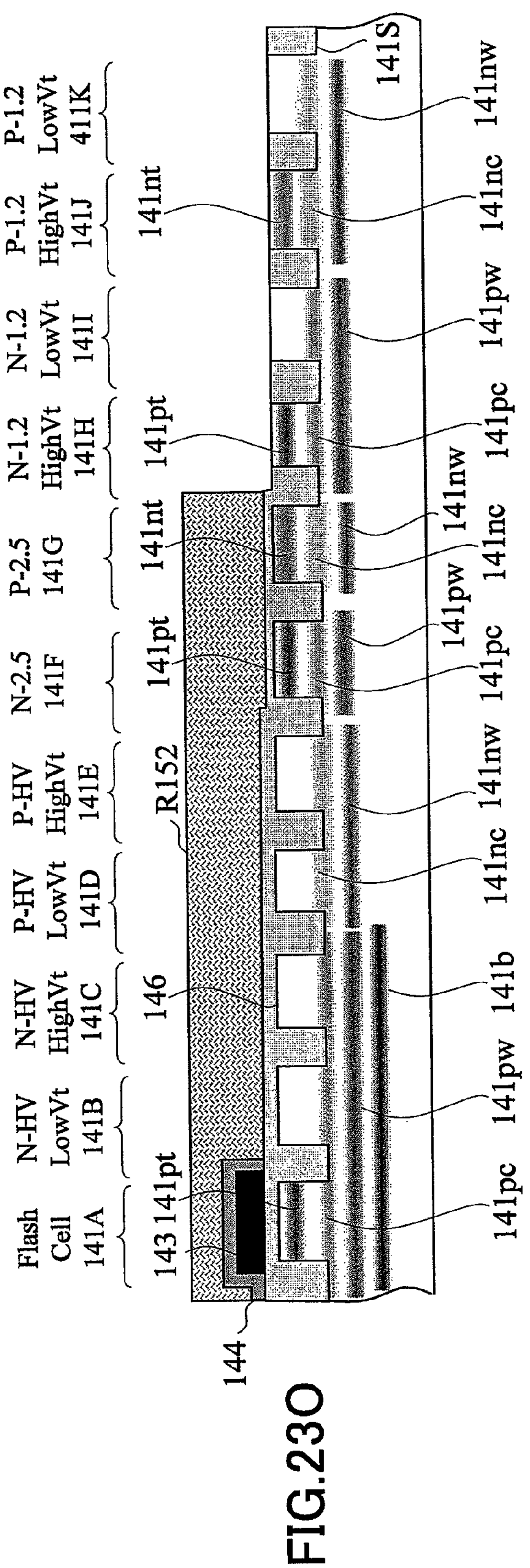

Further, in the step of FIG. 23O, the resist pattern R151 is removed, and by conducting a thermal oxidation processing, the silicon oxide film used for the gate insulation film 148 of the mid voltage MOS transistor is formed to the thickness of 4.5 nm. In the step of FIG. 18O, there is further formed a resist pattern R152 exposing the device regions 141H-141K on the silicon oxide film 148, and while using the resist pattern R152 as a mask, the silicon oxide film 148 is subjected to patterning, and with this, the surface of the silicon substrate is exposed again in the device regions 141H-141K.

Figure 23P:
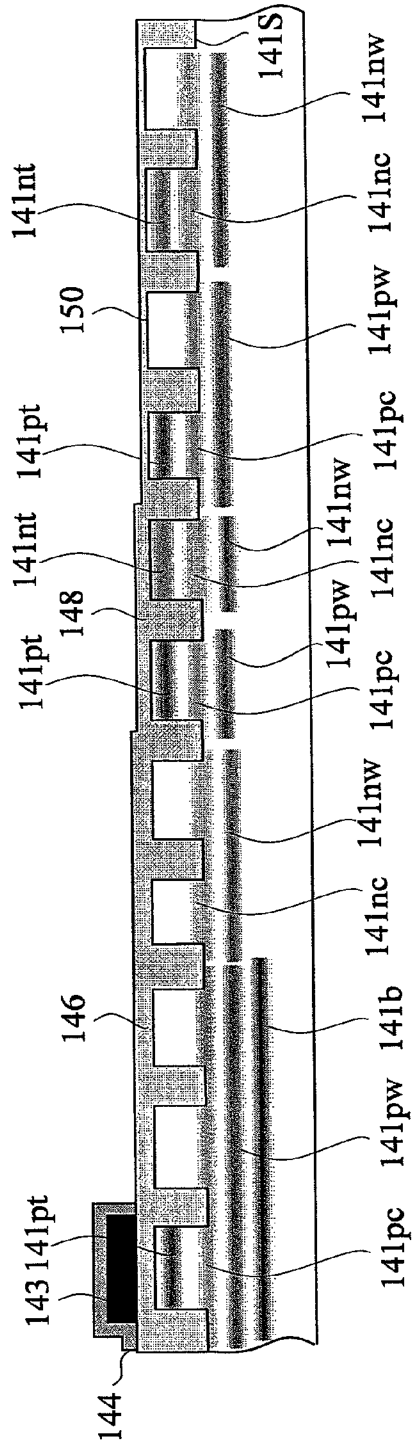

Further, in the process of FIG. 23P, the resist pattern R152 is removed, and by conducting a thermal oxidation processing, a silicon oxide film used for the gate insulation film 150 of the low voltage MOS transistor is formed to the thickness of 2.2 nm.

Because of repeated thermal oxidation processing up to the step to FIG. 23P, the gate insulation film 42 has grown to the thickness of 16 nm and the gate insulation film 46 has grown to the thickness of 5 nm in the state of FIG. 23P.

Figure 23Q:
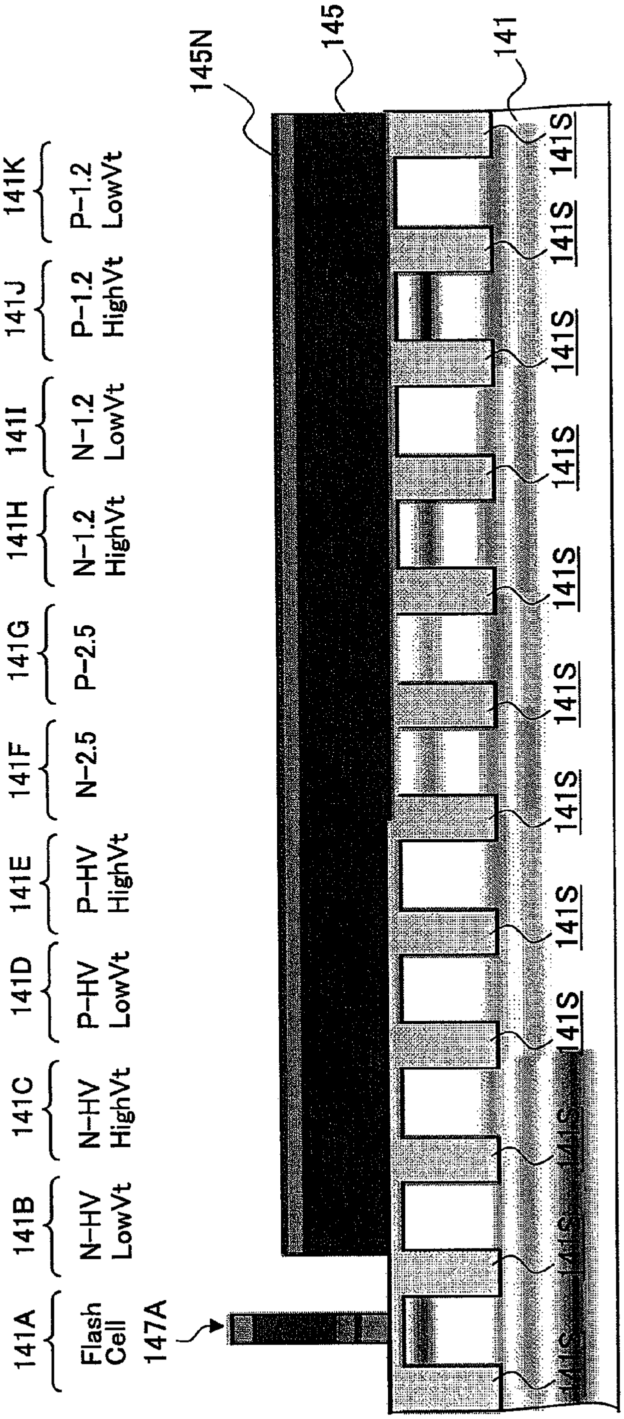

Next in the process of FIG. 23Q, an undoped polysilicon film 145 it deposited on the structure of FIG. 23P with the thickness of 180 nm by a CVD process, and an SiN film 145N is deposited further thereon by a plasma CVD process as an anti-reflection coating and at the same time as an etching stopper film, with the thickness of 30 nm.

Next, in the step of FIG. 23Q, the polysilicon film 145 is patterned by a resist process, and the stacked gate electrode structure 147A is formed in the flash memory device region 144A with the construction such that the control gate electrode 145 stacked on the inter-electrode insulation film 144.

Figure 23R:
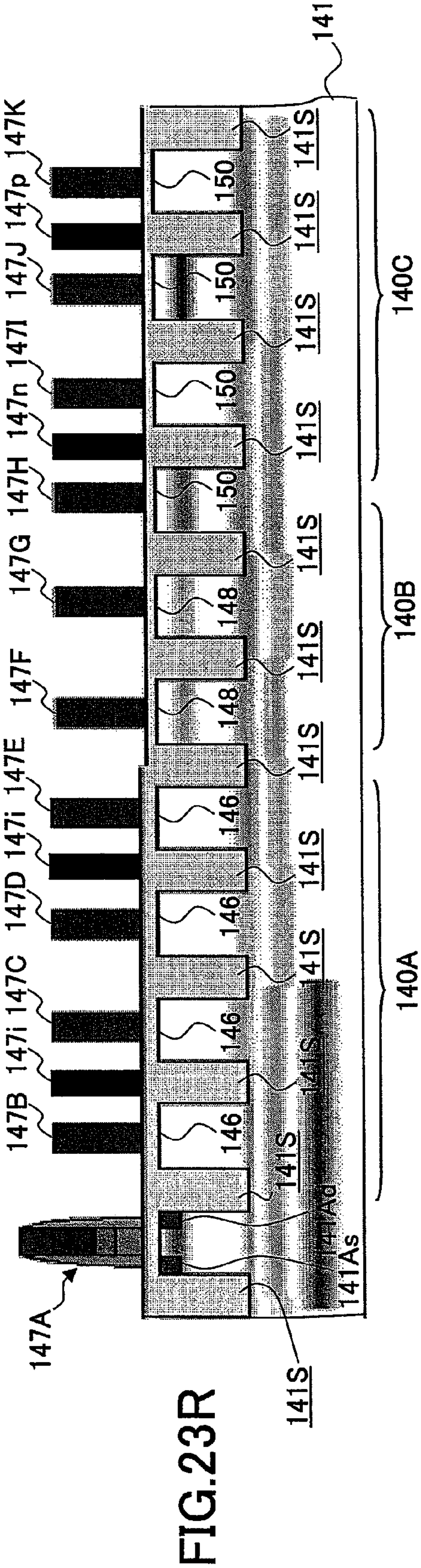

Next, in the step of FIG. 23R, a thermal oxide film (not shown) is formed on the sidewall surfaces of the stacked gate electrode structure 147A by applying a thermal oxidation processing to the structure of FIG. 23Q. Further, while using the stacked gate electrode structure 147A and the polysilicon film 145 as a mask, $As^+$ or $P^+$ is introduced into the device region 141A by an ion implantation process, and with this, the control gate electrode 145 in the stacked floating gate electrode structure 147A is doped to $n^+$-type and the source region 141As and the drain region 141Ad are formed at respective lateral sides of the stacked gate electrode 147A at the same time. During this ion implantation process, it should be noted that the polysilicon film 145 is covered by a resist film not illustrated in the device regions 141B-141K.

Further, in the step of FIG. 23R, a pyrolitic CVD process and an etch back process by RIE are conducted subsequently after formation of the source region 141*s* and the drain region 141*d*, and the sidewall insulation films 147*s* of SiN are formed to the sidewall surface of the stacked gate electrode structure 147A, and the plasma SiN film on the polysilicon film 145 is removed at the same time.

After formation of the sidewall insulation films 147*s*, the polysilicon film 145 is patterned in the device regions 141B-141K in the step of FIG. 23R, and the gate electrodes 147B-147K of undoped polysilicon are formed in correspondence to the device regions 141B-141K, respectively. Further, there is formed an undoped polysilicon pattern 147*i* constituting the interconnection pattern WP1 on the device isolation insulation film 141S for the part between the device regions 141B and 141C, there is formed an undoped polysilicon pattern 147*i* constituting the interconnection pattern WP2 on a part of the device isolation insulation film 141S between the device regions 141D and 141E, there is formed a polysilicon pattern 147*n* constituting the interconnection pattern WP3 on the device isolation insulation film 141S between the device regions 141H and 141I, and further there is formed a polysilicon pattern 147*p* constituting the interconnection pattern WP4 on a part of the device isolation insulation film 141S between the device regions 141J and 141K. In the step of FIG. 23R, the polysilicon patterns 147*n* and 147*p* are in the undoped state.

Figure 23S:
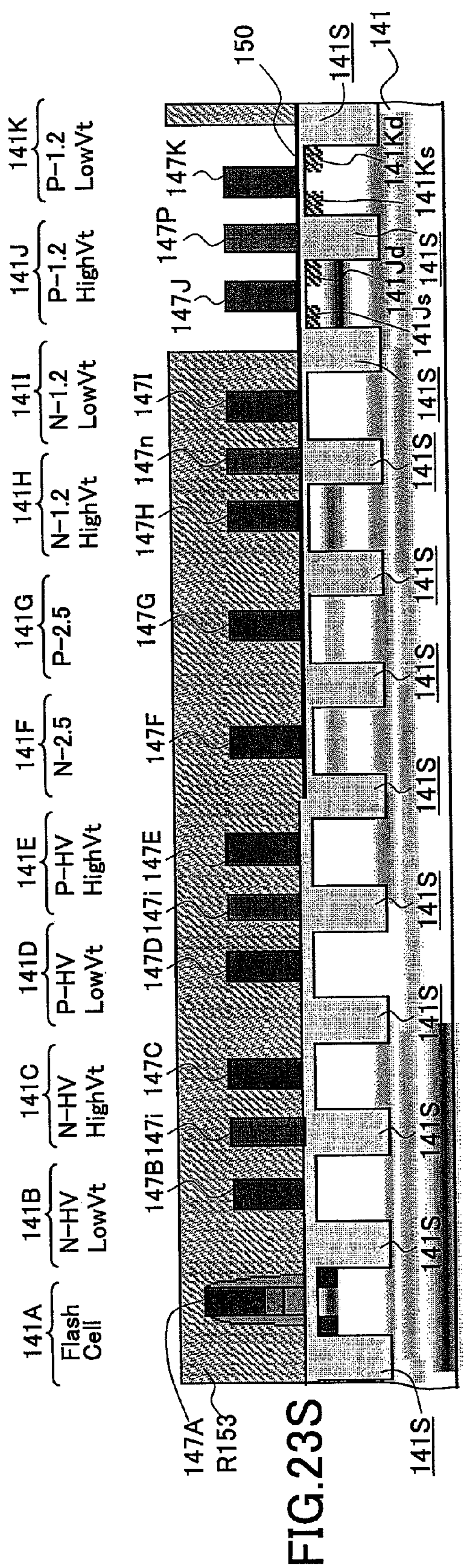

Next in the process of FIG. 23S, a resist pattern R153 exposing the device regions 141J and 141K is formed on substrate 141 on the structure of FIG. 23R, and while using the resist pattern R152 and the gate electrodes 147J and 147K as a mask, $B^+$ is introduced by an ion implantation process under the acceleration voltage of 0.5 keV with the dose of $3.6\times10^{14}$ $cm^{-2}$, followed by oblique ion implantation process of $As^+$ conducted four times with an angle of 28° under the acceleration voltage of 80 keV with the dose of $6.5\times10^{12}$ $cm^{-2}$. With this, a source extension region 141Js or 141Ks of p-type accompanied with a pocket region of n-type and a drain extension region 141Jd or 141Kd of p-type accompanied with a pocket region of n-type are formed in the device regions 141J and 141K at respective lateral sides of the gate electrode 147J or 147K. In the step of FIG. 23S, it should be noted that the resist pattern R153 is formed so as to expose the polysilicon pattern 147*p*, and thus, there occurs ion implantation of p-type and n-type also in the polysilicon pattern 147*p*, while this does not cause a problem, because the ion implantation of high concentration is to be conducted later to the polysilicon pattern 147*p*. Of course, it is possible to form the polysilicon pattern 147*p* so as to cover the resist pattern R153. In this case, ion implantation to the polysilicon pattern 147*p* does not take place in the step of FIG. 23S.

Figure 23T:
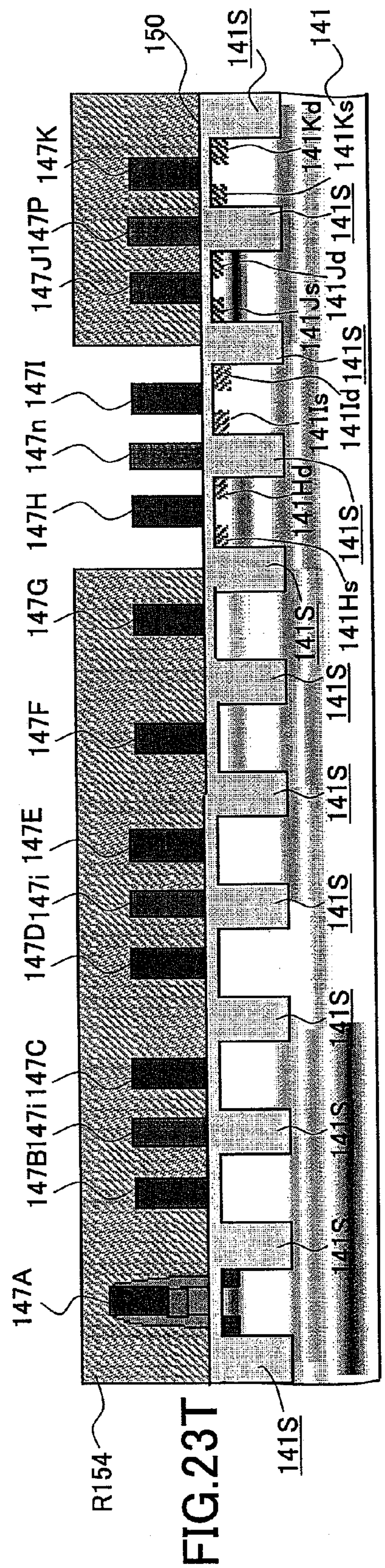

Next with the step of FIG. 23T, the resist pattern R153 of FIG. 18S is removed, and the resist pattern R154 exposing the device regions 141H and 141I is formed on the substrate 141. Further, while using the resist pattern R154 and the gate electrodes 147H and 147I as a mask, $As^+$ is introduced by an ion implantation process under the acceleration voltage of 3 keV with the dose of $1.1\times10^{15}$ $cm^{-2}$, followed by ion implantation process of $BF_2^+$ conducted obliquely four times each with the angle of 28° under the acceleration voltage of 35 keV with the dose of $9.5\times10^{12}$ $cm^{-2}$ and with this, a source extension region 141Hs or 141Is of n-type accompanied with a pocket region of p-type and a drain extension region 141Hd or 141Id of n-type accompanied with a pocket region of p-type are formed in the device regions 141H and 141I at respective lateral sides of the gate electrode 147H or 147I. In the step of FIG. 23T, the resist pattern R154 is formed so as to expose the polysilicon pattern 147*n*, and thus, there occurs also ion implantation of p-type and n-type in the polysilicon pattern 147*n*, while this does not cause a problem in view of the fact that ion implantation of high concentration level is to be made into the polysilicon pattern 147 later. Further, it is possible to form the resist pattern R154 so as to cover the polysilicon pattern 147*n*. In this case, there occurs no ion implantation to the polysilicon pattern 147*n* in the step of FIG. 23T.

Figure 23U:
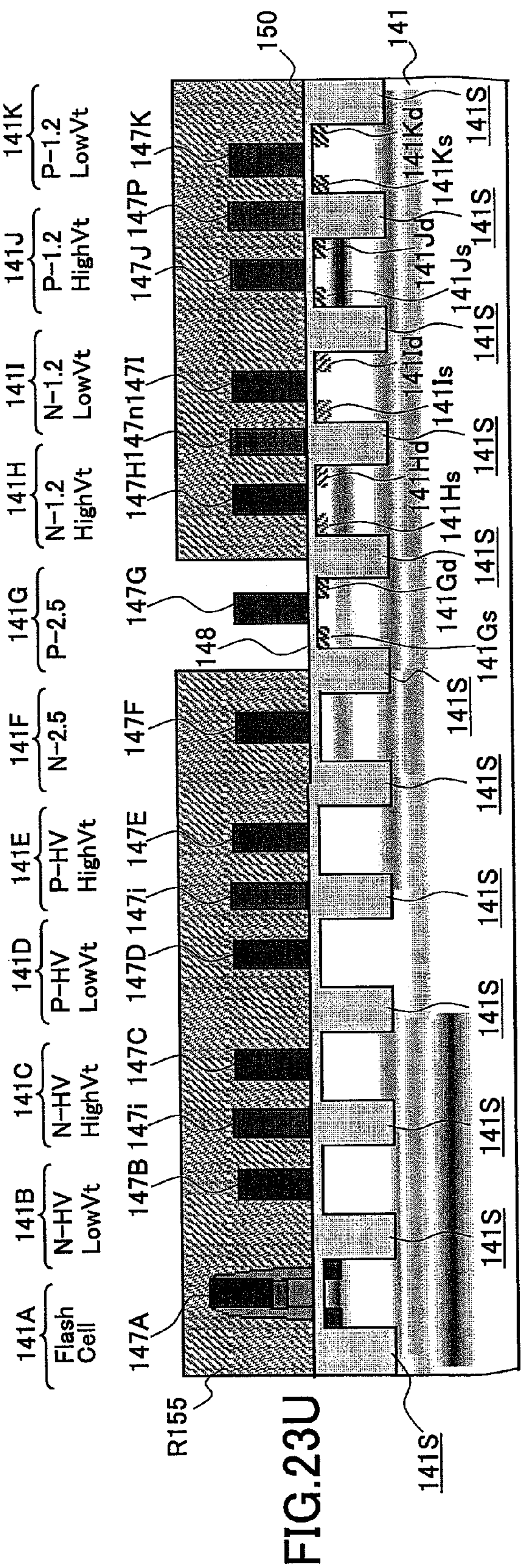

Next, the resist pattern R154 of FIG. 23T, is removed with the step of FIG. 23U, and a resist pattern R155 exposing the device region 141G is formed newly on substrate 141. Further, while using the resist pattern R153 and the gate electrode 147G as a mask, ion implantation of $BF_2^+$ is conducted under the acceleration voltage of 10 keV with the dose of $7.0\times10^{13}$ $cm^{-2}$. With this, the p-type source region 141Gs and the p-type drain region 141Gd are formed at respective lateral sides of the gate electrode 147G.

Figure 23V:
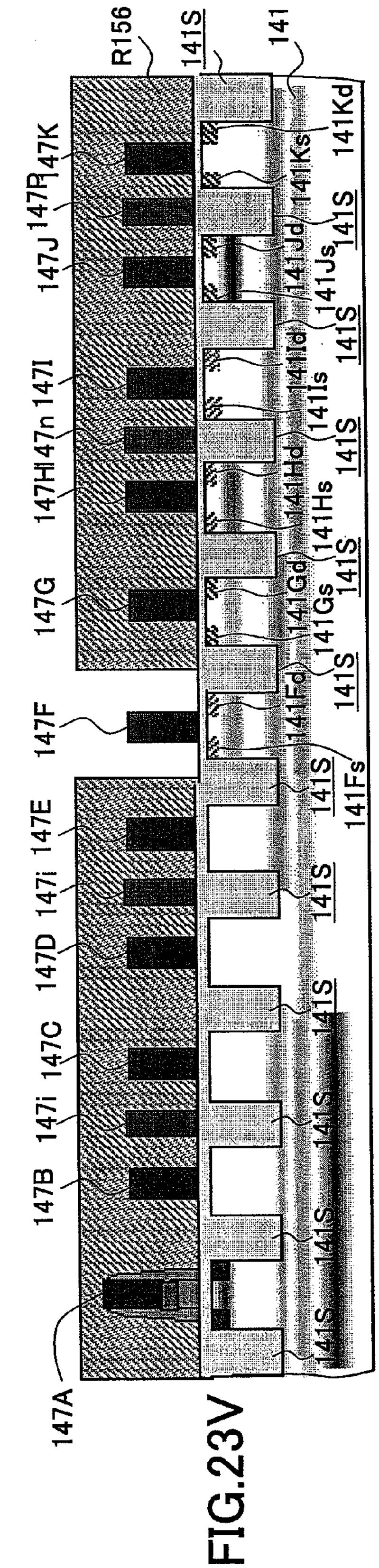

Further, the resist pattern R155 of FIG. 23U is removed with the step of FIG. 23V, and a resist pattern R156 exposing the device region 141F is formed newly on the substrate 141. Further, while using the resist pattern R156 and the gate electrode 147F as a mask, $As^+$ is introduced by an ion implantation process conducted under the acceleration voltage of 10 keV with the dose of $2.0\times10^{13}$ $cm^{-2}$, followed by an ion implantation process of $P^+$ conducted under the acceleration voltage of 10 keV with the dose of $3.0\times10^{13}$ $cm^{-2}$. With this, an n-type source region 141Fs and an n-type drain region 141Fd are formed at respective lateral sides of the gate electrode 147F.

Figure 23W:
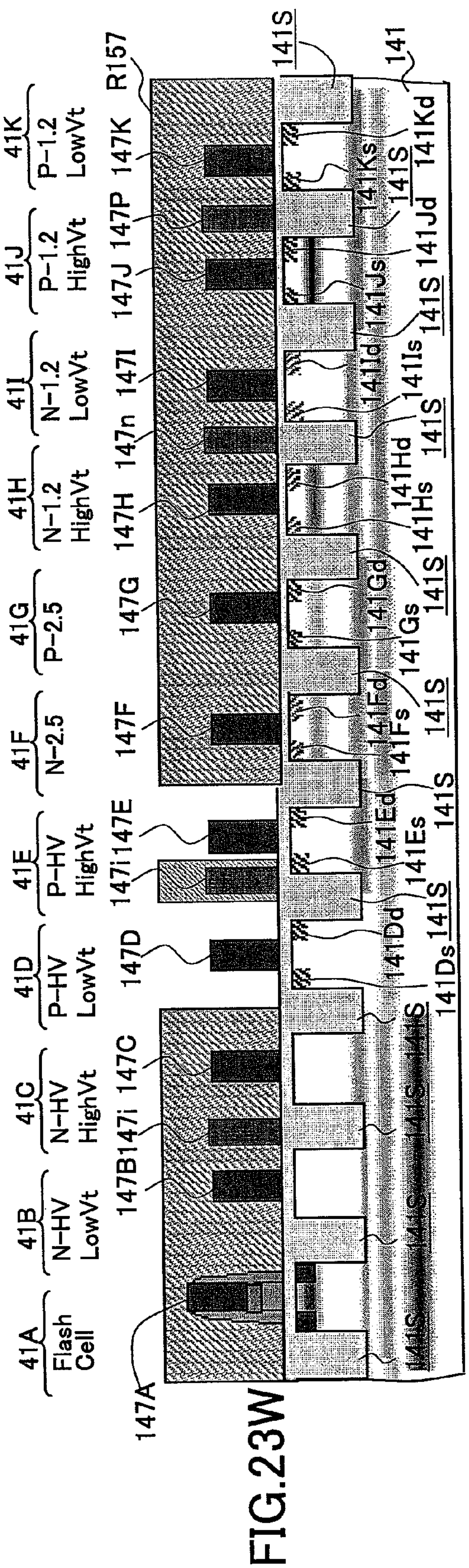

Next, in the step of FIG. 23W, the resist pattern R156 is removed and the resist pattern R157 exposing the device regions 141D and 141E is formed on the substrate 141. Thereby, it should be noted that the resist pattern R157 is formed so as to cover not only the polysilicon pattern 147*i* formed on the device isolation insulation film 141S between the gate electrodes 147H and 147I but also the polysilicon pattern 147*i* formed on the device isolation insulation film 141S between the gate electrodes 147D and 141E, and while using the resist pattern R157 and the gate electrodes 147D and 147E as a mask, $BF_2^+$ is introduced by an ion implantation process under the acceleration voltage of 80 keV to the device region 141D and also 141E with the dose of $4.5\times10^{13}$ $cm^{-2}$. With this, a p-type source region 141Ds and also a p-type drain region 141Dd are formed in the device region 141D at respective lateral sides of the gate electrode 147D. Further, in the device region 141E, a p-type source region 141Es and a p-type drain region 141Ed are formed at both sides of the gate electrode 147E. In this process, ion implantation to the polysilicon pattern 147*i* does not take place.

Figure 23X:
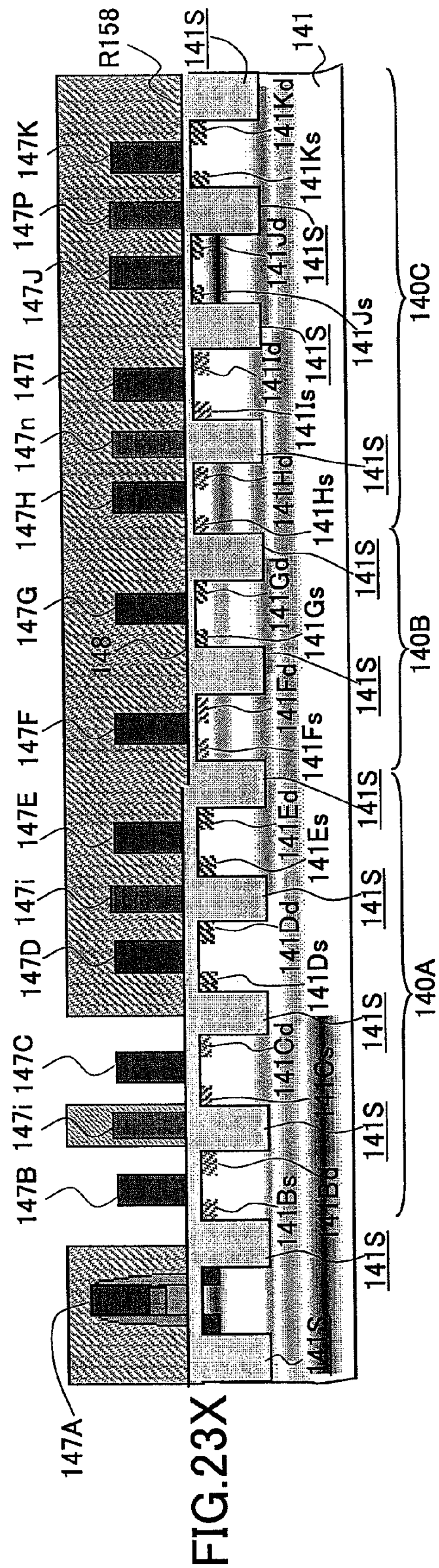

Further, the resist pattern R157 is removed in the step of FIG. 23X, and a resist pattern R158 exposing the device regions 141B and 141C is formed on the substrate 141. Thereby, the resist pattern R158 is formed so as to cover not only the polysilicon pattern 147*i* formed on the device isolation insulation film 141S between the gate electrodes 147D and 147E but also the polysilicon pattern 147*i* formed on the device isolation region 141S between the gate electrodes 147B and 147C, and while using the resist pattern R158 and the gate electrodes 141B and 141C as a mask, $P^+$ is introduced by an ion implantation process under the acceleration voltage of 35 keV with the dose of $4.0\times10^{13}$ $cm^2$, followed by an ion implantation of $P^+$ conducted under the acceleration voltage of 10 keV with the dose of $3.0\times10^{13}$ $cm^{-2}$. With this, an n-type source region 141Bs and an n-type drain region 141Bd are formed in the device region 141B at respective lateral sides of the gate electrode 147B and an n-type source region 141Cs and an n-type drain region 141Cd are formed at respective lateral sides of the gate electrode 147C in the device region 141C. With this process, there occurs no ion implantations in the foregoing two polysilicon patterns 47*i*.

Figure 23Y:
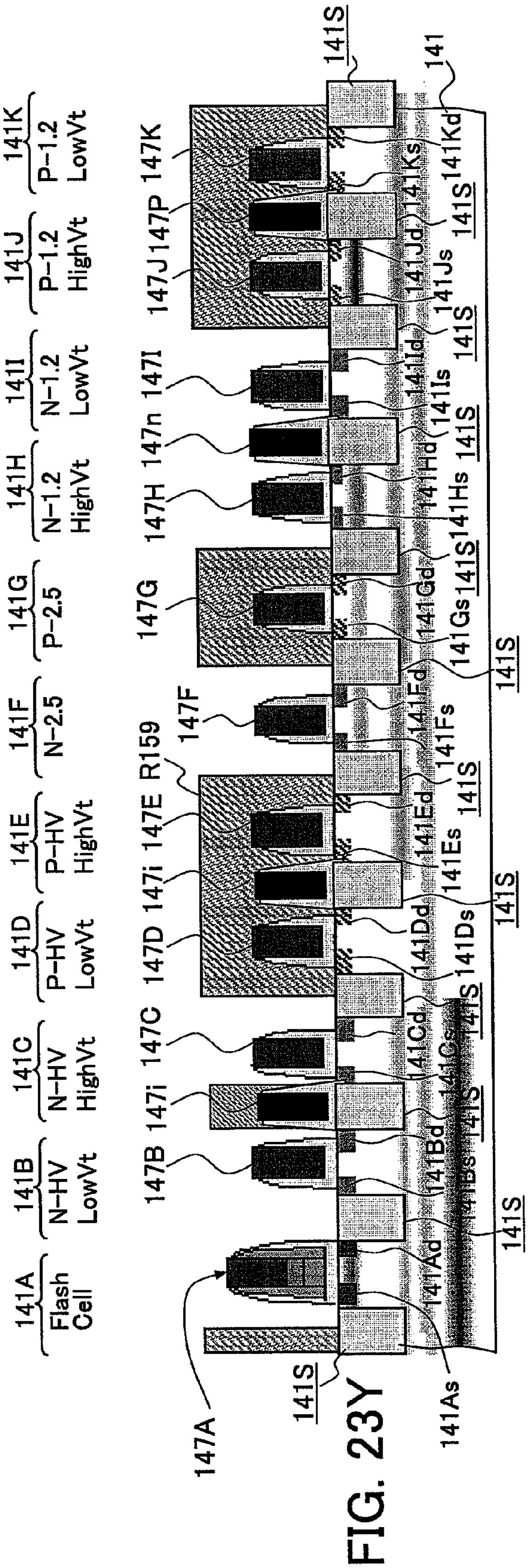

Further, in the step of FIG. 23Y, the resist pattern R158 of FIG. 23X is removed, and an oxide film is deposited on the substrate 141 so as to cover the stacked gate electrode structure 147A and the gate electrodes 147B-147K including the polysilicon patterns 147*i*, 147*n* and 147*p*, uniformly with a thickness of 100 nm. Further, by etching back the same by RIE until the surface of substrate 141 is exposed, sidewall oxide films are formed on the sidewall surfaces of the stacked gate electrode structure 147A, the gate electrodes 147E-147K, and the polysilicon patterns 147*i*, 147*n* and 147*j*.

Furthermore as shown in FIG. 23Y, a resist pattern R157 is formed on the substrate 141 so as to expose the device regions 141A-141C, the device region 141F and the device region 147H and such that the two polysilicon patterns 147 are exposed. Further, while using the resist pattern R157 and the stacked gate electrode structure 147A, the gate electrodes 147B and 147C, the gate electrode 147F and the gate electrodes 147H and 147I and further the sidewall oxide films thereof as a mask, $P^+$ is introduced by an ion implantation process under the acceleration voltage of 10 keV with the dose of $6.0\times10^{15}$ $cm^{-2}$. With this, the source region and the drain region of $n^+$-type (not shown) are formed in each of the device regions 141A-141C, 141F, 141H and 141I. Further, with this process, the gate electrodes 147B-147C, 147F and 147H-147I and further the polysilicon pattern 147*n* are doped to $n^+$-type.

Figure 23Z:
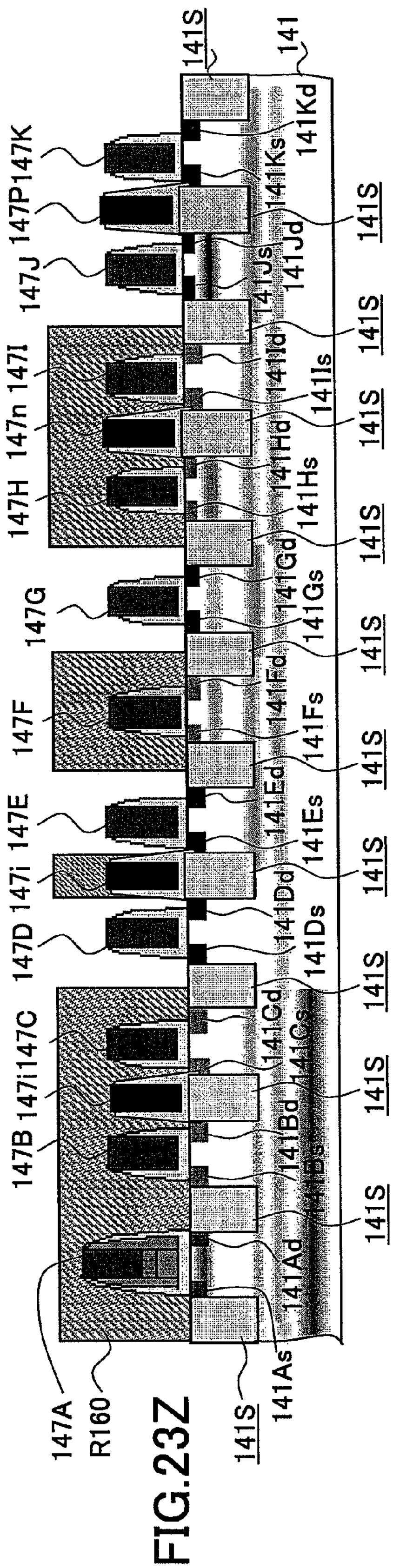
Figure 23A:
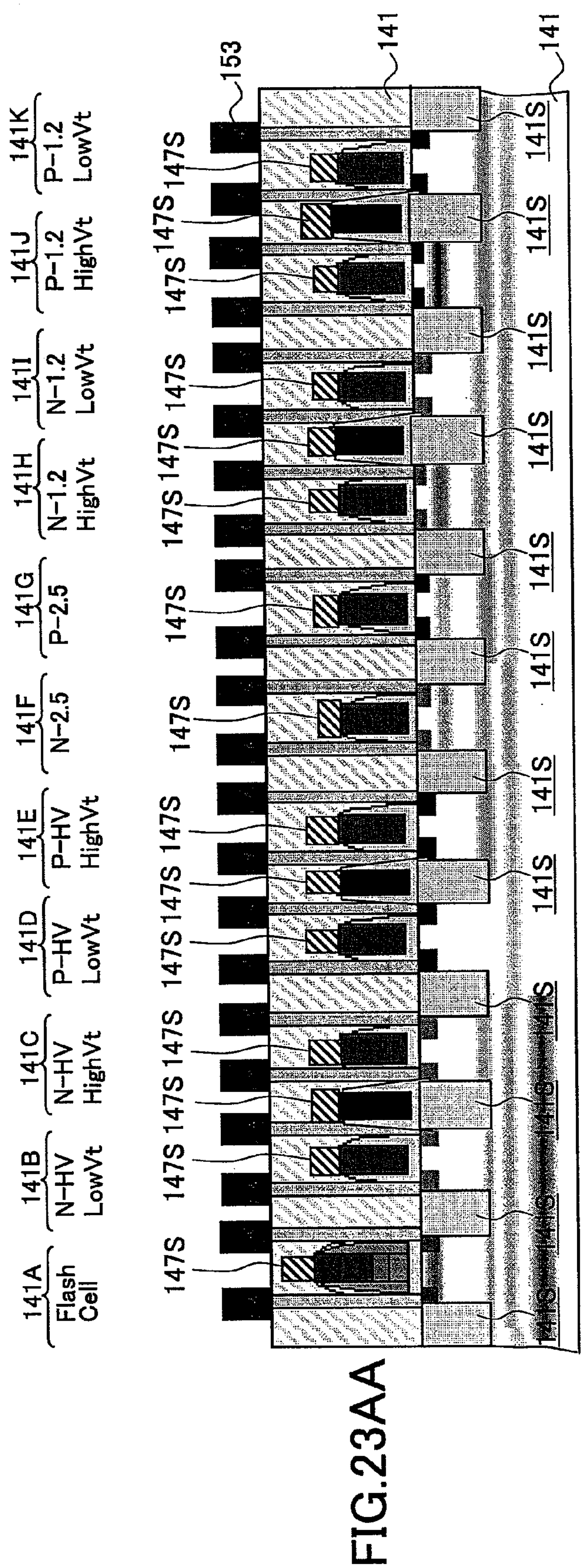
Figure 23A:
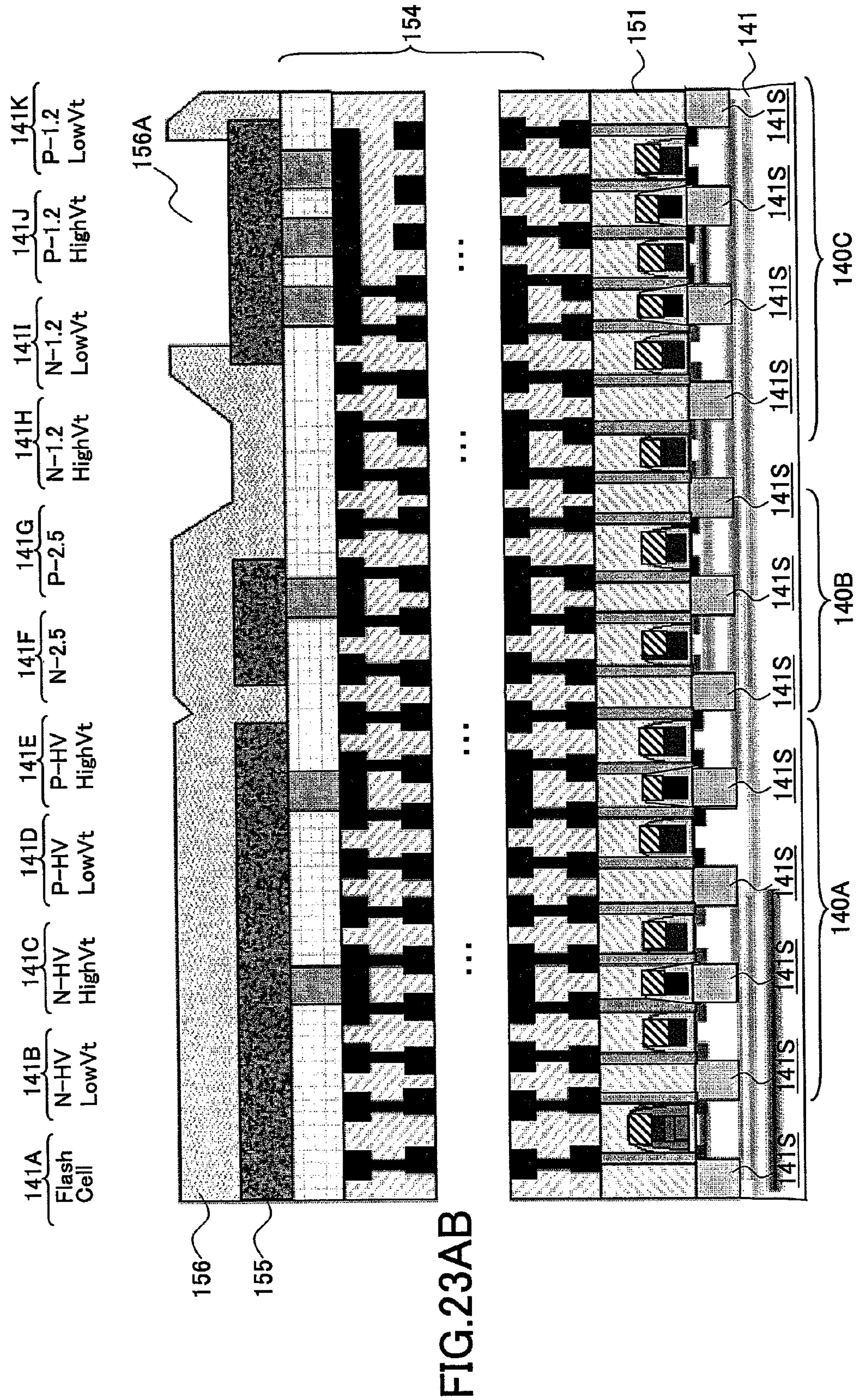

Further, in the step of FIG. 23Z, a resist pattern R160 is formed on the substrate 141 so as to expose the device regions 141D and 141E, the device region 141G and the device regions 147J and 147K such that the two polysilicon patterns 147*i* are covered. Further, while using the resist pattern R160, the gate electrodes 147D, 147E, 147G, 147J and 147K and further the sidewall oxide films thereof as a mask, $B^+$ is introduced by an ion implantation process under the acceleration voltage of 5 keV with the dose of $4.0\times10^{15}$ $cm^{-2}$. With this, the source region and the drain region of $p^+$-type are formed in each of the device regions 141D-141E, 141G, 141J and 141K. Further, in this process, the gate electrodes 147D-147E, 147G and 147J-147K and the polysilicon pattern 147*p* are doped to the $p^+$-type.

Further, in the step of FIG. 23AA, the resist film R158 is removed, and a silicide layer 147S is formed on the exposed surfaces of the gate electrodes 147A-147K, on the exposed surfaces of the polysilicon pattern 147*i*, 147*n* and 147*p*, and on the exposed surfaces of the source region and the drain region by a commonly known method. Further, an insulation film 151 is deposited on the substrate 141 and contact holes are formed therein. Further, an interconnection pattern 153 is formed on the insulation film 151 so that we make a contact with the source region and the drain region of each of the device regions 141A-141K via the contact holes thus formed.

Further, in the step of FIG. 23AB, a multilayer interconnection structure 154 are formed on the structure of FIG. 23AA, and pad electrodes 155 are formed to the multilayer interconnection structure. Further, the overall structure is covered by a passivation film 156, and contact openings 156A are formed in the passivation film 156 according to the needs. With this, the integrated circuit device 140 we explained with reference to FIG. 22 is completed.

Similarly to the previous embodiment, there exists a polysilicon layer of undoped or low impurity concentration level between the silicide interconnection pattern 147S extending on the device isolation insulation film 141S in the high voltage region 140A and the device isolation insulation film 141S also in the present embodiment, and thus, there occurs increase in the threshold voltage of the parasitic field transistor formed right underneath the device isolation insulation film. Thereby, occurrence of leakage current by punch-through is suppressed effectively.

For example, in the case the device isolation insulation film 141S has a width of 0.6 μm and a depth of 300 nm, it is possible to increase the threshold voltage of the parasitic field transistor formed right under the device isolation insulation film 141S from 10V to 15V. Thereby, there is no need of increasing the impurity concentration level of the device region 141B at the depth 141*pw* or 141*pc* with the present embodiment, and thus, there occurs no increase of threshold in the high voltage low threshold n-channel MOS transistor formed in the device region 141B or in the high voltage low threshold p-channel MOS transistor formed in the device region 141D. Thus, it becomes possible to drive the flash memory cell in the semiconductor integrated circuit device 140 of FIG. 3 by the control circuit formed of the high voltage low threshold n-channel MOS transistor formed in the device region 141B, the high voltage low threshold n-channel MOS transistor formed in the device region 141B, the high voltage high threshold n-channel MOS transistor formed in the device region 141C, the high voltage low threshold p-channel MOS transistor was formed in the device region 141D, and the high voltage high threshold p-channel MOS transistor formed in the device region 141E. Here, it should be noted that, with the control circuit noted above, the high voltage low threshold n-channel MOS transistor and the high voltage high threshold re-channel MOS transistor formed in the device regions 141B and 141C form a CMOS circuit together with the high voltage low threshold p-channel MOS transistor and the high voltage high threshold p-channel MOS transistor formed in the device regions 141D and 141E.

Similarly, the low voltage low threshold n-channel MOS transistor and the low voltage high threshold n-channel MOS transistor formed in the device regions 141H and 141I form a CMOS logic circuit together with the low voltage low threshold p-channel MOS transistor and the low voltage high threshold p-channel MOS transistor were in the device regions 141J and 141K.

Further, no interconnection pattern is provided to the mid voltage region 140B with the present embodiment, it is naturally possible to provide an interconnection pattern to the middle voltage region 140B. As explained before, the mid voltage n-channel MOS transistor in the device region 141F and the p-channel MOS transistor in the device region 141G form an input/output circuit of CMOS construction.

Further, while the polysilicon patterns 147*i* are covered by the resist pattern R157 or R158 in the ion implantation process of FIG. 23W or 23X with the present embodiment, improvement of punch-through resistance is attained to some extent also in the case the polysilicon patterns 147*i* are not covered by the resist pattern, in view of the fact that ion implantation dose in the process of FIGS. 23W and 23X is slight.

In the present embodiment, there is a need of covering the polysilicon patterns 147*i* by the resist patterns R157-R160 at the time of ion implantation process with the step of FIGS. 23W-23Z, while there is no need of covering the polysilicon pattern 147*n* or 147*p*. Thus, with the present embodiment, the process of covering the highly miniaturized polysilicon pattern 147*n* or 147*p* similarly to the gate electrodes 147H-147K of the low-voltage transistor by carrying out a strict resist process is omitted. Thus, the resist patterns are formed so as to cover only the polysilicon patterns 147*i* formed on the high voltage region 140A, in which the with of device isolation is large. Thereby, the mask data for the gate electrodes 147B-147E of the high voltage MOS transistor is used also for the mask data for the resist patterns R157-R160 covering the polysilicon patterns 147*i*, with expansion in correspondence to alignment margin. Thereby, mask formation is achieved easily. Because of this, there occurs no difficulty in the formation of the resist patterns R157-R160 used with the present embodiment.

Sixth Embodiment

Figure 24A:
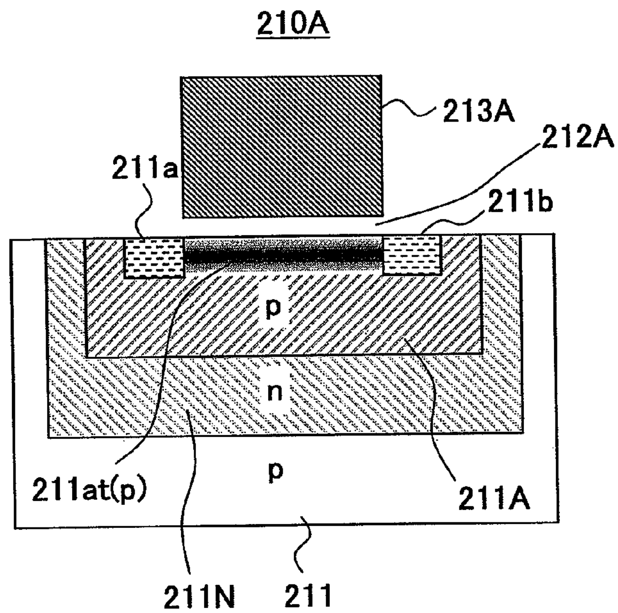
FIGS. 24A-24F are diagrams showing the construction a semiconductor integrated circuit device according to a sixth embodiment of the present invention for each part thereof.
Figure 24B:
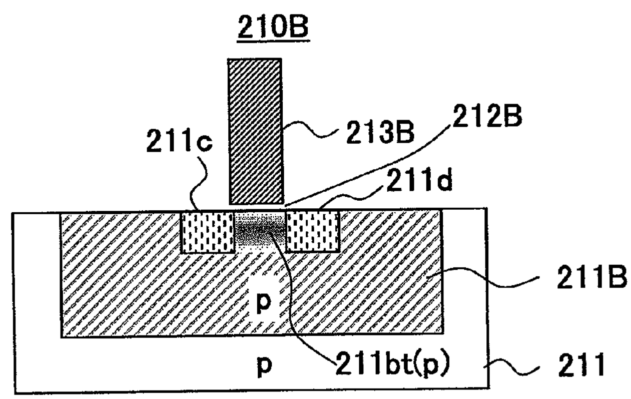
Figure 24C:
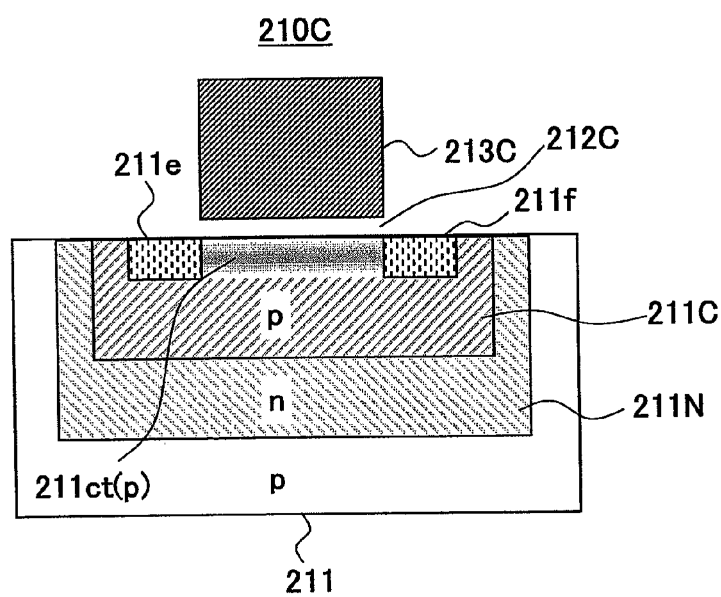
Figure 24D:
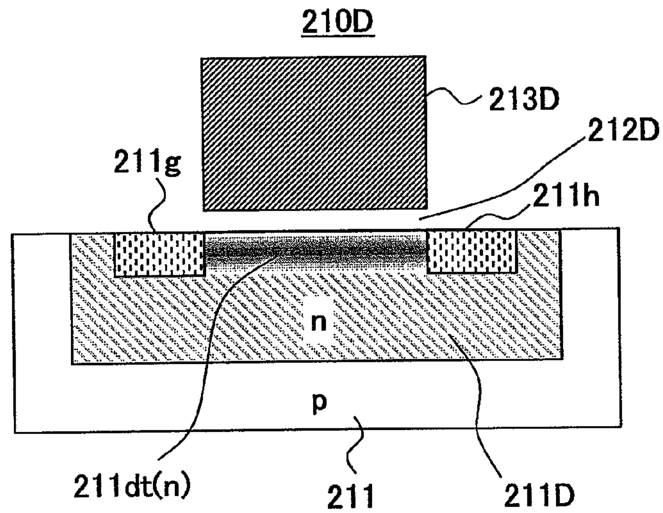
Figure 24E:
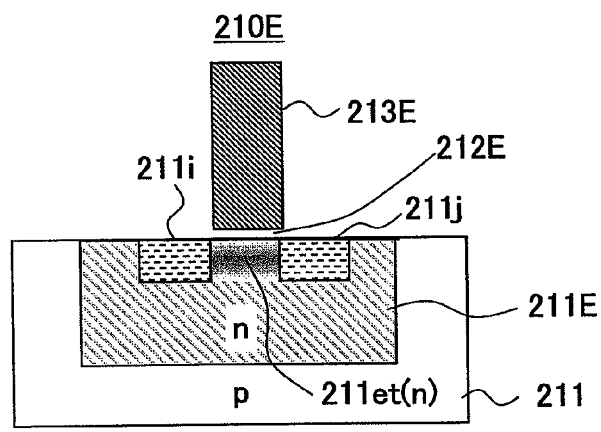
Figure 24F:
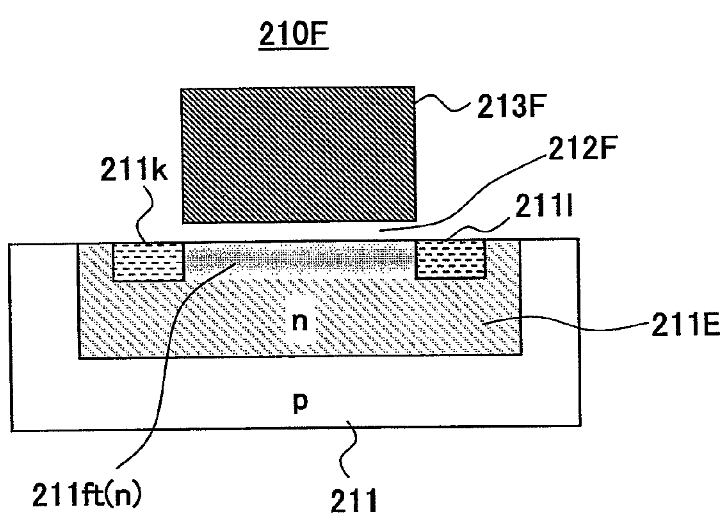

FIGS. 24A-24F are diagrams showing the construction of a semiconductor integrated circuit device according to a sixth embodiment of the present invention formed on a p-type silicon substrate 211, wherein FIG. 24A shows a negative voltage boosting capacitor 210A having a structure similar to the structure of a p-channel MOS transistor, FIG. 24B shows a low voltage n-channel MOS transistor 210B, while FIG. 24C shows a high voltage n-channel MOS transistor 210C. Further, FIG. 24D shows a positive voltage boosting capacitor 210D having a structure similar to the structure of an n-channel MOS transistor, while FIG. 24E shows a low voltage p-channel MOS transistor 210E. Further, FIG. 24F shows a high voltage p-channel MOS transistor 210F.

Referring to FIG. 24A, there is formed an n-type well 211N in the p-type silicon substrate 211, and a p-type well 211A is formed in the n-type well 211N in correspondence to the device region.

On the p-type well 211A, there is formed a gate insulation film 212A of a silicon oxide film and a gate electrode 213A is formed on the gate insulation film 212A. Further, diffusion regions 211*a* and 211*b* of $p^+$-type are formed in the p-type well 211A at respective lateral sides of the gate electrode 213A. The polysilicon gate electrode 213A is doped to $p^+$-type.

On the other hand, there is formed a different p-type well 211B on the p-type substrate 211 as shown in FIG. 24B, and a low voltage n-channel MOS transistor 210B is formed on the p-type well 211B.

Thus, on the p-type well 211B, there is formed a polysilicon gate electrode 213B of short gate length via a gate insulation film 212B of a silicon oxide film of a reduced thickness as compared with the gate insulation film 212A, and the gate electrode 213B is doped to $n^+$-type. Further, source region 211*c* and drain region 211*d* of $n^+$-type are formed at respective lateral sides of the gate electrode 213B in the p-type well 211B, and a channel doping region 211*bt* of p-type is formed in the p-type well 211B near the substrate surface between the source region 211*c* and the drain region 211*d* for threshold control.

Further, as shown in FIG. 24C, another p-type well 211C is formed in the n-type well 211N on the n-type silicon substrate 211, and a high voltage n-channel MOS transistor 210C is formed on this another p-type well 211C.

Thus, on the p-type well 211C, a gate insulation film 212C of a silicon oxide film having the thickness generally equal to that of the gate insulation film 212A, and a gate electrode 213C of large gate length doped to $n^+$-type is formed on the gate insulation film 212C. Further, in the p-type well 211C, source regions 211*e* and 211*f* of $n^+$-type are formed at respective lateral sides of the gate electrode 213C, and a low channel doping region 211*ct* of $p^-$-type with the p-type impurity concentration level lower than that of the channel doping region 211*bt* is formed in the vicinity of the substrate surface in the p-type well between the source region 211*e* and the drain region 211*f* for threshold control.

Further, with the boosting capacitor 210A of FIG. 24A, there is formed a p-type impurity injection region 211 at along the surface of the silicon substrate 211 in the p-type well 211A between the diffusion regions 211*a* and 211*b* right underneath the gate electrode 213A with p-type impurity concentration level higher than that of the channel doping region 211*bt*.

On the other hand, with such a semiconductor integrated circuit device, there is also a need of producing positive high voltage, and thus, an n-type well 211D is formed on the silicon substrate 211 as shown in FIG. 24D, and a positive voltage boosting capacitor 210D is formed on the n-type well 211D in the form of stacking of a capacitor insulation film of a silicon oxide film having a thickness generally identical to the gate insulation film 212C of the high voltage n-channel MOS transistor 210C and a polysilicon electrode 213D doped to $n^+$-type. Further, diffusion regions 211*g* of and 211*h* of $n^+$-type are formed in the n-type well 211D at respective lateral sides of the gate electrode 213D.

Further, another n-type well 211E is formed on the p-type silicon substrate 211 as shown in FIG. 24E, and a low voltage p-channel MOS transistor 210E is formed on the n-type well 211E.

Thus, on the n-type well 211E, there is formed a polysilicon gate electrode 213E of short gate length via a gate insulation film 212E of a silicon oxide film of small thickness substantially identical to that of the gate insulation film 212B of FIG. 6B, wherein the gate electrode 213E is doped to $p^+$-type. Further, in the n-type well 211E, there are formed a source region 211*i* and a drain region 211*j* of $p^+$-type at respective lateral sides of the gate electrode 213E. Further, there is formed a channel doping region 211*et* of n-type in the n-type well 211E in the vicinity of the substrate surface between the source regions 211*i* and 211*j* for threshold control.

Further, on the n-type silicon substrate 211, another n-type well 211E is formed as shown in FIG. 24F, and a high voltage n-channel MOS transistor 210F is formed on the n-type well 211E.

Thus, a gate insulation film 212F of a silicon oxide film having the thickness generally identical to that of the gate insulation film 212C is formed on the n-type well 211F, and a gate electrode 213F of large gate length and doped to $p^+$-type is formed on the gate insulation film 212F. Further, source regions 211*k* and 211*l* of $p^+$-type are formed in the p-type well 211F at respective lateral sides of the gate electrode 213F, and a low channel doping region of 211*ft* of $n^-$-type with an n-type impurity concentration level lower than that of the channel doping region 211*et* is formed in the n-type well 211E between the source region 211*k* and the drain regions 211*l* in the vicinity of the substrate surface for the threshold control.

Further, in the boosting capacitor 210D of FIG. 24D, there is formed an n-type impurity injection region 211*dt* of higher impurity concentration level than the channel doping region 211*et* in the n-type well 211D along the surface of the silicon substrate 211 between the diffusion regions 211*g* and 211*h*.

Figure 12:
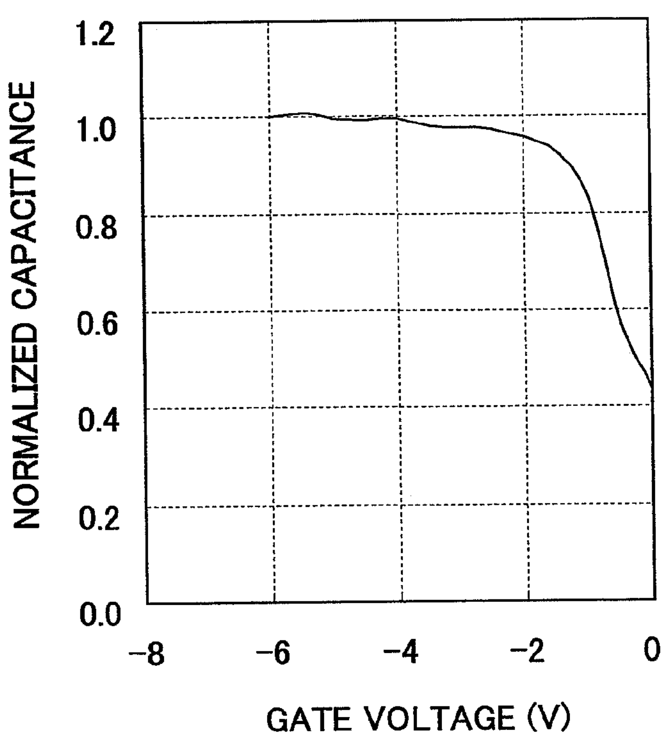

FIG. 25 shows the capacitance-voltage characteristic of the negative voltage boosting capacitor 10A of FIG. 24A, wherein it should be noted that the result of FIG. 12 explained before is shown also in FIG. 25 for the purpose of comparison.

Figure 25:
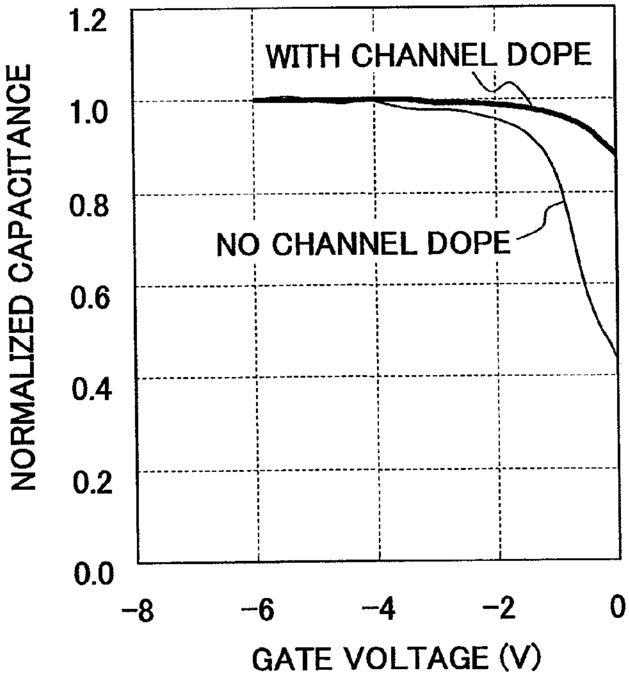
FIGS. 25 and 26 are diagrams showing the capacitance-voltage characteristic of the boosting capacitor formed in the semiconductor integrated circuit according to a seventh embodiment of the present invention in comparison with a conventional boosting capacitor.

Referring to FIG. 25, it can be seen that decrease of capacitance is improved particularly in the operational region of small gate voltage, by setting the impurity concentration level of the p-type channel doped region 210 at of the negative voltage boosting capacitor 210A of FIG. 24A right underneath the $p^+$-type gate electrode 213A generally equal to or larger than the impurity concentration level of the p-type channel doping region in the low voltage n-channel MOS transistor shown in FIG. 24B. Thereby, it becomes possible to achieve efficient boosting even with a low voltage such as 1.2V and it becomes possible to produce a large negative voltage.

Figure 11:
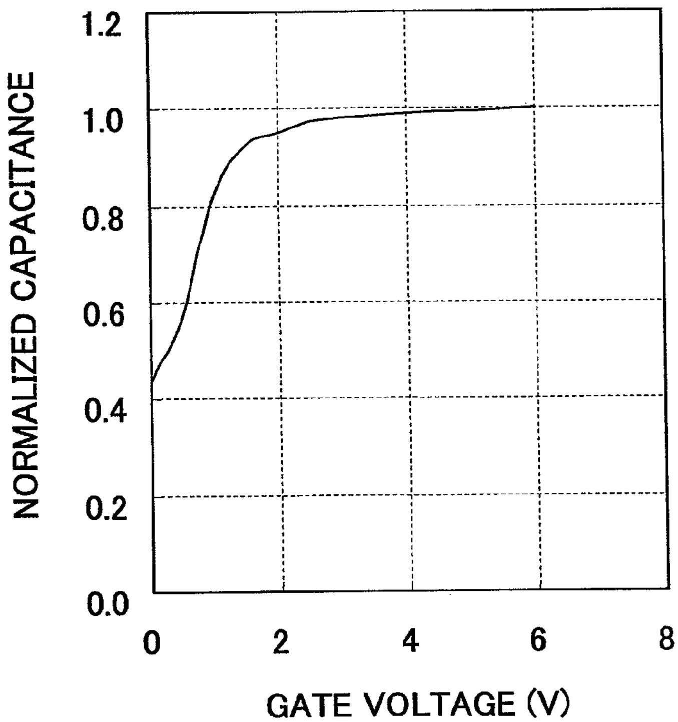
FIGS. 11 and 12 are diagrams showing the capacitance-voltage characteristic obtained by the inventor of the present invention for the boosting capacitor of FIGS. 10A and 10B.
Figure 26:
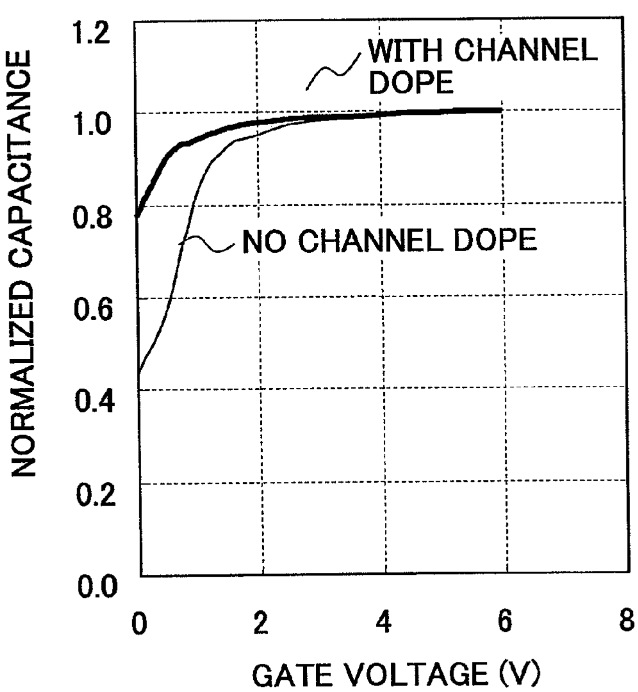

FIG. 26 shows the capacitance-voltage characteristic of the positive voltage boosting capacitor 210D of FIG. 24D, wherein it should be noted that the result of previous FIG. 11 is shown also in FIG. 26 for the purpose of comparison.

Referring to FIG. 26, decrease of capacitance is improved also in this case particularly in the operational region of small gate voltage, by setting, in the positive voltage boosting capacitor 210D of FIG. 24D, the impurity concentration level of the n-type channel doping region 210*dt* right underneath the $n^+$-type gate electrode 213D to be equal to or larger than the impurity concentration level of the n-type channel doping region in the low voltage p-channel MOS transistor shown in FIG. 24E. With this, it becomes possible to achieve efficient boosting at a low supply voltage such as 1.2V and it becomes possible to produce large positive voltage.

Seventh Embodiment

Figure 27:
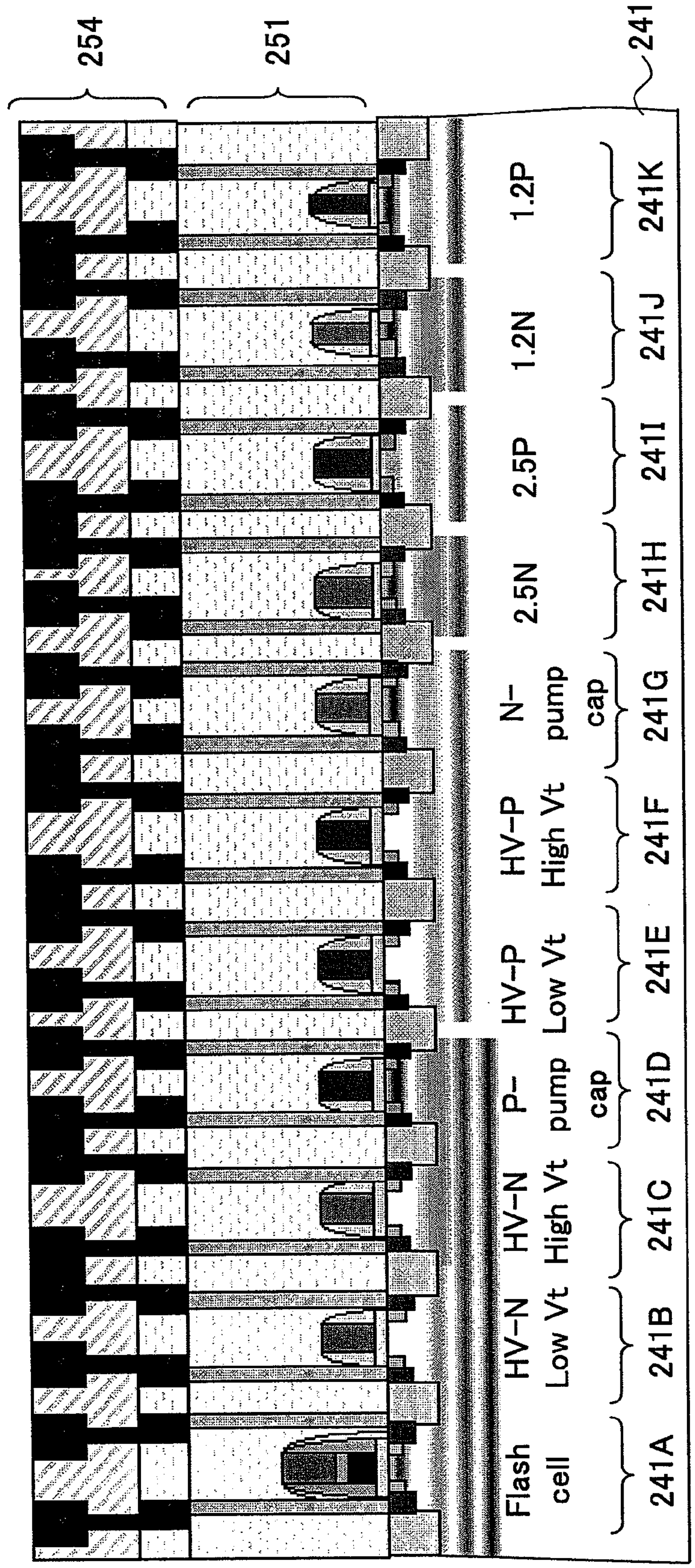
FIG. 27 is a diagram showing the construction of the semiconductor integrated circuit device according to the seventh embodiment of the present invention.

FIG. 27 shows the construction of a semiconductor integrated circuit device 240 according to a seventh embodiment of the present invention.

Referring to FIG. 27, the semiconductor integrated circuit device 240 is formed on a p-type silicon substrate 241 wherein the silicon substrate 241 is formed with: a device region 241A formed with a stacked flash memory device (Flash Cell); a device region 241B formed with a high voltage low threshold n-channel MOS transistor (HV-N/LowVt); a device region 241C formed with a high voltage high threshold re-channel MOS transistor (HV-N/HighVt); a device region 241E formed with a p-well boosting capacitor (P-Pump/cap); a device region 241E formed with a high voltage low threshold p-channel MOS transistor (HV-P/LowVt); a device region 241F formed with a high voltage high threshold p-channel MOS transistor (HV-P/HighVt); a device region 241E formed with an n-well boosting capacitor (N-Pump/cap); a device region 241H formed with a mid voltage n-channel MOS transistor (2.5-N); a device region 241I formed with a mid-voltage p-channel MOS transistor (2.5-P); a device region 241J formed with a low voltage n-channel MOS transistor (1.2-N); and a device region 241K formed with a low voltage p-channel MOS transistor (1.2-P).

Further, on the silicon substrate 241, there is formed an insulation film 251 including therein via-plugs so as to cover the memory device, the high voltage low threshold n-channel MOS transistor, the high voltage high threshold n-channel MOS transistor, the p-well boosting capacitor, the high voltage low threshold p-channel MOS transistor, the high voltage high threshold p-channel MOS transistor, the n-well boosting capacitor, the mid voltage n-channel MOS transistor, the middle voltage p-channel MOS transistor, the low voltage n-channel MOS transistor, and the low voltage p-channel MOS transistor, and a multilayer interconnection structure 254 is formed on the insulation film 251.

Here, it should be noted that the high voltage high threshold n-channel MOS transistor, the high voltage low threshold n-channel MOS transistor, the high voltage high threshold p-channel MOS transistor and the high voltage low threshold p-channel MOS transistor form together a control circuit used for driving the stacked flash memory device, while the low voltage p-channel and the n-channel MOS transistor form a high speed logic device such as a CMOS device integrated with the stacked flash memory device on the silicon substrate 241 and driven at a low voltage such as 1.2V or less.

Further, the mid voltage n-channel and p-channel MOS transistors are driven with a voltage of 2.5V, for example, and forms an input/output circuit, or the like.

In the actual semiconductor integrated circuit device 240, the low voltage logic device is formed of a low voltage high threshold n-channel MOS transistor, a low voltage low threshold n-channel MOS transistor, a low voltage high threshold p-channel MOS transistor and a low voltage low threshold p-channel MOS transistor, while in the following explanation, such a construction will be omitted for the due to, the easiness and explain sake of simplicity.

Hereinafter, the fabrication process of the semiconductor integrated circuit device 240 of FIG. 27 will be explained with reference to FIGS. 28A-28Z.

Figure 28A:
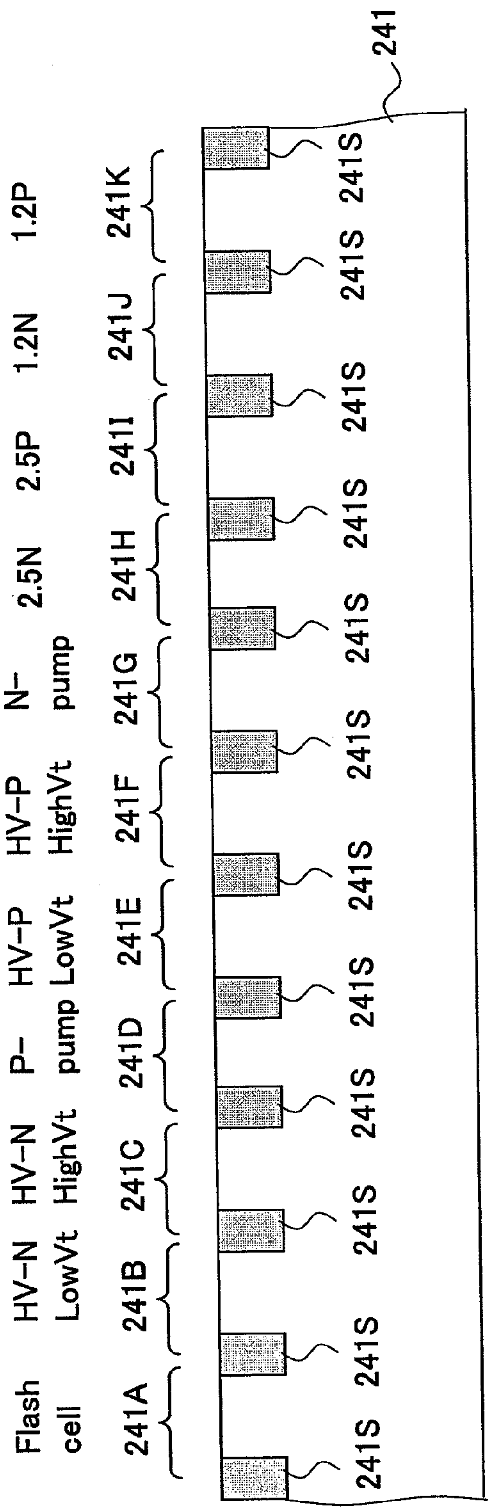
FIGS. 28A-28Z are diagrams showing the fabrication process of the semiconductor integrated circuit device of FIG. 9.

Referring to FIG. 28A, an STI device isolation film 241S is formed on the silicon substrate 241, and with this, the device regions 241A-241K are defined on the substrate 241. Further while not illustrated, the surface of the silicon substrate 241 is oxidized in the step of FIG. 28A and there is formed a silicon oxide film with a film thickness of about 10 nm.

Figure 28B:
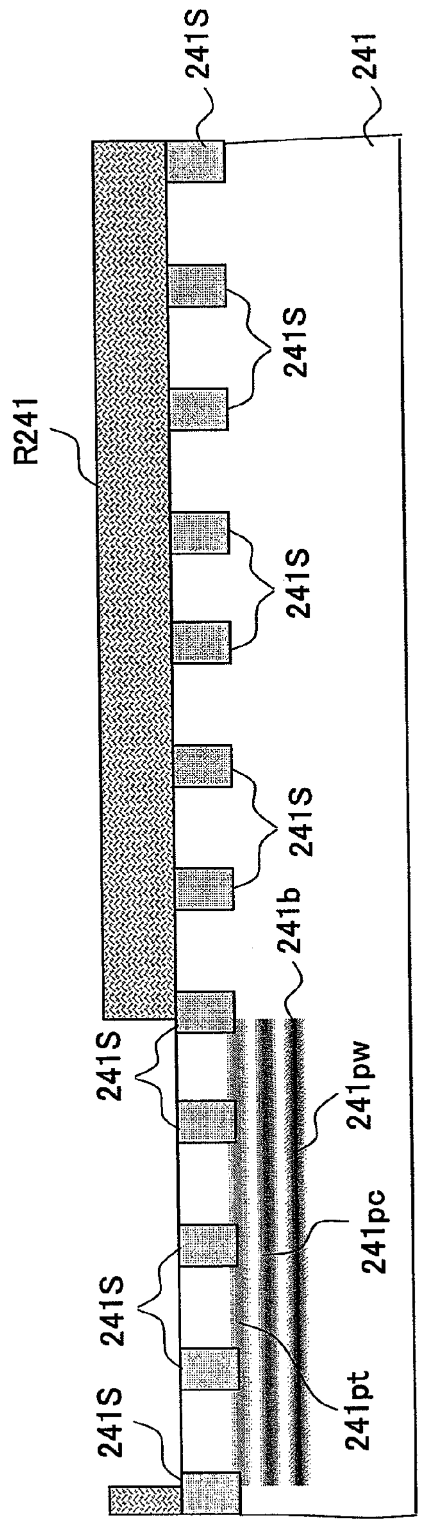

Next, in the step of FIG. 28B, a resist pattern R241 exposes the device regions 241A-241D is formed on the structure of FIG. 28A, and while using the resist pattern R241 as a mask, $P^+$ is introduced by an ion implantation process under the acceleration voltage of 2 MeV to a depth 241*b* deeper than the bottom edge of the device isolation insulation film 241S with a dose of $2\times10^{13}$ $cm^{-2}$. With this an n-type buried impurity region is formed.

Further, in the step of FIG. 28B, while using the resist pattern R241 as a mask, $B^+$ is introduced by an ion implantation process under the acceleration voltage of 400 keV to a depth 241*pw* with the dose of $1.5\times10^{13}$ $cm^{-2}$. With this, a p-type well 241*pw* is formed. Further, in the step of FIG. 28B, while using the resist pattern R261 as a mask, $B^+$ is introduced to a depth 241*pc* by an ion implantation process under the acceleration voltage of 100 keV with the dose $2\times10^{12}$ $cm^{-2}$. With this, a channel stopper region of p-type is formed at the depth 241*pc*. Here, it should be noted that the depths 241*b*, 241*pw* and 241*pc* represent relative ion implantation depths and defined such that the depth 241*pw* is deeper than the device isolation insulation film 241S, but is shallower than depth 241*b*. Further, the position 241*pc* is shallower than the depth 241*pw*, and generally correspond to the bottom edge of the device isolation insulation film 241S. By introducing a p-type impurity element to the depth 241*pc*, the punch-through resistance is improved, and the threshold characteristic of the transistor is controlled at the same time.

Figure 28C:
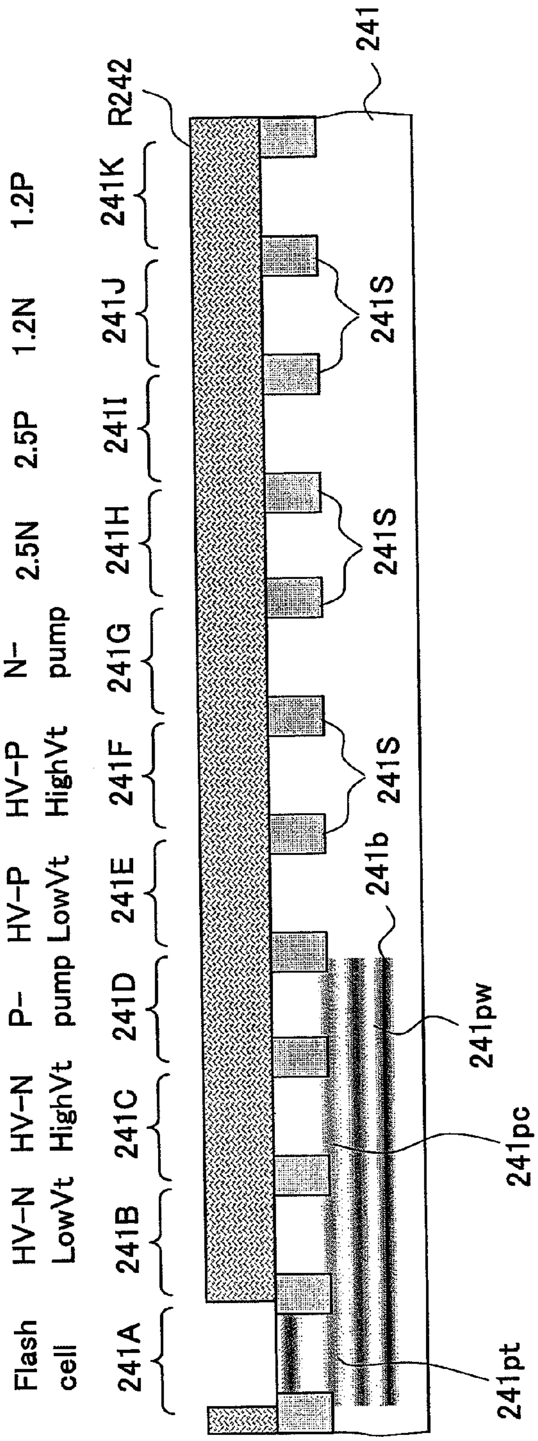

Next, in the step of FIG. 28C, a resist pattern R242 exposing the memory cell region 241A is formed, and $B^+$ is introduced to a shallow depth 241*pt* near the substrate surface by an ion implantation process conducted under the acceleration voltage of 40 keV with a dose of $6\times10^{13}$ $cm^2$, and threshold control is achieved for the memory cell transistor formed in the device region 241A.

Figure 28D:
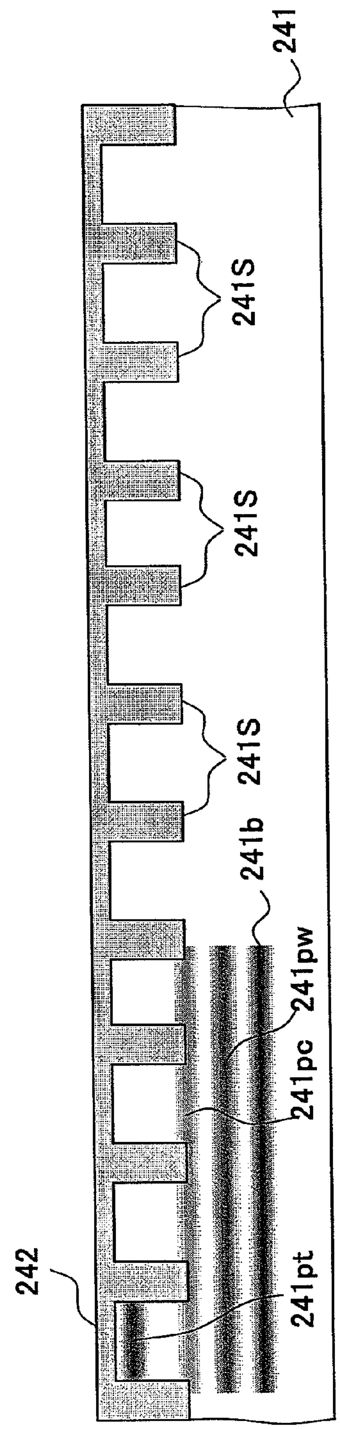

Further, in the step of FIG. 28D, the resist pattern R242 is removed, and after removing the silicon oxide film formed on the surface of the silicon substrate 241 in an HF aqueous solution, a thermal oxidation processing is conducted at the temperature of 900-1050° C. for 30 minutes. With this, a silicon oxide film 242 used for a tunneling insulation film of the flash memory device is formed with a film thickness of about 10 nm.

In this formation step of the tunneling insulation film 242, the p-type impurity element introduced into the device regions 241A-241C previously causes diffusion over a distance of 0.1-0.2 μm.

Figure 28E:
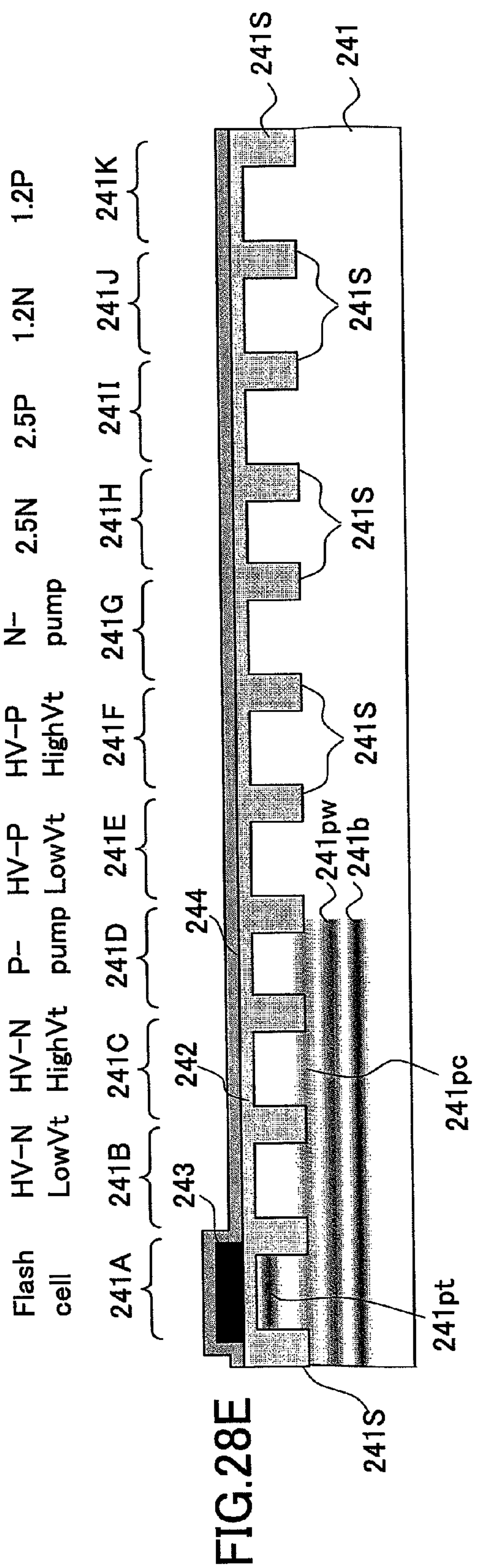

Next, in the step of FIG. 28E, a polysilicon film is deposited on the structure of FIG. 28D by a CVD process, and by patterning the same further, the floating gate electrode 243 is formed on the device region 241A. Further, after formation of the floating gate electrode 243, an oxide film and a nitride film are deposited on the silicon oxide film 242 by a CVD process to the thickness of 5 nm and 10 nm, respectively, and by oxidizing the same further in a wet ambient of 950°, a dielectric film 244 having the ONO structure is formed as an inter-electrode insulation film of the stacked flash memory device.

Figure 28F:
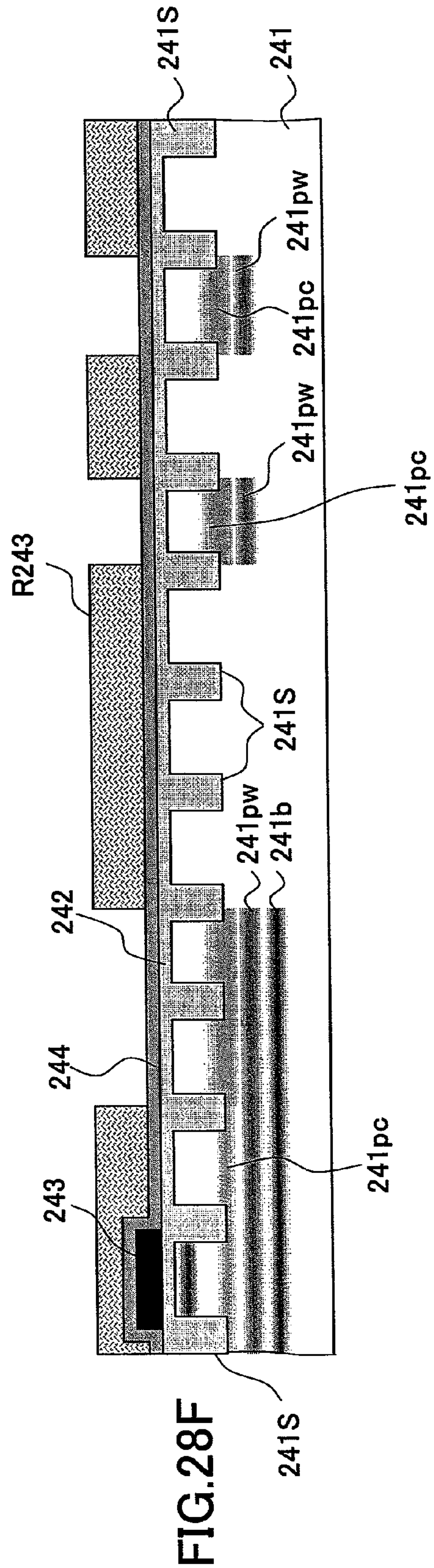

In process of this FIG. 28F, the p-type impurity element introduced to the device regions 241A-241 C previously cause diffusion over a distance of 0.1-0.2 μm along with the heat treatment at the time of formation of the ONO film 244.

Next, in the step of FIG. 28F, a new resist pattern R243 exposing the device regions 241C-241D and 241H and 241J is formed on the structure of FIG. 28E, and while using the resist pattern R243 as a mask, $B^+$ is introduced by an ion implantation process first under the acceleration voltage of 400 keV with the dose of $1.5\times10^{13}$ $cm^{-2}$, and further under the acceleration voltage of 100 keV with the dose $8\times10^{12}$ $cm^{-2}$, and with this, p-type impurity regions becoming a p-type well and a p-type channel stopper region are formed in the device regions 241F and 241H-241I, at a depth 241*pw* deeper than the depth of the device isolation insulation film 241S and at the depth 241*pc* generally equal to the bottom edge of the device isolation insulation film 241S. Further, in the device region 241C to which the p-type impurity element is introduced previously, there occurs an increase in the impurity concentration level for the p-type well, and threshold control is achieved for the high voltage high threshold n-channel MOS transistor formed in the device region 241C and also in the p-well boosting capacitor formed in the device region 241D. Because the impurity regions formed by the ion implantation process after formation of the ONO film in the step of FIG. 28E do not experience heat treatment other than the thermal activation process, and thus, such impurity region maintains the steep impurity concentration profile.

Thereby, punch-through caused between the source/drain regions of mutually adjacent device regions through a path right underneath the p-type well thus formed is suppressed effectively.

Figure 28G:
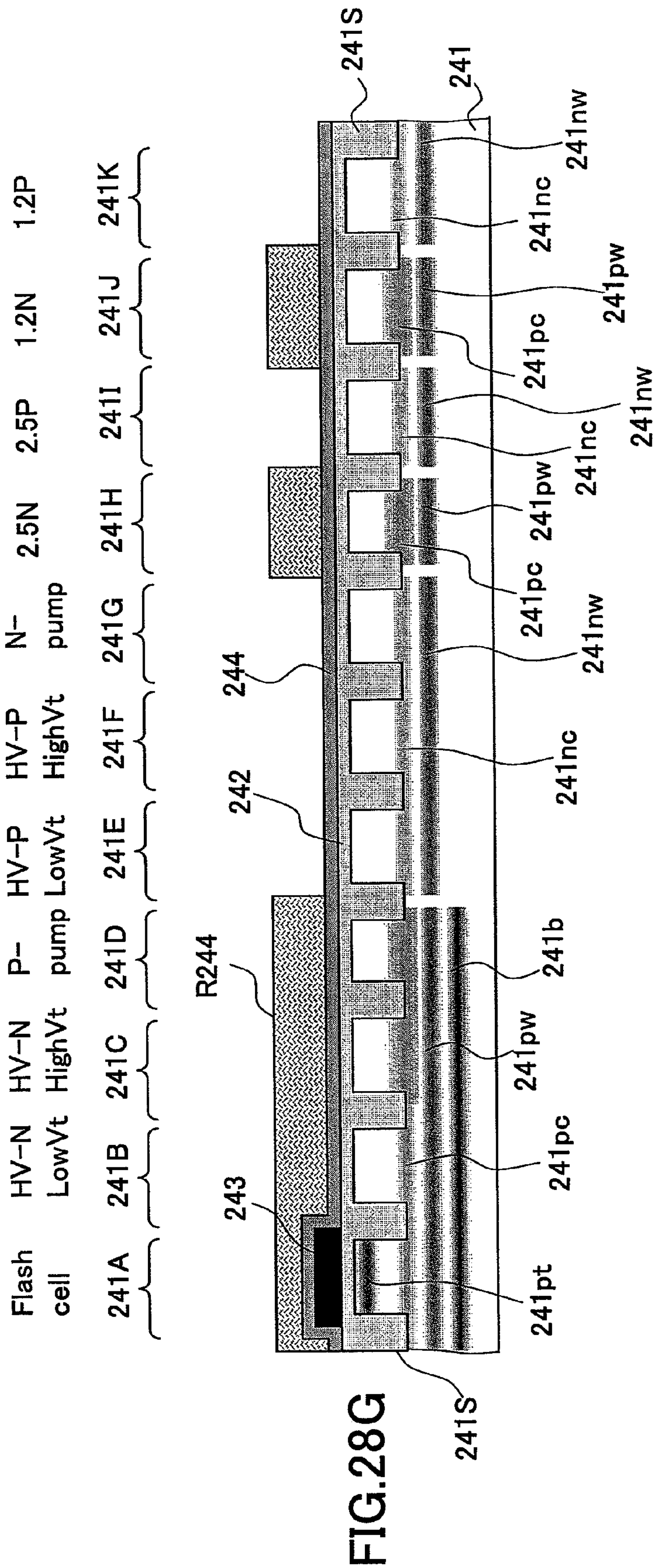

Next in the step of FIG. 28G, a new resist pattern R244 is formed on the ONO film 244 so as to expose the device regions 241D-241G, 241I and 241K, and while using the resist pattern R244 as a mask, $P^+$ is introduced into the silicon substrate 241 by an ion implantation process first under the acceleration voltage of 600 keV with the dose of $1.5\times10^{13}$ $cm^{-2}$, and next under the acceleration voltage of 240 keV with the dose of $3\times10^{12}$ $cm^{-2}$. With this, an n-type well is formed at the depth 241*nw* deeper than the device isolation insulation film 241S in the device regions 241E-241G and the device regions 241I and 241K, and an n-type channel stopper region is formed at the depth 241*nc* generally corresponding to the bottom edge of the device isolation insulation film 241S.

Figures 28H, 28I:
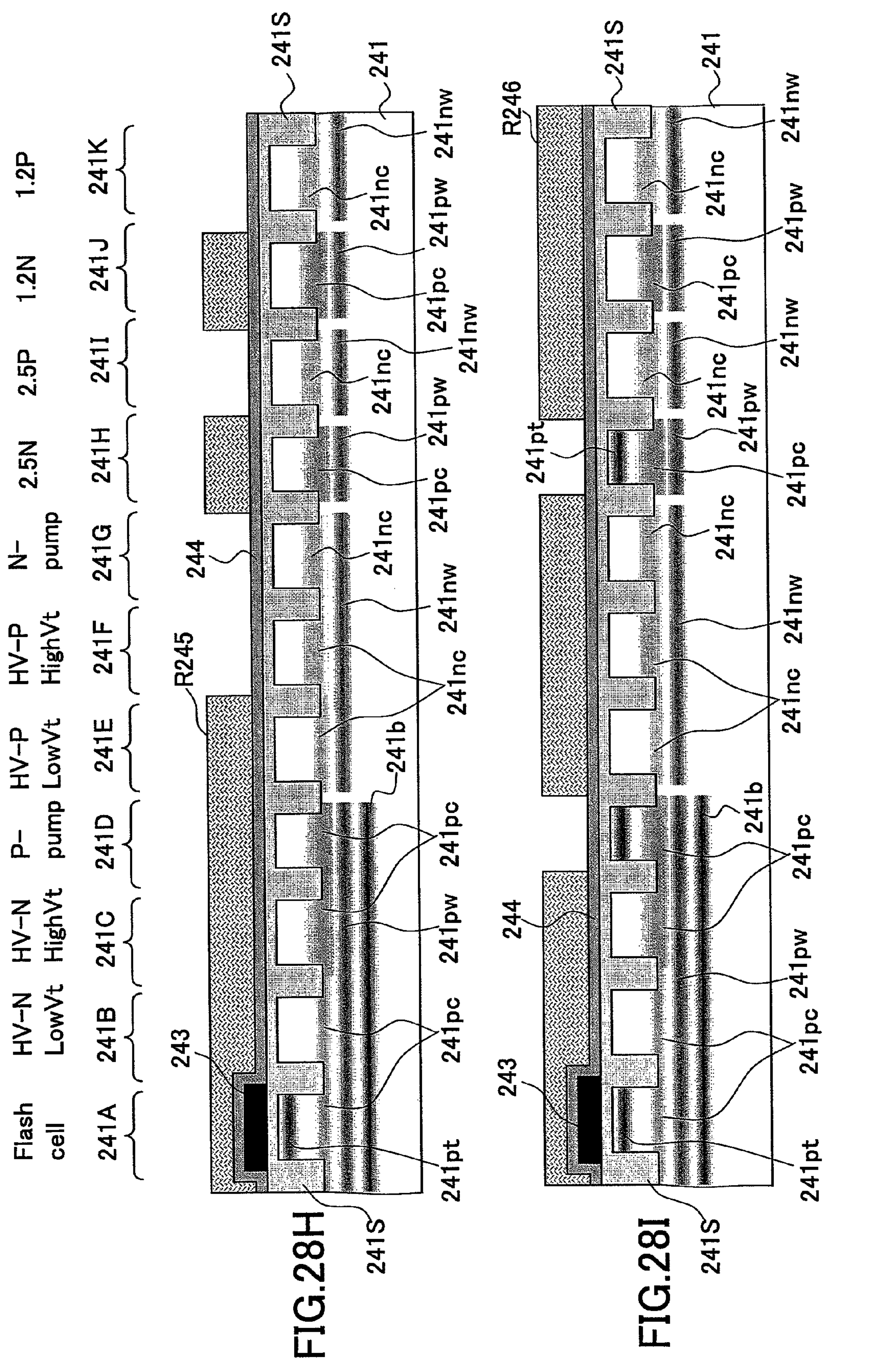

Next, in the step of FIG. 28H, a resist pattern R245 exposing the device regions 241F and 241G, 241I and 241K is formed on the ONO film 244, and while using the resist pattern R245 as a mask, $P^+$ is introduced to the device regions 241F-241G, 241I and also 241K, at a depth 241*nc* corresponding to the bottom edge of the device isolation insulation film 241S by an ion implantation process conducted under the acceleration voltage of 240 keV with the dose of $6.5\times10^{12}$ $cm^{-2}$.

Thereby, the impurity concentration level of the n-type channel stopper region formed in the device regions 241F-241G, 241I and 241K is increased. With this, threshold control is achieved for the high voltage high threshold p-channel MOS transistor formed in the device region 241F, and at the same time, there is caused an increase of impurity concentration level in the n-well boosting capacitor formed in the device region 241G.

Next, in the step of FIG. 28I, a resist pattern R246 exposing the device regions 241D and 241H is formed on the ONO film 244, and while using the resist pattern R246 as a mask, $B^+$ is introduced to a shallow depth 241*pt* near the substrate surface in the device regions 241D and 241H by an ion implantation process conducted under the acceleration voltage of 30 keV with the dose of $5\times10^{12}$ $cm^{-2}$. With this, threshold of the mid voltage n-channel MOS transistor formed in the device region 241H is controlled, and at the same time, the impurity concentration level of the p-well capacitor formed to the device region 241D is increased.

Figure 28J:
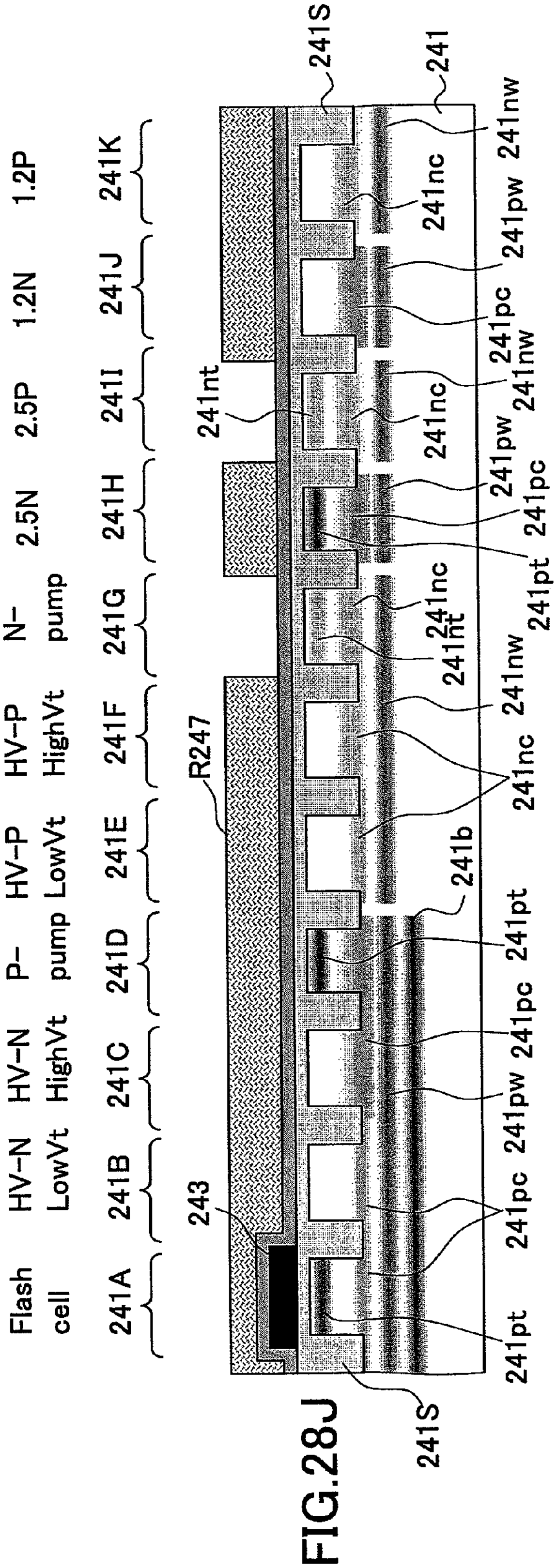

Further, in the step of FIG. 28J, a resist pattern R247 exposes the device regions 241G and 241I is formed on the ONO film 244, and while using the resist pattern R247 as a mask, As is introduced into a shallow depth 241*nt* near the substrate surface in the device regions 241G and 241I by an ion implantation process conducted under the acceleration voltage of 150 keV with the dose of $3\times10^{12}$ $cm^{-2}$. With this, threshold control is achieved for the mid voltage p-channel MOS transistor formed in the device region 241I and the impurity concentration level of the n-well boosting capacitance formed in the device region 241G is increased.

Figure 28K:
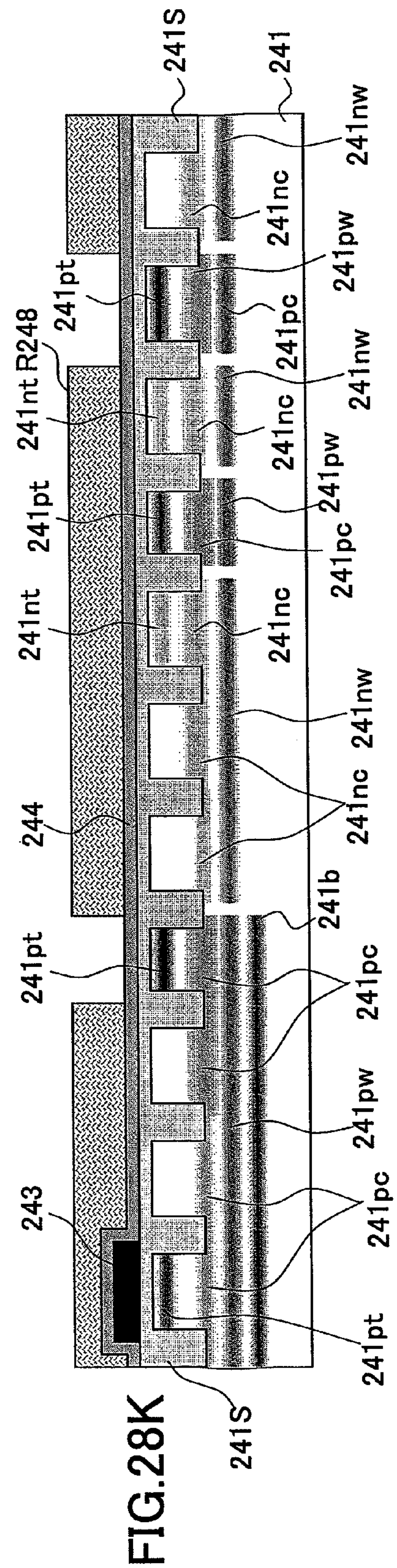

Further, in the step of FIG. 28K, a resist pattern R248 exposing the device regions 241D and 241J is formed on the ONO film 244, and while using the resist pattern R248 as a mask, $B^+$ is introduced by an ion implantation process to a shallow depth 241*pt* near the substrate surface of the device regions 241D and 241J under the acceleration voltage of 10 keV with the dose of $5\times10^{12}$ $cm^{-2}$. With this, the impurity concentration level of the p-well boosting capacitance formed in the device region 241D is increased, and threshold control is achieved for the low voltage n-channel MOS transistor formed in the device region 241J.

Figure 28L:
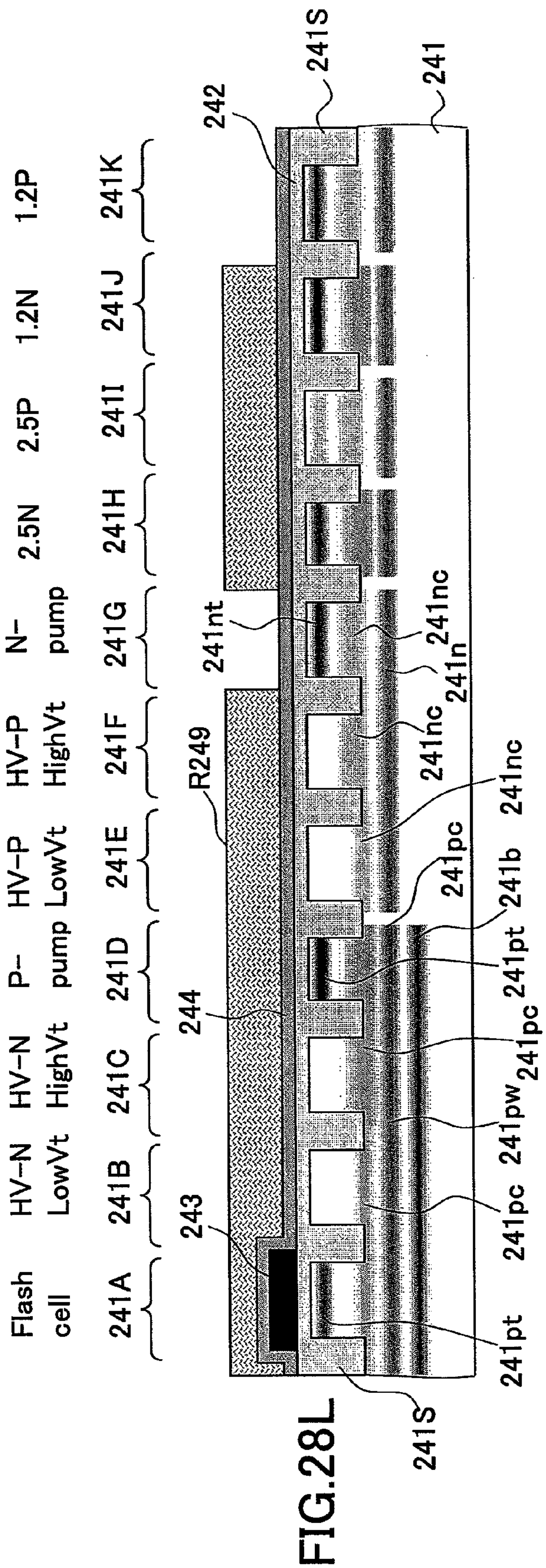

Next, in the step of FIG. 28L, a resist pattern R249 exposing the device regions 241G and 241K is formed on the ONO film 244, and while using the resist pattern R249 as a mask, $As^+$ is introduced to a shallow depth 241*nt* neat the substrate surface of the device regions 241G and 241K by an ion implantation process conducted under the acceleration voltage of 100 keV with the dose of $5\times10^{12}$ $cm^{-2}$. With this, the impurity concentration level of the n-well boosting capacitance formed in the device region 241G is increased, and at the same time, threshold control of the low voltage p-channel MOS transistor formed in the device region 241K is achieved.

Figure 28M:
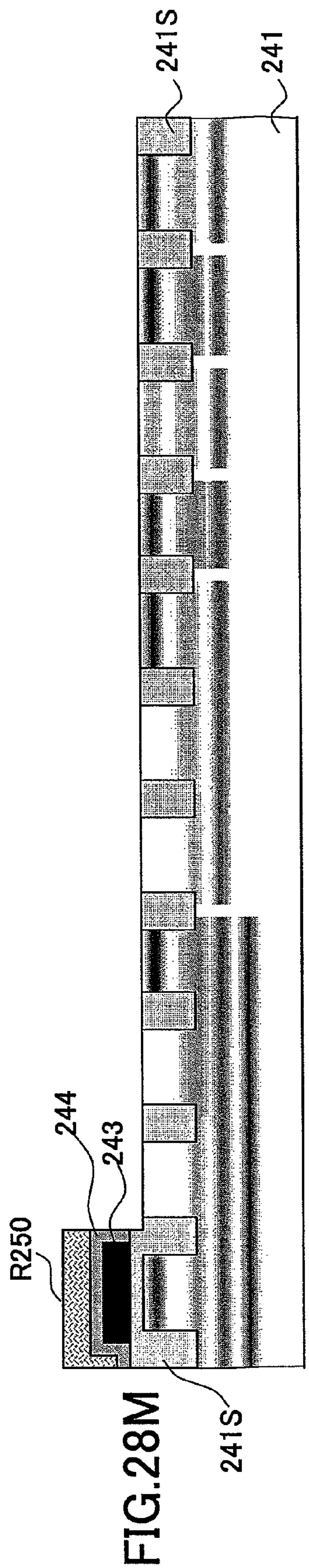

Next, in the step of FIG. 28M, the ONO film 244 and the silicon oxide film 242 underneath are patterned while using the resist pattern R250 as a mask, and the surface of the silicon substrate 241 is exposed for the device regions 241B-241K.

Figure 28N:
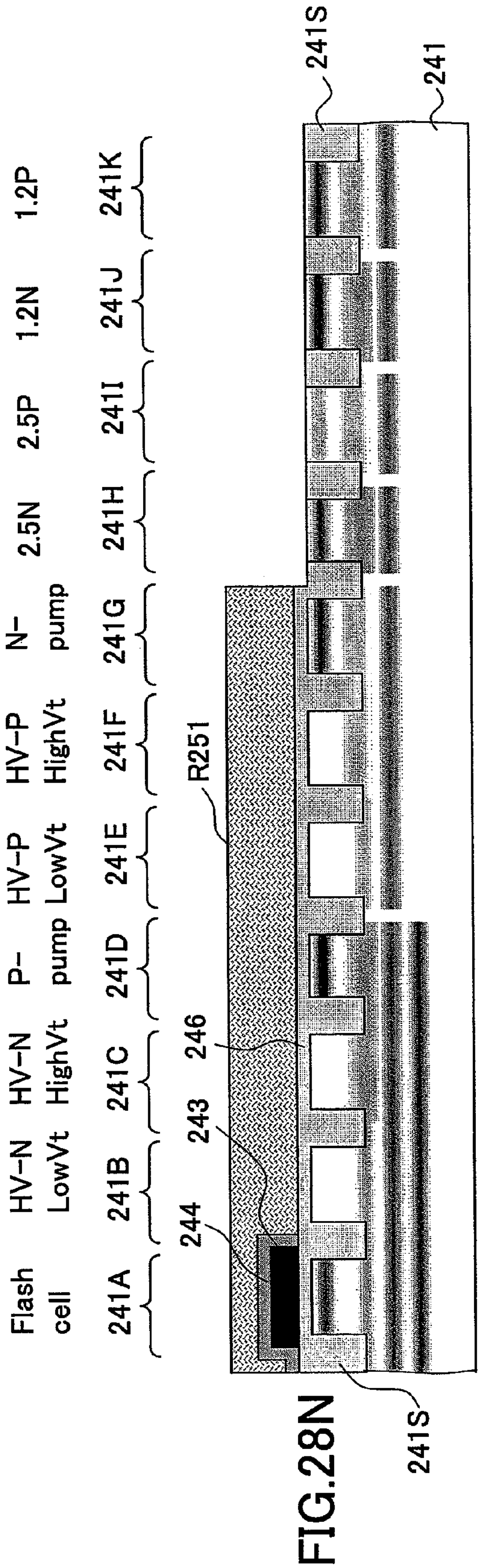

Further, in the step of FIG. 28N, the resist pattern R250 is removed, and by conducting a thermal oxidation processing at the temperature of 850° C., a silicon oxide film 246 used for the gate insulation film of the high voltage MOS transistor is formed to a thickness of 13 nm.

In the step of FIG. 28N, there is formed a resist pattern R251 exposing the device regions 241H-241K on the silicon oxide film 246, and while using the resist pattern R251 as a mask, the silicon oxide film 246 is patterned, and the silicon substrate surface is exposed again over the device regions 241H-241K.

Figure 28O:
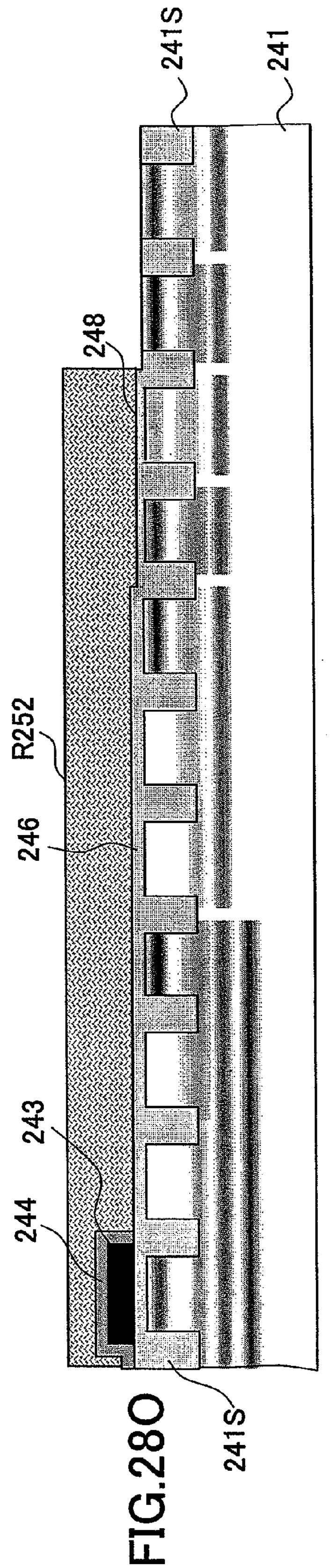

Next, in the step of FIG. 28O, the resist pattern R251 is removed, and a silicon oxide film 248 used for the gate insulation film of the mid voltage MOS transistor is formed by a thermal oxidation processing to the thickness of 4.5 nm.

In the step of FIG. 28O, there is further formed a resist pattern R252 exposes device regions 241J-241K on the silicon oxide film 248, and while using the resist pattern R252 as a mask, the silicon oxide film 248 is patterned. With this, the surface of the silicon substrate is exposed again in the device regions 241J-241K.

Figure 28P:
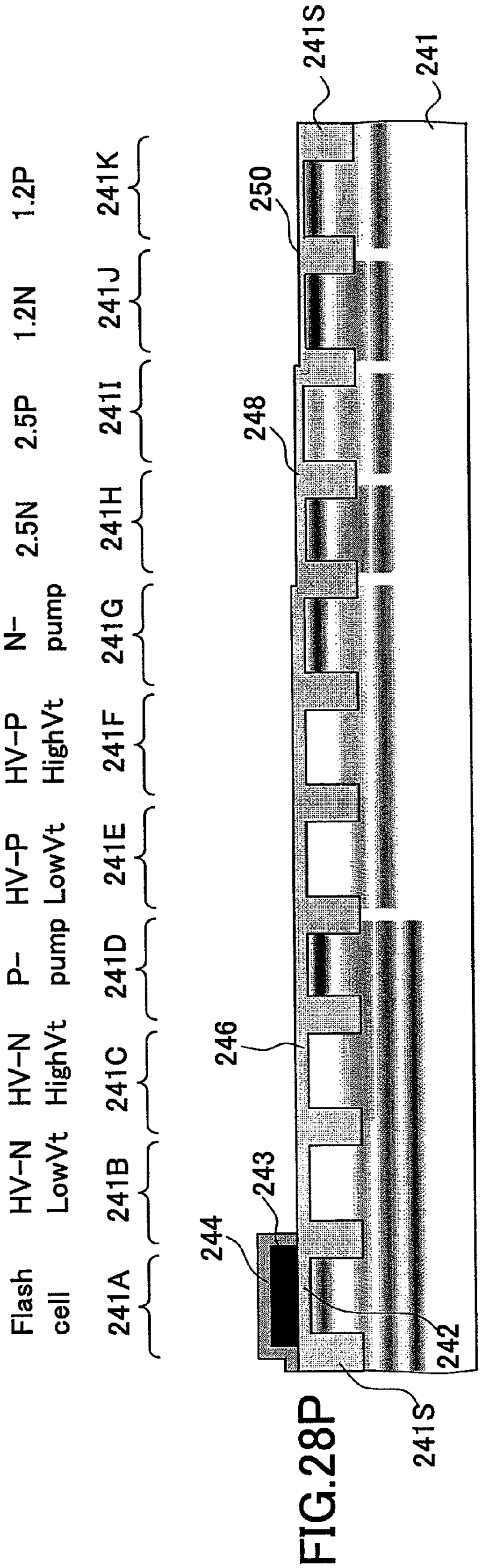

Next, in the step of FIG. 28P, the resist pattern R252, is removed, and by conducting a thermal oxidation processing, a silicon oxide film 250 used for the gate insulation film of the low voltage MOS transistor is formed to the thickness of 2.2 nm.

Because of repeated thermal oxidation processing during the process up to the step of FIG. 28P, it should be noted that the gate insulation film 242 has grown to the thickness of 16 nm and the gate insulation film 246 is growing to the thickness of 5 nm in the state of FIG. 210P.

Figure 28Q:
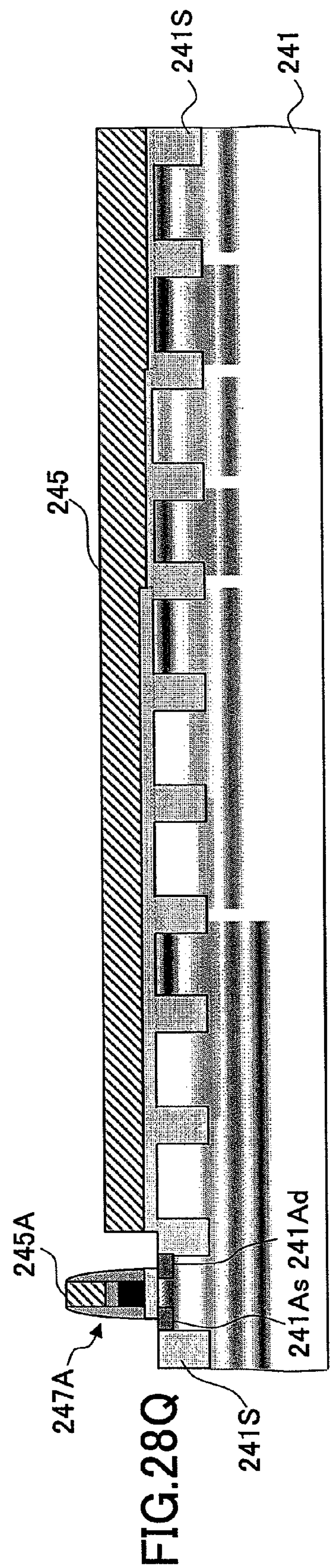

Next in the process of FIG. 28Q, a polysilicon film 245 is deposited on the structure of FIG. 28P with the thickness of 180 nm by a CVD process, an SiN film (not shown) is deposited further thereon by a plasma CVD process as anti-reflection coating and also as an etching stopper, with the thickness of 30 nm. Further, in the step of FIG. 28Q, the polysilicon film 245, the ONO film 244 and the polysilicon film 243 are patterned by a resist process, and a stacked gate electrode structure 247A of the construction in which a control gate electrode 245A is stacked on the inter-electrode insulation film 244 is formed in the flash memory device region 241A. In the step of FIG. 28Q, the sidewall surfaces of the stacked gate electrode structure 247A is subjected to a thermal oxidation processing, and thereafter, source and drain regions 241As and 241Ad are formed at respective lateral sides of the stacked gate electrode 247A by introducing As into the device region 241A while using the stacked gate electrode structure 247A as a mask. Next, an SiN film is grown to the thickness of 100 nm by a pyrolitic CVD process, and by applying an etchback process to the entire surface, the SiN film on the polysilicon film 245 is removed and at the same time, SiN sidewall insulation films are formed on the respective sidewall surfaces of the stacked gate electrode structure 247A.

Figure 28R:
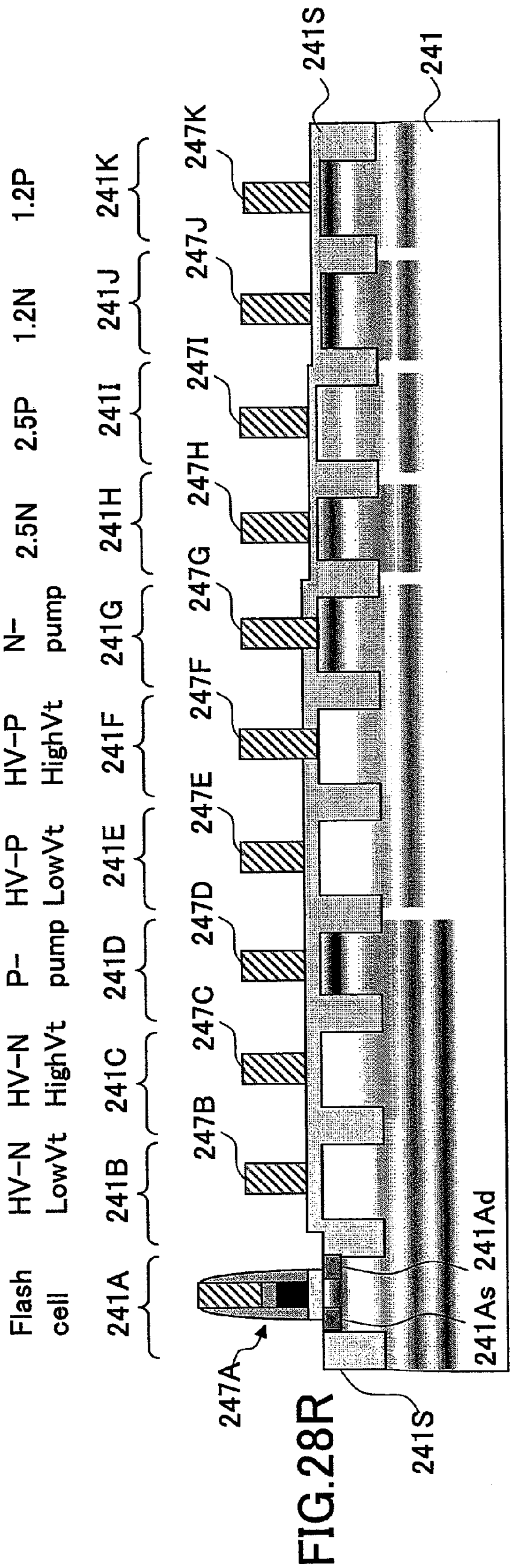

Next, in the step of FIG. 28R, the polysilicon film 245 is patterned in the device regions 241B-241K, and the gate electrodes 247B-247K are formed respectively in correspondence to the device regions 241B-241K.

Figure 28S:
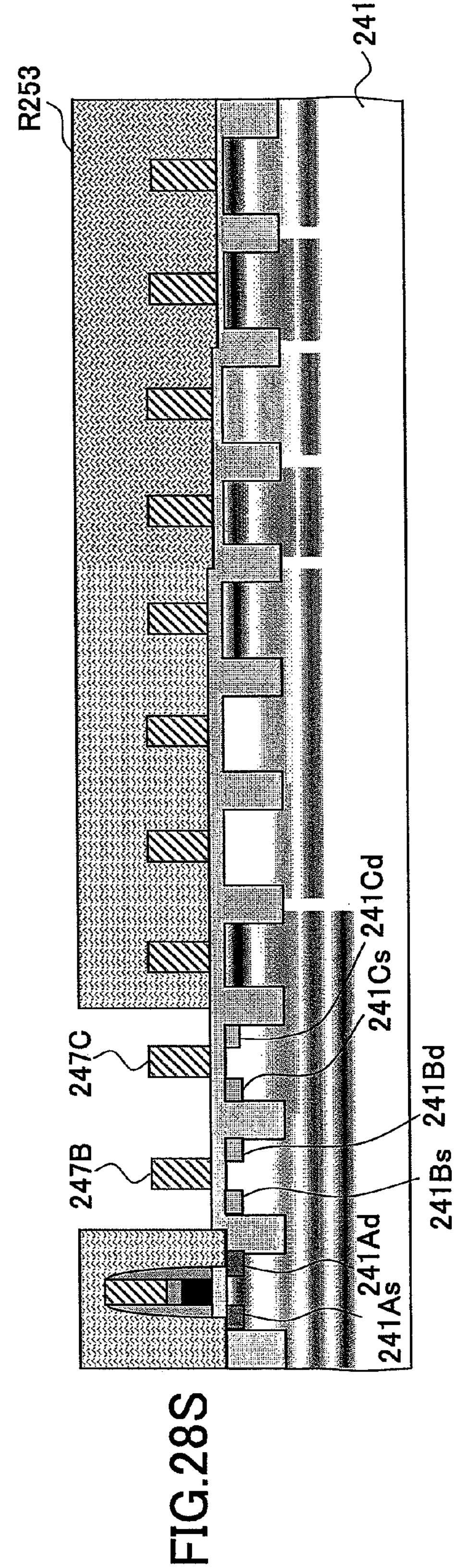

Next, in the process of FIG. 28S, a resist pattern R253 exposing the device regions 241B and 241C of the high voltage n-channel MOS transistor is formed on the structure of FIG. 28R and on substrate 241, and while using the resist pattern R253 and the gate electrodes 247B and 247 C as a mask, $P^+$ is introduced by an ion implantation process under the acceleration voltage of 35 keV with the dose of $3\times10^{13}$ $cm^{-2}$. With this, an n-type source region 241Bs and an n-type drain region 241Bd are formed in the device region 241B at respective lateral sides of the gate electrode 247B, and an n-type source region 241Cs and an n-type drain region 241Cd are formed in the device region 241C at respective lateral sides of the gate electrode 247C.

Figure 28T:
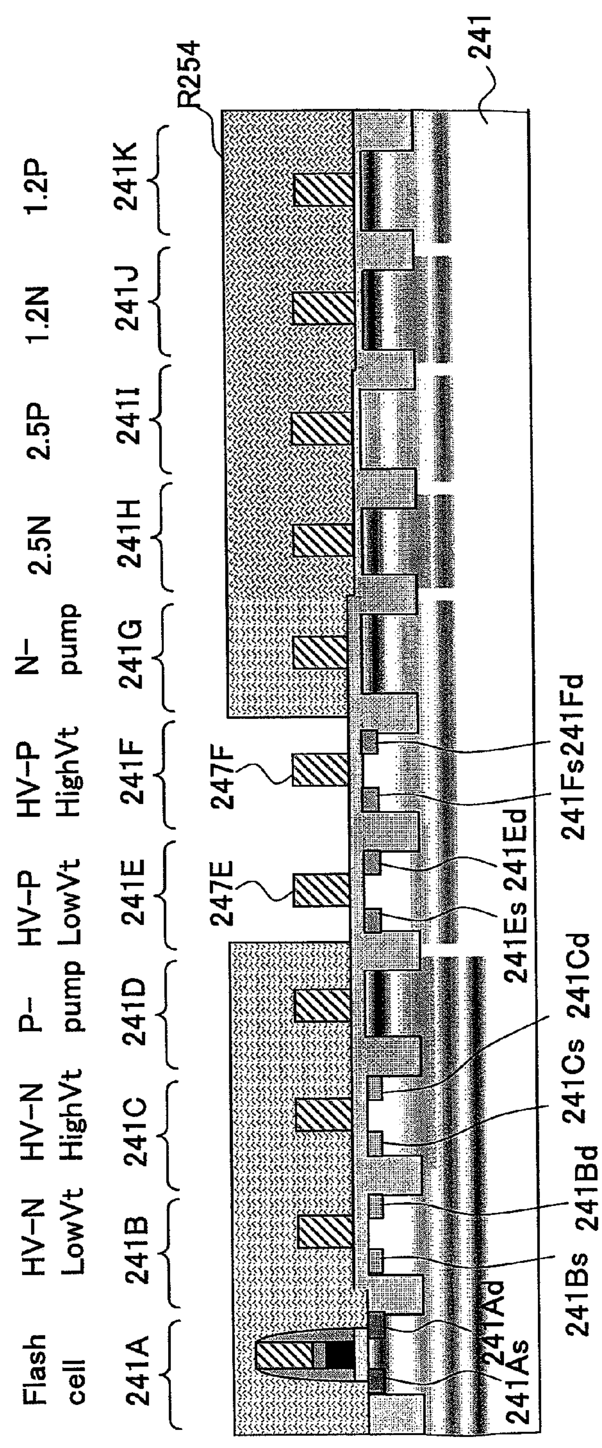

Next with the process of FIG. 28T, the resist pattern R253 of FIG. 28S is removed, and a resist pattern R254 exposing the device regions 241E and 241F of high voltage p-channel MOS transistor is formed on substrate 241. Further, while using the resist pattern R253 and the gate electrodes 247E and 247F as a mask, $BF_2^+$ is introduced by an ion implantation process under the acceleration voltage of 65 keV with the dose of $3\times10^{12}$ $cm^{-2}$. With this, source regions 241Es and 241Ed of n-type are formed in the device region 241E at respective lateral sides of the gate electrode 247E. Further, in the device region 241F, p-type source and drain regions 247Fs and 247Fd are formed at respective lateral sides of the gate electrode 247F.

Figure 28U:
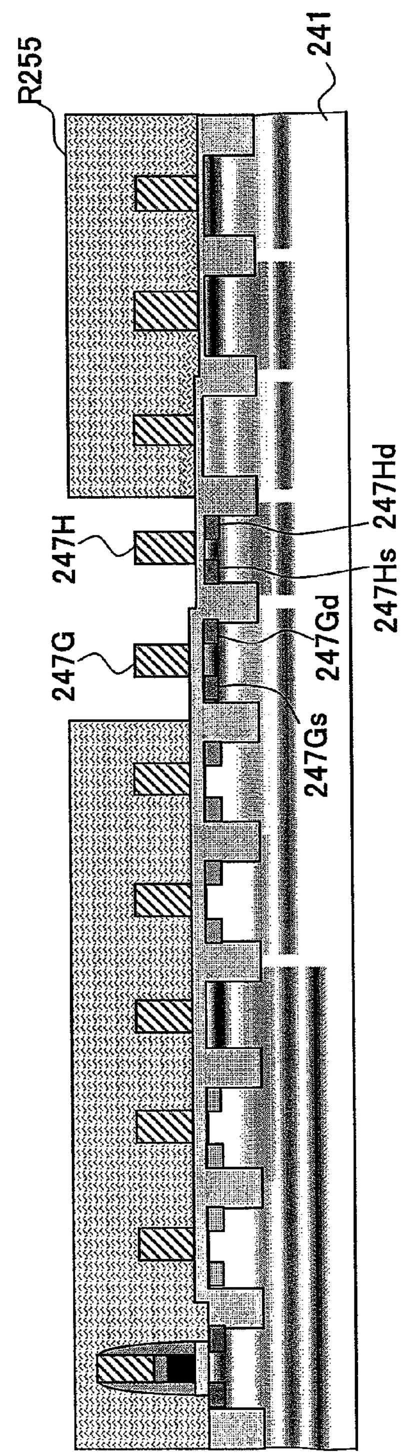

Further, in the step of FIG. 28U, the resist pattern R254 of FIG. 28T is removed, and a resist pattern R255 exposing the device regions 241G and 241H is formed newly on the substrate 241. Further, while using the resist pattern R255 and the gate electrodes 247G and 247H as a mask, $As^+$ is introduced first by an ion implantation process conducted under the acceleration voltage of 10 keV with the dose of 2.0×1013 $cm^{-2}$, followed by ion implantation process of $P^+$ conducted under the acceleration voltage of 10 keV with the dose of $3.0\times10^{13}$ $cm^{-2}$, and n-type source and drain regions 241Gs and 241Gd are formed in the device region 241G at respective lateral sides of the gate electrode 247G. Further, in the device region 241H, n-type source and drain regions 241Hs and 241Hd are formed at respective lateral sides of the gate electrode 247H.

Figure 28V:
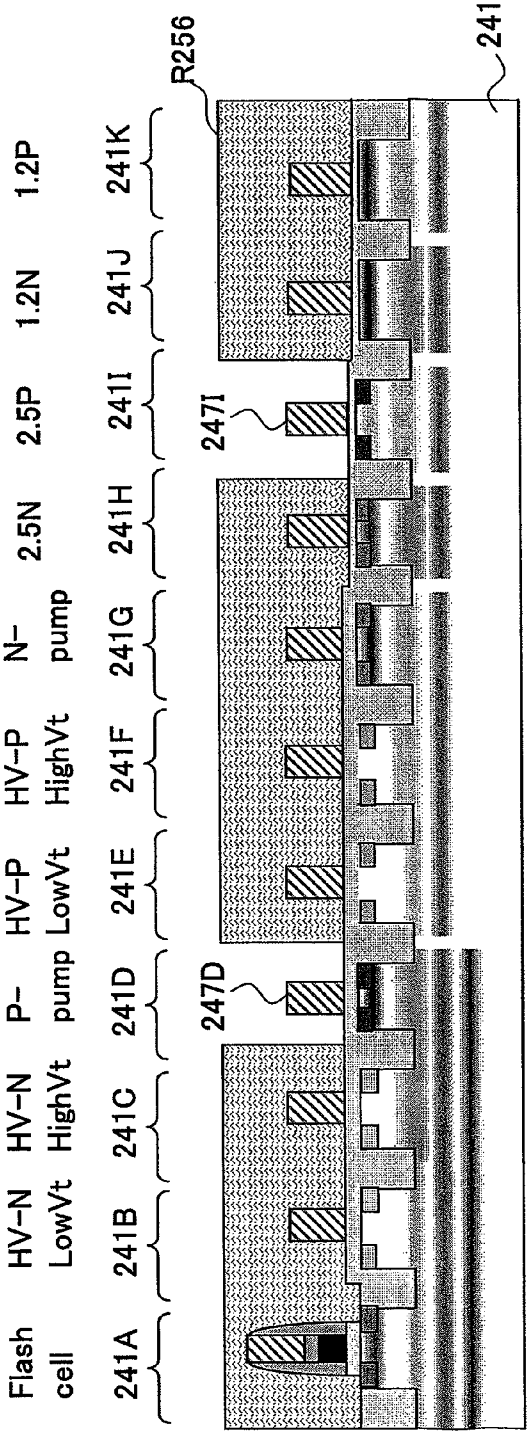

Further, in the step of FIG. 28V, the resist pattern R255 of FIG. 28U is removed, and a resist pattern R256 exposing the device regions 241D and 241I is formed newly on the substrate 241. Further, while using the resist pattern R256 and the gate electrodes 247D and 247I as a mask, $BF_2^+$ is introduced by an ion implantation process under the acceleration voltage of 10 keV with the dose of $7.0\times10^{13}$ $cm^{-2}$, and p-type source and drain regions 241Ds and 241Dd are formed in the device region 241D at respective lateral sides of the gate electrode 247D. Further, in the device region 241I, p-type source and drain regions 241Is and 241Id are formed at both sides of the gate electrode 247I.

Figure 28W:
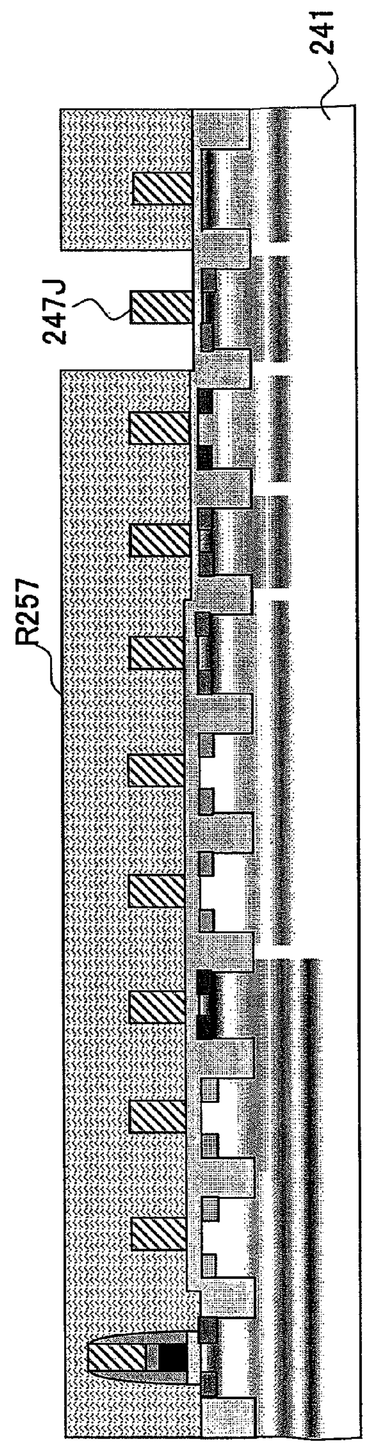

Next, the resist pattern R256, be removed with the process of FIG. 28W, and a resist pattern R257 exposing the device region 241J is formed on the substrate 241. Further, while using the resist pattern R257 and the gate electrode 247J as a mask, $As^+$ is introduced first by an ion implantation process conducted under the acceleration voltage of 3 keV with the dose of $1.1\times10^{15}$ $cm^{-2}$, followed by ion implantation process of $BF_2^+$ conducted four times obliquely with the angle of 28° under the acceleration voltage of 35 keV with the dose $9\times10^{12}$ $cm^{-2}$. With this, n-type LDD region 241Js and 241Jd are formed in the device region 241J at respective lateral sides of the gate electrode 247J together with a p-type pocket region.

Figure 28X:
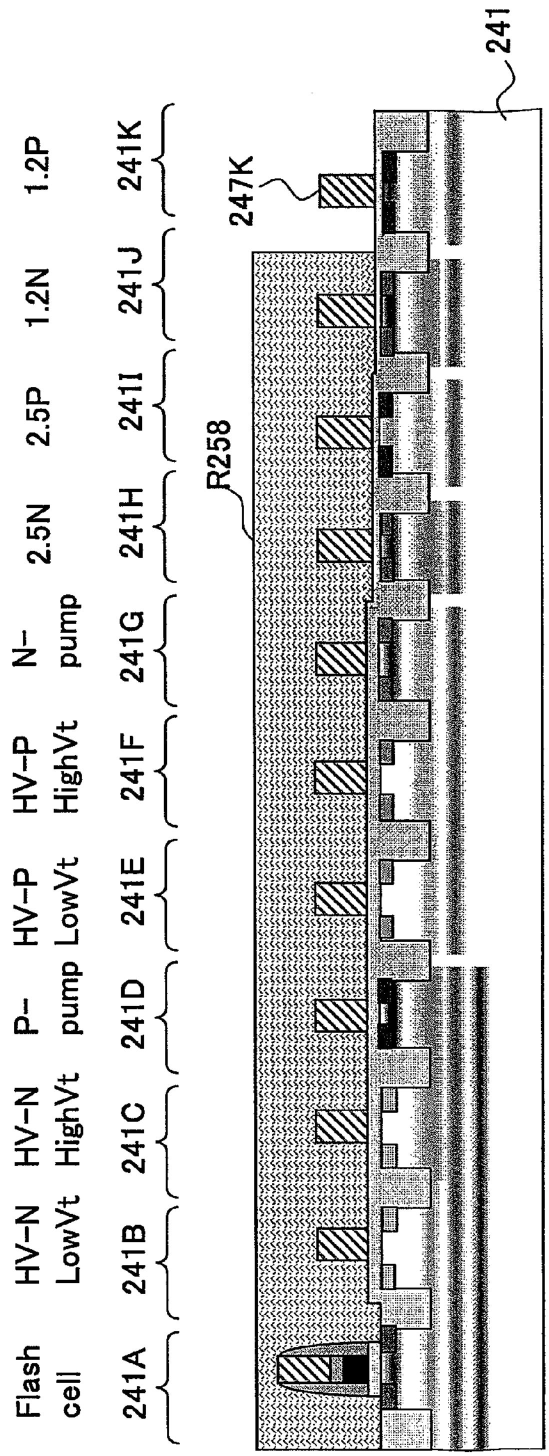

Further, in the step of FIG. 28X, the resist pattern R257 be removed, and a resist pattern R258 exposing the device region 241K is formed on the substrate 241. Further, while using the resist pattern R258 and the gate electrode 247K as a mask, $B^+$ is introduced first by an ion implantation process conducted under the acceleration voltage of 0.5 keV with the dose of $3.6\times10^{13}$ $cm^{-2}$, followed by ion implantation process of $As^+$ conducted under the acceleration voltage of 80 keV with the dose of $6.5\times10^{12}$ $cm^{-2}$, and P-type LDD regions 241Ks and 241Kd are formed in the device region 241K at respective lateral sides of the gate electrode 247K together with an n-type pocket region.

Figure 28Y:
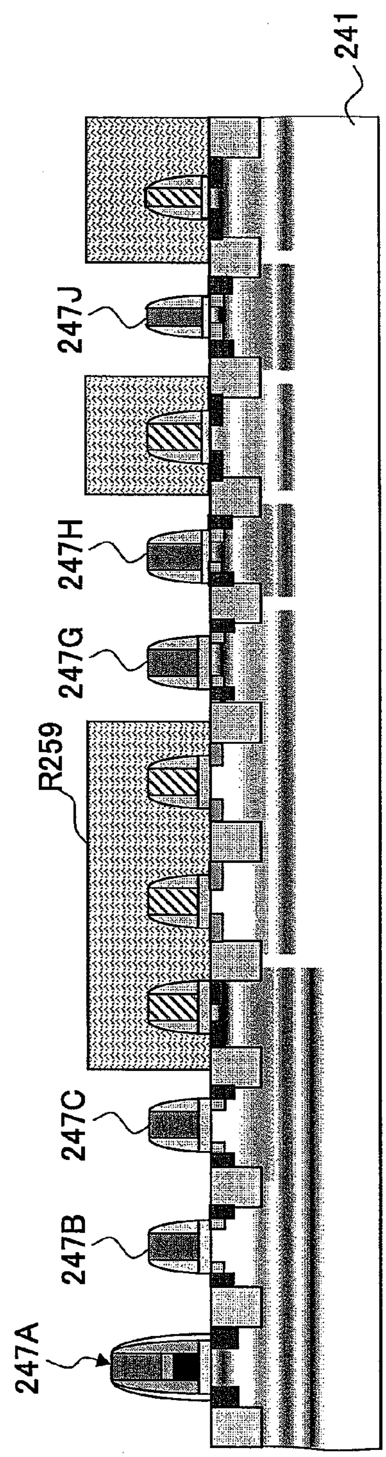

Further, in the step of FIG. 28Y, the resist pattern R258 of FIG. 28X is removed, and an oxide film is deposited to the substrate 241 with a uniform thickness of 100 nm so as to cover the stacked gate electrode structure 247A and the gate electrodes 247A-247K. Further, by etching back the same by RIE until the surface of substrate 241 is exposed, and with this, sidewall oxide films are formed to the sidewall surfaces of the stacked gate electrode structure 247A and the gate electrodes 247B-247K.

Further, as shown in FIG. 28Y, a resist pattern R259 is formed on the substrate 241 so as to expose the device regions 241A-241C and the device regions 241G-241H and the device regions 247J and 247K, and while using the resist pattern R259 and the stacked gate electrode structure 247A, the gate electrodes 247B and 247C, and the gate electrodes 247G-247H and 247J and the sidewall oxide films thereof as a mask, $P^+$ is introduced by an ion implantation process conducted under the acceleration voltage of 10 keV with the dose of $6.0\times10^{15}$ $cm^{-2}$, and source region and drain regions (not shown) of $n^+$-type are formed in each of the device regions 241A-241C, 241G-241H and 241J is formed.

Figure 28Z:
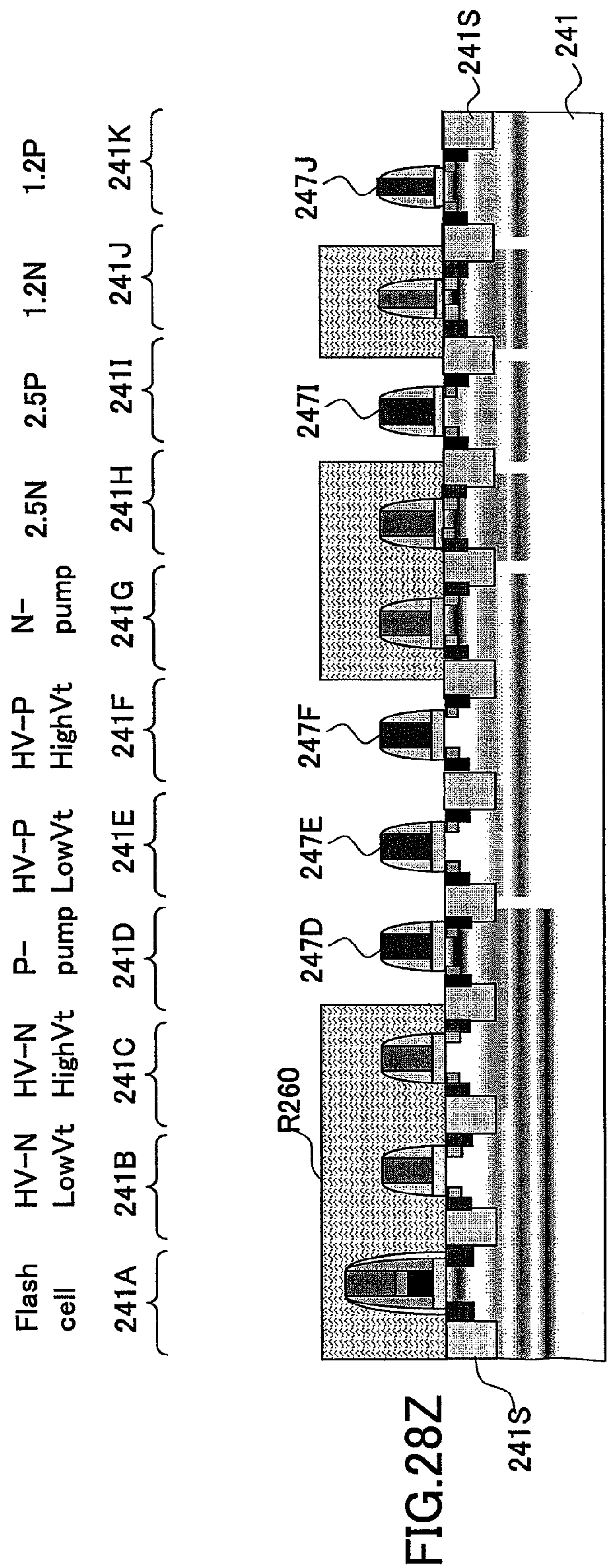

Further, in the step of FIG. 28Z, a resist pattern R258 is formed on the substrate 241 so as to expose the device regions 241D-241F and the device region 247I and 247K, and while using the resist pattern R258 and the gate electrodes 247D-247F, 247I and 247K and the sidewall oxide films thereof as a mask, $B^+$ is introduced by an ion implantation process under the acceleration voltage of 5 keV with the dose of $4.0\times10^{15}$ $cm^{-2}$. With this, source region and drain region of the $p^+$-type (not shown) are formed in the respective device regions 241D-241F, 241I and 241K.

Figure 29:
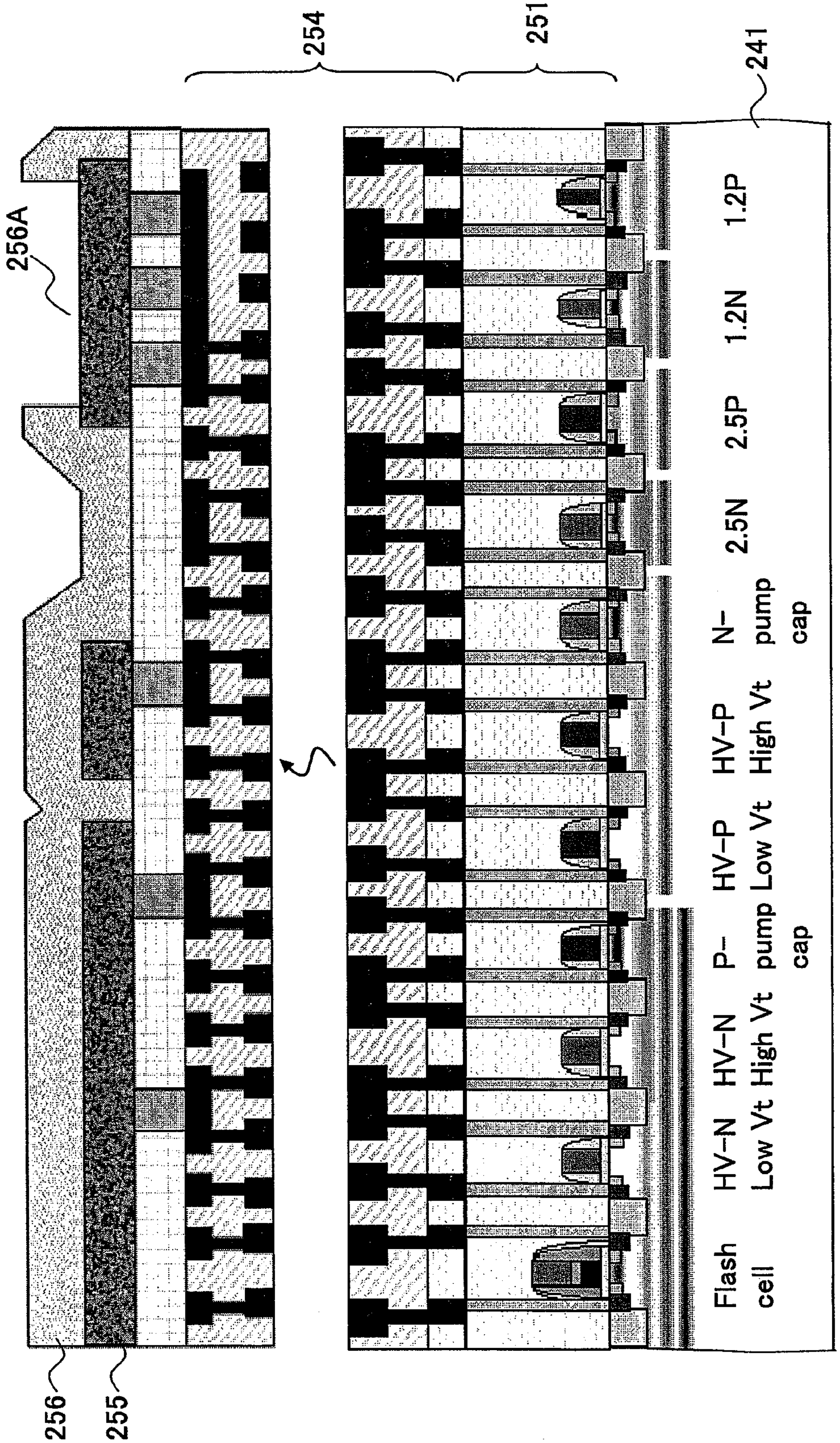
FIG. 29 is a diagram showing the semiconductor integrated circuit device of FIG. 27, in a state formed with a multilayer interconnection structure.

Further, the resist film R258 is removed as shown in FIG. 29, and a silicide layer by (not shown) is formed on the exposed surfaces of the gate electrodes 247A-247K and the exposed surfaces of the source and drain regions by a commonly known method. Further, an insulation film 251 is deposited on the substrate 241, and contact holes are formed in the insulation film 251. Further, an interconnection pattern 253 is formed on the insulation film 251 so that make a contact with the source and drain regions in each of the device regions 241A-241K via the contact holes. Further, a multilayer interconnection structure 254 is formed on the insulation film 251 and pad electrodes 255 are formed on the multilayer interconnection structure. Further, overall structure is covered with a passivation film 256, and contact openings 256A are formed in the passivation film 256 according to the needs. With this, fabrication of the integrated circuit device 240 having a boosting capacitor producing a positive voltage in the device region 241D and a boosting capacitor producing a negative voltage in the device region 241G is completed.

With the boosting capacitor thus formed, ion implantation is carried out repeatedly to the substrate surface right underneath the gate electrode, and thus, the p-type region formed on the substrate surface right underneath the gate electrode 247D in device region 241D has a very high impurity concentration level. Thus, the boosting capacitor formed to the device region 241D shows a large capacitance even when it is driven by a very low drive voltage such as 1.2V or 1.0V. Similarly, the n-type region formed on the substrate surface right underneath the gate electrode 247G in the device region 241G has a very high impurity concentration level, and thus, the boosting capacitor formed in the device region 241G shows a large capacitance even when it is driven by a very low voltage such as 1.2V or 1.0V.

With the process explained with reference to FIGS. 28A-28Z previously, it is possible to integrate the boosting capacitor operating efficiently at such a low voltage on a common semiconductor substrate together with a flash memory device and other low voltage high speed devices. Thereby, formation of the boosting capacitor is implemented at the same time to the fabrication process of other transistors, and there occurs no increase of fabrication process steps.

INDUSTRIAL APPLICABILITY

According to the present invention, it becomes possible to reduce the number of mask processes and the number ion implantation processes at the time of formation of a semiconductor integrated circuit device including plural transistors of different kinds a substrate. Thereby, it becomes possible with the present invention to form a pair of mutually adjacent wells of different conductivity types such that at least one of the wells has a sharper impurity concentration profile than an impurity distribution profile of the well in which the memory cell transistor is formed. Thereby, there occurs no degradation in the punch-through resistance in the semiconductor integrated circuit device. Further, according to the present invention, contamination of the silicon substrate by a resist film is avoided, and the problem of formation of projections and depressions on the silicon substrate is avoided also.

According to the present invention, the conductor pattern formed on the second device isolation insulation film is formed of a polysilicon layer of low impurity concentration level and a metal silicide layer formed thereon, and thus, there is caused depletion in the polysilicon layer in the case a voltage is applied to the metal silicide layer, and conduction of the parasitic field transistor having a channel right underneath the device isolation insulation film is suppressed effectively, even in the case the thickness of the second device isolation insulation film constituting the second the device isolation structure is reduced. With regard to the conductor pattern, on the other hand, a polysilicon film of high resistance such as a polysilicon film of low impurity concentration level or undoped polysilicon film free form impurity element is used, wherein there arises no problem of increase of resistance for the conductor pattern, as there is formed a low resistance metal silicide layer on the surface of such a polysilicon film.

According to the present invention, capacitance-voltage characteristic of the boosting capacitor is changed by forming the impurity injection region of the first the conductivity type in the device region in which the boosting capacitor is formed along the substrate surface between the pair of diffusion regions of the first conductivity type, and it becomes possible to obtain a large capacitance at low voltage particularly in the accumulation region. With this, it becomes possible to form necessary high voltage efficiently from low supply voltage even in the case of a semiconductor integrated circuit device including therein a high-speed logic device driven with a very low voltage of 1.2V or less. Further, the boosting capacitor of the present invention can be formed without adding extra process steps in the formation process of the first and second MOS transistors.

What is claimed:

1. A fabrication method of a semiconductor integrated circuit device comprising:

forming a first well in a semiconductor substrate, which includes a first device region, a second device region and a third device region, of said first device region by performing an ion implantation;

forming a first gate insulation film on said semiconductor substrate of said first device region;

forming a floating gate on said first gate insulation film;

forming a dielectric film on said floating gate;

forming, after forming said dielectric film, a second well in said semiconductor substrate of said second device region and a third well in said semiconductor substrate of said third device region;

forming a second gate insulation film on said semiconductor substrate of said second well and said third well;

removing said second gate insulation film of said third device region;

forming a third gate insulation film of a thickness different from a thickness of said second gate insulation film on said semiconductor substrate of said third device region after removing said second gate insulation film of said third device region;

forming a control gate, first gate electrode and second gate electrode on said dielectric film, said second gate insulation film and third gate insulation film respectively.

2. The fabrication method of the semiconductor integrated circuit device as claimed in claim 1, wherein forming said dielectric film includes forming said dielectric film on said semiconductor substrate of said second device region and said third device region; and forming said second well and said third well includes introducing an impurity element into said semiconductor substrate via said dielectric film and the fabrication method of the semiconductor integrated circuit device as claimed in claim 1, further comprising removing said dielectric film of said second device region and said third device region after forming said second well and said third well, and before forming said second gate insulation film.

3. The fabrication method of the semiconductor integrated circuit device as claimed in claim 1, wherein said second well and said third well are formed simultaneously.

4. The fabrication method of the semiconductor integrated circuit device as claimed in claim 3, wherein said semiconductor substrate includes a fourth device region and a fifth device region, and the fabrication method of the semiconductor integrated circuit device as claimed in claim 3, further comprising forming a fourth well and a fifth well in said semiconductor substrate of said fourth device region and fifth device region respectively before forming said dielectric film.

5. The fabrication method of the semiconductor integrated circuit device as claimed in claim 4, wherein said second well and said third well are formed simultaneously, and said fourth well and said fifth well are formed simultaneously.

6. The fabrication method of the semiconductor integrated circuit device as claimed in claim 1, wherein forming said floating gate includes forming a first conductor film on said first gate insulation film, and patterning said first conductor film to form said floating gate.

7. The fabrication method of the semiconductor integrated circuit device as claimed in claim 1, wherein forming said control gate, said first gate electrode and said second gate electrode includes forming a second conductor film on said dielectric film, said second gate insulation film and said third gate insulation film, and patterning said second conductor film to form said control gate, said first gate electrode and said second electrode.

8. A fabrication method of a semiconductor integrated circuit device comprising:

forming a first well in a semiconductor substrate, which includes a first device region and a second device region, of said first device region by performing an ion implantation;

forming a first gate insulation film on said semiconductor substrate of said first device region;

forming a floating gate on said first gate insulation film;

forming a dielectric film on said floating gate;

forming a second well in said semiconductor substrate of said second device region after forming said dielectric film;

forming a second gate insulation film on said semiconductor substrate of said second well;

forming a control gate, first gate electrode on said dielectric film and said second gate insulation film respectively.

9. The fabrication method of the semiconductor integrated circuit device as claimed in claim 8, wherein forming said dielectric film includes forming said dielectric film on said semiconductor substrate of said second device region; and forming said second well includes introducing an impurity element into said semiconductor substrate of said second device region via said dielectric film, and the fabrication method of the semiconductor integrated circuit device as claimed in claim 1, further comprising removing said dielectric film of said second device region after forming said second well, and before forming said second gate insulation film.

10. The fabrication method of the semiconductor integrated circuit device as claimed in claim 8, wherein forming said floating gate includes forming a first conductor film on said first gate insulation film, and patterning said first conductor film to form said floating gate.

11. The fabrication method of the semiconductor integrated circuit device as claimed in claim 1, wherein forming said control gate, said first gate electrode includes forming a second conductor film on said dielectric film and said second gate insulation film, and patterning said second conductor film to form said control gate and said first gate electrode.

* * * * *